US011518833B2

(12) United States Patent
Matsumura et al.

(10) Patent No.: US 11,518,833 B2

(45) **Date of Patent: *Dec. 6, 2022**

(54) COMPOSITION, FILM, NEAR INFRARED CUT FILTER, LAMINATE, PATTERN FORMING METHOD, SOLID IMAGE PICKUP ELEMENT, IMAGE DISPLAY DEVICE, INFRARED SENSOR, AND COLOR FILTER

(71) Applicant: FUJIFILM Corporation, Tokyo (JP)

(72) Inventors: Tokihiko Matsumura, Haibara-gun (JP); Daisuke Sasaki, Haibara-gun (JP); Kyohei Arayama, Haibara-gun (JP); Yoshihiro Jimbo, Haibara-gun (JP); Kazuya Oota, Haibara-gun (JP); Keisuke Arimura, Haibara-gun (JP); Takahiro Okawara, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/157,195

(22) Filed: Jan. 25, 2021

(65) Prior Publication Data

US 2021/0139708 A1 May 13, 2021

Related U.S. Application Data

(63) Continuation of application No. 16/019,178, filed on Jun. 26, 2018, now Pat. No. 10,947,389, which is a (Continued)

(30) Foreign Application Priority Data

Jan. 29, 2016 (JP) ............................ JP2016-015782
Jul. 20, 2016 (JP) ............................ JP2016-142116
Nov. 25, 2016 (JP) ............................ JP2016-228784

(51) Int. Cl.

*C08F 220/18* (2006.01)
*C08F 2/48* (2006.01)

(Continued)

(52) U.S. Cl.

CPC .......... *C08F 220/1803* (2020.02); *C08F 2/48* (2013.01); *C08F 220/1807* (2020.02);

(Continued)

(58) Field of Classification Search

None

See application file for complete search history.

(56) References Cited

U.S. PATENT DOCUMENTS 5,013,474 A 5/1991 Arai et al.
10,947,389 B2 * 3/2021 Matsumura ......... C09B 23/0008

(Continued)

FOREIGN PATENT DOCUMENTS

CN 102267299 A 12/2011
CN 103323897 A 9/2013

(Continued)

OTHER PUBLICATIONS

Chinese Office Action and Search Report for corresponding Chinese Application No. 201780006291.7, dated Sep. 22, 2020, with English translation of the Office Action.

(Continued)

*Primary Examiner* — Ramsey Zacharia

(74) *Attorney, Agent, or Firm* — Birch, Stewart, Kolasch & Birch, LLP

(57) ABSTRACT

A composition includes two or more near infrared absorbing compounds having an absorption maximum in a wavelength range of 650 to 1000 nm and having a solubility of 0.1 mass % or lower in water at 23° C., in which the two or more near infrared absorbing compounds include a first near infrared absorbing compound having an absorption maximum in a (Continued)

wavelength range of 650 to 1000 nm, and a second near infrared absorbing compound having an absorption maximum in a wavelength range of 650 to 1000 nm which is shorter than the absorption maximum of the first near infrared absorbing compound, and a difference between the absorption maximum of the first near infrared absorbing compound and the absorption maximum of the second near infrared absorbing compound is 1 to 150 nm.

24 Claims, 2 Drawing Sheets

Related U.S. Application Data continuation of application No. PCT/JP2017/001678, filed on Jan. 19, 2017.

(51) Int. Cl.

| | |
|---|---|
| *C08K 5/55* | (2006.01) |
| *C08L 33/10* | (2006.01) |
| *C09B 23/01* | (2006.01) |
| *C09B 23/08* | (2006.01) |
| *C09B 23/14* | (2006.01) |
| *C09B 57/00* | (2006.01) |
| *G02B 5/20* | (2006.01) |
| *G02B 5/22* | (2006.01) |
| *G03F 7/16* | (2006.01) |
| *G03F 7/20* | (2006.01) |
| *G03F 7/32* | (2006.01) |
| *G03F 7/38* | (2006.01) |
| *H01L 27/146* | (2006.01) |
| *H01L 27/148* | (2006.01) |
| *G03F 7/00* | (2006.01) |
| *G03F 7/027* | (2006.01) |
| *G03F 7/031* | (2006.01) |
| *G03F 7/075* | (2006.01) |
| *C08F 220/14* | (2006.01) |
| *C08K 5/00* | (2006.01) |
| *C08K 5/3415* | (2006.01) |
| *C09B 23/00* | (2006.01) |
| *C09K 3/00* | (2006.01) |
| *G03F 7/033* | (2006.01) |

(52) U.S. Cl.

CPC ................ *C08K 5/55* (2013.01); *C08L 33/10* (2013.01); *C09B 23/0008* (2013.01); *C09B 23/0016* (2013.01); *C09B 23/0025* (2013.01); *C09B 23/0033* (2013.01); *C09B 23/0041* (2013.01); *C09B 23/0058* (2013.01); *C09B 23/0066* (2013.01); *C09B 23/0075* (2013.01); *C09B 23/083* (2013.01); *C09B 23/086* (2013.01); *C09B 23/145* (2013.01); *C09B 57/007* (2013.01); *C09B 57/008* (2013.01); *G02B 5/201* (2013.01); *G02B 5/208* (2013.01); *G02B 5/223* (2013.01); *G03F 7/162* (2013.01); *G03F 7/168* (2013.01); *G03F 7/2004* (2013.01); *G03F 7/322* (2013.01); *G03F 7/38* (2013.01); *H01L 27/14621* (2013.01); *H01L 27/14649* (2013.01); *H01L 27/14806* (2013.01); *H01L 27/14875* (2013.01); *G03F 7/0007* (2013.01); *G03F 7/027* (2013.01); *G03F 7/031* (2013.01); *G03F 7/033* (2013.01); *G03F 7/0751* (2013.01)

(56) References Cited

U.S. PATENT DOCUMENTS

| | | | | |
|---|---|---|---|---|
| 2011/0012075 | A1 | 1/2011 | Nii et al. | |
| 2011/0070407 | A1 | 3/2011 | Kato et al. | |
| 2014/0091419 | A1 | 4/2014 | Hasegawa et al. | |
| 2014/0264202 | A1 | 9/2014 | Nagaya et al. | |
| 2015/0221691 | A1 | 8/2015 | Watanabe | |
| 2015/0259547 | A1 | 9/2015 | Ezoe et al. | |
| 2015/0293281 | A1 | 10/2015 | Ezoe et al. | |
| 2015/0372037 | A1 | 12/2015 | Tomeba | |
| 2016/0282531 | A1 | 9/2016 | Murayama et al. | |
| 2017/0012072 | A1 | 1/2017 | Tsuruta et al. | |
| 2017/0038507 | A1 | 2/2017 | Norizuki et al. | |
| 2017/0345860 | A1 | 11/2017 | Nagaya et al. | |
| 2018/0095203 | A1 | 4/2018 | Ooi et al. | |
| 2019/0101672 | A1 * | 4/2019 | Kasai ...................... | G02B 5/20 |

FOREIGN PATENT DOCUMENTS

| | | | |
|---|---|---|---|
| CN | 104379688 | A | 2/2015 |
| CN | 104823083 | A | 8/2015 |
| CN | 105102560 | A | 11/2015 |
| JP | 2008-70827 | A | 3/2008 |
| JP | 2009-185161 | A | 8/2009 |
| JP | 2009-283814 | A | 11/2009 |
| JP | 2010-111750 | A | 5/2010 |
| JP | 2011-68731 | A | 4/2011 |
| JP | 2013-195480 | A | 9/2013 |
| JP | 2014-67019 | A | 4/2014 |
| JP | 2014-80487 | A | 5/2014 |
| JP | 2014-199925 | A | 10/2014 |
| JP | 2015-34252 | A | 2/2015 |
| JP | 2015-200878 | A | 11/2015 |
| KR | 10-2014-0088559 | A | 7/2014 |
| WO | WO 2008/038679 | A | 4/2008 |
| WO | WO 2012/169447 | A1 | 12/2012 |
| WO | WO 2013/054864 | A1 | 4/2013 |
| WO | WO 2015/115538 | A | 8/2015 |
| WO | WO 2015/151999 | A | 10/2015 |
| WO | WO 2015/166873 | A1 | 11/2015 |

OTHER PUBLICATIONS

Chinese Office Action and Search Report, dated Feb. 21, 2020, for corresponding Chinese Application No. 201780006291.7, with an English translation of the Chinese Office Action.

European Office Action dated Nov. 4, 2020 for corresponding Application No. 17 744 055.9.

Extended European Search Report, dated Jan. 21, 2019, for corresponding European Application No. 17744055.9.

Final Office Action dated Aug. 19, 2020 in copending U.S. Appl. No. 16/019,178.

International Preliminary Report on Patentability and Written Opinion of the International Searching Authority (Forms PCT/IB/326, PCT/IB/373 and PCT/ISA/237) for International Application No. PCT/JP2017/001678, dated Aug. 9, 2018, with English translation.

International Search Report (Form PCT/ISA/210) for International Application No. PCT/JP2017/001678, dated Apr. 25, 2017, with English translation.

Japanese Office Action dated Mar. 17, 2020 for corresponding Japanese Application No. 2017564197, with English translation.

Japanese Office Action for corresponding Japanese Application No. 2017-564197, dated Oct. 27, 2020, with English translation.

Japanese Office Action, dated Sep. 3, 2019, for Japanese Application No. 2017-564197, with an English translation.

Korean Office Action for corresponding Korean Application No. 10-2018-7018809, dated Jan. 14, 2020, with English translation.

Korean Office Action for corresponding Korean Application No. 10-2018-7018809, dated Jun. 25, 2020, with an English translation.

Korean Office Action for corresponding Korean Application No. 10-2018-7018809, dated Oct. 5, 2020, with English translation.

Machine translation of JP 2015-034252 A (Year: 2015).

(56) References Cited

OTHER PUBLICATIONS

Non-Final Office Action dated Apr. 1, 2020 in copending U.S. Appl. No. 16/019,178.
Notice of Allowance dated Oct. 26, 2020 in copending U.S. Appl. No. 16/019,178.
Notice to File Corrected Application Papers mailed Nov. 27, 2020 in copending U.S. Appl. No. 16/019,178.
Supplemental Notice of Allowance dated Dec. 4, 2020 in copending U.S. Appl. No. 16/019,178.
Supplemental Notice of Allowance dated Nov. 23, 2020 in copending U.S. Appl. No. 16/019,178.
Taiwanese Office Action and Search Report, dated Apr. 28, 2020, for Taiwanese Application No. 106102756, with an English translation.

* cited by examiner

COMPOSITION, FILM, NEAR INFRARED CUT FILTER, LAMINATE, PATTERN FORMING METHOD, SOLID IMAGE PICKUP ELEMENT, IMAGE DISPLAY DEVICE, INFRARED SENSOR, AND COLOR FILTER

CROSS-REFERENCE TO RELATED APPLICATIONS

This application is a Continuation of U.S. application Ser. No. 16/019,178 filed on Jun. 26, 2018, which is a Continuation of PCT International Application No. PCT/JP2017/1678, filed on Jan. 19, 2017, which claims priority under 35 U.S.C. § 119(a) to Japanese Patent Application No. 2016-015782, filed on Jan. 29, 2016, Japanese Patent Application No. 2016-142116, filed on Jul. 20, 2016, and Japanese Patent Application No. 2016-228784, filed on Nov. 25, 2016. Each of the above application(s) is hereby expressly incorporated by reference, in its entirety, into the present application.

BACKGROUND OF THE INVENTION

1. Field of the Invention

The present invention relates to a composition, a film, a near infrared cut filter, a laminate, a pattern forming method, a solid image pickup element, an image display device, an infrared sensor, and a color filter.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, visibility may be corrected using a near infrared cut filter.

As a near infrared absorbing compound, for example, a pyrrolopyrrole compound or a cyanine compound is known (for example, JP2009-263614A and JP2009-185161A).

JP2009-185161A describes that a near infrared cut filter is manufactured using a near infrared absorbing composition including two or more water-soluble cyanine compounds.

SUMMARY OF THE INVENTION

Recently, a film such as a near infrared cut filter including a near infrared absorbing compound is required to shield infrared light in a wide wavelength range, and further improvement of infrared shielding properties is required. In addition, the film such as a near infrared cut filter including a near infrared absorbing compound may also be used in a high-temperature and high-humidity environment, and it is required that spectral characteristics are not likely to vary even after exposure to a high-temperature and high-humidity environment.

An object of the present invention is to provide a composition with which a film having excellent infrared shielding properties and reduced spectral variation can be formed. In addition, another object of the present invention is to provide a film, a near infrared cut filter, a laminate, a pattern forming method, a solid image pickup element, an image display device, an infrared sensor, and a color filter.

The present inventors performed a thorough investigation under the above-described circumstances, and found that the objects can be achieved by using two or more near infrared absorbing compounds having an absorption maximum in a wavelength range of 650 to 1000 nm and having a solubility of 0.1 mass % or lower in water at 23° C., thereby completing the present invention. The present invention provides the following.

<1> A composition comprising:

two or more near infrared absorbing compounds having an absorption maximum in a wavelength range of 650 to 1000 nm and having a solubility of 0.1 mass % or lower in water at 23° C., in which the two or more near infrared absorbing compounds include a first near infrared absorbing compound having an absorption maximum in a wavelength range of 650 to 1000 nm, and a second near infrared absorbing compound having an absorption maximum in a wavelength range of 650 to 1000 nm which is shorter than the absorption maximum of the first near infrared absorbing compound, and a difference between the absorption maximum of the first near infrared absorbing compound and the absorption maximum of the second near infrared absorbing compound is 1 to 150 nm.

<2> The composition according to <1>, in which in each of the first near infrared absorbing compound and the second near infrared absorbing compound, a ratio A1/A2 of an absorbance A1 at a wavelength of 500 nm to an absorbance A2 at the absorption maximum is 0.04 or lower.

<3> The composition according to <1> or <2>, in which at least one of the first near infrared absorbing compound or the second near infrared absorbing compound includes at least one selected from the group consisting of a pyrrolopyrrole compound, a cyanine compound, a squarylium compound, a phthalocyanine compound, a naphthalocyanine compound, and a rylene compound.

<4> The composition according to any one of <1> to <3>, in which the first near infrared absorbing compound is a pyrrolopyrrole compound.

<5> The composition according to any one of <1> to <4>, in which at least one of the first near infrared absorbing compound or the second near infrared absorbing compound includes a compound represented by the following Formula (I), (I)

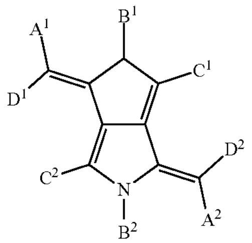

in Formula (I), $A^1$ and $A^2$ each independently represent a heteroaryl group, $B^1$ and $B^2$ each independently represent a —$BR^1R^2$ group, $R^1$ and $R^2$ each independently represent a substituent, $R^1$ and $R^2$ may be bonded to each other to form a ring, $C^1$ and $C^2$ each independently represent an alkyl group, an aryl group, or a heteroaryl group, and $D^1$ and $D^2$ each independently represent a substituent.

<6> The composition according to any one of <1> to <4>, in which at least one of the first near infrared absorbing compound or the second near infrared absorbing compound includes at least one selected from the group consisting of a compound represented by the following Formula (II) and a compound represented by the following Formula (III), (II)

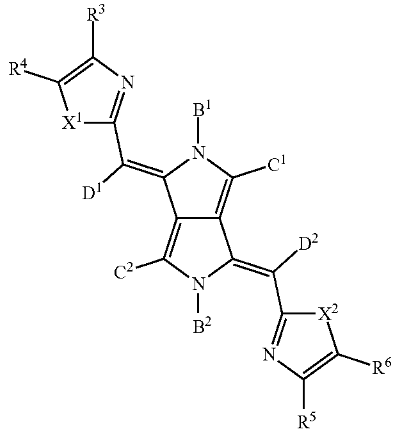

(III)

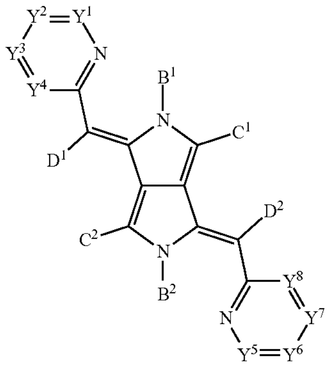

in Formula (II), $X^1$ and $X^2$ each independently represent O, S, $NR^{X1}$, or $CR^{X2}R^{X3}$, $R^{X1}$ to $R^{X3}$ each independently represent a hydrogen atom or a substituent, $R^3$ to $R^6$ each independently represent a hydrogen atom or a substituent, $R^3$ and $R^4$, or $R^5$ and $R^6$ may be bonded to form a ring, $B^1$ and $B^2$ each independently represent a —$BR^1R^2$ group, $R^1$ and $R^2$ each independently represent a substituent, $R^1$ and $R^2$ may be bonded to each other to form a ring, $C^1$ and $C^2$ each independently represent an alkyl group, an aryl group, or a heteroaryl group, and $D^1$ and $D^2$ each independently represent a substituent, in Formula (III), $Y^1$ to $Y^8$ each independently represent N or $CR^{Y1}$, at least two of $Y^1$, $Y^2$, $Y^3$, or $Y^4$ represent $CR^{Y1}$, at least two of $Y^5$, $Y^6$, $Y^7$, or $Y^8$ represent $CR^{Y1}$, $R^{Y1}$ represents a hydrogen atom or a substituent, adjacent $R^{Y1}$'s may be bonded to each other to form a ring, $B^1$ and $B^2$ each independently represent a —$BR^1R^2$ group, $R^1$ and $R^2$ each independently represent a substituent, $R^1$ and $R^2$ may be bonded to each other to form a ring, $C^1$ and $C^2$ each independently represent an alkyl group, an aryl group, or a heteroaryl group, and $D^1$ and $D^2$ each independently represent a substituent.

<7> The composition according to any one of <1> to <6>, in which the first near infrared absorbing compound and the second near infrared absorbing compound have a common colorant skeleton.

<8> The composition according to any one of <1> to <3>, in which both the first near infrared absorbing compound and the second near infrared absorbing compound are pyrrolopyrrole compounds or cyanine compounds.

<9> The composition according to any one of <1> to <8>, in which a difference between the absorption maximum of the first near infrared absorbing compound and the absorption maximum of the second near infrared absorbing compound is 1 to 90 nm.

<10> The composition according to anyone of <1> to <9>, further comprising:

a curable compound.

<11> The composition according to anyone of <1> to <10>, further comprising:

a resin; and a solvent.

<12> The composition according to anyone of <1> to <11>, further comprising:

a chromatic colorant.

<13> A film comprising:

the composition according to any one of <1> to <12>.

<14> A near infrared cut filter comprising:

the composition according to any one of <1> to <12>.

<15> The near infrared cut filter according to <14>, further comprising:

a layer containing copper.

<16> A laminate comprising:

the near infrared cut filter according to <14> or <15>; and a color filter that includes a chromatic colorant.

<17> A pattern forming method comprising:

a step of forming a composition layer on a support, the composition layer including the composition according to any one of <1> to <12>; and a step of forming a pattern on the composition layer using a photolithography method or a dry etching method.

<18> A solid image pickup element comprising:

the film according to <13>.

<19> An image display device comprising:

the film according to <13>.

<20> An infrared sensor comprising:

the film according to <13>.

<21> A color filter comprising:

a pixel that includes the composition according to any one of <1> to <12>; and a pixel selected from the group consisting of a red pixel, a green pixel, a blue pixel, a magenta pixel, a yellow pixel, a cyan pixel, a black pixel, and an achromatic pixel.

According to the present invention, a composition can be provided, with which a film having excellent infrared shielding properties and moisture resistance can be manufactured. In addition, a film, a near infrared cut filter, a laminate, a pattern forming method, a solid image pickup element, an image display device, an infrared sensor, and a color filter can be provided.

DESCRIPTION OF THE PREFERRED EMBODIMENTS

Figure 1:
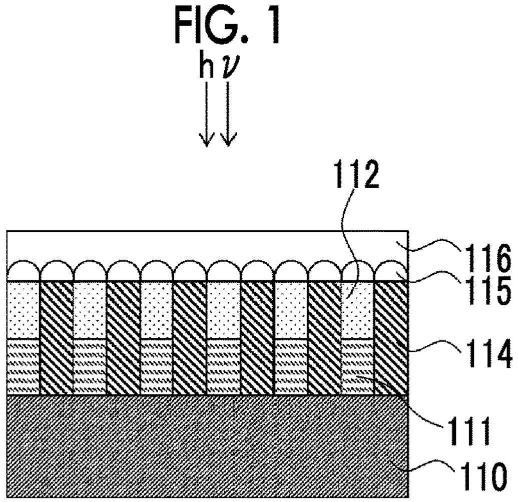
FIG. 1 is a schematic diagram showing an embodiment of an infrared sensor.

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, "light" denotes an actinic ray or radiation. In addition, "actinic ray" or "radiation" denotes, for example, a bright light spectrum of a mercury lamp, a far ultraviolet ray represented by excimer laser, an extreme ultraviolet ray (EUV ray), an X-ray, or an electron beam.

In this specification, unless specified otherwise, "exposure" denotes not only exposure using a bright light spectrum of a mercury lamp, a far ultraviolet ray represented by excimer laser, an X-ray, an EUV ray, or the like but also drawing using a corpuscular beam such as an electron beam or an ion beam.

In this specification, "(meth)acrylate" denotes acrylate and methacrylate, "(meth)acryl" denotes acryl and methacryl, and "(meth)acryloyl" denotes acryloyl and methacryloyl.

In this specification, a weight-average molecular weight and a number-average molecular weight are defined as values in terms of polystyrene obtained by gel permeation chromatography (GPC). In this specification, an weight-average molecular weight (Mw) and a number-average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

In this specification, in a chemical formula, Me represents a methyl group, Et represents an ethyl group, Bu represents a butyl group, and Ph represents a phenyl group.

Near infrared light denotes light (electromagnetic wave) having an absorption maximum in a wavelength range of 700 to 2500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Composition>

A composition according to the present invention includes two or more near infrared absorbing compounds having an absorption maximum in a wavelength range of 650 to 1000 nm and having a solubility of 0.1 mass % or lower in water at 23° C., in which the two or more near infrared absorbing compounds include a first near infrared absorbing compound having an absorption maximum in a wavelength range of 650 to 1000 nm, and a second near infrared absorbing compound having an absorption maximum in a wavelength range of 650 to 1000 nm which is shorter than the absorption maximum of the first near infrared absorbing compound, and a difference between the absorption maximum of the first near infrared absorbing compound and the absorption maximum of the second near infrared absorbing compound is 1 to 150 nm.

In this specification, "having an absorption maximum in a wavelength range of 650 to 1000 nm" denotes having a maximum absorbance in a wavelength range of 650 to 1000 nm in an absorption spectrum of the near infrared absorbing compound in a solution. Examples of a measurement solvent used for the measurement of the absorption spectra of the near infrared absorbing compound in the solution include chloroform, methanol, dimethyl sulfoxide, ethyl acetate, and tetrahydrofuran. In the case of a compound which is soluble in chloroform, chloroform is used as the measurement solvent. In the case of a compound which is not soluble in chloroform, methanol is used. In addition, In the case of a compound which is not soluble in chloroform and methanol, dimethyl sulfoxide is used. In addition, in this specification, the solubility of the near infrared absorbing compound in water at 23° C. denotes a value measured using a method described in Examples described below.

The composition according to the present invention includes the first near infrared absorbing compound and the second near infrared absorbing compound. Therefore, with the composition according to the present invention, a film having excellent infrared shielding properties and reduced spectral variation can be formed.

That is, the first near infrared absorbing compound and the second near infrared absorbing compound have absorption maximums in different wavelength ranges in a wavelength range of 650 to 1000 nm, respectively, and a difference between the absorption maximums is 1 to 150 nm. Therefore, the waveform of the absorption spectrum of the film in a wavelength range of 650 to 1000 nm is wider than that in a case where one infrared absorbing compound is used, and the film can shield infrared light in a wide wavelength range.

In addition, it was found that, in a film including two or more near infrared absorbing compounds, spectral variation is not likely to occur. As a result of investigation, the reason for the spectral variation is presumed to be that the near infrared absorbing compounds in the film bleed out to the film surface or the association state of the near infrared absorbing compound changes.

In the present invention, as the near infrared absorbing compound, a compound having a solubility of 0.1 mass % or lower in water at 23° C. is used. Therefore, the moisture resistance of the obtained film is improved. In a case where the film obtained using the composition according to the present invention is used in a high-temperature and high-humidity environment, the bleed-out of the near infrared absorbing compound, a change in association state, and the like can be suppressed, and the spectral variation can be reduced.

In addition, by using a compound having excellent light fastness (for example, a pyrrolopyrrole compound) as the first near infrared absorbing compound, even in a case where a compound having poor light fastness is used as the second near infrared absorbing compound, a film having excellent light fastness can be manufactured. The mechanism in which the above-described effect is obtained is presumed to be that an energy absorbed by the second near infrared absorbing compound having an absorption maximum which is shorter than that of the first near infrared absorbing compound moves to the first near infrared absorbing compound side having excellent light fastness such that decomposition or the like of the second near infrared absorbing compound can be suppressed.

Hereinafter, each component of the composition will be described.

<<Near Infrared Absorbing Compound>>

The composition according to the present invention includes two or more near infrared absorbing compounds (hereinafter, also referred to as "near infrared absorbing compound A") having an absorption maximum in a wavelength range of 650 to 1000 nm and having a solubility of 0.1 mass % or lower in water at 23° C.

The absorption maximum of the near infrared absorbing compound A is present preferably in a range of 660 to 1000 nm, more preferably in a range of 670 to 1000 nm, and still more preferably in a range of 710 to 1000 nm.

The solubility of the near infrared absorbing compound A in water at 23° C. is preferably 0.1 mass % or lower, more preferably 0.05 mass % or lower, and still more preferably 0.01 mass % or lower. According to the aspect, a film having more reduced spectral variation can be manufactured. In particular, the spectral variation can be more effectively suppressed even after exposure to a high-temperature and high-humidity environment.

In the near infrared absorbing compound A, a ratio A1/A2 of an absorbance A1 at a wavelength of 500 nm to an absorbance A2 at the absorption maximum is preferably 0.08 or lower and more preferably 0.04 or lower. According to this aspect, a film having excellent visible transparency and infrared shielding properties can be manufactured.

The absorbance A1 at a wavelength of 500 nm and the absorbance A2 at the absorption maximum are values obtained from the absorption spectrum of the near infrared absorbing compound in the solution.

The two or more near infrared absorbing compounds include at least the first near infrared absorbing compound having an absorption maximum in a wavelength range of 650 to 1000 nm, and the second near infrared absorbing compound having an absorption maximum in a wavelength range of 650 to 1000 nm which is shorter than the absorption maximum of the first near infrared absorbing compound. A difference between the absorption maximum of the first near infrared absorbing compound and the absorption maximum of the second near infrared absorbing compound is 1 to 150 nm.

In a preferable aspect of a combination of the first near infrared absorbing compound and the second near infrared absorbing compound, a difference between the absorption maximum of the first near infrared absorbing compound and the absorption maximum of the second near infrared absorbing compound is preferably 5 to 100 nm and more preferably 30 to 90 nm. This aspect is suitable for manufacturing a film or the like that can shield infrared light in a wide wavelength range.

In another preferable aspect of a combination of the first near infrared absorbing compound and the second near infrared absorbing compound, a difference between the absorption maximum of the first near infrared absorbing compound and the absorption maximum of the second near infrared absorbing compound is preferably 5 to 100 nm and more preferably 20 to 60 nm. This aspect is suitable for manufacturing a film or the like that can selectively shield infrared light in a specific wavelength range.

The composition according to the present invention may include three or more near infrared absorbing compounds having an absorption maximum in the above-described wavelength range. In this case, a near infrared absorbing compound having the longest absorption maximum in a wavelength range of 650 to 1000 nm is set as the first near infrared absorbing compound, and all the near infrared absorbing compounds having an absorption maximum which is shorter than the absorption maximum of the first near infrared absorbing compound are set as the second near infrared absorbing compound. In addition, in a case where two or more near infrared absorbing compounds having the longest absorption maximum are present, these compounds can be considered as the first near infrared absorbing compound.

The near infrared absorbing compound A is not particularly limited as long as it is a compound having an absorption maximum in a wavelength range of 650 to 1000 nm and having a solubility of 0.1 mass % or lower in water at 23° C. Examples of the near infrared absorbing compound A include a pyrrolopyrrole compound, a cyanine compound, a squarylium compound, a phthalocyanine compound, a naphthalocyanine compound, a rylene compound, a merocyanine compound, a croconium compound, an oxonol compound, a diimmonium compound, a dithiol compound, a triarylmethane compound, a pyrromethene compound, an azomethine compound, an anthraquinone compound, and a dibenzofuranone compound. Among these, a pyrrolopyrrole compound, a cyanine compound, a squarylium compound, a phthalocyanine compound, a naphthalocyanine compound, or a rylene compound is preferable, a pyrrolopyrrole compound, a cyanine compound, or a squarylium compound is more preferable, and a pyrrolopyrrole compound is still more preferable.

The first near infrared absorbing compound and the second near infrared absorbing compound may be compound having a common colorant skeleton, or may be compounds having different colorant skeletons. The compounds having a common colorant skeleton denote the same kind of compounds. For example, in a case where both the first near infrared absorbing compound and the second near infrared absorbing compound are pyrrolopyrrole compounds (compound having a pyrrolopyrrole colorant skeleton), the first near infrared absorbing compound and the second near infrared absorbing compound correspond the compounds having a common colorant skeleton.

It is preferable that the first near infrared absorbing compound is a pyrrolopyrrole compound. The second near infrared absorbing compound may be a pyrrolopyrrole compound or may be a compound other than a pyrrolopyrrole compound. Examples of the compound other than a pyrrolopyrrole compound include a cyanine compound, a squarylium compound, a phthalocyanine compound, a naphthalocyanine compound, and a rylene compound. Among these, a cyanine compound or a squarylium compound is preferable. From the viewpoint of light fastness, it is preferable that the second near infrared absorbing compound is a pyrrolopyrrole compound. That is, an aspect where the first near infrared absorbing compound is a pyrrolopyrrole compound and the second near infrared absorbing compound is at least one selected from the group consisting of a pyrrolopyrrole compound, a squarylium compound, and a cyanine compound is more preferable. In this aspect, the second near infrared absorbing compound is more preferably a pyrrolopyrrole compound or a squarylium compound, and is still more preferably a pyrrolopyrrole compound. The pyrrolopyrrole compound has excellent light fastness. Therefore, by using a pyrrolopyrrole compound as the first near infrared absorbing compound, even in a case where a compound having lower light fastness than the pyrrolopyrrole compound is used as the second near infrared absorbing compound, a film having excellent light fastness can be manufactured. In particular, in a case where both the first near infrared absorbing compound and the second near infrared absorbing compound pyrrolopyrrole compounds, a film having excellent light fastness can be manufactured.

In addition, it is preferable that the first near infrared absorbing compound is a squarylium compound. The second near infrared absorbing compound may be a squarylium compound or may be a compound other than a squarylium compound. Examples of the compound other than a squarylium compound include a pyrrolopyrrole compound, a cyanine compound, a phthalocyanine compound, a naphthalocyanine compound, and a rylene compound. Among these, a pyrrolopyrrole compound or a cyanine compound is preferable. The second near infrared absorbing compound is more preferably a pyrrolopyrrole compound or a squarylium compound. That is, an aspect where the first near infrared absorbing compound is a squarylium compound and the second near infrared absorbing compound is at least one selected from the group consisting of a pyrrolopyrrole compound, a squarylium compound, and a cyanine compound is more preferable. In this aspect, the second near infrared absorbing compound is more preferably a pyrrolopyrrole compound or a squarylium compound.

In addition, it is preferable that the first near infrared absorbing compound is a cyanine compound. The second near infrared absorbing compound may be a cyanine compound or may be a compound other than a cyanine compound. Examples of the compound other than a cyanine compound include a pyrrolopyrrole compound, a squarylium compound, a phthalocyanine compound, a naphthalocyanine compound, and a rylene compound. Among these, a pyrrolopyrrole compound or a squarylium compound is preferable. The second near infrared absorbing compound is more preferably a pyrrolopyrrole compound or a squarylium compound. That is, an aspect where the first near infrared absorbing compound is a cyanine compound and the second near infrared absorbing compound is at least one selected from the group consisting of a pyrrolopyrrole compound, a squarylium compound, and a cyanine compound is more preferable. In this aspect, the second near infrared absorbing compound is more preferably a pyrrolopyrrole compound or a cyanine compound, and is still more preferably a cyanine compound.

The content of the near infrared absorbing compound A (the total content of the first near infrared absorbing compound and the second near infrared absorbing compound) in the composition is preferably 0.01 to 60 mass % with respect to the total solid content of the composition. The lower limit is preferably 0.1 mass % or higher and more preferably 0.5 mass % or higher. The upper limit is preferably 30 mass % or lower, and more preferably 15 mass % or lower. In the above-described range, excellent near infrared absorption capacity can be imparted.

A ratio between the first near infrared absorbing compound and the second near infrared absorbing compound is not particularly limited. The content of the second near infrared absorbing compound is preferably 5 to 500 parts by mass, more preferably 10 to 300 parts by mass, and still more preferably 30 to 200 parts by mass with respect to 100 parts by mass of the first near infrared absorbing compound.

The composition may include one compound or may include two or more compounds as the first near infrared absorbing compound. In a case where the composition includes two or more compounds as the first near infrared absorbing compound and/or the second near infrared absorbing compound, the total content of the compounds is in the above-described range.

In addition, the composition may include one compound or may include two or more compounds as the second near infrared absorbing compound. From the viewpoint of spectral characteristics, it is preferable that the composition includes two or more compounds as the second near infrared absorbing compound. In a case where the composition includes an n number of second near infrared absorbing compounds, among absorption maximums of the n number of second near infrared absorbing compounds, a difference between an absorption maximum of a compound $A_a$ having the (a)-st longest absorption maximum and an absorption maximum of a compound $A_{a+1}$ having the (a+1)-st longest absorption maximum is preferably 1 to 90 nm and more preferably 5 to 60 nm. Here, a represents an integer of 1 to n−1, and n represents an integer of 2 or more.

In addition, for example, in a case where the composition includes three second near infrared absorbing compounds, a difference between an absorption maximum of a compound $A_1$ having the longest absorption maximum (a compound having the longest absorption maximum) and an absorption maximum of a compound $A_2$ having the second longest absorption maximum (a compound having an absorption maximum which is shorter than the absorption maximum of the compound $A_1$) is preferably 1 to 90 nm and more preferably 5 to 60 nm. In addition, a difference between the absorption maximum of the compound $A_2$ having the second longest absorption maximum and an absorption maximum of a compound $A_3$ having the third longest absorption maximum (a compound having an absorption maximum which is shorter than the absorption maximum of the compound $A_2$) is preferably 1 to 90 nm and more preferably 5 to 60 nm.

It is preferable that the first near infrared absorbing compound and the second near infrared absorbing compound are used as a colorant polymer. The colorant polymer has two or more near infrared absorbing colorant structures and preferably three or more near infrared absorbing colorant structures in one molecule. The upper limit of the number of near infrared absorbing colorant structures in one molecule is not particularly limited and may be 100 or less.

(Pyrrolopyrrole Compound)

It is preferable that the pyrrolopyrrole compound used as the near infrared absorbing compound A is a compound represented by Formula (I).

(I)

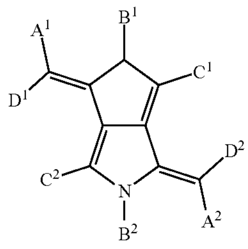

In Formula (I), $A^1$ and $A^2$ each independently represent a heteroaryl group.

$B^1$ and $B^2$ each independently represent a —$BR^1R^2$ group, $R^1$ and $R^2$ each independently represent a substituent, and $R^1$ and $R^2$ may be bonded to each other to form a ring.

$C^1$ and $C^2$ each independently represent an alkyl group, an aryl group, or a heteroaryl group.

$D^1$ and $D^2$ each independently represent a substituent.

In Formula (I), $A^1$ and $A^2$ each independently represent a heteroaryl group. $A^1$ and $A^2$ may represent the same group or different groups. It is preferable that $A^1$ and $A^2$ represent the same group.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms constituting the heteroaryl group is preferably 3 to 30, more preferably 3 to 18, still more preferably 3 to 12 and even still more preferably 3 to 10. It is preferable that the heteroaryl group is a 5-membered or 6-membered ring.

It is preferable that the heteroaryl group is a group represented by the following Formula (A-1) or a group represented by the following Formula (A-2).

(A-1)

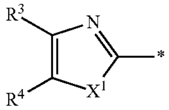

(A-2)

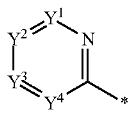

In Formula (A-1), $X^1$'s each independently represent O, S, $NR^{X1}$, or $CR^{X2}R^{X3}$, $R^{X1}$ to $R^{X3}$ each independently represent a hydrogen atom or a substituent, $R^3$ and $R^4$ each independently represent a hydrogen atom or a substituent, and $R^3$ and $R^4$ may be bonded to each other to form a ring. * represents a binding site in Formula (I).

Preferable examples of the substituent represented by $R^3$, $R^4$, and $R^{X1}$ to $R^{X3}$ include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxyl group, a halogen atom, and a cyano group. Among these, an alkyl group, an aryl group, or a halogen atom is preferable.

The number of carbon atoms in the alkyl group is preferably 1 to 20, more preferably 1 to 15, and still more preferably 1 to 8. The alkyl group may be linear, branched, or cyclic and is preferably linear or branched. The alkyl group may have a substituent or may be unsubstituted. Examples of the substituent include the above-described groups such as a halogen atom or an aryl group.

The number of carbon atoms in the aryl group is preferably 6 to 30, more preferably 6 to 20, and still more preferably 6 to 12. The aryl group may have a substituent or may be unsubstituted. Examples of the substituent include the above-described groups such as a halogen atom or an alkyl group.

Examples of the halogen atom include a fluorine atom, a chlorine atom, a bromine atom, and an iodine atom.

The ring which is formed by $R^3$ and $R^4$ being bonded to each other is preferably an aromatic ring. In a case where $R^3$ and $R^4$ are bonded to each other to form a ring, for example, (A-1) represents a group represented by the following (A-1-1) or a group represented by the following (A-1-2).

(A-1-1)

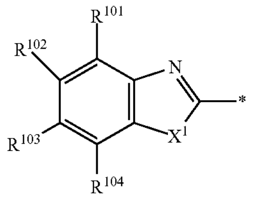

(A-1-2)

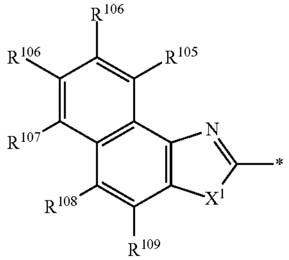

In the formula, $X^1$'s each independently represent O, S, $NR^{X1}$, or $CR^{X2}R^{X3}$, $R^{X1}$ to $R^{X3}$ each independently represent a hydrogen atom or a substituent, and $R^{101}$ to $R^{109}$ each independently represent a hydrogen atom or a substituent. * represents a binding site in Formula (I).

In Formula (A-2), $Y^1$ to $Y^4$ each independently represent N or $CR^{Y1}$, at least two of $Y^1$, $Y^2$, $Y^3$, or $Y^4$ represent $CR^{Y1}$, $R^{Y1}$ represents a hydrogen atom or a substituent, and adjacent $R^{Y1}$'s may be bonded to each other to form a ring. * represents a binding site in Formula (I).

Examples of the substituent represented by $R^{Y1}$ include the above-described substituents. Among these, an alkyl group, an aryl group, or a halogen atom is preferable. The number of carbon atoms in the alkyl group is preferably 1 to 20, more preferably 1 to 15, and still more preferably 1 to 8. The alkyl group may be linear, branched, or cyclic and is preferably linear or branched. The alkyl group may have a substituent or may be unsubstituted. Examples of the substituent include the above-described substituents such as a halogen atom or an aryl group.

The number of carbon atoms in the aryl group is preferably 6 to 30, more preferably 6 to 20, and still more preferably 6 to 12. The aryl group may have a substituent or may be unsubstituted. Examples of the substituent include the above-described substituents such as a halogen atom or an alkyl group.

Examples of the halogen atom include a fluorine atom, a chlorine atom, a bromine atom, and an iodine atom.

At least two of $Y^1$, $Y^2$, $Y^3$, or $Y^4$ represent $CR^{Y1}$, and adjacent $R^{Y1}$'s may be bonded to each other to forma ring. The ring which is formed by adjacent $R^{Y1}$'s being bonded to each other is preferably an aromatic ring. In a case where adjacent $R^{Y1}$'s are bonded to each other to forma ring, for example, (A-2) represents a group represented by any one of the following (A-2-1) to (A-2-5).

(A-2-1)

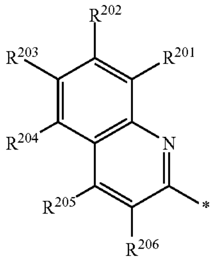

(A-2-2)

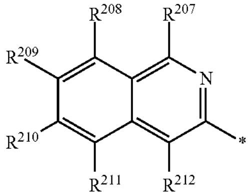

(A-2-3)

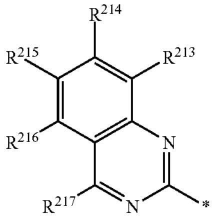

(A-2-4)

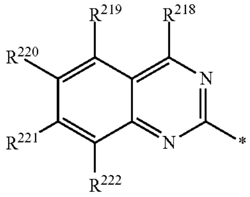

-continued (A-2-5)

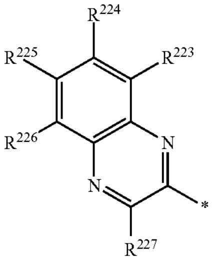

In the formula, $R^{201}$ to $R^{227}$ each independently represent a hydrogen atom or a substituent, and * represents a binding site in Formula (I).

Specific examples of $A^1$ and $A^2$ are as follows. In the following description, Bu represents a butyl group. * represents a binding site in Formula (I).

A-1

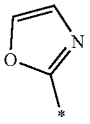

A-2

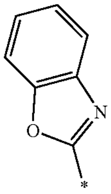

A-3

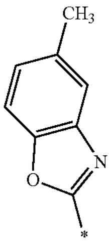

A-4

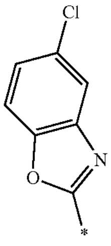

A-5

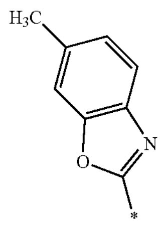

A-6
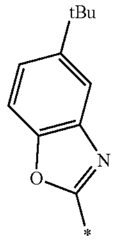
A-7
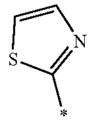
A-8
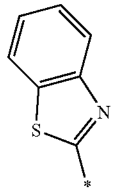
A-9
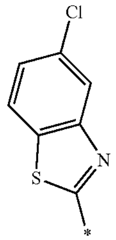
A-10
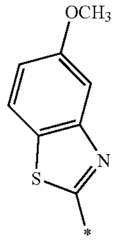
A-11
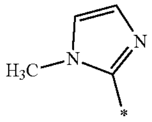
A-12
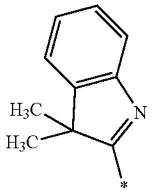
A-13
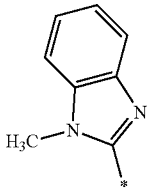
A-14
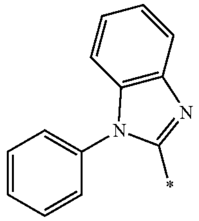
A-15
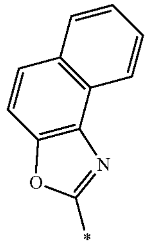
A-16
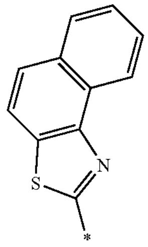
A-17
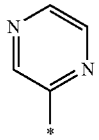
A-18
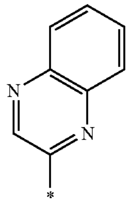
A-19
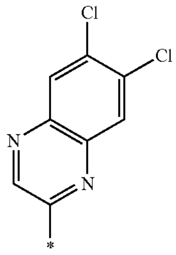
A-20
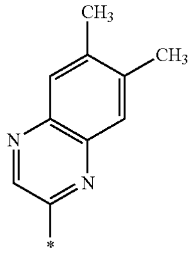

-continued

A-21

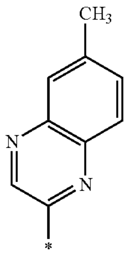

A-22

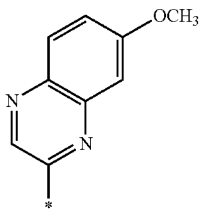

A-23

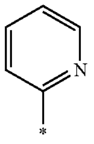

A-24

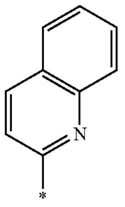

A-25

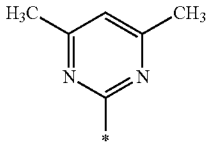

A-26

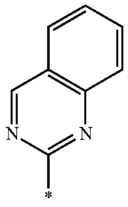

A-27

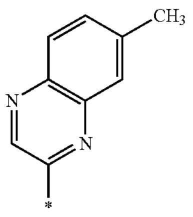

-continued

A-28

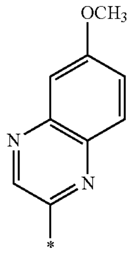

A-29

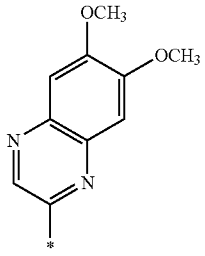

In Formula (I), $B^1$ and $B^2$ each independently represent a —$BR^1R^2$ group, and $R^1$ and $R^2$ each independently represent a substituent. $R^1$ and $R^2$ may be bonded to each other to form a ring. Examples of the substituent include the groups described regarding $A^1$ and $A^2$. Among these, a halogen atom, an alkyl group, an alkenyl group, an alkoxy group, an aryl group, or a heteroaryl group is preferable, a halogen atom, an aryl group, or a heteroaryl group is more preferable, and an aryl group or a heteroaryl group is still more preferable. $R^1$ and $R^2$ may represent the same group or different groups. It is preferable that $R^1$ and $R^2$ represent the same group. In addition, $B^1$ and $B^2$ may represent the same group or different groups. It is preferable that $B^1$ and $B^2$ represent the same group.

As the halogen atom, a fluorine atom, a chlorine atom, a chlorine atom, a bromine atom, or an iodine atom is preferable, and a fluorine atom is more preferable.

The number of carbon atoms in the alkyl group is preferably 1 to 40. For example, the lower limit is more preferably 3 or more. For example, the upper limit is more preferably 30 or less and still more preferably 25 or less. The alkyl group may be linear, branched, or cyclic and is preferably linear or branched.

The number of carbon atoms in the alkenyl group is preferably 2 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkenyl group may be linear, branched, or cyclic.

The number of carbon atoms in the alkoxy group is preferably 1 to 40. For example, the lower limit is more preferably 3 or more. For example, the upper limit is more preferably 30 or less and still more preferably 25 or less. The alkoxy group may be linear, branched, or cyclic.

The number of carbon atoms in the aryl group is preferably 6 to 20 and more preferably 6 to 12. The aryl group may have a substituent or may be unsubstituted. Examples of the substituent include an alkyl group, an alkoxy group, and a halogen atom. The details of the groups are as described above.

The heteroaryl group may be monocyclic or polycyclic. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms constituting the heteroaryl group is preferably 3 to 30, more preferably 3 to 18, still more preferably 3 to 12 and even still more preferably 3 to 5. It is preferable that the heteroaryl group is a 5-membered or 6-membered ring. The heteroaryl group may have a substituent or may be unsubstituted. Examples of the substituent include an alkyl group, an alkoxy group, and a halogen atom. The details of the groups are as described above.

$R^1$ and $R^2$ of the —$BR^1R^2$ group may be bonded to each other to form a ring. Examples of the ring include structures represented by the following (b-1) to (b-4). In the following formulae, R represents a substituent, $R^{a1}$ to $R^{a4}$ each independently represent a hydrogen atom or a substituent, m1 to m3 each independently represent an integer of 0 to 4, and * represents a binding site in Formula (I). Examples of the substituent represented by R and $R^{a1}$ to $R^{a4}$ include the substituents described above regarding $R^1$ and $R^2$. Among these, a halogen atom or an alkyl group is preferable.

(b-1)

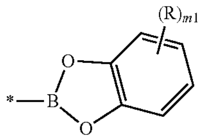

(b-2)

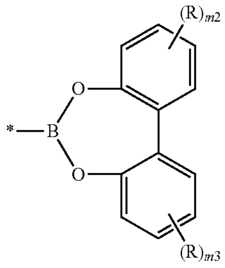

(b-3)

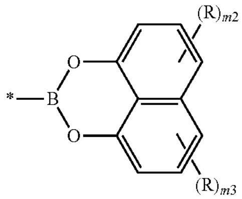

(b-4)

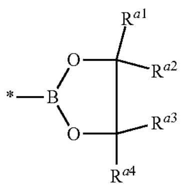

Specific examples of $B^1$ and $B^2$ are as follows. In the following formulae, Me represents a methyl group, and Bu represents a butyl group. * represents a binding site in Formula (I).

B-1

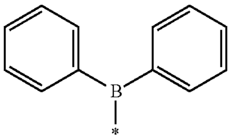

B-2

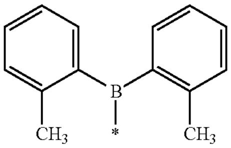

B-3

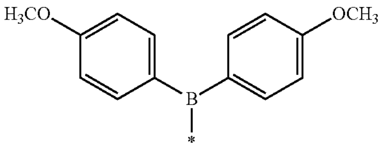

B-4

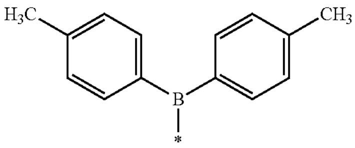

B-5

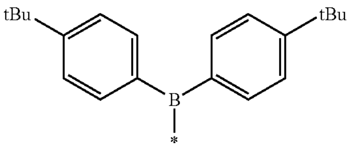

B-6

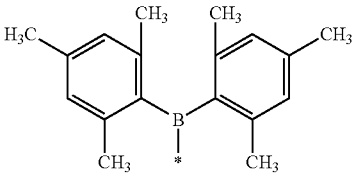

B-7

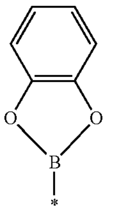

B-8

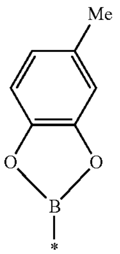

-continued

B-9

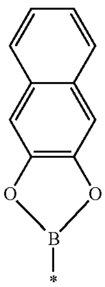

B-10

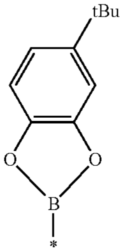

B-11

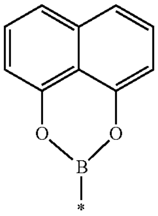

B-12

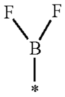

B-13

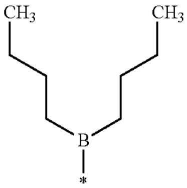

B-14

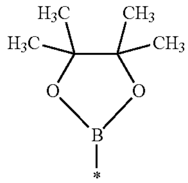

B-15

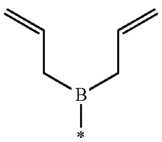

B-16

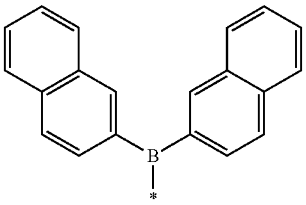

-continued

B-17

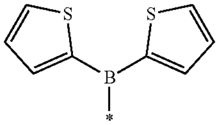

In Formula (I), $C^1$ and $C^2$ each independently represent an alkyl group, an aryl group, or a heteroaryl group. $C^1$ and $C^2$ may represent the same group or different groups. It is preferable that $C^1$ and $C^2$ represent the same group. $C^1$ and $C^2$ each independently represent preferably an aryl group or a heteroaryl group, and more preferably an aryl group.

The number of carbon atoms in the alkyl group is preferably 1 to 40, more preferably 1 to 30, and still more preferably 1 to 25. The alkyl group may be linear, branched, or cyclic and is preferably linear or branched and more preferably branched.

As the aryl group, an aryl group having 6 to 20 carbon atoms is preferable, and an aryl group having 6 to 12 carbon atoms is more preferable. A phenyl group or a naphthyl group is still more preferable.

The heteroaryl group may be monocyclic or polycyclic. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms constituting the heteroaryl group is preferably 3 to 30, more preferably 3 to 18, and still more preferably 3 to 12.

The alkyl group, the aryl group, and the heteroaryl group may have a substituent or may be unsubstituted. It is preferable that the groups have a substituent. In addition, the groups may have two or more substituents. For example, in a case where $C^1$ and $C^2$ represent a phenyl group, the phenyl group may have substituents at the two meta positions or the two ortho positions, respectively, with respect to a pyrrolopyrrole ring or may have a substituent at the one meta position or the one ortho position with respect to a pyrrolopyrrole ring. In addition, the phenyl group may have substituents at one of the meta position or the ortho position and the para position, respectively. In addition, the phenyl group may have substituents at the two meta positions or the two ortho positions and the para position, respectively.

Examples of the substituent include a hydrocarbon group which may have an oxygen atom, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxyl group, a halogen atom, and a cyano group.

Examples of the halogen atom include a fluorine atom, a chlorine atom, a bromine atom, and an iodine atom.

Examples of the hydrocarbon group include an alkyl group, an alkenyl group, and an aryl group.

The number of carbon atoms in the alkyl group is preferably 1 to 40. The lower limit is more preferably 3 or more, still more preferably 5 or more, even still more preferably 8 or more, and even yet still more preferably 10 or more. The upper limit is more preferably 35 or less and still more preferably 30 or less. The alkyl group may be linear, branched, or cyclic and is preferably linear or branched and more preferably branched. The number of carbon atoms in the branched alkyl group is preferably 3 to 40. The lower limit is, for example, preferably 5 or more, more preferably 8 or more, and still more preferably 10 or more. The upper limit is more preferably 35 or less and still more preferably 30 or less. For example, the number of branches in the branched alkyl group is preferably 2 to 10 and more preferably 2 to 8.

The number of carbon atoms in the alkenyl group is preferably 2 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkenyl group may be linear, branched, or cyclic and is preferably linear or branched and more preferably branched. The number of carbon atoms in the branched alkenyl group is preferably 3 to 40. The lower limit is, for example, preferably 5 or more, more preferably 8 or more, and still more preferably 10 or more. The upper limit is more preferably 35 or less and still more preferably 30 or less. The number of branches in the branched alkenyl group is preferably 2 to 10 and more preferably 2 to 8.

The number of carbon atoms in the aryl group is preferably 6 to 30, more preferably 6 to 20, and still more preferably 6 to 12.

Examples of the hydrocarbon group having an oxygen atom include a group represented by -L-$R^{x1}$.

L represents —O—, —CO—, —COO—, —OCO—, —$(OR^{x2})_m$—, or —$(R^{x2}O)_m$—. $R^{x1}$ represents an alkyl group, an alkenyl group, or an aryl group. $R^{x2}$ represents an alkylene group or an arylene group. m represents an integer of 2 or more, and an m number of $R^{x2}$'s may be the same as or different from each other.

L represents preferably —O—, —$(OR^{x2})_m$—, or —$(R^{x2}O)_m$—, and more preferably —O—.

The alkyl group, the alkenyl group, and the aryl group represented by $R^{x1}$ have the same definitions and the same preferable ranges as described above. $R^{x1}$ represents preferably an alkyl group or an alkenyl group and more preferably an alkyl group.

The number of carbon atoms in the alkylene group represented by $R^{x2}$ is preferably 1 to 20, more preferably 1 to 10, and still more preferably 1 to 5. The alkylene group may be linear, branched, or cyclic and is preferably linear or branched. The number of carbon atoms in the arylene group represented by $R^{x2}$ is preferably 6 to 20 and more preferably 6 to 12. $R^{x2}$ represents preferably an alkylene group.

m represents an integer of 2 or more, preferably 2 to 20, and more preferably 2 to 10.

The substituent which may be included in the alkyl group, the aryl group, and the heteroaryl group is preferably a group having a branched alkyl structure. In addition, as the substituent, a hydrocarbon group which may have an oxygen atom is preferable, and a hydrocarbon group having an oxygen atom is more preferable. The hydrocarbon group having an oxygen atom is preferably a group represented by —O—$R^{x1}$. $R^{x1}$ represents preferably an alkyl group or an alkenyl group, more preferably an alkyl group, and still more preferably a branched alkyl group. That is, the substituent is more preferably an alkoxy group and still more preferably a branched alkoxy group. In a case where the substituent is an alkoxy group, a film having excellent heat resistance and light fastness can be easily obtained. The number of carbon atoms in the alkoxy group is preferably 1 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkoxy group may be linear, branched, or cyclic and is preferably linear or branched and more preferably branched. The number of carbon atoms in the branched alkoxy group is preferably 3 to 40. The lower limit is, for example, preferably 5 or more, more preferably 8 or more, and still more preferably 10 or more. The upper limit is more preferably 35 or less and still more preferably 30 or less. The number of branches in the branched alkoxy group is preferably 2 to 10 and more preferably 2 to 8.

Specific examples of $C^1$ and $C^2$ are as follows. In the following formulae, Me represents a methyl group, and Bu represents a butyl group. * represents a binding site in Formula (I). In addition, optical isomers having the following structures can also be preferably used.

C-1

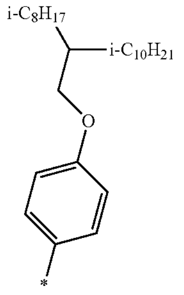

C-2

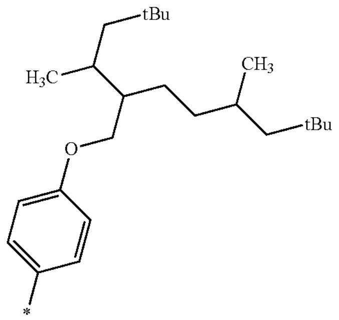

C-3

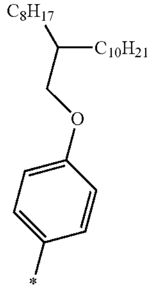

-continued
C-4
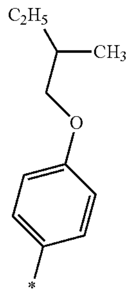
C-5
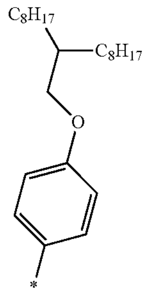
C-6
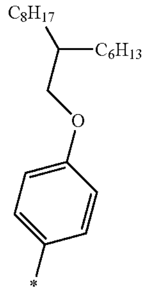
C-7
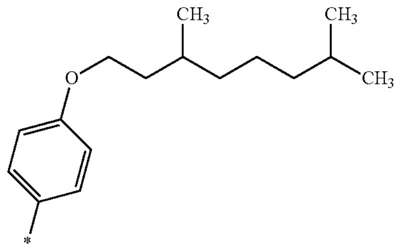
C-8
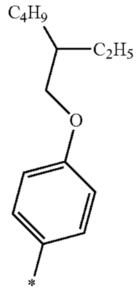
-continued
C-9
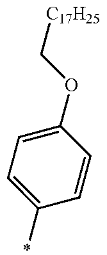
C-10
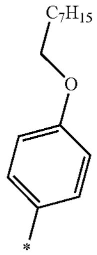
C-11
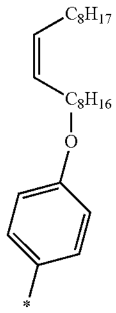
C-12
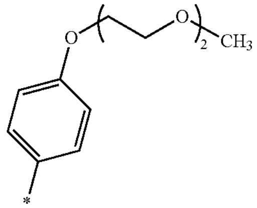
C-13
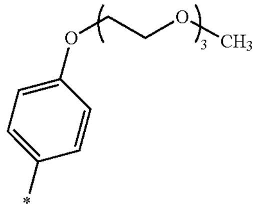
C-14
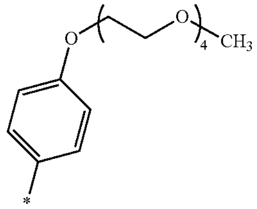

-continued
C-15
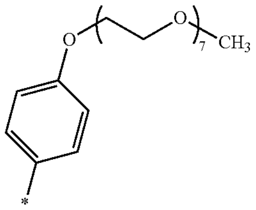
C-16
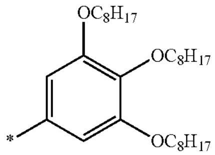
C-17
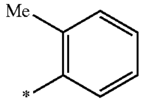
C-18
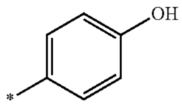
C-19
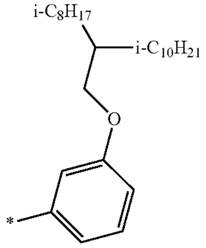
C-20
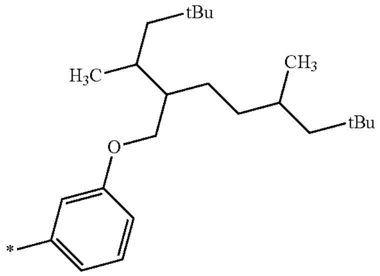
C-21
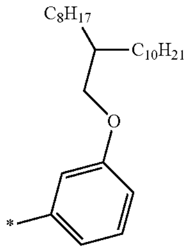
-continued
C-22
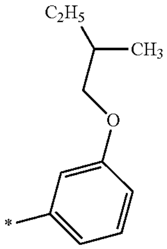
C-23
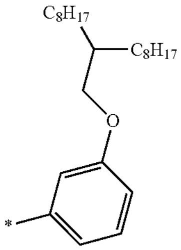
C-24
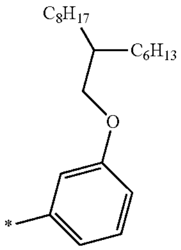
C-25
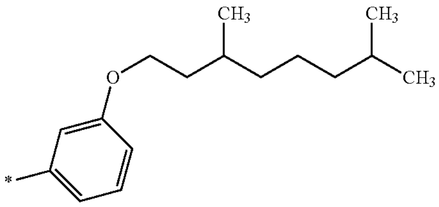
C-26
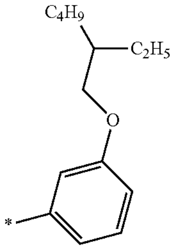
C-27
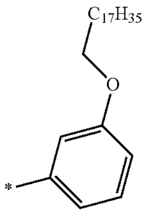

-continued
C-28
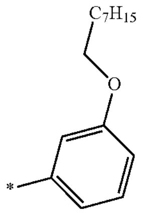
C-29
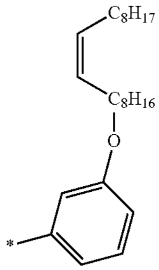
C-30
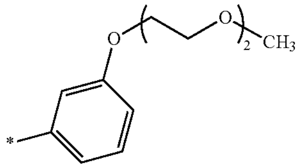
C-31
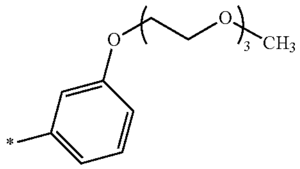
C-32
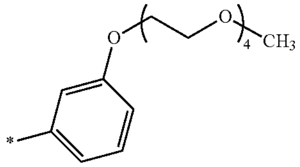
C-33
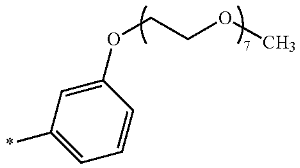
C-34
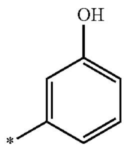
-continued
C-35
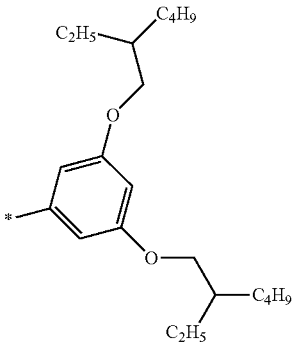
C-36
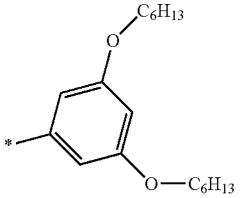
C-37
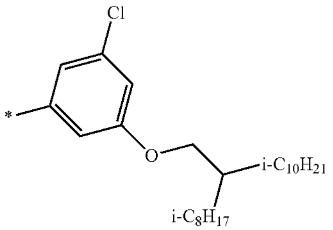
C-38
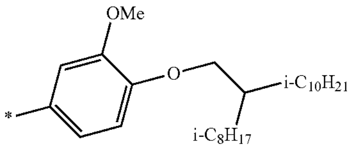
C-39
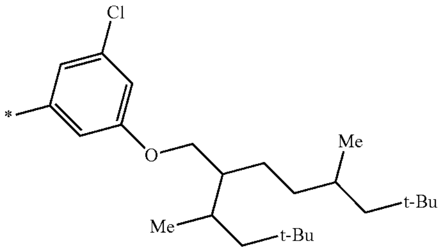
C-40
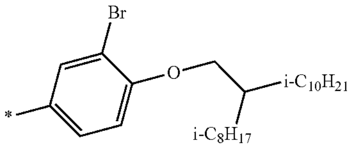
C-41
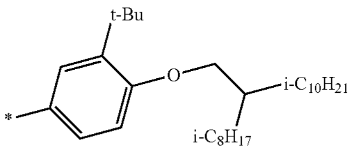
In Formula (I), $D^1$ and $D^2$ each independently represent a substituent. $D^1$ and $D^2$ may represent the same group or different groups. It is preferable that $D^1$ and $D^2$ represent the same group.

Examples of the substituent include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxyl group, a halogen atom, and a cyano group. It is preferable that $D^1$ and $D^2$ represents an electron-withdrawing group.

A substituent having a positive Hammett sigma para value (σp value) functions as an electron-withdrawing group. In the present invention, a substituent having a Hammett σp value of 0.2 or higher can be used as an example of the electron-withdrawing group. The σp value is preferably 0.25 or higher, more preferably 0.3 or higher, and still more preferably 0.35 or higher. The upper limit is not particularly limited and is preferably 0.80. Specific examples of the electron-withdrawing group include a cyano group (σp value=0.66), a carboxyl group (for example, —COOH; σp value=0.45), an alkoxycarbonyl group (—COOMe: σp value=0.45), an aryloxycarbonyl group (for example, —COOPh; σp value=0.44), a carbamoyl group (for example, —$CONH_2$; σp value=0.36), an alkylcarbonyl group (for example, —COMe; σp value=0.50), an arylcarbonyl group (for example, —COPh; σp value=0.43), an alkylsulfonyl group (for example, —$SO_2$Me; σp value=0.72), and an arylsulfonyl group (for example, —$SO_2$Ph; σp value=0.68). As the electron-withdrawing group, a cyano group, an alkylcarbonyl group, an alkylsulfonyl group, or an arylsulfonyl group is preferable, and a cyano group is more preferable. Here, Me represents a methyl group, and Ph represents a phenyl group. The details of the Hammett σp value can be found in paragraphs "0024" and "0025" of JP2009-263614A, the content of which is incorporated herein by reference.

Specific examples of $D^1$ and $D^2$ are as follows. * represents a binding site in Formula (I).

D-1

*—CN

D-2

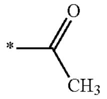

D-3

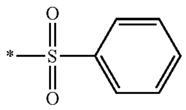

D-4

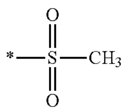

It is preferable that the pyrrolopyrrole compound is a compound represented by the following Formula (II) or a compound represented by the following Formula (III). According to this aspect, a film having excellent infrared shielding properties and light fastness can be manufactured.

(II)

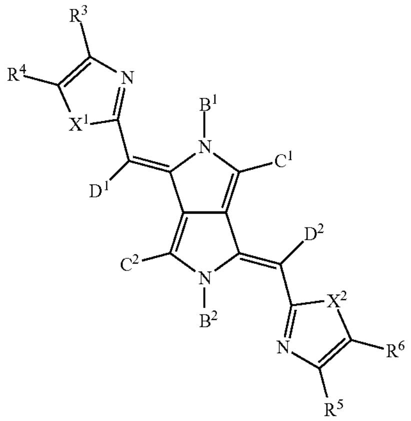

(III)

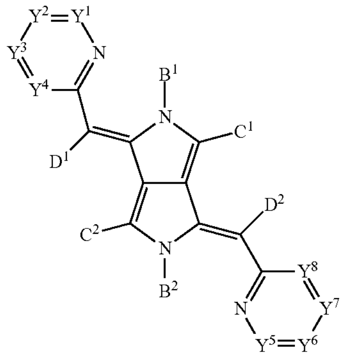

In Formula (II), $X^1$ and $X^2$ each independently represent O, S, $NR^{X1}$, or $CR^{X2}R^{X3}$, and $R^{X1}$ to $R^{X3}$ each independently represent a hydrogen atom or a substituent.

$R^3$ to $R^6$ each independently represent a hydrogen atom or a substituent.

$R^3$ and $R^4$, or $R^5$ and $R^6$ may be bonded to form a ring.

$B^1$ and $B^2$ each independently represent a —$BR^1R^2$ group, $R^1$ and $R^2$ each independently represent a substituent, and $R^1$ and $R^2$ may be bonded to each other to form a ring.

$C^1$ and $C^2$ each independently represent an alkyl group, an aryl group, or a heteroaryl group.

$D^1$ and $D^2$ each independently represent a substituent.

$B^1$, $B^2$, $C^1$, $C^2$, $D^1$, and $D^2$ in Formula (II) have the same definitions and the preferable ranges as $B^1$, $B^2$, $C^1$, $C^2$, $D^1$, and $D^2$ in Formula (I). $X^1$ and $X^2$ in Formula (II) have the same definitions and the same preferable ranges as $X^1$ in Formula (A-1). $R^3$ to $R^6$ in Formula (II) have the same definitions and the same preferable ranges as $R^3$ and $R^4$ in Formula (A-1).

In Formula (III), $Y^1$ to $Y^8$ each independently represent N or $CR^{Y1}$, at least two of $Y^1$, $Y^2$, $Y^3$, or $Y^4$ represent $CR^{Y1}$, at least two of $Y^5$, $Y^6$, $Y^7$, or $Y^8$ represent $CR^{Y1}$, $R^{Y1}$ represents a hydrogen atom or a substituent, and adjacent $R^{Y1}$'s may be bonded to each other to form a ring.

$B^1$ and $B^2$ each independently represent a —$BR^1R^2$ group, $R^1$ and $R^2$ each independently represent a substituent, and $R^1$ and $R^2$ may be bonded to each other to form a ring.

$C^1$ and $C^2$ each independently represent an alkyl group, an aryl group, or a heteroaryl group.

$D^1$ and $D^2$ each independently represent a substituent.

$B^1$, $B^2$, $C^1$, $C^2$, $D^1$, and $D^2$ in Formula (III) have the same definitions and the preferable ranges as $B^1$, $B^2$, $C^1$, $C^2$, $D^1$, and $D^2$ in Formula (I). $Y^1$ to $Y^8$ in Formula (III) have the same definitions and the same preferable ranges as $Y^1$ to $Y^4$ in Formula (A-2).

Specific examples of the pyrrolopyrrole compound include the following compounds. Reference numerals described in "$B^1$ and $B^2$ structures" and "$C^1$ and $C^2$ structures" in the following tables represent the groups shown as the specific examples of $B^1$, $B^2$, $C^1$, and $C^2$. In addition, specific examples of the pyrrolopyrrole compound include a compound described in paragraphs "0049" to "0058" of JP2009-263614A, the content of which is incorporated herein by reference.

TABLE 1

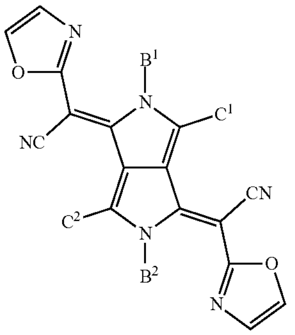

| No. | $B^1$ and $B^2$ structures | $C^1$ and $C^2$ structures |
|---|---|---|
| II-1 | B-1 | C-1 |
| II-2 | B-1 | C-2 |
| II-3 | B-1 | C-19 |
| II-4 | B-1 | C-20 |
| II-5 | B-7 | C-1 |
| II-6 | B-7 | C-2 |
| II-7 | B-7 | C-19 |
| II-8 | B-7 | C-20 |

TABLE 2

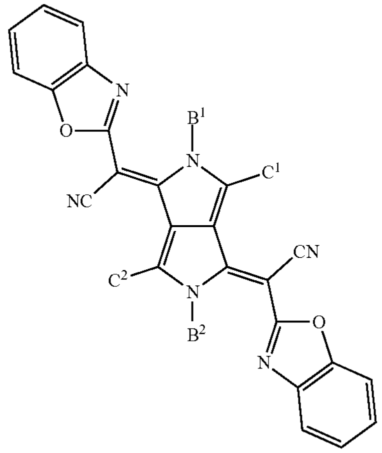

| No. | $B^1$ and $B^2$ structures | $C^1$ and $C^2$ structures |
|---|---|---|
| II-9 | B-1 | C-1 |
| II-10 | B-1 | C-2 |
| II-11 | B-1 | C-3 |
| II-12 | B-1 | C-4 |
| II-13 | B-1 | C-5 |
| II-14 | B-1 | C-6 |
| II-15 | B-1 | C-7 |
| II-16 | B-1 | C-8 |
| II-17 | B-1 | C-9 |
| II-18 | B-1 | C-10 |
| II-19 | B-1 | C-11 |
| II-20 | B-1 | C-12 |
| II-21 | B-1 | C-13 |
| II-22 | B-1 | C-14 |
| II-23 | B-1 | C-15 |
| II-24 | B-1 | C-16 |
| II-25 | B-1 | C-17 |
| II-26 | B-1 | C-18 |
| II-27 | B-1 | C-19 |
| II-28 | B-1 | C-20 |
| II-29 | B-1 | C-21 |
| II-30 | B-1 | C-22 |
| II-31 | B-1 | C-23 |
| II-32 | B-1 | C-24 |
| II-33 | B-1 | C-25 |
| II-34 | B-1 | C-26 |
| II-35 | B-1 | C-27 |
| II-36 | B-1 | C-28 |
| II-37 | B-1 | C-29 |
| II-38 | B-1 | C-30 |
| II-39 | B-1 | C-31 |
| II-40 | B-1 | C-32 |
| II-41 | B-1 | C-33 |
| II-42 | B-1 | C-34 |
| II-43 | B-2 | C-1 |
| II-44 | B-2 | C-2 |
| II-45 | B-2 | C-3 |
| II-46 | B-2 | C-19 |
| II-47 | B-2 | C-20 |
| II-48 | B-2 | C-21 |
| II-49 | B-3 | C-1 |
| II-50 | B-3 | C-2 |
| II-51 | B-3 | C-3 |
| II-52 | B-3 | C-19 |
| II-53 | B-3 | C-20 |
| II-54 | B-3 | C-21 |
| II-55 | B-4 | C-1 |
| II-56 | B-4 | C-2 |
| II-57 | B-4 | C-3 |
| II-58 | B-4 | C-19 |
| II-59 | B-4 | C-20 |
| II-60 | B-4 | C-21 |
| II-61 | B-5 | C-1 |
| II-62 | B-5 | C-2 |
| II-63 | B-5 | C-3 |

TABLE 2-continued

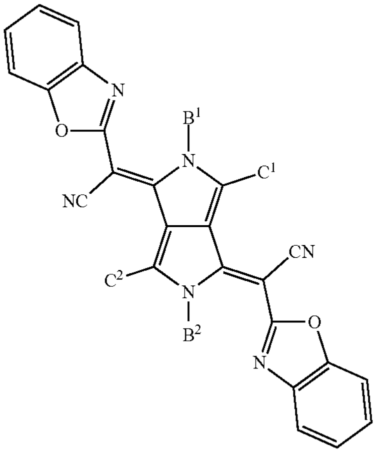

| No. | $B^1$ and $B^2$ structures | $C^1$ and $C^2$ structures |
|---|---|---|
| II-64 | B-5 | C-19 |
| II-65 | B-5 | C-20 |
| II-66 | B-5 | C-21 |
| II-67 | B-6 | C-1 |
| II-68 | B-6 | C-2 |
| II-69 | B-6 | C-3 |
| II-70 | B-6 | C-19 |
| II-71 | B-6 | C-20 |
| II-72 | B-6 | C-21 |

TABLE 3

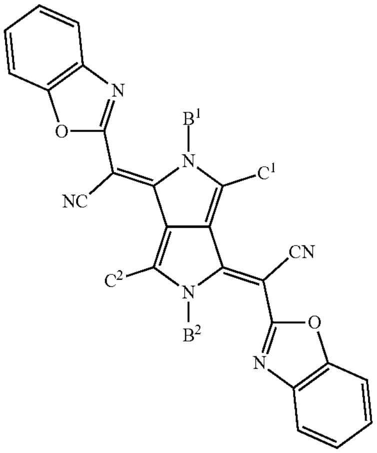

| No. | $B^1$ and $B^2$ structures | $C^1$ and $C^2$ structures |
|---|---|---|
| II-73 | B-7 | C-1 |
| II-74 | B-7 | C-2 |
| II-75 | B-7 | C-3 |
| II-76 | B-7 | C-4 |
| II-77 | B-7 | C-5 |
| II-78 | B-7 | C-6 |
| II-79 | B-7 | C-7 |
| II-80 | B-7 | C-8 |
| II-81 | B-7 | C-9 |
| II-82 | B-7 | C-10 |
| II-83 | B-7 | C-11 |
| II-84 | B-7 | C-12 |
| II-85 | B-7 | C-13 |
| II-86 | B-7 | C-14 |
| II-87 | B-7 | C-15 |

TABLE 3-continued

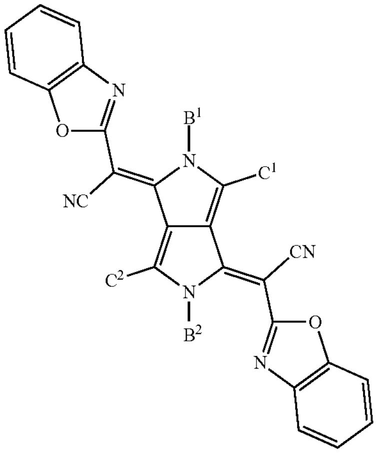

| No. | $B^1$ and $B^2$ structures | $C^1$ and $C^2$ structures |
|---|---|---|
| II-88 | B-7 | C-16 |
| II-89 | B-7 | C-17 |
| II-90 | B-7 | C-18 |
| II-91 | B-7 | C-19 |
| II-92 | B-7 | C-20 |
| II-93 | B-7 | C-21 |
| II-94 | B-7 | C-22 |
| II-95 | B-7 | C-23 |
| II-96 | B-7 | C-24 |
| II-97 | B-7 | C-25 |
| II-98 | B-7 | C-26 |
| II-99 | B-7 | C-27 |
| II-100 | B-7 | C-28 |
| II-101 | B-7 | C-29 |
| II-102 | B-7 | C-30 |
| II-103 | B-7 | C-31 |
| II-104 | B-7 | C-32 |
| II-105 | B-7 | C-33 |
| II-106 | B-7 | C-34 |
| II-107 | B-8 | C-1 |
| II-108 | B-8 | C-2 |
| II-109 | B-8 | C-3 |
| II-110 | B-8 | C-19 |
| II-111 | B-8 | C-20 |
| II-112 | B-8 | C-21 |
| II-113 | B-9 | C-1 |
| II-114 | B-9 | C-2 |
| II-115 | B-9 | C-3 |
| II-116 | B-9 | C-19 |
| II-117 | B-9 | C-20 |
| II-118 | B-9 | C-21 |
| II-119 | B-10 | C-1 |
| II-120 | B-10 | C-2 |
| II-121 | B-10 | C-3 |
| II-122 | B-10 | C-19 |
| II-123 | B-10 | C-20 |
| II-124 | B-10 | C-21 |
| II-125 | B-11 | C-1 |
| II-126 | B-11 | C-2 |
| II-127 | B-11 | C-3 |
| II-128 | B-11 | C-19 |
| II-129 | B-11 | C-20 |
| II-130 | B-11 | C-21 |
| II-131 | B-12 | C-1 |
| II-132 | B-12 | C-2 |
| II-133 | B-12 | C-3 |
| II-134 | B-12 | C-19 |
| II-135 | B-12 | C-20 |
| II-136 | B-12 | C-21 |

TABLE 4

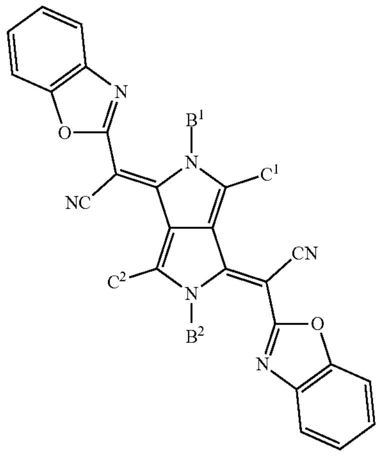

| No. | B[1] and B[2] structures | C[1] and C[2] structures |
|---|---|---|
| II-137 | B-13 | C-1 |
| II-138 | B-13 | C-2 |
| II-139 | B-13 | C-3 |
| II-140 | B-13 | C-19 |
| II-141 | B-13 | C-20 |
| II-142 | B-13 | C-21 |
| II-143 | B-14 | C-1 |
| II-144 | B-14 | C-2 |
| II-145 | B-14 | C-3 |
| II-146 | B-14 | C-19 |
| II-147 | B-14 | C-20 |
| II-148 | B-14 | C-21 |
| II-149 | B-15 | C-1 |
| II-150 | B-15 | C-2 |
| II-151 | B-15 | C-3 |
| II-152 | B-15 | C-19 |
| II-153 | B-15 | C-20 |
| II-154 | B-15 | C-21 |
| II-155 | B-16 | C-1 |
| II-156 | B-16 | C-2 |
| II-157 | B-16 | C-3 |
| II-158 | B-16 | C-19 |
| II-159 | B-16 | C-20 |
| II-160 | B-16 | C-21 |
| II-161 | B-17 | C-1 |
| II-162 | B-17 | C-2 |
| II-163 | B-17 | C-3 |
| II-164 | B-17 | C-19 |
| II-165 | B-17 | C-20 |
| II-166 | B-17 | C-21 |

TABLE 5

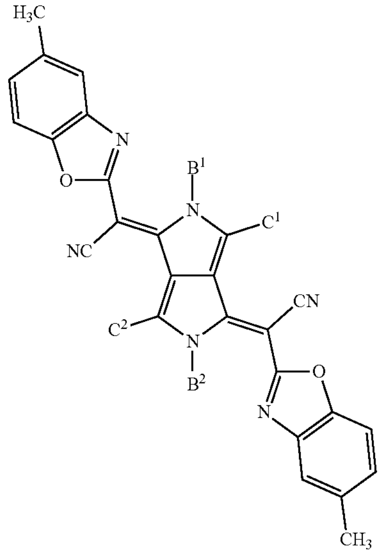

| No. | B[1] and B[2] structures | C[1] and C[2] structures |
|---|---|---|
| II-167 | B-1 | C-1 |
| II-168 | B-1 | C-2 |
| II-169 | B-1 | C-3 |
| II-170 | B-1 | C-4 |
| II-171 | B-1 | C-5 |
| II-172 | B-1 | C-6 |
| II-173 | B-1 | C-7 |
| II-174 | B-1 | C-8 |
| II-175 | B-1 | C-9 |
| II-176 | B-1 | C-10 |
| II-177 | B-1 | C-11 |
| II-178 | B-1 | C-12 |
| II-179 | B-1 | C-13 |
| II-180 | B-1 | C-14 |
| II-181 | B-1 | C-15 |
| II-182 | B-1 | C-16 |
| II-183 | B-1 | C-17 |
| II-184 | B-1 | C-18 |
| II-185 | B-1 | C-19 |
| II-186 | B-1 | C-20 |
| II-187 | B-1 | C-21 |
| II-188 | B-1 | C-22 |
| II-189 | B-1 | C-23 |
| II-190 | B-1 | C-24 |
| II-191 | B-1 | C-25 |
| II-192 | B-1 | C-26 |
| II-193 | B-1 | C-27 |
| II-194 | B-1 | C-28 |
| II-195 | B-1 | C-29 |
| II-196 | B-1 | C-30 |
| II-197 | B-1 | C-31 |
| II-198 | B-1 | C-32 |
| II-199 | B-1 | C-33 |
| II-200 | B-1 | C-34 |
| II-201 | B-2 | C-1 |
| II-202 | B-2 | C-2 |
| II-203 | B-2 | C-3 |
| II-204 | B-2 | C-19 |
| II-205 | B-2 | C-20 |
| II-206 | B-2 | C-21 |
| II-207 | B-3 | C-1 |
| II-208 | B-3 | C-2 |
| II-209 | B-3 | C-3 |
| II-210 | B-3 | C-19 |
| II-211 | B-3 | C-20 |
| II-212 | B-3 | C-21 |
| II-213 | B-4 | C-1 |
| II-214 | B-4 | C-1 |
| II-215 | B-4 | C-3 |
| II-216 | B-4 | C-19 |

TABLE 5-continued

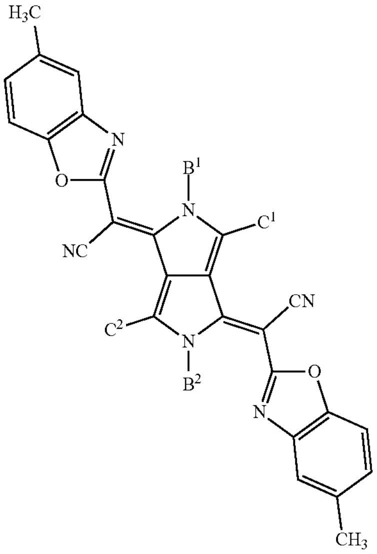

| No. | $B^1$ and $B^2$ structures | $C^1$ and $C^2$ structures |
|---|---|---|
| II-217 | B-4 | C-20 |
| II-218 | B-4 | C-21 |
| II-219 | B-5 | C-1 |
| II-220 | B-5 | C-2 |
| II-221 | B-5 | C-3 |
| II-222 | B-5 | C-19 |
| II-223 | B-5 | C-20 |
| II-224 | B-5 | C-21 |
| II-225 | B-6 | C-1 |
| II-226 | B-6 | C-2 |
| II-227 | B-6 | C-3 |
| II-228 | B-6 | C-19 |
| II-229 | B-6 | C-20 |
| II-230 | B-6 | C-21 |

TABLE 6

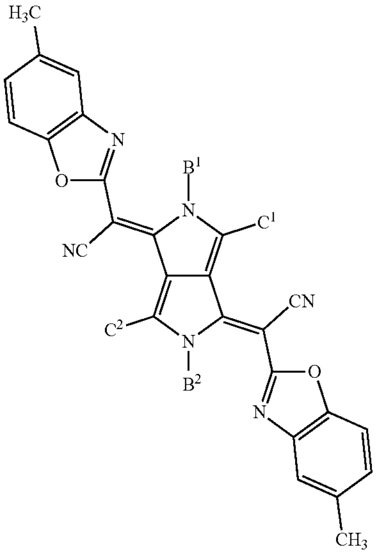

| No. | $B^1$ and $B^2$ structures | $C^1$ and $C^2$ structures |
|---|---|---|
| II-231 | B-7 | C-1 |
| II-232 | B-7 | C-2 |

TABLE 6-continued

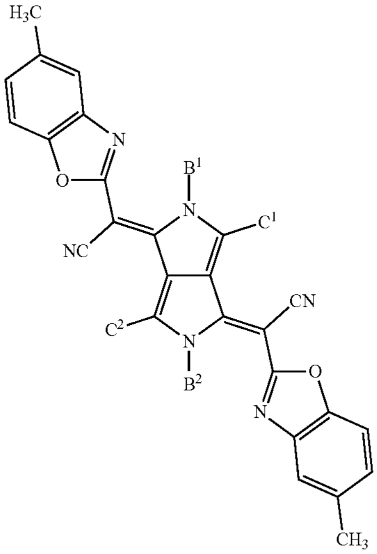

| No. | $B^1$ and $B^2$ structures | $C^1$ and $C^2$ structures |
|---|---|---|
| II-233 | B-7 | C-3 |
| II-234 | B-7 | C-4 |
| II-235 | B-7 | C-5 |
| II-236 | B-7 | C-6 |
| II-237 | B-7 | C-7 |
| II-238 | B-7 | C-8 |
| II-239 | B-7 | C-9 |
| II-240 | B-7 | C-10 |
| II-241 | B-7 | C-11 |
| II-242 | B-7 | C-12 |
| II-243 | B-7 | C-13 |
| II-244 | B-7 | C-14 |
| II-245 | B-7 | C-15 |
| II-246 | B-7 | C-16 |
| II-247 | B-7 | C-17 |
| II-248 | B-7 | C-18 |
| II-249 | B-7 | C-19 |
| II-250 | B-7 | C-20 |
| II-251 | B-7 | C-21 |
| II-252 | B-7 | C-22 |
| II-253 | B-7 | C-23 |
| II-254 | B-7 | C-24 |
| II-255 | B-7 | C-25 |
| II-256 | B-7 | C-26 |
| II-257 | B-7 | C-27 |
| II-258 | B-7 | C-28 |
| II-259 | B-7 | C-29 |
| II-260 | B-7 | C-30 |
| II-261 | B-7 | C-31 |
| II-262 | B-7 | C-32 |
| II-263 | B-7 | C-33 |
| II-264 | B-7 | C-34 |
| II-265 | B-8 | C-1 |
| II-266 | B-8 | C-2 |
| II-267 | B-8 | C-3 |
| II-268 | B-8 | C-19 |
| II-269 | B-8 | C-20 |
| II-270 | B-8 | C-21 |
| II-271 | B-9 | C-1 |
| II-272 | B-9 | C-2 |
| II-273 | B-9 | C-3 |
| II-274 | B-9 | C-19 |
| II-275 | B-9 | C-20 |
| II-276 | B-9 | C-21 |
| II-277 | B-10 | C-1 |
| II-278 | B-10 | C-2 |
| II-279 | B-10 | C-3 |
| II-280 | B-10 | C-19 |
| II-281 | B-10 | C-20 |

TABLE 6-continued

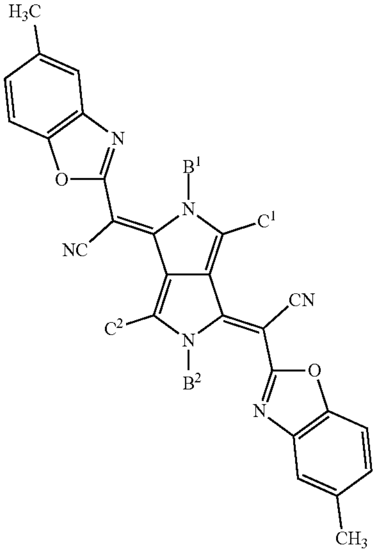

| No. | $B^1$ and $B^2$ structures | $C^1$ and $C^2$ structures |
|---|---|---|
| II-282 | B-10 | C-21 |
| II-283 | B-11 | C-1 |
| II-284 | B-11 | C-2 |
| II-285 | B-11 | C-3 |
| II-286 | B-11 | C-19 |
| II-287 | B-11 | C-20 |
| II-288 | B-11 | C-21 |
| II-289 | B-12 | C-1 |
| II-290 | B-12 | C-2 |
| II-291 | B-12 | C-3 |
| II-292 | B-12 | C-19 |
| II-293 | B-12 | C-20 |
| II-294 | B-12 | C-21 |

TABLE 7

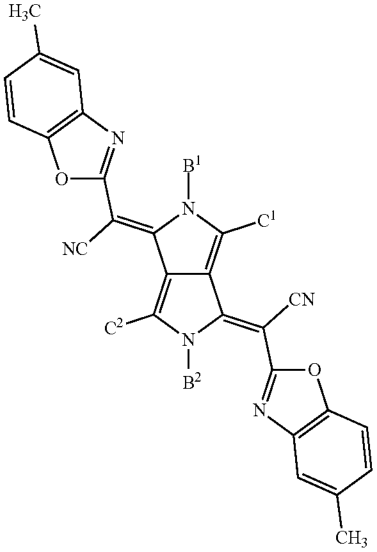

| No. | $B^1$ and $B^2$ structures | $C^1$ and $C^2$ structures |
|---|---|---|
| II-295 | B-13 | C-1 |
| II-296 | B-13 | C-2 |

TABLE 7-continued

| | | |
|---|---|---|
| II-297 | B-13 | C-3 |
| II-298 | B-13 | C-19 |
| II-299 | B-13 | C-20 |
| II-300 | B-13 | C-21 |
| II-301 | B-14 | C-1 |
| II-302 | B-14 | C-2 |
| II-303 | B-14 | C-3 |
| II-304 | B-14 | C-19 |
| II-305 | B-14 | C-20 |
| II-306 | B-14 | C-21 |
| II-307 | B-15 | C-1 |
| II-308 | B-15 | C-2 |
| II-309 | B-15 | C-3 |
| II-310 | B-15 | C-19 |
| II-311 | B-15 | C-20 |
| II-312 | B-15 | C-21 |
| II-313 | B-16 | C-1 |
| II-314 | B-16 | C-2 |
| II-315 | B-16 | C-3 |
| II-316 | B-16 | C-19 |
| II-317 | B-16 | C-20 |
| II-318 | B-16 | C-21 |
| II-319 | B-17 | C-1 |
| II-320 | B-17 | C-2 |
| II-321 | B-17 | C-3 |
| II-322 | B-17 | C-19 |
| II-323 | B-17 | C-20 |
| II-324 | B-17 | C-21 |

TABLE 8

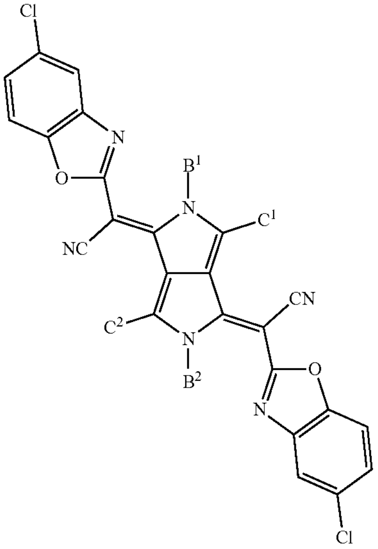

| No. | $B^1$ and $B^2$ structures | $C^1$ and $C^2$ structures |
|---|---|---|
| II-325 | B-1 | C-1 |
| II-326 | B-1 | C-2 |
| II-327 | B-1 | C-3 |
| II-328 | B-1 | C-4 |
| II-329 | B-1 | C-5 |
| II-330 | B-1 | C-6 |
| II-331 | B-1 | C-7 |
| II-332 | B-1 | C-8 |
| II-333 | B-1 | C-9 |
| II-334 | B-1 | C-10 |
| II-335 | B-1 | C-11 |
| II-336 | B-1 | C-12 |
| II-337 | B-1 | C-13 |
| II-338 | B-1 | C-14 |
| II-339 | B-1 | C-15 |
| II-340 | B-1 | C-16 |
| II-341 | B-1 | C-17 |

TABLE 8-continued

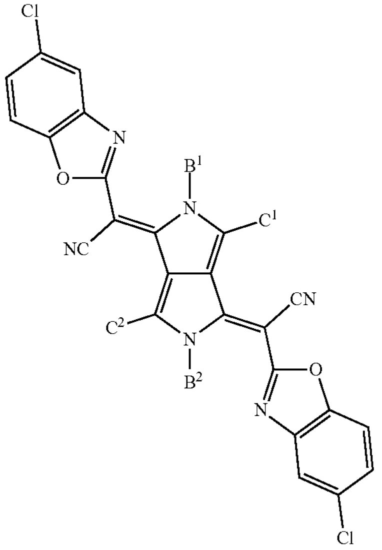

| No. | $B^1$ and $B^2$ structures | $C^1$ and $C^2$ structures |
|---|---|---|
| II-342 | B-1 | C-18 |
| II-343 | B-1 | C-19 |
| II-344 | B-1 | C-20 |
| II-345 | B-1 | C-21 |
| II-346 | B-1 | C-22 |
| II-347 | B-1 | C-23 |
| II-348 | B-1 | C-24 |
| II-349 | B-1 | C-25 |
| II-350 | B-1 | C-26 |
| II-351 | B-1 | C-27 |
| II-352 | B-1 | C-28 |
| II-353 | B-1 | C-29 |
| II-354 | B-1 | C-30 |
| II-355 | B-1 | C-31 |
| II-356 | B-1 | C-32 |
| II-357 | B-1 | C-33 |
| II-358 | B-1 | C-34 |
| II-359 | B-2 | C-1 |
| II-360 | B-2 | C-2 |
| II-361 | B-2 | C-3 |
| II-362 | B-2 | C-19 |
| II-363 | B-2 | C-20 |
| II-364 | B-2 | C-21 |
| II-365 | B-3 | C-1 |
| II-366 | B-3 | C-2 |
| II-367 | B-3 | C-3 |
| II-368 | B-3 | C-19 |
| II-369 | B-3 | C-20 |
| II-370 | B-3 | C-21 |
| II-371 | B-4 | C-1 |
| II-372 | B-4 | C-2 |
| II-373 | B-4 | C-3 |
| II-374 | B-4 | C-19 |
| II-375 | B-4 | C-20 |
| II-376 | B-4 | C-21 |
| II-377 | B-5 | C-1 |
| II-378 | B-5 | C-2 |
| II-379 | B-5 | C-3 |
| II-380 | B-5 | C-19 |
| II-381 | B-5 | C-20 |
| II-382 | B-5 | C-21 |
| II-383 | B-6 | C-1 |
| II-384 | B-6 | C-2 |
| II-385 | B-6 | C-3 |
| II-386 | B-6 | C-19 |
| II-387 | B-6 | C-20 |
| II-388 | B-6 | C-21 |

TABLE 9

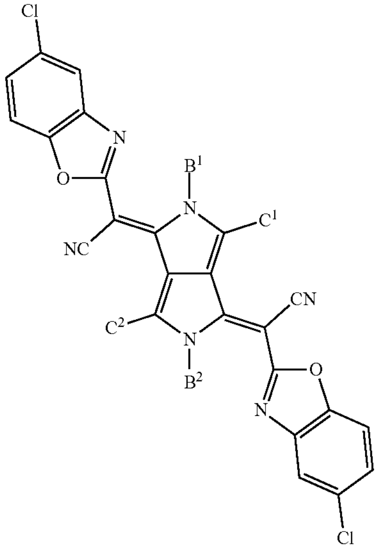

| No. | $B^1$ and $B^2$ structures | $C^1$ and $C^2$ structures |
|---|---|---|
| II-389 | B-7 | C-1 |
| II-390 | B-7 | C-2 |
| II-391 | B-7 | C-3 |
| II-392 | B-7 | C-4 |
| II-393 | B-7 | C-5 |
| II-394 | B-7 | C-6 |
| II-395 | B-7 | C-7 |
| II-396 | B-7 | C-8 |
| II-397 | B-7 | C-9 |
| II-398 | B-7 | C-10 |
| II-399 | B-7 | C-11 |
| II-400 | B-7 | C-12 |
| II-401 | B-7 | C-13 |
| II-402 | B-7 | C-14 |
| II-403 | B-7 | C-15 |
| II-404 | B-7 | C-16 |
| II-405 | B-7 | C-17 |
| II-406 | B-7 | C-18 |
| II-407 | B-7 | C-19 |
| II-408 | B-7 | C-20 |
| II-409 | B-7 | C-21 |
| II-410 | B-7 | C-22 |
| II-411 | B-7 | C-23 |
| II-412 | B-7 | C-24 |
| II-413 | B-7 | C-25 |
| II-414 | B-7 | C-26 |
| II-415 | B-7 | C-27 |
| II-416 | B-7 | C-28 |
| II-417 | B-7 | C-29 |
| II-418 | B-7 | C-30 |
| II-419 | B-7 | C-31 |
| II-420 | B-7 | C-32 |
| II-421 | B-7 | C-33 |
| II-422 | B-7 | C-34 |
| II-423 | B-8 | C-1 |
| II-424 | B-8 | C-2 |
| II-425 | B-8 | C-3 |
| II-426 | B-8 | C-19 |
| II-427 | B-8 | C-20 |
| II-428 | B-8 | C-21 |
| II-429 | B-9 | C-1 |
| II-430 | B-9 | C-2 |
| II-431 | B-9 | C-3 |
| II-432 | B-9 | C-19 |
| II-433 | B-9 | C-20 |
| II-434 | B-9 | C-21 |
| II-435 | B-10 | C-1 |
| II-436 | B-10 | C-2 |
| II-437 | B-10 | C-3 |
| II-438 | B-10 | C-19 |

TABLE 9-continued

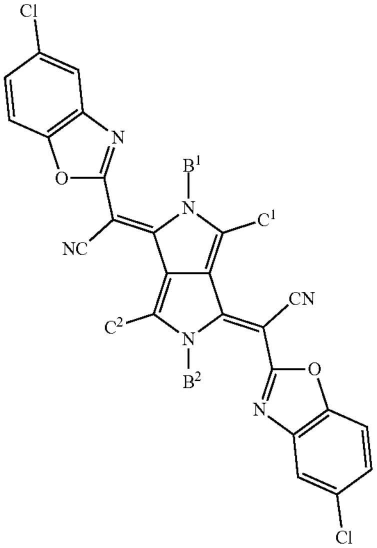

| No. | $B^1$ and $B^2$ structures | $C^1$ and $C^2$ structures |
|---|---|---|
| II-439 | B-10 | C-20 |
| II-440 | B-10 | C-21 |
| II-441 | B-11 | C-1 |
| II-442 | B-11 | C-2 |
| II-443 | B-11 | C-3 |
| II-444 | B-11 | C-19 |
| II-445 | B-11 | C-20 |
| II-446 | B-11 | C-21 |
| II-447 | B-12 | C-1 |
| II-448 | B-12 | C-2 |
| II-449 | B-12 | C-3 |
| II-450 | B-12 | C-19 |
| II-451 | B-12 | C-20 |
| II-452 | B-12 | C-21 |

TABLE 10

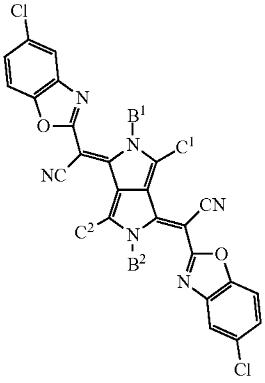

| No. | $B^1$ and $B^2$ structures | $C^1$ and $C^2$ structures |
|---|---|---|
| II-453 | B-13 | C-1 |
| II-454 | B-13 | C-2 |
| II-455 | B-13 | C-3 |
| II-456 | B-13 | C-19 |
| II-457 | B-13 | C-20 |
| II-458 | B-13 | C-21 |
| II-459 | B-14 | C-1 |
| II-460 | B-14 | C-2 |
| II-461 | B-14 | C-3 |

TABLE 10-continued

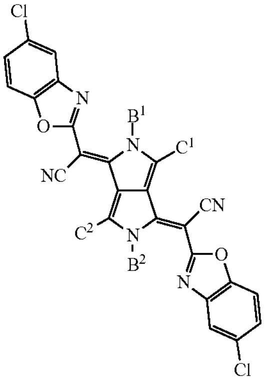

| No. | $B^1$ and $B^2$ structures | $C^1$ and $C^2$ structures |
|---|---|---|
| II-462 | B-14 | C-19 |
| II-463 | B-14 | C-20 |
| II-464 | B-14 | C-21 |
| II-465 | B-15 | C-1 |
| II-466 | B-15 | C-2 |
| II-467 | B-15 | C-3 |
| II-468 | B-15 | C-19 |
| II-469 | B-15 | C-20 |
| II-470 | B-15 | C-21 |
| II-471 | B-16 | C-1 |
| II-472 | B-16 | C-2 |
| II-473 | B-16 | C-3 |
| II-474 | B-16 | C-19 |
| II-475 | B-16 | C-20 |
| II-476 | B-16 | C-21 |
| II-477 | B-17 | C-1 |
| II-478 | B-17 | C-2 |
| II-479 | B-17 | C-3 |
| II-480 | B-17 | C-19 |
| II-481 | B-17 | C-20 |
| II-482 | B-17 | C-21 |

TABLE 11

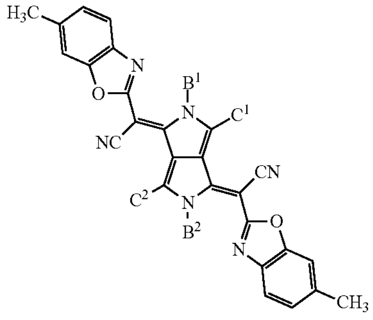

| No | $B^1$ and $B^2$ structures | $C^1$ and $C^2$ structures |
|---|---|---|
| II-483 | B-1 | C-1 |
| II-484 | B-1 | C-2 |
| II-485 | B-1 | C-19 |
| II-486 | B-1 | C-20 |
| II-487 | B-7 | C-1 |
| II-488 | B-7 | C-2 |
| II-489 | B-7 | C-19 |
| II-490 | B-7 | C-20 |

TABLE 12

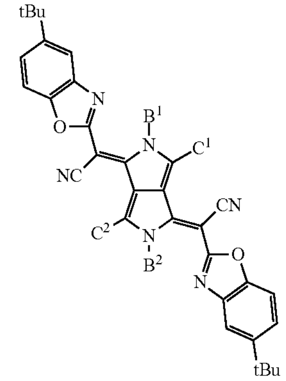

| No. | $B^1$ and $B^2$ structures | $C^1$ and $C^2$ structures |
|---|---|---|
| II-491 | B-1 | C-1 |
| II-492 | B-1 | C-2 |
| II-493 | B-1 | C-19 |
| II-494 | B-1 | C-20 |
| II-495 | B-7 | C-1 |
| II-496 | B-7 | C-2 |
| II-497 | B-7 | C-19 |
| II-498 | B-7 | C-20 |

TABLE 13

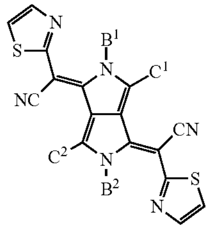

| No. | $B^1$ and $B^2$ structures | $C^1$ and $C^2$ structures |
|---|---|---|
| II-499 | B-1 | C-1 |
| II-500 | B-1 | C-2 |
| II-501 | B-1 | C-19 |
| II-502 | B-1 | C-20 |
| II-503 | B-7 | C-1 |
| II-504 | B-7 | C-2 |
| II-505 | B-7 | C-19 |
| II-506 | B-7 | C-20 |

TABLE 14

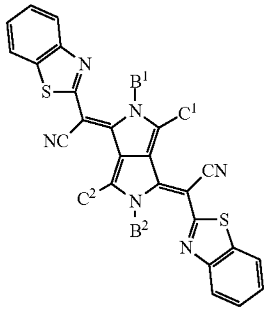

| No. | $B^1$ and $B^2$ structures | $C^1$ and $C^2$ structures |
|---|---|---|
| II-507 | B-1 | C-1 |
| II-508 | B-1 | C-2 |
| II-509 | B-1 | C-3 |
| II-510 | B-1 | C-4 |
| II-511 | B-1 | C-5 |
| II-512 | B-1 | C-6 |
| II-513 | B-1 | C-7 |
| II-514 | B-1 | C-8 |
| II-515 | B-1 | C-9 |
| II-516 | B-1 | C-10 |
| II-517 | B-1 | C-11 |
| II-518 | B-1 | C-12 |
| II-519 | B-1 | C-13 |
| II-520 | B-1 | C-14 |
| II-521 | B-1 | C-15 |
| II-522 | B-1 | C-16 |
| II-523 | B-1 | C-17 |
| II-524 | B-1 | C-18 |
| II-525 | B-1 | C-19 |
| II-526 | B-1 | C-20 |
| II-527 | B-1 | C-21 |
| II-528 | B-1 | C-22 |
| II-529 | B-1 | C-23 |
| II-530 | B-1 | C-24 |
| II-531 | B-1 | C-25 |
| II-532 | B-1 | C-26 |
| II-533 | B-1 | C-27 |
| II-534 | B-1 | C-28 |
| II-535 | B-1 | C-29 |
| II-536 | B-1 | C-30 |
| II-537 | B-1 | C-31 |
| II-538 | B-1 | C-32 |
| II-539 | B-1 | C-33 |
| II-540 | B-1 | C-34 |
| II-541 | B-2 | C-1 |
| II-542 | B-2 | C-2 |
| II-543 | B-2 | C-3 |
| II-544 | B-2 | C-19 |
| II-545 | B-2 | C-20 |
| II-546 | B-2 | C-21 |
| II-547 | B-3 | C-1 |
| II-548 | B-3 | C-2 |
| II-549 | B-3 | C-3 |
| II-550 | B-3 | C-19 |
| II-551 | B-3 | C-20 |
| II-552 | B-3 | C-21 |
| II-553 | B-4 | C-1 |
| II-554 | B-4 | C-2 |
| II-555 | B-4 | C-3 |
| II-556 | B-4 | C-19 |
| II-557 | B-4 | C-20 |
| II-558 | B-4 | C-21 |
| II-559 | B-5 | C-1 |
| II-560 | B-5 | C-2 |
| II-561 | B-5 | C-3 |
| II-562 | B-5 | C-19 |
| II-563 | B-5 | C-20 |
| II-564 | B-5 | C-21 |
| II-565 | B-6 | C-1 |
| II-566 | B-6 | C-2 |
| II-567 | B-6 | C-3 |

TABLE 14-continued

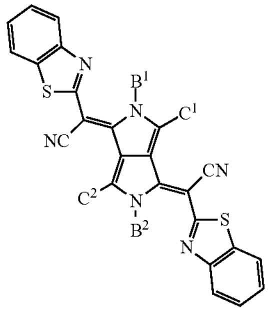

| No. | $B^1$ and $B^2$ structures | $C^1$ and $C^2$ structures |
|---|---|---|
| II-568 | B-6 | C-19 |
| II-569 | B-6 | C-20 |
| II-570 | B-6 | C-21 |

TABLE 15

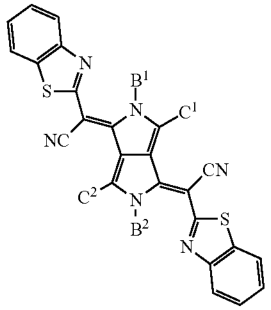

| No. | $B^1$ and $B^2$ structures | $C^1$ and $C^2$ structures |
|---|---|---|
| II-571 | B-7 | C-1 |
| II-572 | B-7 | C-2 |
| II-573 | B-7 | C-3 |
| II-574 | B-7 | C-4 |
| II-575 | B-7 | C-5 |
| II-576 | B-7 | C-6 |
| II-577 | B-7 | C-7 |
| II-578 | B-7 | C-8 |
| II-579 | B-7 | C-9 |
| II-580 | B-7 | C-10 |
| II-581 | B-7 | C-11 |
| II-582 | B-7 | C-12 |
| II-583 | B-7 | C-13 |
| II-584 | B-7 | C-14 |
| II-585 | B-7 | C-15 |
| II-586 | B-7 | C-16 |
| II-587 | B-7 | C-17 |
| II-588 | B-7 | C-18 |
| II-589 | B-7 | C-19 |
| II-590 | B-7 | C-20 |
| II-591 | B-7 | C-21 |
| II-592 | B-7 | C-22 |
| II-593 | B-7 | C-23 |
| II-594 | B-7 | C-24 |
| II-595 | B-7 | C-25 |
| II-596 | B-7 | C-26 |
| II-597 | B-7 | C-27 |
| II-598 | B-7 | C-28 |
| II-599 | B-7 | C-29 |
| II-600 | B-7 | C-30 |
| II-601 | B-7 | C-31 |
| II-602 | B-7 | C-32 |
| II-603 | B-7 | C-33 |
| II-604 | B-7 | C-34 |

TABLE 15-continued

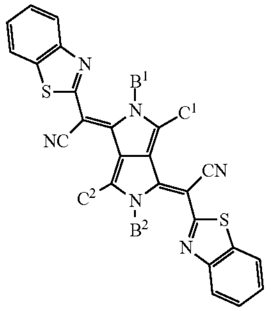

| No. | $B^1$ and $B^2$ structures | $C^1$ and $C^2$ structures |
|---|---|---|
| II-605 | B-8 | C-1 |
| II-606 | B-8 | C-2 |
| II-607 | B-8 | C-3 |
| II-608 | B-8 | C-19 |
| II-609 | B-8 | C-20 |
| II-610 | B-8 | C-21 |
| II-611 | B-9 | C-1 |
| II-612 | B-9 | C-2 |
| II-613 | B-9 | C-3 |
| II-614 | B-9 | C-19 |
| II-615 | B-9 | C-20 |
| II-616 | B-9 | C-21 |
| II-617 | B-10 | C-1 |
| II-618 | B-10 | C-2 |
| II-619 | B-10 | C-3 |
| II-620 | B-10 | C-19 |
| II-621 | B-10 | C-20 |
| II-622 | B-10 | C-21 |
| II-623 | B-11 | C-1 |
| II-624 | B-11 | C-2 |
| II-625 | B-11 | C-3 |
| II-626 | B-11 | C-19 |
| II-627 | B-11 | C-20 |
| II-628 | B-11 | C-21 |
| II-629 | B-12 | C-1 |
| II-630 | B-12 | C-2 |
| II-631 | B-12 | C-3 |
| II-632 | B-12 | C-19 |
| II-633 | B-12 | C-20 |
| II-634 | B-12 | C-21 |

TABLE 16

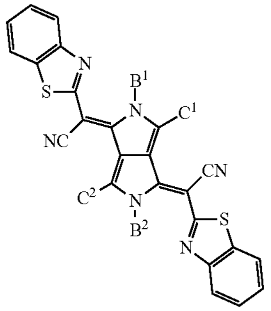

| No. | $B^1$ and $B^2$ structures | $C^1$ and $C^2$ structures |
|---|---|---|
| II-635 | B-13 | C-1 |
| II-636 | B-13 | C-2 |
| II-637 | B-13 | C-3 |
| II-638 | B-13 | C-19 |
| II-639 | B-13 | C-20 |
| II-640 | B-13 | C-21 |
| II-641 | B-14 | C-1 |

TABLE 16-continued

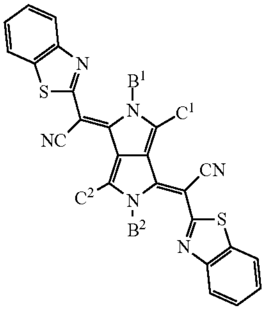

| No. | $B^1$ and $B^2$ structures | $C^1$ and $C^2$ structures |
|---|---|---|
| II-642 | B-14 | C-2 |
| II-643 | B-14 | C-3 |
| II-644 | B-14 | C-19 |
| II-645 | B-14 | C-20 |
| II-646 | B-14 | C-21 |
| II-647 | B-15 | C-1 |
| II-648 | B-15 | C-2 |
| II-649 | B-15 | C-3 |
| II-650 | B-15 | C-19 |
| II-651 | B-15 | C-20 |
| II-652 | B-15 | C-21 |
| II-653 | B-16 | C-1 |
| II-654 | B-16 | C-2 |
| II-655 | B-16 | C-3 |
| II-656 | B-16 | C-19 |
| II-657 | B-16 | C-20 |
| II-658 | B-16 | C-21 |
| II-659 | B-17 | C-1 |
| II-660 | B-17 | C-2 |
| II-661 | B-17 | C-3 |
| II-662 | B-17 | C-19 |
| II-663 | B-17 | C-20 |
| II-664 | B-17 | C-21 |

TABLE 17

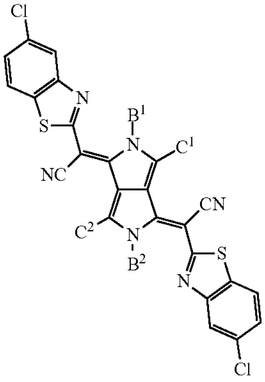

| No | $B^1$ and $B^2$ structures | $C^1$ and $C^2$ structures |
|---|---|---|
| II-665 | B-1 | C-1 |
| II-666 | B-1 | C-2 |
| II-667 | B-1 | C-19 |
| II-668 | B-1 | C-20 |
| II-669 | B-7 | C-1 |
| II-670 | B-7 | C-2 |
| II-671 | B-7 | C-19 |
| II-672 | B-7 | C-20 |

TABLE 18

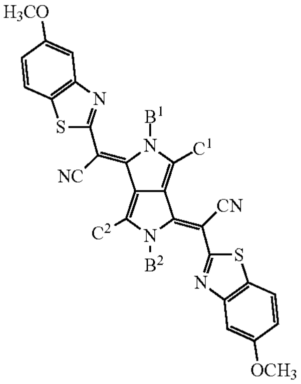

| No. | $B^1$ and $B^2$ structures | $C^1$ and $C^2$ structures |
|---|---|---|
| II-673 | B-1 | C-1 |
| II-674 | B-1 | C-2 |
| II-675 | B-1 | C-19 |
| II-676 | B-1 | C-20 |
| II-677 | B-7 | C-1 |
| II-678 | B-7 | C-2 |
| II-679 | B-7 | C-19 |
| II-680 | B-7 | C-20 |

TABLE 19

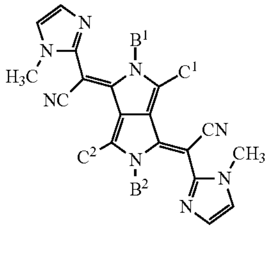

| No. | $B^1$ and $B^2$ structures | $C^1$ and $C^2$ structures |
|---|---|---|
| II-681 | B-1 | C-1 |
| II-682 | B-1 | C-2 |
| II-683 | B-1 | C-19 |
| II-684 | B-1 | C-20 |
| II-685 | B-7 | C-1 |
| II-686 | B-7 | C-2 |
| II-687 | B-7 | C-19 |
| II-688 | B-7 | C-20 |

TABLE 20
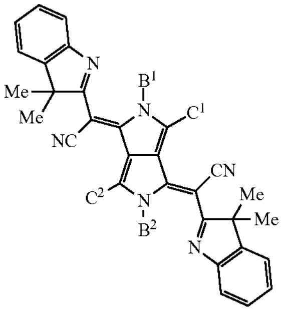
| No. | B¹ and B² structures | C¹ and C² structures |
|---|---|---|
| II-689 | B-1 | C-1 |
| II-690 | B-1 | C-2 |
| II-691 | B-1 | C-19 |
| II-692 | B-1 | C-20 |
| II-693 | B-7 | C-1 |
| II-694 | B-7 | C-2 |
| II-695 | B-7 | C-19 |
| II-696 | B-7 | C-20 |
TABLE 21
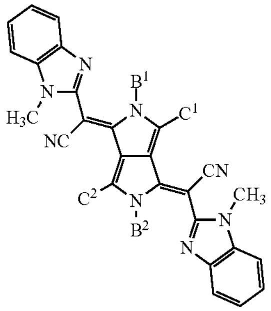
| No. | B¹ and B² structures | C¹ and C² structures |
|---|---|---|
| II-697 | B-1 | C-1 |
| II-698 | B-1 | C-2 |
| II-699 | B-1 | C-19 |
| II-700 | B-1 | C-20 |
| II-701 | B-7 | C-1 |
| II-702 | B-7 | C-2 |
| II-703 | B-7 | C-19 |
| II-704 | B-7 | C-20 |
TABLE 22
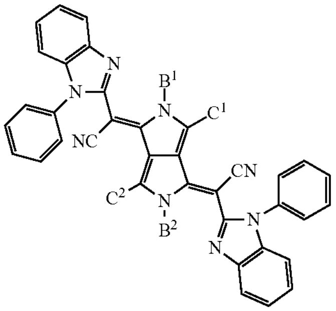
| No. | B¹ and B² structures | C¹ and C² structures |
|---|---|---|
| II-705 | B-1 | C-1 |
| II-706 | B-1 | C-2 |
| II-707 | B-1 | C-19 |
| II-708 | B-1 | C-20 |
| II-709 | B-7 | C-1 |
| II-710 | B-7 | C-2 |
| II-711 | B-7 | C-19 |
| II-712 | B-7 | C-20 |
TABLE 23
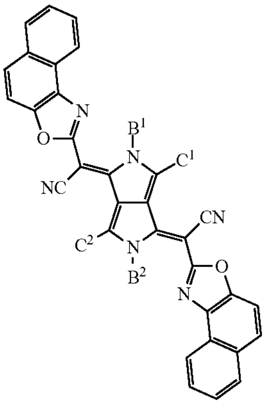
| No. | B¹ and B² structures | C¹ and C² structures |
|---|---|---|
| II-713 | B-1 | C-1 |
| II-714 | B-1 | C-2 |
| II-715 | B-1 | C-19 |
| II-716 | B-1 | C-20 |
| II-717 | B-7 | C-1 |
| II-718 | B-7 | C-2 |
| II-719 | B-7 | C-19 |
| II-720 | B-7 | C-20 |

TABLE 24

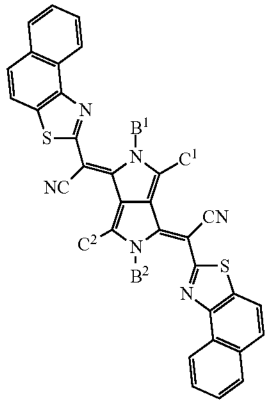

| No. | $B^1$ and $B^2$ structures | $C^1$ and $C^2$ structures |
|---|---|---|
| II-721 | B-1 | C-1 |
| II-722 | B-1 | C-2 |
| II-723 | B-1 | C-19 |
| II-724 | B-1 | C-20 |
| II-725 | B-7 | C-1 |
| II-726 | B-7 | C-2 |
| II-727 | B-7 | C-19 |
| II-728 | B-7 | C-20 |

TABLE 25

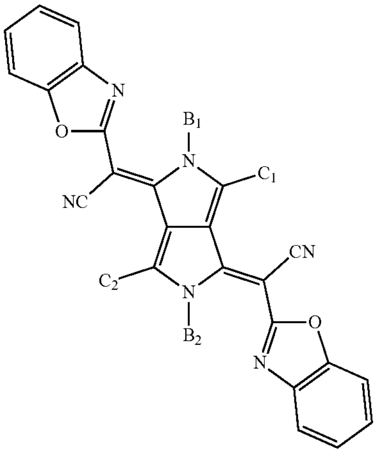

| No. | $B^1$ and $B^2$ structures | $C^1$ and $C^2$ structures |
|---|---|---|
| II-729 | B-1 | C-35 |
| II-730 | B-1 | C-36 |
| II-731 | B-1 | C-37 |
| II-732 | B-1 | C-38 |
| II-733 | B-1 | C-39 |
| II-734 | B-1 | C-40 |
| II-735 | B-1 | C-41 |
| II-736 | B-7 | C-35 |
| II-737 | B-7 | C-36 |
| II-738 | B-7 | C-37 |
| II-739 | B-7 | C-38 |
| II-740 | B-7 | C-39 |
| II-741 | B-7 | C-40 |
| II-742 | B-7 | C-41 |

TABLE 26

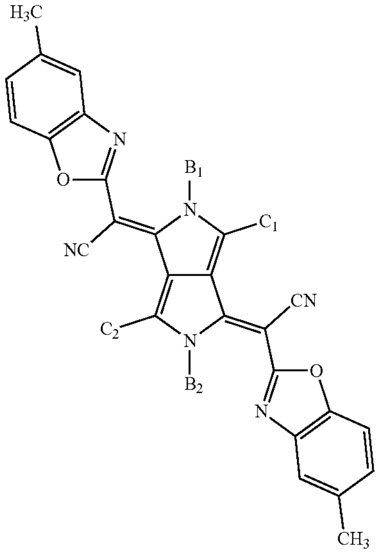

| No. | $B^1$ and $B^2$ structures | $C^1$ and $C^2$ structures |
|---|---|---|
| II-743 | B-1 | C-35 |
| II-744 | B-1 | C-36 |
| II-745 | B-1 | C-37 |
| II-746 | B-1 | C-38 |
| II-747 | B-1 | C-39 |
| II-748 | B-1 | C-40 |
| II-749 | B-1 | C-41 |
| II-750 | B-7 | C-35 |
| II-751 | B-7 | C-36 |
| II-752 | B-7 | C-37 |
| II-753 | B-7 | C-38 |
| II-754 | B-7 | C-39 |
| II-755 | B-7 | C-40 |
| II-756 | B-7 | C-41 |

TABLE 27

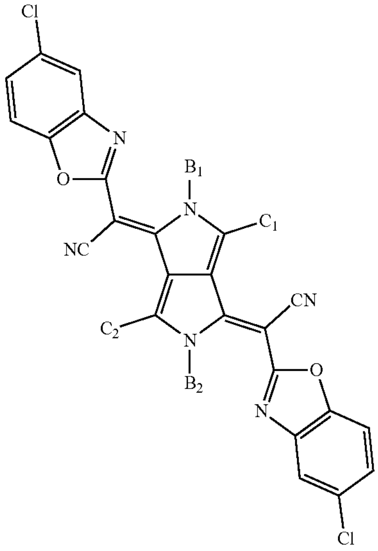

| No. | $B^1$ and $B^2$ structures | $C^1$ and $C^2$ structures |
|---|---|---|
| II-757 | B-1 | C-35 |
| II-758 | B-1 | C-36 |

TABLE 27-continued

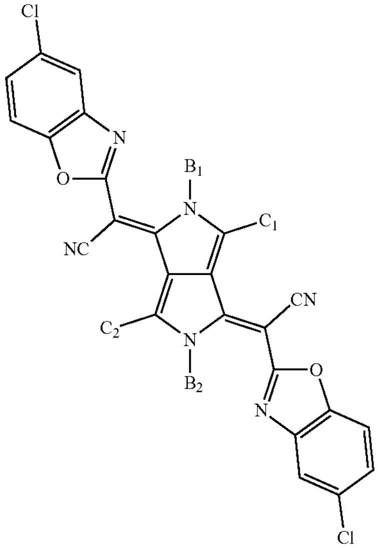

| No. | B¹ and B² structures | C¹ and C² structures |
|---|---|---|
| II-759 | B-1 | C-37 |
| II-760 | B-1 | C-38 |
| II-761 | B-1 | C-39 |
| II-762 | B-1 | C-40 |
| II-763 | B-1 | C-41 |
| II-764 | B-7 | C-35 |
| II-765 | B-7 | C-36 |
| II-766 | B-7 | C-37 |
| II-767 | B-7 | C-38 |
| II-768 | B-7 | C-39 |
| II-769 | B-7 | C-40 |
| II-770 | B-7 | C-41 |

TABLE 28

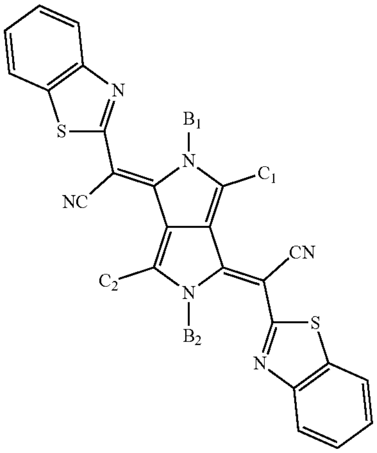

| No. | B¹ and B² structures | C¹ and C² structures |
|---|---|---|
| II-771 | B-1 | C-35 |
| II-772 | B-1 | C-36 |
| II-773 | B-1 | C-37 |
| II-774 | B-1 | C-38 |
| II-775 | B-1 | C-39 |
| II-776 | B-1 | C-40 |
| II-777 | B-1 | C-41 |
| II-778 | B-7 | C-35 |

TABLE 28-continued

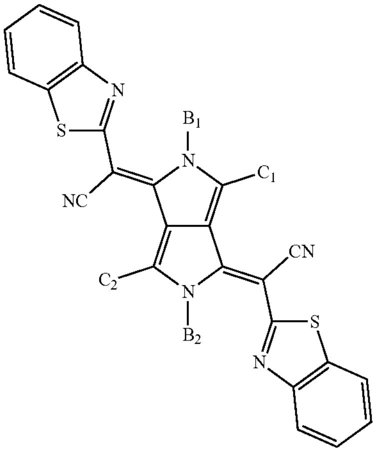

| No. | B¹ and B² structures | C¹ and C² structures |
|---|---|---|
| II-779 | B-7 | C-36 |
| II-780 | B-7 | C-37 |
| II-781 | B-7 | C-38 |
| II-782 | B-7 | C-39 |
| II-783 | B-7 | C-40 |
| II-784 | B-7 | C-41 |

TABLE 29

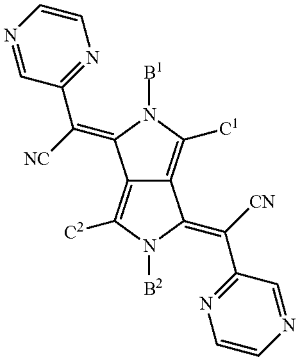

| No. | B¹ and B² structures | C¹ and C² structures |
|---|---|---|
| III-1 | B-1 | C-1 |
| III-2 | B-1 | C-2 |
| III-3 | B-1 | C-19 |
| III-4 | B-1 | C-20 |
| III-5 | B-7 | C-1 |
| III-6 | B-7 | C-2 |
| III-7 | B-7 | C-19 |
| III-8 | B-7 | C-20 |

TABLE 30

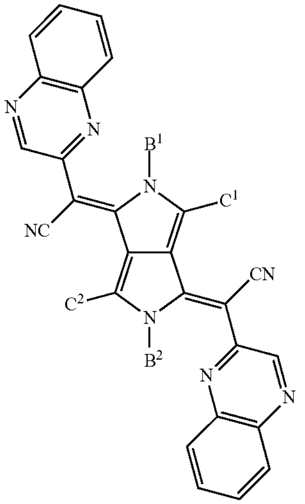

| No. | $B^1$ and $B^2$ structures | $C^1$ and $C^2$ structures |
|---|---|---|
| III-9 | B-1 | C-1 |
| III-10 | B-1 | C-2 |
| III-11 | B-1 | C-3 |
| III-12 | B-1 | C-4 |
| III-13 | B-1 | C-5 |
| III-14 | B-1 | C-6 |
| III-15 | B-1 | C-7 |
| III-16 | B-1 | C-8 |
| III-17 | B-1 | C-9 |
| III-18 | B-1 | C-10 |
| III-19 | B-1 | C-11 |
| III-20 | B-1 | C-12 |
| III-21 | B-1 | C-13 |
| III-22 | B-1 | C-14 |
| III-23 | B-1 | C-15 |
| III-24 | B-1 | C-16 |
| III-25 | B-1 | C-17 |
| III-26 | B-1 | C-18 |
| III-27 | B-1 | C-19 |
| III-28 | B-1 | C-20 |
| III-29 | B-1 | C-21 |
| III-30 | B-1 | C-22 |
| III-31 | B-1 | C-23 |
| III-32 | B-1 | C-24 |
| III-33 | B-1 | C-25 |
| III-34 | B-1 | C-26 |
| III-35 | B-1 | C-27 |
| III-36 | B-1 | C-28 |
| III-37 | B-1 | C-29 |
| III-38 | B-1 | C-30 |
| III-39 | B-1 | C-31 |
| III-40 | B-1 | C-32 |
| III-41 | B-1 | C-33 |
| III-42 | B-1 | C-34 |
| III-43 | B-2 | C-1 |
| III-44 | B-2 | C-2 |
| III-45 | B-2 | C-3 |
| III-46 | B-2 | C-19 |
| III-47 | B-2 | C-20 |
| III-48 | B-2 | C-21 |
| III-49 | B-3 | C-1 |
| III-50 | B-3 | C-2 |
| III-51 | B-3 | C-3 |
| III-52 | B-3 | C-19 |
| III-53 | B-3 | C-20 |
| III-54 | B-3 | C-21 |
| III-55 | B-4 | C-1 |
| III-56 | B-4 | C-2 |
| III-57 | B-4 | C-3 |
| III-58 | B-4 | C-19 |
| III-59 | B-4 | C-20 |
| III-60 | B-4 | C-21 |

TABLE 30-continued

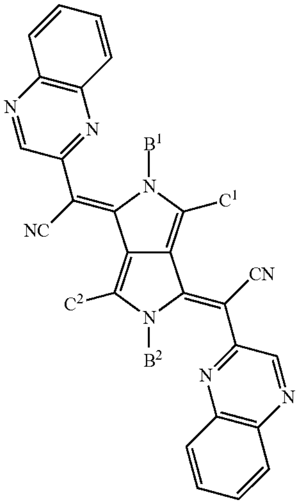

| No. | $B^1$ and $B^2$ structures | $C^1$ and $C^2$ structures |
|---|---|---|
| III-61 | B-5 | C-1 |
| III-62 | B-5 | C-2 |
| III-63 | B-5 | C-3 |
| III-64 | B-5 | C-19 |
| III-65 | B-5 | C-20 |
| III-66 | B-5 | C-21 |
| III-67 | B-6 | C-1 |
| III-68 | B-6 | C-2 |
| III-69 | B-6 | C-3 |
| III-70 | B-6 | C-19 |
| III-71 | B-6 | C-20 |
| III-72 | B-6 | C-21 |

TABLE 31

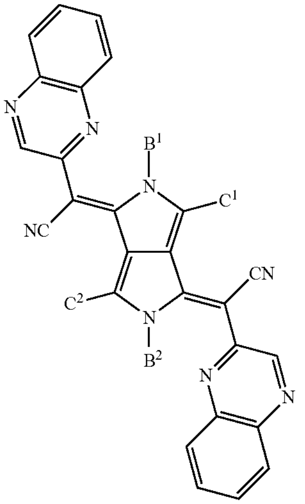

| No. | $B^1$ and $B^2$ structures | $C^1$ and $C^2$ structures |
|---|---|---|
| III-73 | B-7 | C-1 |
| III-74 | B-7 | C-2 |
| III-75 | B-7 | C-3 |
| III-76 | B-7 | C-4 |
| III-77 | B-7 | C-5 |
| III-78 | B-7 | C-6 |
| III-79 | B-7 | C-7 |

TABLE 31-continued

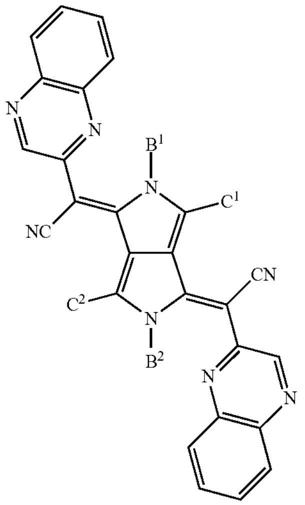

| No. | $B^1$ and $B^2$ structures | $C^1$ and $C^2$ structures |
|---|---|---|
| III-80 | B-7 | C-8 |
| III-81 | B-7 | C-9 |
| III-82 | B-7 | C-10 |
| III-83 | B-7 | C-11 |
| III-84 | B-7 | C-12 |
| III-85 | B-7 | C-13 |
| III-86 | B-7 | C-14 |
| III-87 | B-7 | C-15 |
| III-88 | B-7 | C-16 |
| III-89 | B-7 | C-17 |
| III-90 | B-7 | C-18 |
| III-91 | B-7 | C-19 |
| III-92 | B-7 | C-20 |
| III-93 | B-7 | C-21 |
| III-94 | B-7 | C-22 |
| III-95 | B-7 | C-23 |
| III-96 | B-7 | C-24 |
| III-97 | B-7 | C-25 |
| III-98 | B-7 | C-26 |
| III-99 | B-7 | C-27 |
| III-100 | B-7 | C-28 |
| III-101 | B-7 | C-29 |
| III-102 | B-7 | C-30 |
| III-103 | B-7 | C-31 |
| III-104 | B-7 | C-32 |
| III-105 | B-7 | C-33 |
| III-106 | B-7 | C-34 |
| III-107 | B-8 | C-1 |
| III-108 | B-8 | C-2 |
| III-109 | B-8 | C-3 |
| III-110 | B-8 | C-19 |
| III-111 | B-8 | C-20 |
| III-112 | B-8 | C-21 |
| III-113 | B-9 | C-1 |
| III-114 | B-9 | C-2 |
| III-115 | B-9 | C-3 |
| III-116 | B-9 | C-19 |
| III-117 | B-9 | C-20 |
| III-118 | B-9 | C-21 |
| III-119 | B-10 | C-1 |
| III-120 | B-10 | C-2 |

TABLE 31-continued

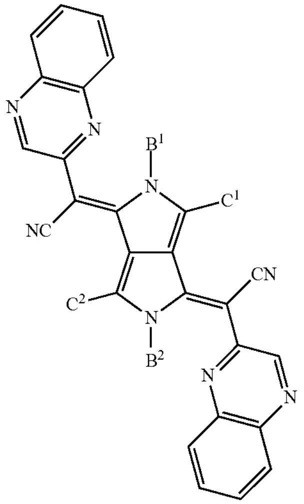

| No. | $B^1$ and $B^2$ structures | $C^1$ and $C^2$ structures |
|---|---|---|
| III-121 | B-10 | C-3 |
| III-122 | B-10 | C-19 |
| III-123 | B-10 | C-20 |
| III-124 | B-10 | C-21 |
| III-125 | B-11 | C-1 |
| III-126 | B-11 | C-2 |
| III-127 | B-11 | C-3 |
| III-128 | B-11 | C-19 |
| III-129 | B-11 | C-20 |
| III-130 | B-11 | C-21 |
| III-131 | B-12 | C-1 |
| III-132 | B-12 | C-2 |
| III-133 | B-12 | C-3 |
| III-134 | B-12 | C-19 |
| III-135 | B-12 | C-20 |
| III-136 | B-12 | C-21 |

TABLE 32

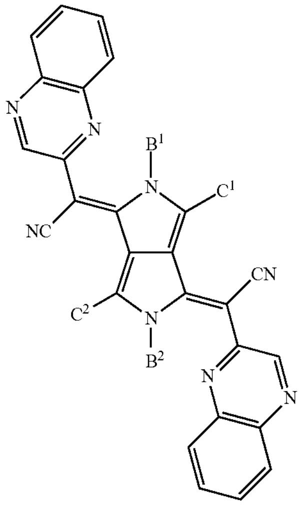

| No. | $B^1$ and $B^2$ structures | $C^1$ and $C^2$ structures |
|---|---|---|
| III-137 | B-13 | C-1 |
| III-138 | B-13 | C-2 |
| III-139 | B-13 | C-3 |

TABLE 32-continued

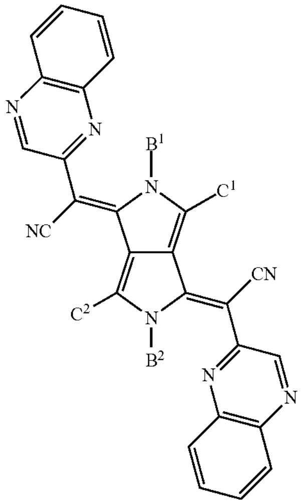

| No. | $B^1$ and $B^2$ structures | $C^1$ and $C^2$ structures |
|---|---|---|
| III-140 | B-13 | C-19 |
| III-141 | B-13 | C-20 |
| III-142 | B-13 | C-21 |
| III-143 | B-14 | C-1 |
| III-144 | B-14 | C-2 |
| III-145 | B-14 | C-3 |
| III-146 | B-14 | C-19 |
| III-147 | B-14 | C-20 |
| III-148 | B-14 | C-21 |
| III-149 | B-15 | C-1 |
| III-150 | B-15 | C-2 |
| III-151 | B-15 | C-3 |
| III-152 | B-15 | C-19 |
| III-153 | B-15 | C-20 |
| III-154 | B-15 | C-21 |
| III-155 | B-16 | C-1 |
| III-156 | B-16 | C-2 |
| III-157 | B-16 | C-3 |
| III-158 | B-16 | C-19 |
| III-159 | B-16 | C-20 |
| III-160 | B-16 | C-21 |
| III-161 | B-17 | C-1 |
| III-162 | B-17 | C-2 |
| III-163 | B-17 | C-3 |
| III-164 | B-17 | C-19 |
| III-165 | B-17 | C-20 |
| III-166 | B-17 | C-21 |

TABLE 33

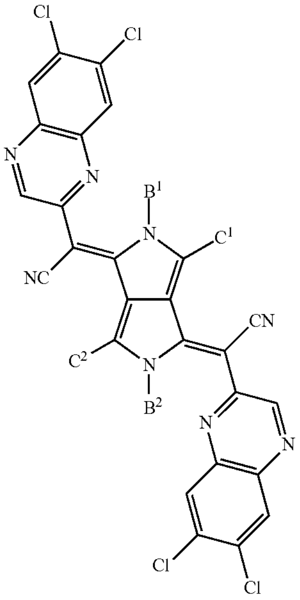

| No. | $B^1$ and $B^2$ structures | $C^1$ and $C^2$ structures |
|---|---|---|
| IIII-167 | B-1 | C-1 |
| IIII-168 | B-1 | C-2 |
| IIII-169 | B-1 | C-3 |
| IIII-170 | B-1 | C-4 |
| IIII-171 | B-1 | C-5 |
| IIII-172 | B-1 | C-6 |
| IIII-173 | B-1 | C-7 |
| IIII-174 | B-1 | C-8 |
| IIII-175 | B-1 | C-9 |
| IIII-176 | B-1 | C-10 |
| IIII-177 | B-1 | C-11 |
| IIII-178 | B-1 | C-12 |
| IIII-179 | B-1 | C-13 |
| IIII-180 | B-1 | C-14 |
| IIII-181 | B-1 | C-15 |
| IIII-182 | B-1 | C-16 |
| IIII-183 | B-1 | C-17 |
| IIII-184 | B-1 | C-18 |
| IIII-185 | B-1 | C-19 |
| IIII-186 | B-1 | C-20 |
| IIII-187 | B-1 | C-21 |
| IIII-188 | B-1 | C-22 |
| IIII-189 | B-1 | C-23 |
| IIII-190 | B-1 | C-24 |
| IIII-191 | B-1 | C-25 |
| IIII-192 | B-1 | C-26 |
| IIII-193 | B-1 | C-27 |
| IIII-194 | B-1 | C-28 |
| IIII-195 | B-1 | C-29 |
| IIII-196 | B-1 | C-30 |
| IIII-197 | B-1 | C-31 |
| IIII-198 | B-1 | C-32 |

TABLE 33-continued

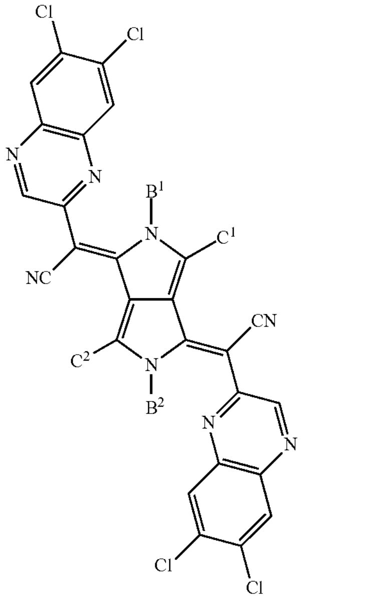

| No. | $B^1$ and $B^2$ structures | $C^1$ and $C^2$ structures |
|---|---|---|
| IIII-199 | B-1 | C-33 |
| IIII-200 | B-1 | C-34 |
| IIII-201 | B-2 | C-1 |
| IIII-202 | B-2 | C-2 |
| IIII-203 | B-2 | C-3 |
| IIII-204 | B-2 | C-19 |
| IIII-205 | B-2 | C-20 |
| IIII-206 | B-2 | C-21 |
| IIII-207 | B-3 | C-1 |
| IIII-208 | B-3 | C-2 |
| IIII-209 | B-3 | C-3 |
| IIII-210 | B-3 | C-19 |
| IIII-211 | B-3 | C-20 |
| IIII-212 | B-3 | C-21 |
| IIII-213 | B-4 | C-1 |
| IIII-214 | B-4 | C-2 |
| IIII-215 | B-4 | C-3 |
| IIII-216 | B-4 | C-19 |
| IIII-217 | B-4 | C-20 |
| IIII-218 | B-4 | C-21 |
| IIII-219 | B-5 | C-1 |
| IIII-220 | B-5 | C-2 |
| IIII-221 | B-5 | C-3 |
| IIII-222 | B-5 | C-19 |
| IIII-223 | B-5 | C-20 |
| IIII-224 | B-5 | C-21 |
| IIII-225 | B-6 | C-1 |
| IIII-226 | B-6 | C-2 |
| IIII-227 | B-6 | C-3 |
| IIII-228 | B-6 | C-19 |
| IIII-229 | B-6 | C-20 |
| IIII-230 | B-6 | C-21 |

TABLE 34

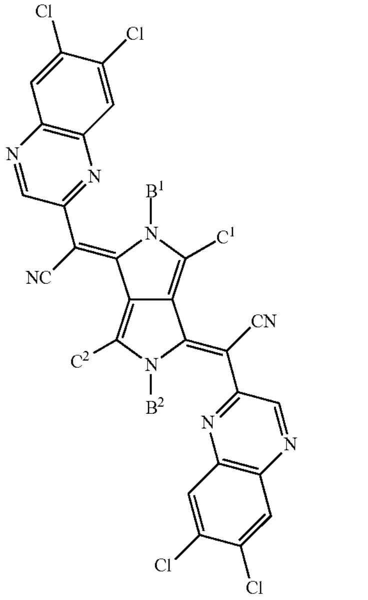

| No. | $B^1$ and $B^2$ structures | $C^1$ and $C^2$ structures |
|---|---|---|
| III-231 | B-7 | C-1 |
| III-232 | B-7 | C-2 |
| III-233 | B-7 | C-3 |
| III-234 | B-7 | C-4 |
| III-235 | B-7 | C-5 |
| III-236 | B-7 | C-6 |
| III-237 | B-7 | C-7 |
| III-238 | B-7 | C-8 |
| III-239 | B-7 | C-9 |
| III-240 | B-7 | C-10 |
| III-241 | B-7 | C-11 |
| III-242 | B-7 | C-12 |
| III-243 | B-7 | C-13 |
| III-244 | B-7 | C-14 |
| III-245 | B-7 | C-15 |
| III-246 | B-7 | C-16 |
| III-247 | B-7 | C-17 |
| III-248 | B-7 | C-18 |
| III-249 | B-7 | C-19 |
| III-250 | B-7 | C-20 |
| III-251 | B-7 | C-21 |
| III-252 | B-7 | C-22 |
| III-253 | B-7 | C-23 |
| III-254 | B-7 | C-24 |
| III-255 | B-7 | C-25 |
| III-256 | B-7 | C-26 |
| III-257 | B-7 | C-27 |
| III-258 | B-7 | C-28 |
| III-259 | B-7 | C-29 |
| III-260 | B-7 | C-30 |
| III-261 | B-7 | C-31 |

TABLE 34-continued

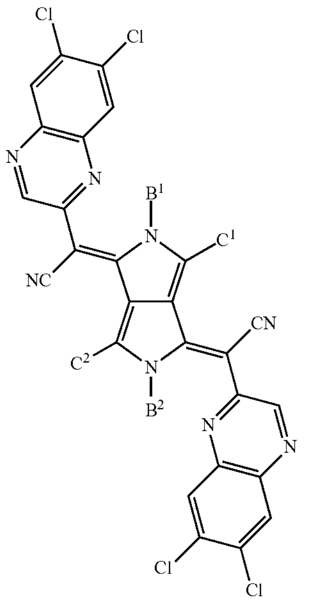

| No. | $B^1$ and $B^2$ structures | $C^1$ and $C^2$ structures |
|---|---|---|
| III-262 | B-7 | C-32 |
| III-263 | B-7 | C-33 |
| III-264 | B-7 | C-34 |
| III-265 | B-8 | C-1 |
| III-266 | B-8 | C-2 |
| III-267 | B-8 | C-3 |
| III-268 | B-8 | C-19 |
| III-269 | B-8 | C-20 |
| III-270 | B-8 | C-21 |
| III-271 | B-9 | C-1 |
| III-272 | B-9 | C-2 |
| III-273 | B-9 | C-3 |
| III-274 | B-9 | C-19 |
| III-275 | B-9 | C-20 |
| III-276 | B-9 | C-21 |
| III-277 | B-10 | C-1 |
| III-278 | B-10 | C-2 |
| III-279 | B-10 | C-3 |
| III-280 | B-10 | C-19 |
| III-281 | B-10 | C-20 |
| III-282 | B-10 | C-21 |
| III-283 | B-11 | C-1 |
| III-284 | B-11 | C-2 |
| III-285 | B-11 | C-3 |
| III-286 | B-11 | C-19 |
| III-287 | B-11 | C-20 |
| III-288 | B-11 | C-21 |
| III-289 | B-12 | C-1 |
| III-290 | B-12 | C-2 |
| III-291 | B-12 | C-3 |
| III-292 | B-12 | C-19 |
| III-293 | B-12 | C-20 |
| III-294 | B-12 | C-21 |

TABLE 35

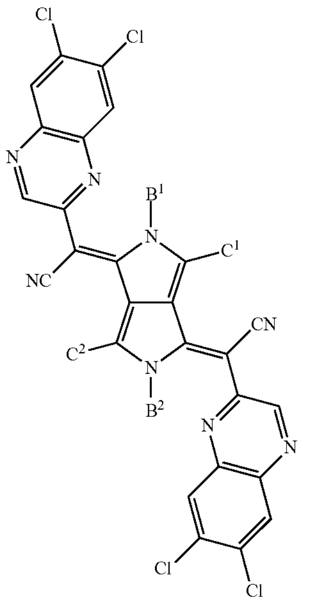

| No. | $B^1$ and $B^2$ structures | $C^1$ and $C^2$ structures |
|---|---|---|
| III-295 | B-13 | C-1 |
| III-296 | B-13 | C-2 |
| III-297 | B-13 | C-3 |
| III-298 | B-13 | C-19 |
| III-299 | B-13 | C-20 |
| III-300 | B-13 | C-21 |
| III-301 | B-14 | C-1 |
| III-302 | B-14 | C-2 |
| III-303 | B-14 | C-3 |
| III-304 | B-14 | C-19 |
| III-305 | B-14 | C-20 |
| III-306 | B-14 | C-21 |
| III-307 | B-15 | C-1 |
| III-308 | B-15 | C-2 |
| III-309 | B-15 | C-3 |
| III-310 | B-15 | C-19 |
| III-311 | B-15 | C-20 |
| III-312 | B-15 | C-21 |
| III-313 | B-16 | C-1 |
| III-314 | B-16 | C-2 |
| III-315 | B-16 | C-3 |
| III-316 | B-16 | C-19 |
| III-317 | B-16 | C-20 |
| III-318 | B-16 | C-21 |
| III-319 | B-17 | C-1 |
| III-320 | B-17 | C-2 |
| III-321 | B-17 | C-3 |
| III-322 | B-17 | C-19 |
| III-323 | B-17 | C-20 |
| III-324 | B-17 | C-21 |

TABLE 36

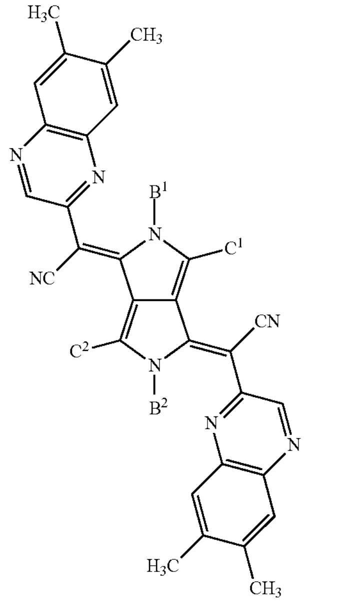

| No. | $B^1$ and $B^2$ structures | $C^1$ and $C^2$ structures |
|---|---|---|
| III-325 | B-1 | C-1 |
| III-326 | B-1 | C-2 |
| III-327 | B-1 | C-19 |
| III-328 | B-1 | C-20 |
| III-329 | B-7 | C-1 |
| III-330 | B-7 | C-2 |
| III-331 | B-7 | C-19 |
| III-332 | B-7 | C-20 |

TABLE 37

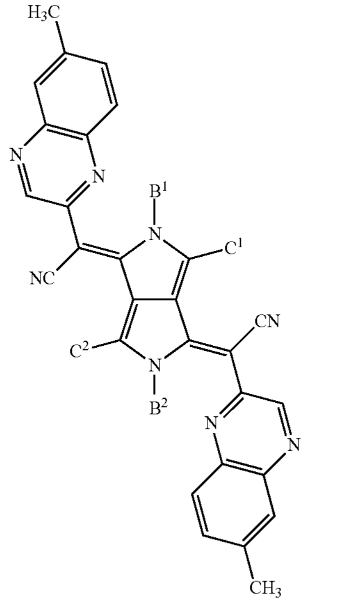

| No. | $B^1$ and $B^2$ structures | $C^1$ and $C^2$ structures |
|---|---|---|
| III-333 | B-1 | C-1 |
| III-334 | B-1 | C-2 |

TABLE 37-continued

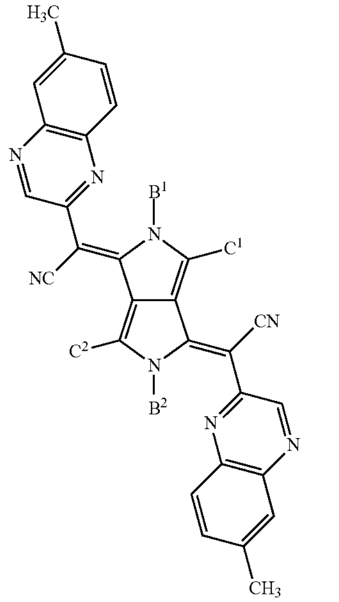

| No. | $B^1$ and $B^2$ structures | $C^1$ and $C^2$ structures |
|---|---|---|
| III-335 | B-1 | C-19 |
| III-336 | B-1 | C-20 |
| III-337 | B-7 | C-1 |
| III-338 | B-7 | C-2 |
| III-339 | B-7 | C-19 |
| III-340 | B-7 | C-20 |

TABLE 38

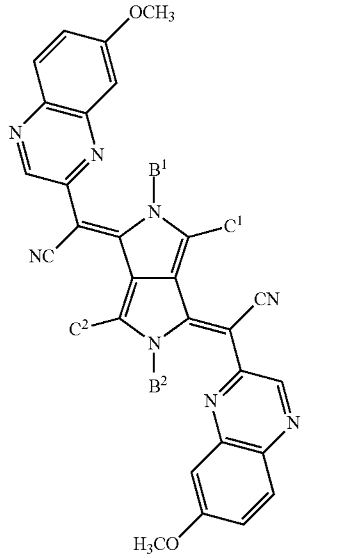

| No. | $B^1$ and $B^2$ structures | $C^1$ and $C^2$ structures |
|---|---|---|
| III-341 | B-1 | C-1 |
| III-342 | B-1 | C-2 |
| III-343 | B-1 | C-19 |
| III-344 | B-1 | C-20 |
| III-345 | B-7 | C-1 |
| III-346 | B-7 | C-2 |

TABLE 38-continued

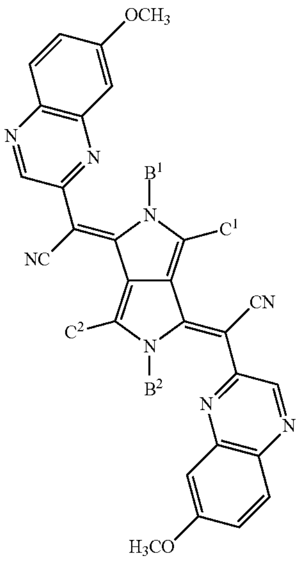

| No. | $B^1$ and $B^2$ structures | $C^1$ and $C^2$ structures |
|---|---|---|
| III-347 | B-7 | C-19 |
| III-348 | B-7 | C-20 |

TABLE 39

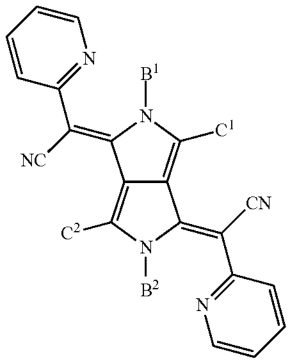

| No. | $B^1$ and $B^2$ structures | $C^1$ and $C^2$ structures |
|---|---|---|
| III-349 | B-1 | C-1 |
| III-350 | B-1 | C-2 |
| III-351 | B-1 | C-19 |
| III-352 | B-1 | C-20 |
| III-353 | B-7 | C-1 |
| III-354 | B-7 | C-2 |
| III-355 | B-7 | C-19 |
| III-356 | B-7 | C-20 |

TABLE 40

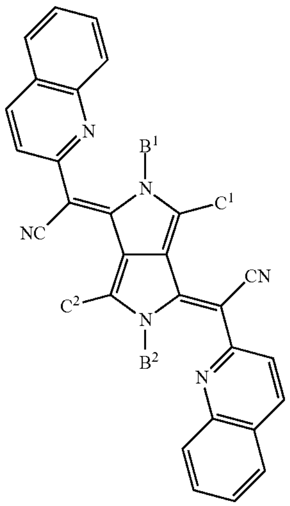

| No. | $B^1$ and $B^2$ structures | $C^1$ and $C^2$ structures |
|---|---|---|
| III-357 | B-1 | C-1 |
| III-358 | B-1 | C-2 |
| III-359 | B-1 | C-19 |
| III-360 | B-1 | C-20 |
| III-361 | B-7 | C-1 |
| III-362 | B-7 | C-2 |
| III-363 | B-7 | C-19 |
| III-364 | B-7 | C-20 |

TABLE 41

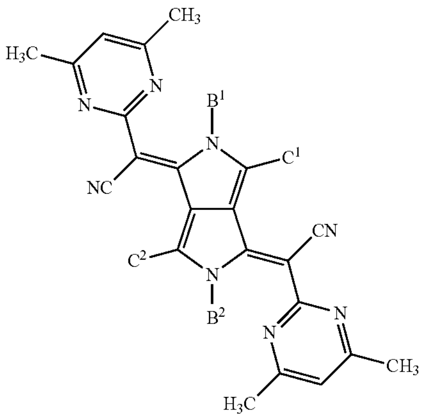

| No. | $B^1$ and $B^2$ structures | $C^1$ and $C^2$ structures |
|---|---|---|
| III-365 | B-1 | C-1 |
| III-366 | B-1 | C-2 |
| III-367 | B-1 | C-19 |
| III-368 | B-1 | C-20 |
| III-369 | B-7 | C-1 |
| III-370 | B-7 | C-2 |
| III-371 | B-7 | C-19 |
| III-372 | B-7 | C-20 |

TABLE 42

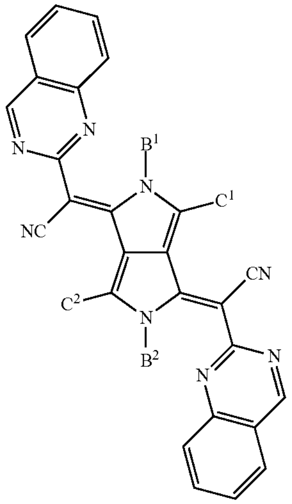

| No. | $B^1$ and $B^2$ structures | $C^1$ and $C^2$ structures |
|---|---|---|
| III-373 | B-1 | C-1 |
| III-374 | B-1 | C-2 |
| III-375 | B-1 | C-19 |
| III 376 | B-1 | C-20 |
| III-377 | B-7 | C-1 |
| III-378 | B-7 | C-2 |
| III-379 | B-7 | C-19 |
| III-380 | B-7 | C-20 |

TABLE 43

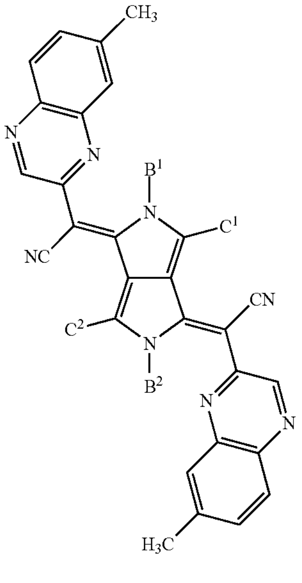

| No. | $B^1$ and $B^2$ structures | $C^1$ and $C^2$ structures |
|---|---|---|
| III-381 | B-1 | C-1 |
| III-382 | B-1 | C-2 |
| III-383 | B-1 | C-19 |
| III-384 | B-1 | C-20 |
| III-385 | B-7 | C-1 |
| III-386 | B-7 | C-2 |
| III-387 | B-7 | C-19 |
| III-388 | B-7 | C-20 |

TABLE 44

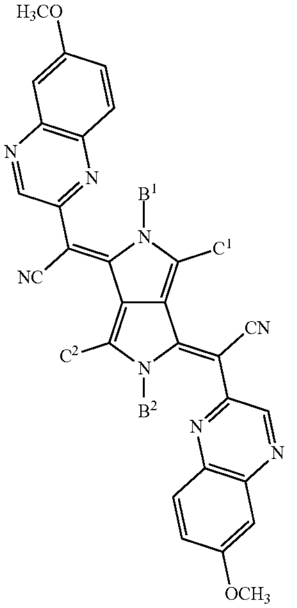

| No. | $B^1$ and $B^2$ structures | $C^1$ and $C^2$ structures |
|---|---|---|
| III-389 | B-1 | C-1 |
| III-390 | B-1 | C-2 |
| III-391 | B-1 | C-19 |
| III-392 | B-1 | C-20 |
| III-393 | B-7 | C-1 |
| III-394 | B-7 | C-2 |
| III-395 | B-7 | C-19 |
| III-396 | B-7 | C-20 |

TABLE 45

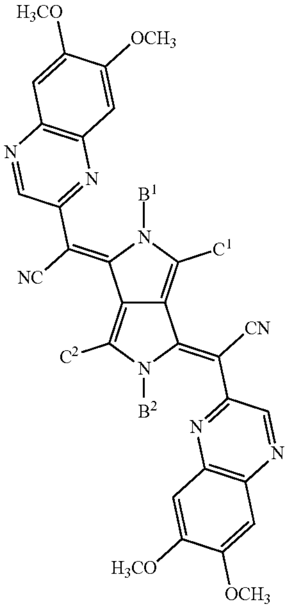

| No. | $B^1$ and $B^2$ structures | $C^1$ and $C^2$ structures |
|---|---|---|
| III-397 | B-1 | C-1 |
| III-398 | B-1 | C-2 |
| III-399 | B-1 | C-19 |

TABLE 45-continued

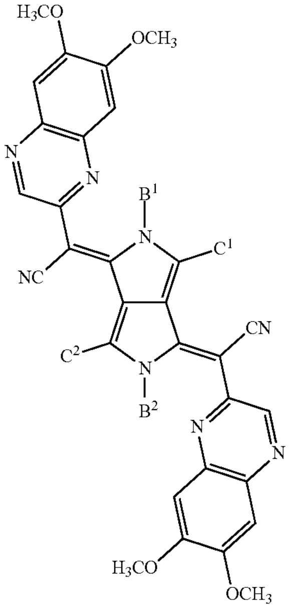

| No. | $B^1$ and $B^2$ structures | $C^1$ and $C^2$ structures |
|---|---|---|
| III-400 | B-1 | C-20 |
| III-401 | B-7 | C-1 |
| III-402 | B-7 | C-2 |
| III-403 | B-7 | C-19 |
| III-404 | B-7 | C-20 |

TABLE 46

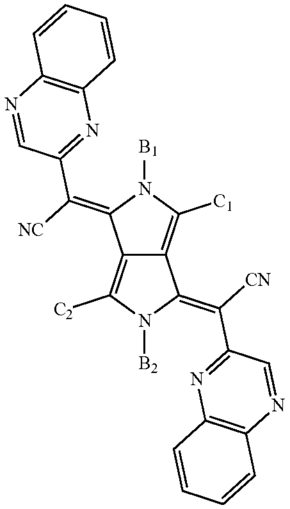

| No. | $B^1$ and $B^2$ structures | $C^1$ and $C^2$ structures |
|---|---|---|
| III-405 | B-1 | C-35 |
| III-406 | B-1 | C-36 |
| III-407 | B-1 | C-37 |
| III-408 | B-1 | C-38 |
| III-409 | B-1 | C-39 |
| III-410 | B-1 | C-40 |
| III-411 | B-1 | C-41 |
| III-412 | B-7 | C-35 |
| III-413 | B-7 | C-36 |

TABLE 46-continued

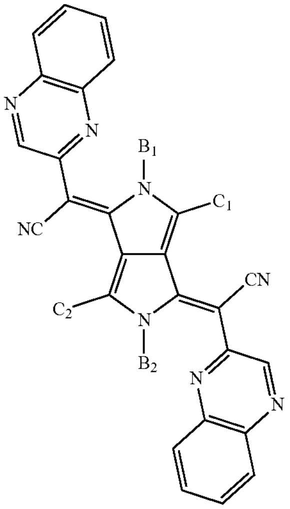

| No. | $B^1$ and $B^2$ structures | $C^1$ and $C^2$ structures |
|---|---|---|
| III-414 | B-7 | C-37 |
| III-415 | B-7 | C-38 |
| III-416 | B-7 | C-39 |
| III-417 | B-7 | C-40 |
| III-418 | B-7 | C-41 |

TABLE 47

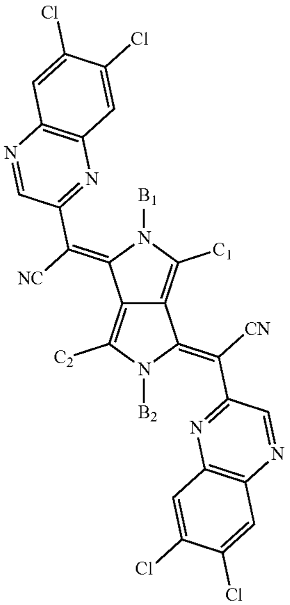

| No. | $B^1$ and $B^2$ structures | $C^1$ and $C^2$ structures |
|---|---|---|
| III-419 | B-1 | C-35 |
| III-420 | B-1 | C-36 |
| III-421 | B-1 | C-37 |
| III-422 | B-1 | C-38 |
| III-423 | B-1 | C-39 |
| III-424 | B-1 | C-40 |
| III-425 | B-1 | C-41 |
| III-426 | B-7 | C-35 |
| III-427 | B-7 | C-36 |

TABLE 47-continued

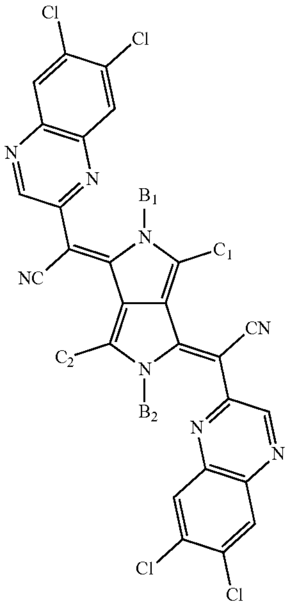

| No. | $B^1$ and $B^2$ structures | $C^1$ and $C^2$ structures |
|---|---|---|
| III-428 | B-7 | C-37 |
| III-429 | B-7 | C-38 |
| III-430 | B-7 | C-39 |
| III-431 | B-7 | C-40 |
| III-432 | B-7 | C-41 |

TABLE 48

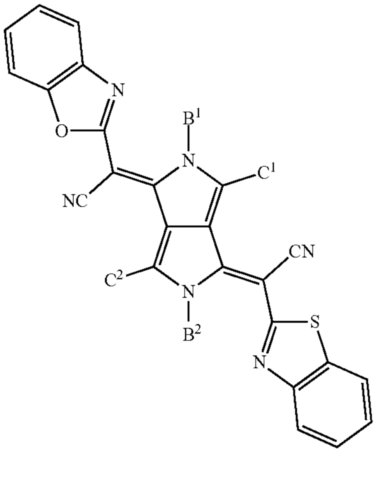

| No. | $B^1$ and $B^2$ structures | $C^1$ and $C^2$ structures |
|---|---|---|
| IV-1 | B-1 | C-1 |
| IV-2 | B-1 | C-2 |
| IV-3 | B-1 | C-19 |
| IV-4 | B-1 | C-20 |
| IV-5 | B-7 | C-1 |
| IV-6 | B-7 | C-2 |
| IV-7 | B-7 | C-19 |
| IV-8 | B-7 | C-20 |

TABLE 49

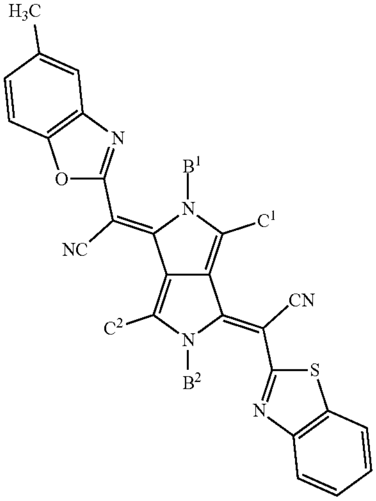

| No. | $B^1$ and $B^2$ structures | $C^1$ and $C^2$ structures |
|---|---|---|
| IV-9 | B-1 | C-1 |
| IV-10 | B-1 | C-2 |
| IV-11 | B-1 | C-3 |
| IV-12 | B-1 | C-4 |
| IV-13 | B-1 | C-5 |
| IV-14 | B-1 | C-6 |
| IV-15 | B-1 | C-7 |
| IV-16 | B-1 | C-8 |
| IV-17 | B-1 | C-9 |
| IV-18 | B-1 | C-10 |
| IV-19 | B-1 | C-11 |
| IV-20 | B-1 | C-12 |
| IV-21 | B-1 | C-13 |
| IV-22 | B-1 | C-14 |
| IV-23 | B-1 | C-15 |
| IV-24 | B-1 | C-16 |
| IV-25 | B-1 | C-17 |
| IV-26 | B-1 | C-18 |
| IV-27 | B-1 | C-19 |
| IV-28 | B-1 | C-20 |
| IV-29 | B-1 | C-21 |
| IV-30 | B-1 | C-22 |
| IV-31 | B-1 | C-23 |
| IV-32 | B-1 | C-24 |
| IV-33 | B-1 | C-25 |
| IV-34 | B-1 | C-26 |
| IV-35 | B-1 | C-27 |
| IV-36 | B-1 | C-28 |
| IV-37 | B-1 | C-29 |
| IV-38 | B-1 | C-30 |
| IV-39 | B-1 | C-31 |
| IV-40 | B-1 | C-32 |
| IV-41 | B-1 | C-33 |
| IV-42 | B-1 | C-34 |
| IV-43 | B-2 | C-1 |
| IV-44 | B-2 | C-2 |
| IV-45 | B-2 | C-3 |
| IV-46 | B-2 | C-19 |
| IV-47 | B-2 | C-20 |
| IV-48 | B-2 | C-21 |
| IV-49 | B-3 | C-1 |
| IV-50 | B-3 | C-2 |
| IV-51 | B-3 | C-3 |
| IV-52 | B-3 | C-19 |
| IV-53 | B-3 | C-20 |
| IV-54 | B-3 | C-21 |
| IV-55 | B-4 | C-1 |
| IV-56 | B-4 | C-2 |
| IV-57 | B-4 | C-3 |
| IV-58 | B-4 | C-19 |
| IV-59 | B-4 | C-20 |
| IV-60 | B-4 | C-21 |

TABLE 49-continued

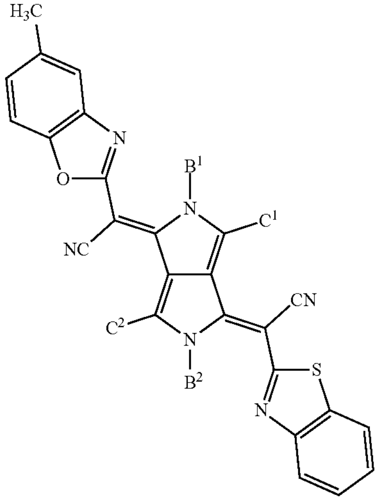

| No. | $B^1$ and $B^2$ structures | $C^1$ and $C^2$ structures |
|---|---|---|
| IV-61 | B-5 | C-1 |
| IV-62 | B-5 | C-2 |
| IV-63 | B-5 | C-3 |
| IV-64 | B-5 | C-19 |
| IV-65 | B-5 | C-20 |
| IV-66 | B-5 | C-21 |
| IV-67 | B-6 | C-1 |
| IV-68 | B-6 | C-2 |
| IV-69 | B-6 | C-3 |
| IV-70 | B-6 | C-19 |
| IV-71 | B-6 | C-20 |
| IV-72 | B-6 | C-21 |

TABLE 50

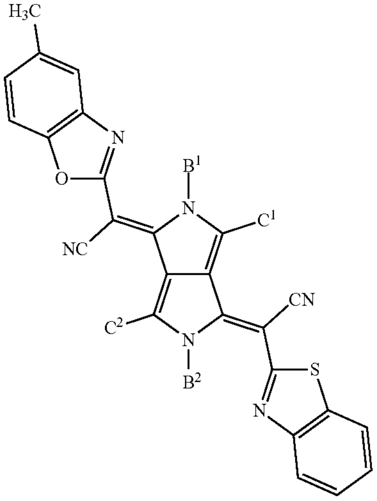

| No. | $B^1$ and $B^2$ structures | $C^1$ and $C^2$ structures |
|---|---|---|
| IV-73 | B-7 | C-1 |
| IV-74 | B-7 | C-2 |
| IV-75 | B-7 | C-3 |
| IV-76 | B-7 | C-4 |
| IV-77 | B-7 | C-5 |
| IV-78 | B-7 | C-6 |
| IV-79 | B-7 | C-7 |
| IV-80 | B-7 | C-8 |

TABLE 50-continued

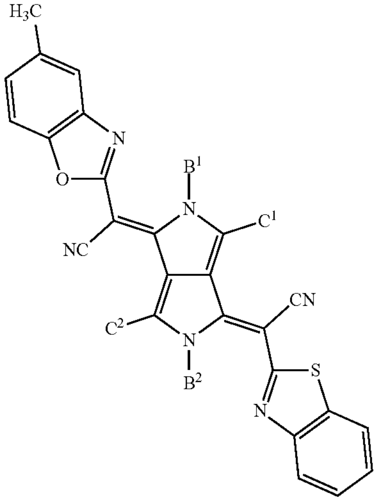

| No. | $B^1$ and $B^2$ structures | $C^1$ and $C^2$ structures |
|---|---|---|
| IV-81 | B-7 | C-9 |
| IV-82 | B-7 | C-10 |
| IV-83 | B-7 | C-11 |
| IV-84 | B-7 | C-12 |
| IV-85 | B-7 | C-13 |
| IV-86 | B-7 | C-14 |
| IV-87 | B-7 | C-15 |
| IV-88 | B-7 | C-16 |
| IV-89 | B-7 | C-17 |
| IV-90 | B-7 | C-18 |
| IV-91 | B-7 | C-19 |
| IV-92 | B-7 | C-20 |
| IV-93 | B-7 | C-21 |
| IV-94 | B-7 | C-22 |
| IV-95 | B-7 | C-23 |
| IV-96 | B-7 | C-24 |
| IV-97 | B-7 | C-25 |
| IV-98 | B-7 | C-26 |
| IV-99 | B-7 | C-27 |
| IV-100 | B-7 | C-28 |
| IV-101 | B-7 | C-29 |
| IV-102 | B-7 | C-30 |
| IV-103 | B-7 | C-31 |
| IV-104 | B-7 | C-32 |
| IV-105 | B-7 | C-33 |
| IV-106 | B-7 | C-34 |
| IV-107 | B-8 | C-1 |
| IV-108 | B-8 | C-2 |
| IV-109 | B-8 | C-3 |
| IV-110 | B-8 | C-19 |
| IV-111 | B-8 | C-20 |
| IV-112 | B-8 | C-21 |
| IV-113 | B-9 | C-1 |
| IV-114 | B-9 | C-2 |
| IV-115 | B-9 | C-3 |
| IV-116 | B-9 | C-19 |
| IV-117 | B-9 | C-20 |
| IV-118 | B-9 | C-21 |
| IV-119 | B-10 | C-1 |
| IV-120 | B-10 | C-2 |
| IV-121 | B-10 | C-3 |
| IV-122 | B-10 | C-19 |
| IV-123 | B-10 | C-20 |
| IV-124 | B-10 | C-21 |
| IV-125 | B-11 | C-1 |
| IV-126 | B-11 | C-2 |
| IV-127 | B-11 | C-3 |
| IV-128 | B-11 | C-19 |
| IV-129 | B-11 | C-20 |
| IV-130 | B-11 | C-21 |
| IV-131 | B-12 | C-1 |
| IV-132 | B-12 | C-2 |

TABLE 50-continued

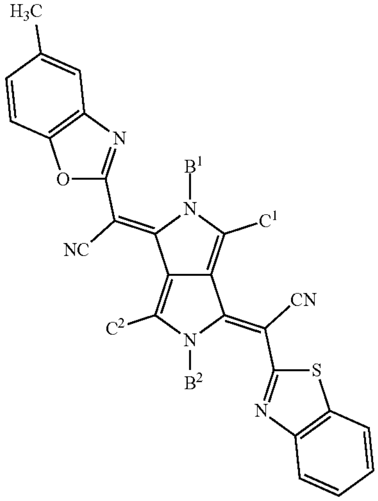

| No. | $B^1$ and $B^2$ structures | $C^1$ and $C^2$ structures |
|---|---|---|
| IV-133 | B-12 | C-3 |
| IV-134 | B-12 | C-19 |
| IV-135 | B-12 | C-20 |
| IV-136 | B-12 | C-21 |

TABLE 51

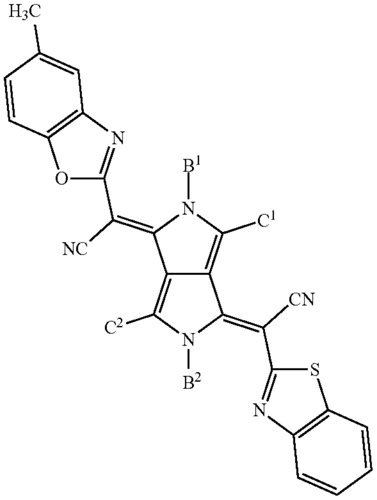

| No. | $B^1$ and $B^2$ structures | $C^1$ and $C^2$ structures |
|---|---|---|
| IV-137 | B-13 | C-1 |
| IV-138 | B-13 | C-2 |
| IV-139 | B-13 | C-3 |
| IV-140 | B-13 | C-19 |
| IV-141 | B-13 | C-20 |
| IV-142 | B-13 | C-21 |
| IV-143 | B-14 | C-1 |
| IV-144 | B-14 | C-2 |
| IV-145 | B-14 | C-3 |
| IV-146 | B-14 | C-19 |
| IV-147 | B-14 | C-20 |
| IV-148 | B-14 | C-21 |
| IV-149 | B-15 | C-1 |
| IV-150 | B-15 | C-2 |
| IV-151 | B-15 | C-3 |
| IV-152 | B-15 | C-19 |

TABLE 51-continued

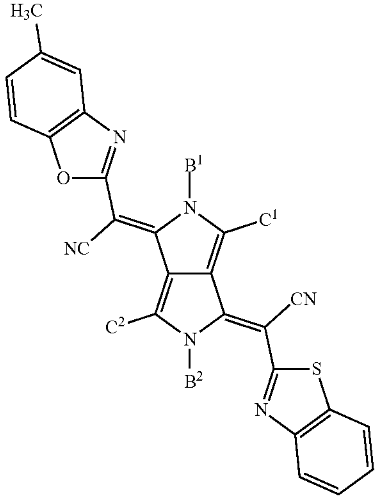

| No. | $B^1$ and $B^2$ structures | $C^1$ and $C^2$ structures |
|---|---|---|
| IV-153 | B-15 | C-20 |
| IV-154 | B-15 | C-21 |
| IV-155 | B-16 | C-1 |
| IV-156 | B-16 | C-2 |
| IV-157 | B-16 | C-3 |
| IV-158 | B-16 | C-19 |
| IV-159 | B-16 | C-20 |
| IV-160 | B-16 | C-21 |
| IV-161 | B-17 | C-1 |
| IV-162 | B-17 | C-2 |
| IV-163 | B-17 | C-3 |
| IV-164 | B-17 | C-19 |
| IV-165 | B-17 | C-20 |
| IV-166 | B-17 | C-21 |

TABLE 52

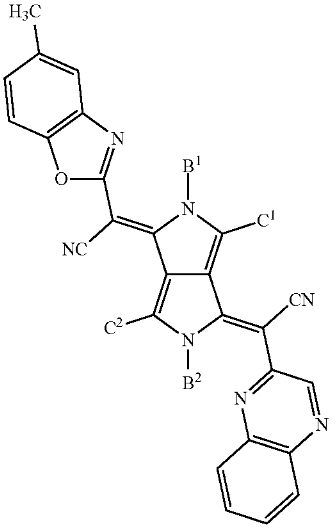

| No. | $B^1$ and $B^2$ structures | $C^1$ and $C^2$ structures |
|---|---|---|
| IV-167 | B-1 | C-1 |
| IV-168 | B-1 | C-2 |
| IV-169 | B-1 | C-19 |
| IV-170 | B-1 | C-20 |

TABLE 52-continued

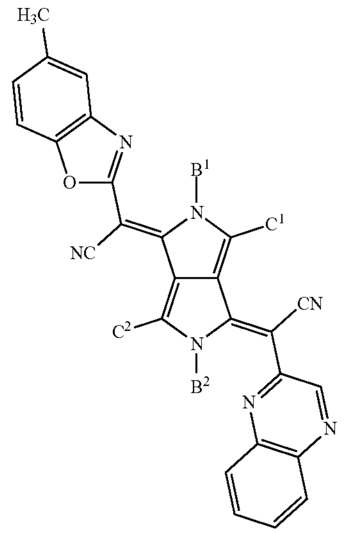

| No. | $B^1$ and $B^2$ structures | $C^1$ and $C^2$ structures |
|---|---|---|
| IV-171 | B-7 | C-1 |
| IV-172 | B-7 | C-2 |
| IV-173 | B-7 | C-19 |
| IV-174 | B-7 | C-20 |

TABLE 53

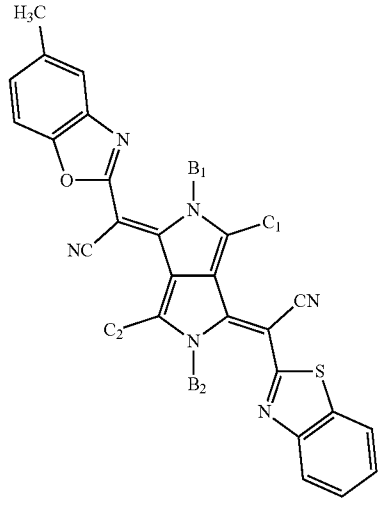

| No. | $B^1$ and $B^2$ structures | $C^1$ and $C^2$ structures |
|---|---|---|
| IV-175 | B-1 | C-35 |
| IV-176 | B-1 | C-36 |
| IV-177 | B-1 | C-37 |
| IV-178 | B-1 | C-38 |
| IV-179 | B-1 | C-39 |
| IV-180 | B-1 | C-40 |
| IV-181 | B-1 | C-41 |
| IV-182 | B-7 | C-35 |
| IV-183 | B-7 | C-36 |
| IV-184 | B-7 | C-37 |
| IV-185 | B-7 | C-38 |
| IV-186 | B-7 | C-39 |

TABLE 53-continued

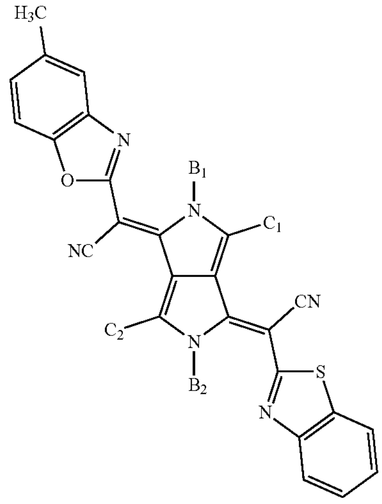

| No. | $B^1$ and $B^2$ structures | $C^1$ and $C^2$ structures |
|---|---|---|
| IV-187 | B-7 | C-40 |
| IV-188 | B-7 | C-41 |

TABLE 54

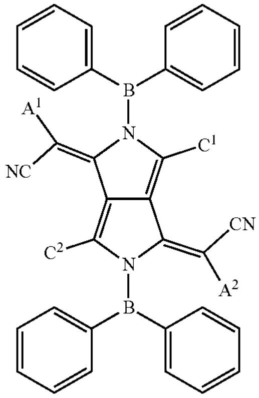

| No. | $A^1$ and $A^2$ structures | $C^1$ structure | $C^2$ structure |
|---|---|---|---|
| V-1 | A-3 | C-18 | C-1 |
| V-2 | A-3 | C-18 | C-2 |
| V-3 | A-3 | C-18 | C-5 |
| V-4 | A-3 | C-18 | C-8 |
| V-5 | A-3 | C-34 | C-19 |
| V-6 | A-3 | C-34 | C-20 |
| V-7 | A-3 | C-2 | C-8 |
| V-8 | A-3 | C-2 | C-17 |
| V-9 | A-4 | C-18 | C-1 |
| V-10 | A-4 | C-18 | C-2 |
| V-11 | A-4 | C-18 | C-5 |
| V-12 | A-4 | C-18 | C-8 |
| V-13 | A-4 | C-34 | C-19 |
| V-14 | A-4 | C-34 | C-20 |
| V-15 | A-4 | C-2 | C-8 |
| V-16 | A-4 | C-2 | C-17 |
| V-17 | A-8 | C-18 | C-1 |
| V-18 | A-8 | C-18 | C-2 |
| V-19 | A-8 | C-18 | C-5 |
| V-20 | A-8 | C-18 | C-8 |
| V-21 | A-8 | C-34 | C-19 |
| V-22 | A-8 | C-34 | C-20 |
| V-23 | A-8 | C-2 | C-8 |

TABLE 54-continued

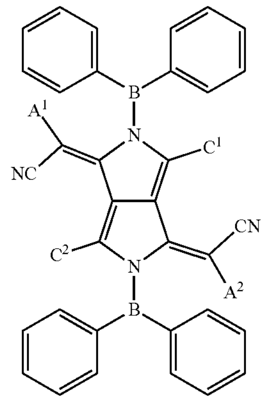

| No. | $A^1$ and $A^2$ structures | $C^1$ structure | $C^2$ structure |
|---|---|---|---|
| V-24 | A-8 | C-2 | C-17 |
| V-25 | A-10 | C-18 | C-1 |
| V-26 | A-10 | C-18 | C-2 |
| V-27 | A-10 | C-18 | C-5 |
| V-28 | A-10 | C-18 | C-8 |
| V-29 | A-10 | C-34 | C-19 |
| V-30 | A-10 | C-34 | C-20 |
| V-31 | A-10 | C-2 | C-8 |
| V-32 | A-10 | C-2 | C-17 |
| V-33 | A-18 | C-18 | C-1 |
| V-34 | A-18 | C-18 | C-2 |
| V-35 | A-18 | C-18 | C-5 |
| V-36 | A-18 | C-18 | C-8 |
| V-37 | A-18 | C-34 | C-19 |
| V-38 | A-18 | C-34 | C-20 |
| V-39 | A-18 | C-2 | C-8 |
| V-40 | A-18 | C-2 | C-17 |
| V-41 | A-19 | C-18 | C-1 |
| V-42 | A-19 | C-18 | C-2 |
| V-43 | A-19 | C-18 | C-5 |
| V-44 | A-19 | C-18 | C-8 |
| V-45 | A-19 | C-34 | C-19 |
| V-46 | A-19 | C-34 | C-20 |
| V-47 | A-19 | C-2 | C-8 |
| V-48 | A-19 | C-2 | C-17 |

(Squarylium Compound)

It is preferable that the squarylium compound used as the near infrared absorbing compound A is a compound represented by Formula (SQ).

(SQ)

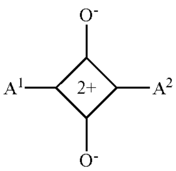

In the formula, $A^1$ and $A^2$ each independently represent an aryl group, a heteroaryl group, or a group represented by the following Formula (2).

(2)

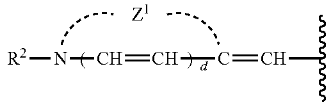

In Formula (2), $Z^1$ represents a non-metal atomic group which forms a nitrogen-containing heterocycle, $R^2$ represents an alkyl group, an alkenyl group, or an aralkyl group, d represents 0 or 1, and a wave line represents a direct bond to a 4-membered ring in Formula (SQ).

In Formula (SQ), $A^1$ and $A^2$ each independently represent an aryl group, a heteroaryl group, or a group represented by Formula (2), and preferably a group represented by Formula (2).

The number of carbon atoms in the aryl group represented by $A^1$ and $A^2$ is preferably 6 to 48, more preferably 6 to 24, and still more preferably 6 to 12. Specific examples include a phenyl group and a naphthyl group. In a case where the aryl group has a substituent, the number of carbon atoms in the aryl group denotes the number of carbon atoms excluding the number of carbon atoms in the substituent.

It is preferable that the heteroaryl group represented by $A^1$ and $A^2$ is a 5-membered or 6-membered ring. In addition, the heteroaryl group is preferably a monocycle or a fused ring, more preferably a monocycle or a fused ring composed of 2 to 8 rings, still more preferably a monocycle or a fused ring composed of 2 to 4 rings, and even still more preferably a monocycle or a fused ring composed of 2 or 3 rings. Examples of a heteroatom included in the heteroaryl group include a nitrogen atom, an oxygen atom, and a sulfur atom. Among these, a nitrogen atom or a sulfur atom is preferable. The number of heteroatoms is preferably 1 to 3 and more preferably 1 or 2. Specific examples include a heteroaryl group derived from a monocycle or a polycyclic aromatic ring such as a 5-membered or 6-membered ring containing at least one of a nitrogen atom, an oxygen atom, or a sulfur atom.

The aryl group and the heteroaryl group may have a substituent. In a case where the aryl group and the heteroaryl group have two or more substituents, the substituents may be the same as or different from each other.

Examples of the substituent include a halogen atom, a cyano group, a nitro group, an alkyl group, an alkenyl group, an alkynyl group, an aryl group, a heteroaryl group, an aralkyl group, $—OR^{10}$, $—COR^{11}$, $—COOR^{12}$, $—OCOR^{13}$, $—NR^{14}R^{15}$, $—NHCOR^{16}$, $—CONR^{17}R^{18}$, $—NHCONR^{19}R^{20}$, $—NHCOOR^{21}$, $—SR^{22}$, $—SO_2R^{23}$, $—SO_2OR^{24}$, $—NHSO_2R^{25}$, and $—SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in $—COOR^{12}$ represents a hydrogen atom (that is, a carboxyl group), the hydrogen atom may be dissociable (that is, a carbonate group) or may be in the form of a salt. In a case where $R^{24}$ in $—SO_2OR^{24}$ represents a hydrogen atom (that is, a sulfo group), the hydrogen atom may be dissociable (that is, a sulfonate group) or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5-membered or 6-membered ring. The number of carbon atoms constituting the ring of the heteroaryl group is preferably 3 to 30, more preferably 3 to 18, and still more preferably 3 to 12.

The alkyl group, the alkenyl group, the alkynyl group, the aralkyl group, the aryl group, and the heteroaryl group may have a substituent or may be unsubstituted. Examples of the substituent include the above-described substituents.

Next, the group represented by Formula (2) which is represented by $A^1$ and $A^2$ will be described.

In Formula (2), $R^2$ represents an alkyl group, an alkenyl group, or an aralkyl group and preferably an alkyl group.

The number of carbon atoms in the alkyl group is preferably 1 to 30, more preferably 1 to 20, still more preferably 1 to 12, and even still more preferably 2 to 8.

The number of carbon atoms in the alkenyl group is preferably 2 to 30, more preferably 2 to 20, and still more preferably 2 to 12.

The alkyl group and the alkenyl group may be linear, branched, or cyclic and is preferably linear or branched.

The number of carbon atoms in the aralkyl group is preferably 7 to 30 and more preferably 7 to 20.

In Formula (2), the nitrogen-containing heterocycle formed by $Z^1$ is preferably a 5-membered or 6-membered ring. In addition, the nitrogen-containing heterocycle is preferably a monocycle or a fused ring, more preferably a monocycle or a fused ring composed of 2 to 8 rings, still more preferably a monocycle or a fused ring composed of 2 to 4 rings, and even still more preferably a fused ring composed of 2 or 3 rings. In addition to a nitrogen atom, the nitrogen-containing heterocycle may include a sulfur atom. In addition, the nitrogen-containing heterocycle may have a substituent. Examples of the substituent include the above-described substituents. For example, a halogen atom, an alkyl group, a hydroxyl group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

It is preferable that the group represented by Formula (2) is a group represented by the following Formula (3) or (4).

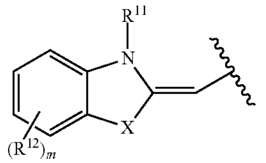

(3)

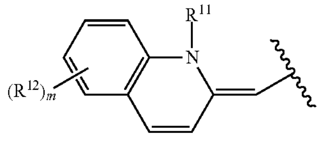

(4)

In Formulae (3) and (4), $R^{11}$ represents an alkyl group, an alkenyl group, or an aralkyl group and $R^{12}$ represents a substituent. m represents an integer of 0 to 4. In a case where m represents 2 or more, $R^{12}$'s may be linked to each other to form a ring. X represents a nitrogen atom or $CR^{13}R^{14}$, and $R^{13}$ and $R^{14}$ each independently represent a hydrogen atom or a substituent. A wave line represents a direct bond to a 4-membered ring in Formula (SQ).

$R^{11}$ in Formulae (3) and (4) has the same definition and the same preferable range as $R^2$ in Formula (2).

$R^{12}$ in Formulae (3) and (4) represents a substituent. Examples of the substituent include the substituents described above regarding the Formula (SQ). For example, a halogen atom, an alkyl group, a hydroxyl group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

In a case where m represents 2 or more, $R^{12}$'s may be linked to each other to form a ring. Examples of the ring include an alicyclic ring (a nonaromatic hydrocarbon ring), an aromatic ring, and a heterocycle. The ring may be a monocycle or a polycycle. In a case where substituents are linked to each other to form a ring, a linking group may be a divalent linking group selected from the group consisting of —CO—, —O—, —NH—, a divalent aliphatic group, a divalent aromatic group, and a combination thereof. For example, it is preferable that $R^2$'s may be linked to each other to form a benzene ring.

In Formula (3), X represents a nitrogen atom or $CR^{13}R^{14}$, and $R^{13}$ and $R^{14}$ each independently represent a hydrogen atom or a substituent. Examples of the substituent include the substituents described above regarding the Formula (SQ). For example, the substituent is an alkyl group. The number of carbon atoms in the alkyl group is preferably 1 to 20, more preferably 1 to 10, still more preferably 1 to 5, even still more preferably 1 to 3, and most preferably 1. The alkyl group is preferably linear or branched and more preferably linear.

m represents an integer of 0 to 4 and preferably 0 to 2.

As shown below, cations in Formula (SQ) are present without being localized.

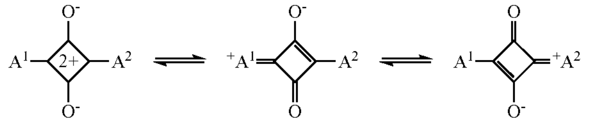

It is more preferable that the squarylium compound used as the near infrared absorbing compound A is a compound represented by Formula (SQ-1).

Formula (SQ-1)

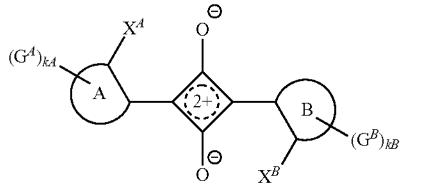

In Formula (SQ-1), a ring A and a ring B each independently represent an aromatic ring.

$X^A$ and $X^B$ each independently represent a substituent.

$G^A$ and $G^B$ each independently represent a substituent.

kA represents an integer of 0 to nA, and kB represents an integer of 0 to nB.

nA represents an integer representing the maximum number of $G^A$'s which may be substituted in the ring A, and nB represents an integer representing the maximum number of $G^B$'s which may be substituted in the ring B.

$X^A$ and $G^A$, or $X^B$ and $G^B$ may be bonded to each other to form a ring, and in a case where a plurality of $G^A$'s and a plurality of $G^B$'s are present, $G^A$'s or $G^B$'s may be bonded to each other to form a ring.

In Formula (SQ-1), $G^A$ and $G^B$ each independently represent a substituent.

Examples of the substituent include a halogen atom, a cyano group, a nitro group, an alkyl group, an alkenyl group, an alkynyl group, an aralkyl group, an aryl group, a heteroaryl group, —$OR^{c1}$, —$COR^{c2}$, —$COOR^{c3}$, —$OCOR^{c4}$, —$NR^{c5}R^{c6}$, —$NHCOR^{c7}$, —$CONR^{c8}R^{c9}$, —$NHCONR^{c10}R^{c11}$, —$NHCOOR^{c12}$, —$SR^{c13}$, —$SO_2R^{c14}$, —$SO_2OR^{c15}$, —$NHSO_2R^{c16}$ and —$SO_2NR^{c17}R^{c18}$. $R^{c1}$ to $R^{c8}$ each independently represent a hydrogen atom, an alkyl group, an alkenyl group, an alkynyl group, an aryl group, or a heteroaryl group. In a case where $R^{c3}$ in —$COOR^{c3}$ represents a hydrogen atom (that is, a carboxyl group), the hydrogen atom may be dissociable (that is, a carbonate group) or may be in the form of a salt. In a case where $R^{c15}$ in —$SO_2OR^{c15}$ represents a hydrogen atom (that is, a sulfo group), the hydrogen atom may be dissociable (that is, a sulfonate group) or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 12, and still more preferably 1 to 8. The alkyl group may be linear, branched, or cyclic. The alkyl group may be unsubstituted or may have a substituent.

The number of carbon atoms in the alkenyl group is preferably 2 to 20, more preferably 2 to 12, and still more preferably 2 to 8. The alkenyl group may be linear, branched, or cyclic.

The number of carbon atoms in the alkynyl group is preferably 2 to 20, more preferably 2 to 12, and still more preferably 2 to 8. The alkynyl group may be linear, branched, or cyclic.

The number of carbon atoms in the aryl group is preferably 6 to 25, more preferably 6 to 15, and still more preferably 6 to 10.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5-membered or 6-membered ring. The number of carbon atoms constituting the ring of the heteroaryl group is preferably 3 to 30, more preferably 3 to 18, and still more preferably 3 to 12.

The alkyl group, the alkenyl group, the alkynyl group, the aralkyl group, the aryl group, and the heteroaryl group may have a substituent or may be unsubstituted. Examples of the substituent include the substituents represented by $G^A$ and $G^B$ such as a halogen atom, a hydroxyl group, a carboxyl group, a sulfo group, an alkoxy group, or an amino group.

In Formula (SQ-1), $X^A$ and $X^B$ each independently represent a substituent. As the substituent, a group having active hydrogen is preferable, —OH, —SH, —COOH, —$SO_3H$, —$NHR^{x1}$, —$NR^{X1}R^{X2}$, —$NHCOR^{X1}$, —$CONR^{X1}R^{X2}$, —$NHCONR^{X1}R^2$, —$NHCOOR^{X1}$, —$NHSO_2R^{X1}$, —$B(OH)_2$, —$PO(OH)_3$, or —$NHBR^{x1}R^{x2}$ is preferable, and —OH, —$NHCOR^{X1}$, —$NHCONR^{X1}R^{X2}$, —$NHCOOR^{X1}$, —$NHSO_2R^{X1}$, or —$NHBR^{X1}R^{X2}$ is more preferable.

$R^{x1}$ and $R^{x2}$ each independently represent a substituent. Examples of the substituent include an alkyl group and an aryl group. Among these, an alkyl group is preferable. The number of carbon atoms in the alkyl group is preferably 1 to 20, more preferably 1 to 15, still more preferably 1 to 8, and even still more preferably 1 or 5. The alkyl group may be linear, branched, or cyclic and is preferably linear or branched. The number of carbon atoms in the aryl group is preferably 6 to 30, more preferably 6 to 20, and still more preferably 6 to 12. The alkyl group and the aryl group may have a substituent or may be unsubstituted, and preferably has a substituent. Examples of the substituent include the substituents described regarding $G^A$ and $G^B$. For example, a halogen atom, an aryl group, or an alkoxy group may be used.

In Formula (SQ-1), the ring A and the ring B each independently represent an aromatic ring. The aromatic ring may be a monocycle or a fused ring. The aromatic ring may be an aromatic hydrocarbon ring or an aromatic heterocycle. Specific examples of the aromatic ring include a benzene ring, a naphthalene ring, a pentalene ring, an indene ring, an azulene ring, a heptalene ring, an indacene ring, a perylene ring, a pentacene ring, an acenaphthylene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring or a naphthalene ring is preferable, and a naphthalene ring is more preferable.

The aromatic ring may be unsubstituted or may have a substituent. Examples of the substituent include the substituents described regarding $G^A$ and $G^B$.

In Formula (SQ-1), $X^A$ and $G^A$, or $X^B$ and $G^B$ may be bonded to each other to form a ring, and in a case where a plurality of $G^A$'s and a plurality of $G^B$'s are present, $G^A$'s or $G^B$'s may be bonded to each other to forma ring. It is preferable that the ring is a 5-membered or 6-membered ring. The ring may be a monocycle or a polycycle. In a case where $X^A$ and $G^A$, $X^B$ and $G^B$, $G^A$'s, or $G^B$'s are bonded to each other to form a ring, the groups may be directly bonded to each other to form a ring, or may be bonded to each other to form a ring through a divalent linking group selected from the group consisting of an alkylene group, —CO—, —O—, —NH—, —BR—, and a combination thereof to form a ring. It is preferable that $X^A$ and $G^A$, $X^B$ and $G^B$, $G^A$'s, or $G^B$'s are bonded to each other through —BR— to forma ring. R represents a hydrogen atom or a substituent. Examples of the substituent include an alkyl group, an alkenyl group, an alkynyl group, an aryl group, and a heteroaryl group. The details of the alkyl group, the alkenyl group, the alkynyl group, the aryl group, and the heteroaryl group are the same as the ranges described regarding the $G^A$ and $G^B$.

In Formula (SQ-1), kA represents an integer of 0 to nA, kB represents an integer of 0 to nB, nA represents an integer representing the maximum number of $G^A$'s which may be substituted in the ring A, and nB represents an integer representing the maximum number of $G^B$'s which may be substituted in the ring B. kA and kB each independently represent preferably an integer of 0 to 4, more preferably 0 to 2, and still more preferably 0 or 1.

It is preferable that the squarylium compound is a compound represented by the following Formula (SQ-A). This compound has excellent heat resistance and light fastness.

Formula (SQ-A)

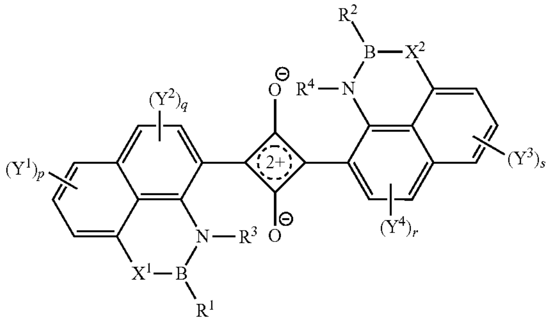

In the formula, $R^1$ and $R^2$ each independently represent an alkyl group, an alkenyl group, an aryl group, or a heteroaryl group.

$R^3$ and $R^4$ each independently represent a hydrogen atom or an alkyl group.

$X^1$ and $X^2$ each independently an oxygen atom or —N($R^5$)—.

$R^5$ represents a hydrogen atom, an alkyl group, an aryl group, or a heteroaryl group.

$Y^1$ to $Y^4$ each independently represent a substituent, and $Y^1$ and $Y^2$ or $Y^3$ and $Y^4$ may be bonded to each other to form a ring.

In a case where a plurality of Y's, a plurality of $Y^2$'s, a plurality of $Y^3$'s, and a plurality of $Y^4$'s are present, $Y^1$'s, $Y^2$'s, $Y^3$'s, or $Y^4$'s may be bonded to each other to form a ring.

p and s each independently represent an integer of 0 to 3.

q and r each independently represent an integer of 0 to 2.

In Formula (SQ-A), the number of carbon atoms in the alkyl group represented by $R^1$ and $R^2$ is preferably 1 to 40. The lower limit is more preferably 3 or more, still more preferably 5 or more, even still more preferably 10 or more, and even yet still more preferably 13 or more. The upper limit is more preferably 35 or less and still more preferably 30 or less. The alkyl group may be linear, branched, or cyclic and is preferably linear or branched and more preferably branched. For example, the number of branches in the branched alkyl group is preferably 2 to 10 and more preferably 2 to 8.

The number of carbon atoms in the alkenyl group represented by $R^1$ and $R^2$ is preferably 2 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkenyl group is preferably linear or branched and more preferably branched. The number of branches in the branched alkenyl group is preferably 2 to 10 and more preferably 2 to 8.

The number of carbon atoms in the aryl group represented by $R^1$ and $R^2$ is preferably 6 to 30, more preferably 6 to 20, and still more preferably 6 to 12.

The heteroaryl group represented by $R^1$ and $R^2$ may be monocyclic or polycyclic. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. The number of carbon atoms constituting the ring of the heteroaryl group is preferably 3 to 30, more preferably 3 to 18, and still more preferably 3 to 12.

The alkyl group, the alkenyl group, the aryl group, and the heteroaryl group represented by $R^1$ and $R^2$ may be unsubstituted or may have a substituent. Examples of the substituent include the substituents described regarding $G^A$ and G, and an alkoxy group is preferable.

In Formula (SQ-A), $R^3$ and $R^4$ each independently represent a hydrogen atom or an alkyl group. $R^3$ and $R^4$ may represent the same group or different groups. It is preferable that $R^3$ and $R^4$ represent the same group. The number of carbon atoms in the alkyl group represented by $R^3$ and $R^4$ is preferably 1 to 20, more preferably 1 to 10, still more preferably 1 to 4, and even still more preferably 1 and 2. The alkyl group may be linear or branched. $R^3$ and $R^4$ each independently represent preferably a hydrogen atom, a methyl group, or an ethyl group, more preferably a hydrogen atom or a methyl group, and still more preferably a hydrogen atom.

In Formula (SQ-A), $X^1$ and $X^2$ each independently represent an oxygen atom or —N($R^5$)—. $X^1$ and $X^2$ may be the same as or different from each other and is preferably the same as each other.

$R^5$ represents a hydrogen atom, an alkyl group, an aryl group, or a heteroaryl group and preferably a hydrogen atom, an alkyl group, or an aryl group. The details of the alkyl group, the aryl group, and the heteroaryl group represented by R5 are the same as the range described above regarding $R^3$ and $R^4$. The alkyl group, the aryl group, and the heteroaryl group represented by $R^5$ may be unsubstituted or may have a substituent. Examples of the substituent include the substituents described regarding $G^A$ and $G^B$.

In Formula (SQ-A), $Y^1$ to $Y^4$ each independently represent a substituent. Examples of the substituent include the substituents described regarding $G^A$ and $G^B$.

In Formula (SQ-A), $Y^1$ and $Y^2$, or $Y^3$ and $Y^4$ may be bonded to each other to form a ring. For example, $Y^1$ and $Y^2$ may be bonded to each other and may form, for example, a tricycle such as an acenaphthene ring or an acenaphthylene ring with a naphthalene ring directly bonded to $Y^1$ and $Y^2$.

In a case where a plurality of Y's, a plurality of $Y^2$'s, a plurality of $Y^3$'s, and a plurality of $Y^4$'s are present, $Y^1$'s, $Y^2$'s, $Y^3$'s, or $Y^4$'s may be bonded to each other to form a ring structure. For example, in a case where a plurality of Y's are present, Y's may be bonded to each other and may form, for example, a tricycle such as an anthracene ring or a phenanthrene ring with a naphthalene ring directly bonded to $Y^1$ and $Y^2$. In a case where Y's are bonded to each other to form a ring structure, it is not necessary that a plurality of $Y^2$'s, $Y^3$'s or $Y^4$'s are present as substituents other than $Y^1$. In addition, $Y^2$ to $Y^4$ are not necessarily present. The same shall be applied to a case where $Y^2$'s, $Y^3$'s, or $Y^4$'s are bonded to each other to form a ring structure.

p and s each independently represent an integer of 0 to 3, preferably 0 or 1, and more preferably 0.

q and r each independently represent an integer of 0 to 2, preferably 0 or 1, and more preferably 0.

Specific examples of the squarylium compound include the following compounds. Other examples of the squarylium compound include a compound described in paragraphs "0044" to "0049" of JP2011-208101A, the content of which is incorporated herein by reference.

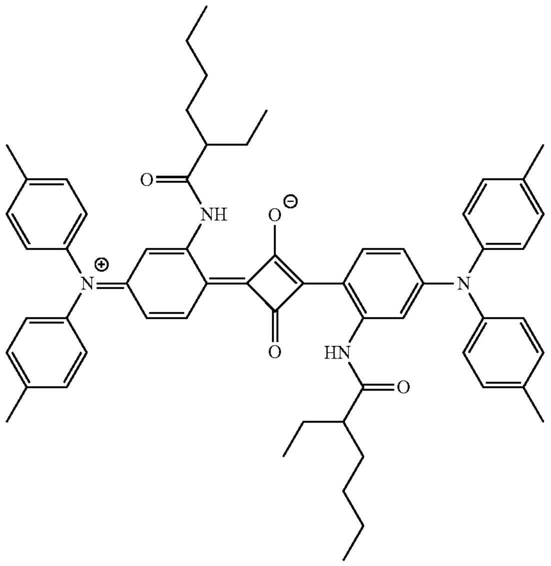

-continued

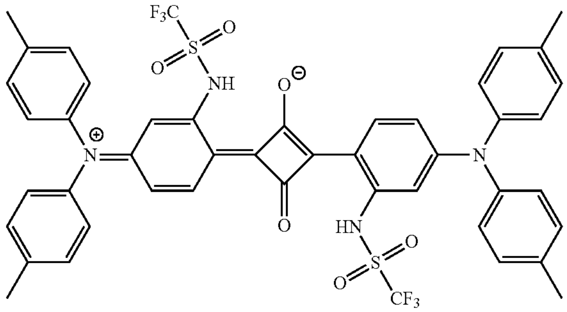

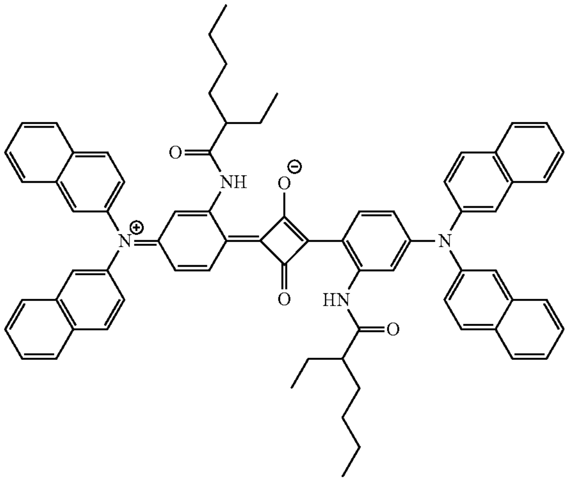

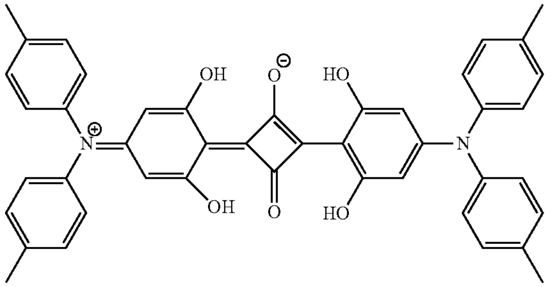

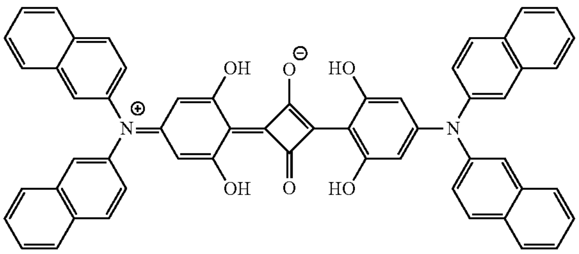

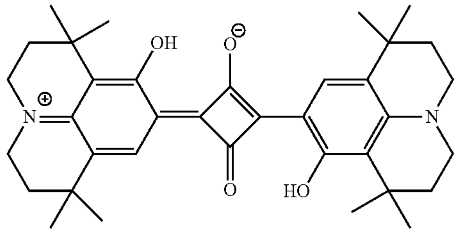

-continued
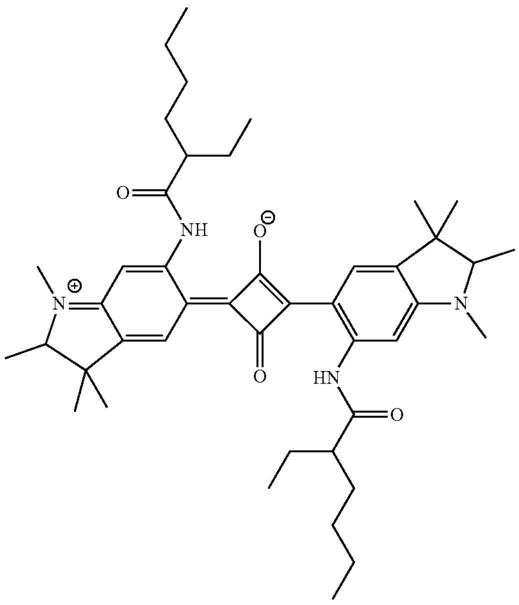
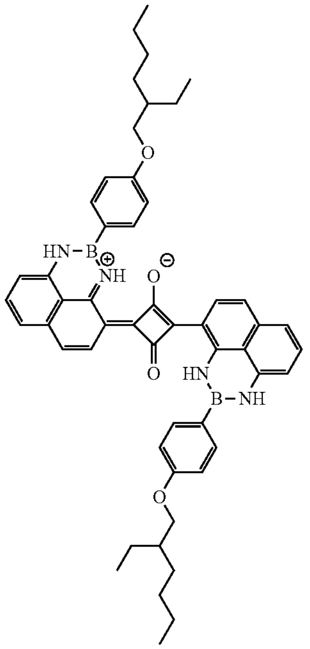
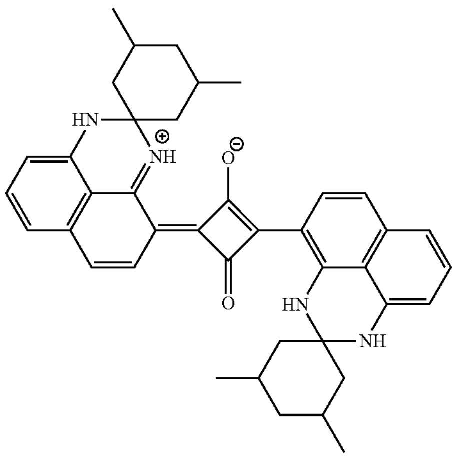
-continued
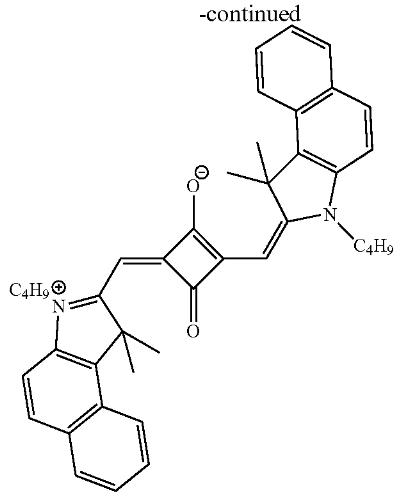
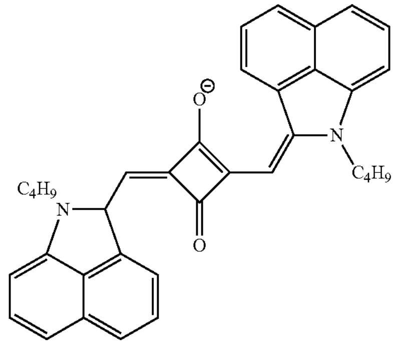
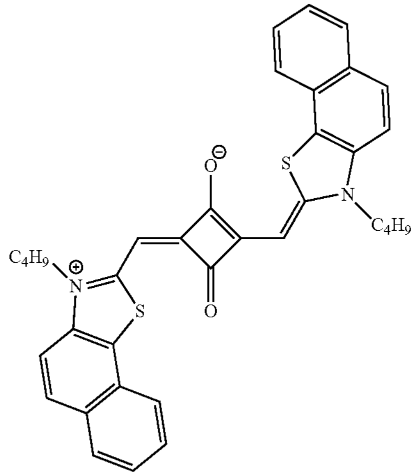
(Cyanine Compound)
It is preferable that the cyanine compound used as the near infrared absorbing compound A is a compound represented by Formula (C).
Formula (C)
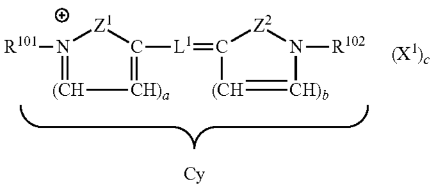

In Formula (C), $Z^1$ and $Z^2$ each independently represent a non-metal atomic group for forming a 5- or 6-membered nitrogen-containing heterocycle which may be fused.

$R^{101}$ and $R^{102}$ each independently represent an alkyl group, an alkenyl group, an alkynyl group, an aralkyl group, or an aryl group.

$L^1$ represents a methine chain including an odd number of methine groups.

a and b each independently represent 0 or 1.

In a case where a represents 0, a carbon atom and a nitrogen atom are bonded through a double bond. In a case where b represents 0, a carbon atom and a nitrogen atom are bonded through a single bond.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

In Formula (C), $Z^1$ and $Z^2$ each independently represent a non-metal atomic group for forming a 5- or 6-membered nitrogen-containing heterocycle which may be fused. Another heterocycle, an aromatic ring, or an aliphatic ring may be fused to the nitrogen-containing heterocycle. It is preferable that the nitrogen-containing heterocycle is a 5-membered ring. A structure in which a benzene ring or a naphthalene ring is fused to the 5-membered nitrogen-containing heterocycle is more preferable. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazol ring, an indolenine ring, a benzoindolenine ring, an imidazole ring, a benzimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, a benzothiazole ring, or a benzimidazole ring is preferable, and an indolenine ring, a benzothiazole ring, or a benzimidazole ring is more preferable. The nitrogen-containing heterocycle and a ring fused thereto may have a substituent. Examples of the substituent include the substituents described above regarding Formula (SQ).

In Formula (C), $R^{101}$ and $R^{102}$ each independently represent an alkyl group, an alkenyl group, an alkynyl group, an aralkyl group, or an aryl group.

The number of carbon atoms in the alkyl group is preferably 1 to 20, more preferably 1 to 12, and still more preferably 1 to 8. The alkyl group may be linear, branched, or cyclic.

The number of carbon atoms in the alkenyl group is preferably 2 to 20, more preferably 2 to 12, and still more preferably 2 to 8. The alkenyl group may be linear, branched, or cyclic.

The number of carbon atoms in the alkynyl group is preferably 2 to 20, more preferably 2 to 12, and still more preferably 2 to 8. The alkynyl group may be linear, branched, or cyclic.

The number of carbon atoms in the aryl group is preferably 6 to 25, more preferably 6 to 15, and still more preferably 6 to 10. The aryl group may be unsubstituted or may have a substituent.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The alkyl group, the alkenyl group, the alkynyl group, the aralkyl group, and the aryl group may have a substituent or may be unsubstituted. Examples of the substituent include a halogen atom, a hydroxyl group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt.

In Formula (C), $L^1$ represents a methine chain including an odd number of methine groups. $L^1$ represents a methine chain including 3, 5, or 7 methine groups.

The methine group may have a substituent. It is preferable that the methine group having a substituent is a methine group positioned at the center (meso position). Specific examples of the substituent include a substituent which may be included in the nitrogen-containing heterocycle represented by $Z^1$ and $Z^2$, and a group represented by Formula (a). In addition, two substituents in the methine chain may be bonded to each other to form a 5-membered or 6-membered ring.

(a)

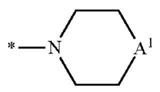

In Formula (a), * represents a linking portion to the methine chain, and A represents an oxygen atom or a sulfur atom.

In Formula (C), a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (C) will be shown below.

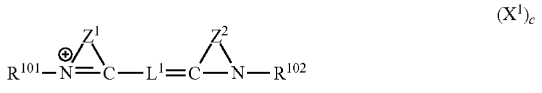

In a case where a site represented by Cy in Formula (C) is a cation site, $X^1$ represents an anion, and c represents the number of $X^1$'s for balancing charge. Examples of the anion include an halide ion ($Cl^-$, $Br^-$, $I^-$), a p-toluenesulfonate ion, an ethyl sulfate ion, $PF_6^-$, $BF_4^-$ or $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyano borate anion.

In a case where a site represented by Cy in Formula (C) is an anion site, $X^1$ represents a cation, and c represents the number of $X^1$'s for balancing charge. Examples of the cation include an alkali metal ion (for example, $Li^+$, $Na^+$, or $K^+$), an alkali earth metal ion ($Mg^{2+}$, $Ca^{2+}$, $Ba^{2+}$, or $Sr^{2+}$), a transition metal ion (for example, $Ag^+$, $Fe^{2+}$, $Co^{2+}$, $Ni^{2+}$, $Cu^{2+}$, or $Zn^{2+}$), other metal ions (for example, $Al^{3+}$), an ammonium ion, a triethylammonium ion, a tributylammonium ion, a pyridinium ion, a tetrabutylammonium ion, a guanidinium ion, a tetramethylguanidinium ion, and diazabicycloundecenium. As the cation, $Na^+$, $K^+$, $Mg^{2+}$, $Ca^{2+}$, $Zn^{2+}$, or diazabicycloundecenium is preferable.

In a case where charge of a site represented by Cy in Formula (C) is neutralized in a molecule, $X^1$ is not present. That is, c represents 0.

It is preferable that the cyanine compound is a compound represented by any one of the following Formulae (C-1) to (C-3).

(C-1)

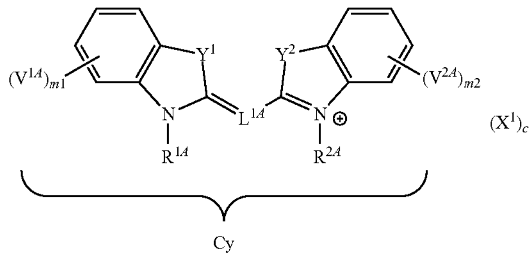

(C-2)

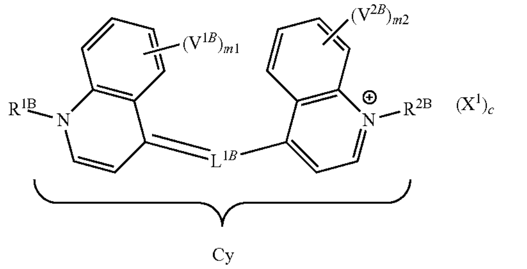

(C-3)

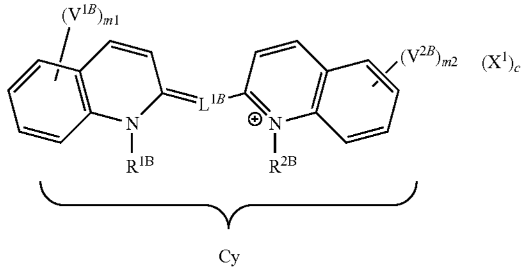

In the formulae, $R^{1A}$, $R^{2A}$, $R^{1B}$, and $R^{2B}$ each independently represent an alkyl group, an alkenyl group, an alkynyl group, an aralkyl group, or an aryl group.

$L^{1A}$ and $L^{1B}$ each independently represent a methine chain including an odd number of methine groups.

$Y^1$ and $Y^2$ each independently represent —S—, —O—, —$NR^{X1}$— or, —$CR^{X2}R^{X3}$—.

$R^{X1}$, $R^{X2}$, and $R^{X3}$ each independently represent a hydrogen atom or an alkyl group.

$V^{1A}$, $V^{2A}$, $V^{1B}$, and $V^{2B}$ each independently represent a substituent.

m1 and m2 each independently represent 0 to 4.

In a case where a site represented by Cy in the formula is a cation site, $X^1$ represents an anion, and c represents the number of $X^1$'s for balancing charge.

In a case where a site represented by Cy in the formula is an anion site, $X^1$ represents a cation, and c represents the number of $X^1$'s for balancing charge.

In a case where charge of a site represented by Cy is neutralized in a molecule, $X^1$ is not present.

The groups represented by $R^{1A}$, $R^{2A}$, $R^{1B}$, and $R^{2B}$ have the same definitions and the same preferable ranges as those of the alkyl group, the alkenyl group, the alkynyl group, the aralkyl group, and the aryl group described regarding $R^{101}$ and $R^{102}$ of Formula (C). These groups may be unsubstituted or may have a substituent. Examples of the substituent include a halogen atom, a hydroxyl group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt. In a case where $R^{A}$, $R^{2A}$, $R^{1B}$, and $R^{2B}$ represent an alkyl group, it is more preferable that the alkyl group is linear.

$Y^1$ and $Y^2$ each independently represent —S—, —O—, —$NR^{X1}$— or, —$CR^{X2}R^{X3}$— and preferably —$NR^{X1}$—. $R^{X1}$, $R^{X2}$, and $R^{X3}$ each independently represent a hydrogen atom or an alkyl group and preferably an alkyl group. The number of carbon atoms in the alkyl group is preferably 1 to 10, more preferably 1 to 5, and still more preferably 1 to 3. The alkyl group may be linear, branched, or cyclic and is preferably linear or branched and more preferably linear. The alkyl group is still more preferably a methyl group or an ethyl group.

$L^{1A}$ and $L^{1B}$ have the same definitions and the same preferable ranges as those of $L^1$ in Formula (C).

Examples of the substituent represented by $V^{1A}$, $V^{2A}$, $V^{1B}$, and $V^{2B}$ include the substituents described regarding Formula (SQ), and preferable ranges thereof are also the same.

m1 and m2 each independently represent 0 to 4 and preferably 0 to 2.

The anion and the cation represented by X1 have the same range and definitions and the same preferable ranges as those described regarding $X^1$ in Formula (C).

Specific examples of the cyanine compound include the following compounds. Other examples of the cyanine compound include compound described in JP2015-172004A and JP2015-172102A.

Cy-1

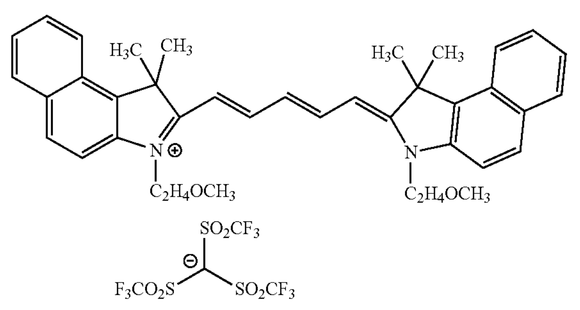

Cy-2

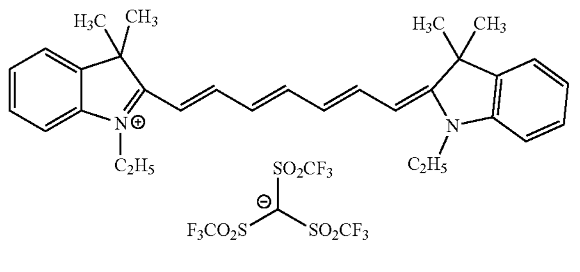

-continued
Cy-3
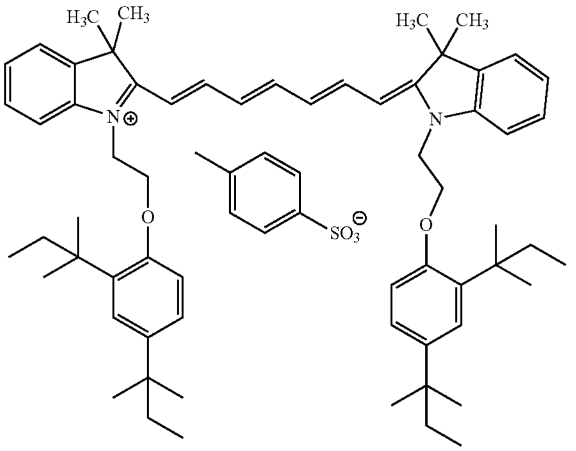
Cy-4
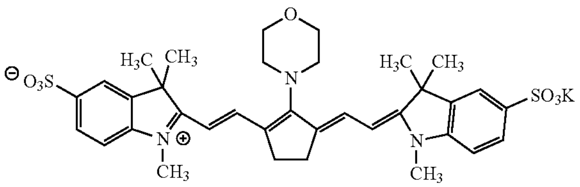
Cy-5
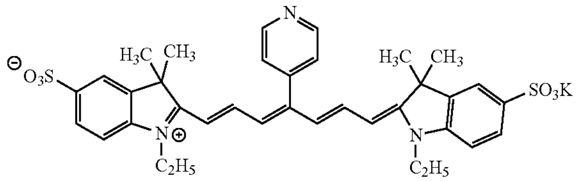
Cy-6
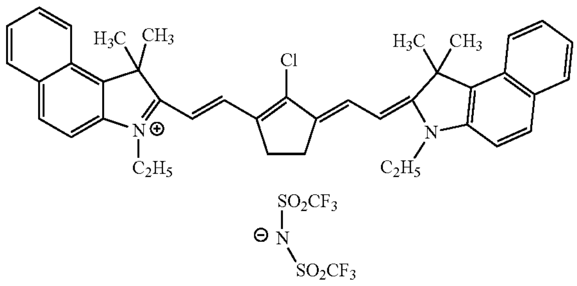
Cy-7
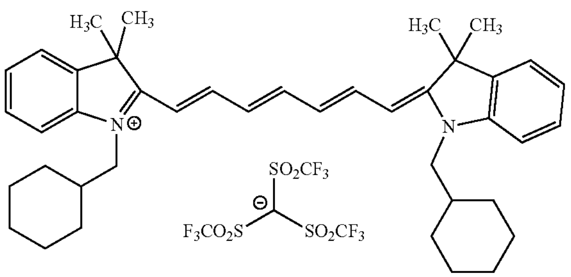
-continued
Cy-8
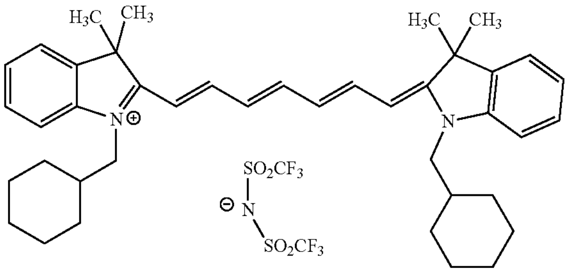
Cy-9
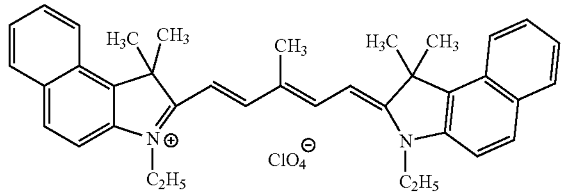
Cy-10
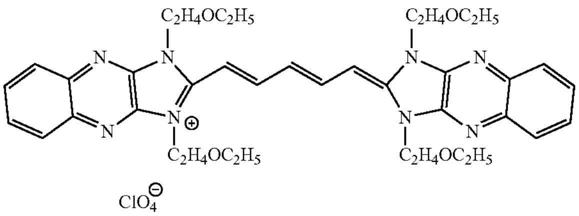
Cy-11
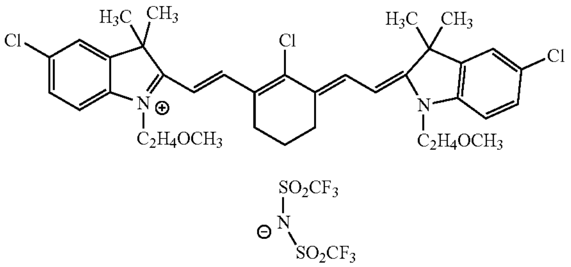
Cy-12
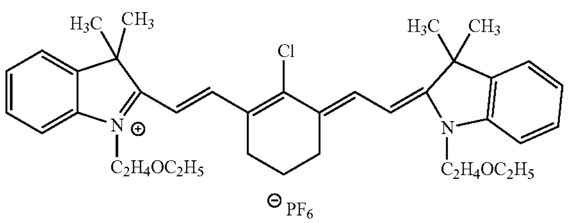
Cy-13
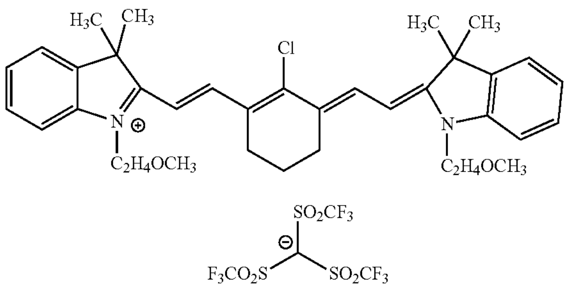

-continued

Cy-14

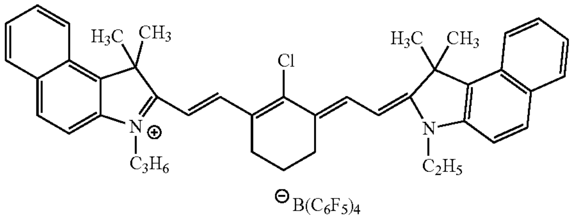

Cy-15

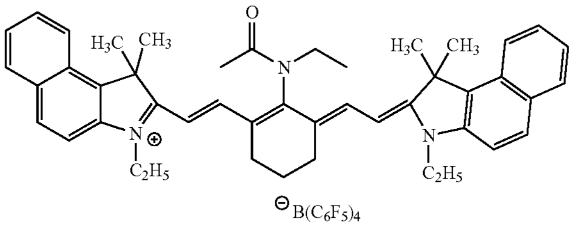

Cy-16

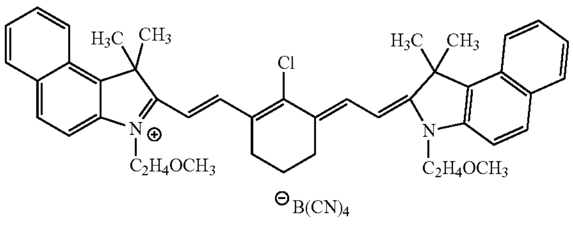

Cy-17

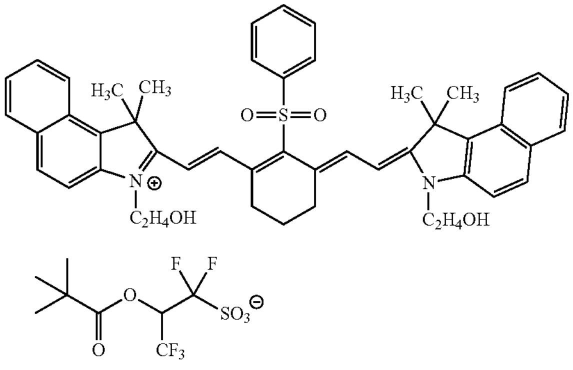

<<Other Near Infrared Absorbing Compounds>>

The composition may further include near infrared absorbing compounds (also referred to as "other near infrared absorbing compounds) other than the near infrared absorbing compound A.

Examples of the other near infrared absorbing compounds include a copper compound, a cyanine compound, a squarylium compound, a phthalocyanine compound, a naphthalocyanine compound, a rylene compound, a merocyanine compound, a croconium compound, an oxonol compound, a diimmonium compound, a dithiol compound, a triarylmethane compound, a pyrromethene compound, an azomethine compound, an anthraquinone compound, and a dibenzofuranone compound.

It is preferable that the copper compound is a copper complex. As the copper complex, a copper complex represented by the following Formula (Cu-1) can be used. This copper complex is a copper compound in which a ligand L is coordinated to copper as central metal, and the copper is typically divalent copper. For example, the copper complex can be obtained, for example, by mixing, reaction, or the like of a compound which forms the ligand L or a salt thereof with a copper component.

$$Cu(L)_{n1}\cdot(X)_{n2} \qquad \text{Formula (Cu-1)}$$

In the formula, L represents a ligand coordinated to copper, and X represents a counter ion. n1 represents an integer of 1 to 4. n2 represents an integer of 0 to 4.

X represents a counter ion. The copper compound site may be a neutral complex having no charge, a cationic complex, or an anionic complex. In this case, optionally, a counter ion is present to neutralize the charge of the copper compound.

In a case where the counter ion is a negative counter ion (counter anion), for example, the counter anion may be an inorganic anion or an organic anion. Specific examples include a hydroxide ion, a halogen anion (for example, a fluoride ion, a chloride ion, a bromide ion, or an iodide ion), a substituted or unsubstituted alkylcarboxylate ion (for example, an acetate ion or a trifluoroacetate ion), a substituted or unsubstituted arylcarboxylate ion (for example, a benzoate ion), a substituted or unsubstituted alkylsulfonate ion (for example, a methanesulfonate ion, a trifluoromethanesulfonate ion), a substituted or unsubstituted arylsulfonate ion (for example, a p-toluenesulfonate ion or a p-chlorobenzenesulfonate ion), an aryldisulfonate ion (for example, a 1,3-benzenedisulfonate ion, a 1,5-naphthalenedisulfonate ion, or an 2,6-naphthalenedisulfonate ion), an alkylsulfate ion (for example, a methylsulfate ion), a sulfate ion, a thiocyanate ion, a nitrate ion, a perchlorate ion, a tetrafluoroborate ion, a tetraarylborate ion, a tetrakis(pentafluorophenyl)borate ion ($B^-(C_6F_5)_4$), a hexafluorophosphate ion, a picrate ion, an amide ion (including amide substituted with an acyl group or a sulfonyl group), and a methide ion (including a methide substituted with an acyl group or a sulfonyl group). Among these, a halogen anion, a substituted or unsubstituted alkylcarboxylate ion, a sulfate ion, a nitrate ion, a tetrafluoroborate ion, a tetraarylborate ion, a hexafluorophosphate ion, an amide ion (including amide substituted with an acyl group or a sulfonyl group), a methide ion (including a methide ion substituted with an acyl group or a sulfonyl group) is preferable.

The counter anion is preferably a low nucleophilic anion. The low nucleophilic anion is an anion obtained by dissociation of a proton with an acid having a low pKa value generally called super acid. Although the definition thereof varies depending on documents, super acid is a generic term for acid having a lower pKa value than methanesulfonic acid. For example, a structure described in J. Org. Chem. 2011, 76, 391-395, Equilibrium Acidities of Super Acids is known. For example, the pKa value of the low nucleophilic anion is preferably −11 or lower and more preferably −11 to −18. The pKa value can be measured using a method described in, for example, J. Org. Chem. 2011, 76, 391-395. In this case, a pKa value refers to a value in 1,2-dichloroethane unless specified otherwise.

As the low nucleophilic anion, a tetrafluoroborate ion, a tetraarylborate ion (including a tetraarylborate ion having an aryl group which is substituted with a halogen atom or a fluoroalkyl group as an alkyl group), a hexafluorophosphate ion, an imide ion (including imide substituted with an acyl group or a sulfonyl group), a methide ion (including a methide ion which is substituted with an acyl group or a sulfonyl group) is more preferable, and a tetraarylborate ion, an imide ion, a methide ion is still more preferable.

In a case where the counter ion is a positive counter ion (counter cation), examples of the positive counter ion include an inorganic or organic ammonium ion (for example, a tetraalkylammonium ion such as a tetrabutylammonium ion, a triethylbenzylammonium ion, or a pyridinium ion), a phosphonium ion (for example, a tetraalkylphosphonium ion such as a tetrabutylphosphonium ion, an alkyltriphenylphosphonium ion, or a triethylphenylphosphonium ion), an alkali metal ion, and a proton.

In addition, the counter ion may be a metal complex ion. In particular, the counter ion may be a salt of a copper complex, that is, a cationic copper complex or an anionic copper complex.

The ligand L is a compound having a coordination site coordinated to copper, and examples thereof include a compound having one or more selected from the group consisting of a coordination site coordinated to copper by an anion and a coordinating atom coordinated to copper by an unshared electron pair. The coordination site coordinated by an anion may or may not be dissociable. As the ligand L, a compound (multidentate ligand) having two or more coordination sites coordinated to copper is preferable. In addition, in order to improve visible transparency, it is preferable that a plurality of π-conjugated systems such as aromatic compounds are not continuously bonded to each other in the ligand L. As the ligand L, a compound (monodentate ligand) having one coordination site coordinated to copper and a compound (multidentate ligand) having two or more coordination sites coordinated to copper can also be used in combination. Examples of the monodentate ligand include a monodentate ligand coordinated by an anion or an unshared electron pair. Examples of the ligand coordinated by an anion include a halide anion, a hydroxide anion, an alkoxide anion, a phenoxide anion, an amide anion (including amide substituted with an acyl group or a sulfonyl group), an imide anion (including imide substituted with an acyl group or a sulfonyl group), an anilide anion (including anilide substituted with an acyl group or a sulfonyl group), a thiolate anion, a hydrogen carbonate anion, a carboxylate anion, a thiocarboxylate anion, a dithiocarboxylate anion, a hydrogen sulfate anion, a sulfonate anion, a dihydrogen phosphate anion, a phosphoric acid diester anion, a phosphonic acid monoester anion, a hydrogen phosphonate anion, a phosphinate anion, a nitrogen-containing heterocyclic anion, a nitrate anion, a hypochlorite anion, a cyanide anion, a cyanate anion, an isocyanate anion, a thiocyanate anion, an isothiocyanate anion, and an azide anion. Examples of the monodentate ligand coordinated by an unshared electron pair include water, alcohol, phenol, ether, amine, aniline, amide, imide, imine, nitrile, isonitrile, thiol, thioether, a carbonyl compound, a thiocarbonyl compound, sulfoxide, a heterocyclic ring, carbonic acid, carboxylic acid, sulfuric acid, sulfonic acid, phosphoric acid, phosphonic acid, phosphinic acid, nitric acid, and an ester thereof.

It is preferable that the copper complex includes a compound (hereinafter, also referred to as "compound (A)") having at least two coordination sites as a ligand. The number of coordination sites in the compound (A) is more preferably at least 3, and still more preferably 3 to 5. The compound (A) acts as a chelating ligand to a copper component. That is, it is presumed that, by at least two coordinating atoms in the compound (A) being chelating-coordinated to copper, the structure of the copper complex is distorted, high transmittance in a visible range can be obtained, infrared absorption capability can be improved, and a color value can also be improved. The copper complex may include two or more compounds (A). In a case where the copper complex includes two or more compounds (A), the compounds (A) may be the same as or different from each other. Examples of the coordination site in the compound (A) include a coordination site coordinated by an anion and a coordination site coordinated by an unshared electron pair. The copper complex may be tetradentate-coordinated, pentadentate-coordinated, or hexadentate-coordinated, more preferably tetradentate-coordinated or pentadentate-coordinated, and still more preferably pentadentate-coordinated. In addition, in the copper complex, it is preferable that copper and the ligand form a 5-membered ring and/or a 6-membered ring. This copper complex is stable in shape and has excellent complex stability.

The copper complex can be obtained by mixing and/or reaction of the compound (A) with a copper component (copper or a compound including copper). It is preferable that the copper component is a compound including divalent copper. As the copper component, one kind may be used alone, or two or more kinds may be used in combination.

As the copper component, for example, copper oxide or a copper salt can be used. As the copper salt, for example, copper carboxylate (for example, copper acetate, copper ethylacetoacetate, copper formate, copper benzoate, copper stearate, copper naphthenate, copper citrate, or copper 2-ethylhexanoate), copper sulfonate (for example, copper methanesulfonate), copper phosphate, copper phosphoric acid ester, copper phosphonate, copper phosphonic acid ester, copper phosphinate, copper amide, copper sulfone amide, copper imide, copper acyl sulfone imide, copper bissulfone imide, copper methide, alkoxy copper, phenoxy copper, copper hydroxide, copper carbonate, copper sulfate, copper nitrate, copper perchlorate, copper fluoride, copper chloride, copper bromide is preferable, copper carboxylate, copper sulfonate, copper sulfone amide, copper imide, copper acyl sulfone imide, copper bissulfone imide, alkoxy copper, phenoxy copper, copper hydroxide, copper carbonate, copper fluoride, copper chloride, copper sulfate, copper nitrate, is more preferable, copper carboxylate, copper acyl sulfone imide, phenoxy copper, copper chloride, copper sulfate, copper nitrate is still more preferable, and copper carboxylate, copper acyl sulfone imide, copper chloride, copper sulfate is even still more preferable. A molar ratio (compound (A): copper component) of the amount of the compound (A) to the amount of the copper component which is caused to react with the compound is preferably 1:0.5 to 1:8 and more preferably 1:0.5 to 1:4. In addition, when the copper component and the compound (A) are caused to react with each other, for example, it is preferable that reaction conditions are 20° C. to 100° C. and 0.5 hours or longer.

The copper complex may include a ligand other than the compound (A). Examples of the ligand other than the compound (A) include a monodentate ligand coordinated by an anion or an unshared electron pair. Examples of the ligand coordinated by an anion include a halide anion, a hydroxide anion, an alkoxide anion, a phenoxide anion, an amide anion (including amide substituted with an acyl group or a sulfonyl group), an imide anion (including imide substituted with an acyl group or a sulfonyl group), an anilide anion (including anilide substituted with an acyl group or a sulfonyl group), a thiolate anion, a hydrogen carbonate anion, a carboxylate anion, a thiocarboxylate anion, a dithiocarboxylate anion, a hydrogen sulfate anion, a sulfonate anion, a dihydrogen phosphate anion, a phosphoric acid diester anion, a phosphonic acid monoester anion, a hydrogen phosphonate anion, a phosphinate anion, a nitrogen-containing heterocyclic anion, a nitrate anion, a hypochlorite anion, a cyanide anion, a cyanate anion, an isocyanate anion, a thiocyanate anion, an isothiocyanate anion, and an azide anion. Examples of the monodentate ligand coordinated by an unshared electron pair include water, alcohol, phenol, ether, amine, aniline, amide, imide, imine, nitrile, isonitrile, thiol, thioether, a carbonyl compound, a thiocarbonyl compound, sulfoxide, a heterocyclic ring, carbonic acid, carboxylic acid, sulfuric acid, sulfonic acid, phosphoric acid, phosphonic acid, phosphinic acid, nitric acid, and an ester thereof. The kind and number of monodentate ligands can be appropriately selected according to the compound (A) coordinated to the copper complex.

Depending on the number of coordination sites coordinated by an anion, the copper complex may be a neutral complex having no charge, a cationic complex, or an anionic complex. In this case, optionally, a counter ion is present to neutralize the charge of the copper complex. In a case where the counter ion is a negative counter ion, for example, the counter ion may be an inorganic anion or an organic anion. Specific examples include a hydroxide ion, a halogen anion (for example, a fluoride ion, a chloride ion, a bromide ion, or an iodide ion), a substituted or unsubstituted alkylcarboxylate ion (for example, an acetate ion or a trifluoroacetate ion), a substituted or unsubstituted arylcarboxylate ion (for example, a benzoate ion), a substituted or unsubstituted alkylsulfonate ion (for example, a methanesulfonate ion, a trifluoromethanesulfonate ion), a substituted or unsubstituted arylsulfonate ion (for example, a p-toluenesulfonate ion or a p-chlorobenzenesulfonate ion), an aryldisulfonate ion (for example, a 1,3-benzenedisulfonate ion, a 1,5-naphthalenedisulfonate ion, or an 2,6-naphthalenedisulfonate ion), an alkylsulfate ion (for example, a methylsulfate ion), a sulfate ion, a thiocyanate ion, a nitrate ion, a perchlorate ion, a tetrafluoroborate ion, a tetraarylborate ion, a hexafluorophosphate ion, a picrate ion, an amide ion (including amide substituted with an acyl group or a sulfonyl group), and a methide ion (including a methide substituted with an acyl group or a sulfonyl group). Among these, a halogen anion, a substituted or unsubstituted alkylcarboxylate ion, a sulfate ion, a nitrate ion, a tetrafluoroborate ion, a tetraarylborate ion, a hexafluorophosphate ion, an amide ion (including amide substituted with an acyl group or a sulfonyl group), a methide ion (including a methide substituted with an acyl group or a sulfonyl group) is preferable. In a case where the counter ion is a positive counter ion, examples of the positive counter ion include an inorganic or organic ammonium ion (for example, a tetraalkylammonium ion such as a tetrabutylammonium ion, a triethylbenzylammonium ion, or a pyridinium ion), a phosphonium ion (for example, a tetraalkylphosphonium ion such as a tetrabutylphosphonium ion, an alkyltriphenylphosphonium ion, or a triethylphenylphosphonium ion), an alkali metal ion, and a proton. In addition, the counter ion may be a metal complex ion.

As the copper complex, for example, the following aspects (1) to (5) are preferable, the aspects (2) to (5) are more preferable, the aspects (3) to (5) are still more preferable, and the aspect (4) is even still more preferable.

(1) a copper complex which includes one or two compounds having two coordination sites as a ligand (2) a copper complex which includes a compound having three coordination sites as a ligand (3) a copper complex which includes a compound having three coordination sites and a compound having two coordination sites as a ligand (4) a copper complex which includes a compound having four coordination sites as a ligand (5) a copper complex which includes a compound having five coordination sites as a ligand Specific examples of the copper complex are as follows. In addition, as the copper complex, copper complexes described in paragraphs "0013" to "0056" of JP2014-41318A and paragraphs "0012" to "0030" of JP2014-32380A may be used, the content of which is incorporated herein by reference.

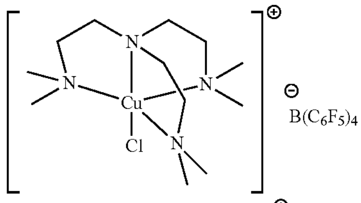

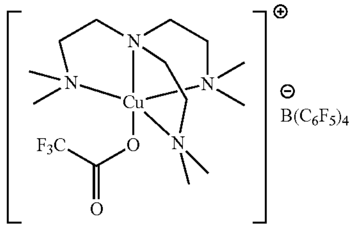

In addition, as the other near infrared absorbing compound, inorganic particles can also be used. As the inorganic particles, metal oxide particles or metal particles are preferable from the viewpoint of further improving infrared shielding properties. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. The shape of the inorganic particles is not particularly limited and may have a sheet shape, a wire shape, or a tube shape irrespective of whether or not the shape is spherical or non-spherical.

In addition, as the inorganic particles, a tungsten oxide compound can be used. Specifically, a tungsten oxide compound represented by the following Formula (compositional formula) (W-1) is more preferable.

$$M_xW_yO_z \quad \text{(W-1)}$$

M represents metal, W represents tungsten, and O represents oxygen.

$0.001 \leq x/y \leq 1.1$ $2.2 \leq z/y \leq 3.0$

Examples of the metal represented by M include an alkali metal, an alkali earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi. Among these, an alkali metal is preferable, Rb or Cs is more preferable, and Cs is still more preferable. As the metal represented by M, one kind or two or more kinds may be used.

By adjusting x/y to be 0.001 or higher, infrared light can be sufficiently shielded. By adjusting x/y to be 1.1 or lower, production of an impurity phase in the tungsten oxide compound can be reliably avoided.

By adjusting z/y to be 2.2 or higher, chemical stability as a material can be further improved. By adjusting z/y to be 3.0 or lower, infrared light can be sufficiently shielded.

Specific examples of the tungsten oxide compound include $Cs_{0.33}WO_3$, $Rb_{0.33}WO_3$, $K_{0.33}WO_3$, and $Ba_{0.33}WO_3$. Among these, $Cs_{0.33}WO_3$ or $Rb_{0.33}WO_3$ is preferable, and $Cs_{0.33}WO_3$ is more preferable.

The tungsten oxide compound is available in the form of, for example, a dispersion of tungsten particles such as YMF-02 (manufactured by Sumitomo Metal Mining Co., Ltd.).

The average particle size of the inorganic particles is preferably 800 nm or less, more preferably 400 nm or less, and still more preferably 200 nm or less. By adjusting the average particle size of the inorganic particles to be in the above-described range, transmittance in a visible range can be reliably improved. From the viewpoint of avoiding light scattering, it is preferable that the average particle size of the inorganic particles is as small as possible. Due to the reason of handleability during manufacturing or the like, the average particle size of the inorganic particle is typically 1 nm or more.

The content of the other near infrared absorbing compounds is preferably 0.01 to 50 mass % with respect to the total solid content of the composition. The lower limit is preferably 0.1 mass % or higher and more preferably 0.5 mass % or higher. The upper limit is preferably 30 mass % or lower, and more preferably 15 mass % or lower.

<<Chromatic Colorant>>

The composition may include achromatic colorant. In the present invention, "chromatic colorant" denotes a colorant other than a white colorant and a black colorant. It is preferable that the chromatic colorant is a colorant having an absorption maximum in a wavelength range of 400 nm or longer and shorter than 650 nm.

As the chromatic colorant, a pigment or a dye may be used. It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment. In addition, regarding a particle size distribution of the secondary particles of the pigment (hereinafter, simply referred to as "particle size distribution") which can be used, it is preferable that secondary particles having a particle size of (average particle size±100) nm account for 70 mass % or higher, preferably, 80 mass % or higher in the pigment. The particle size distribution of the secondary particles can be measured using a scattering intensity distribution. The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

The pigment is preferably an organic pigment, and examples thereof are as follows. However, the present invention is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In a case where the composition includes a chromatic colorant, the content of the chromatic colorant is preferably 0.1 to 70 mass % with respect to the total solid content of the composition. The lower limit is preferably 0.5 mass % or higher and more preferably 1.0 mass % or higher. The upper limit is preferably 60 mass % or lower, and more preferably 50 mass % or lower.

The content of the chromatic colorant is preferably 10 to 1000 parts by mass and more preferably 50 to 800 parts by mass with respect to 100 parts by mass of the near infrared absorbing compound A.

In addition, the total content of the chromatic colorant and the near infrared absorbing compound A is preferably 1 to 80 mass % with respect to the total solid content of the composition according to the present invention. The lower limit is preferably 5 mass % or higher and more preferably 10 mass % or higher. The upper limit is preferably 70 mass % or lower, and more preferably 60 mass % or lower.

In a case where the composition includes two or more chromatic colorants, it is preferable that the total content of the two or more chromatic colorants is in the above-described range.

<<Coloring Material that Allows Transmission of at Least Part of Light in Infrared Range and Shields Light in Visible Range (Coloring Material that Shields Visible Light)>>

The composition may include a coloring material that shields visible light. The content of a pigment in the coloring material that shields visible light is preferably 90 mass % or higher, more preferably 95 mass % or higher, and still more preferably 99 mass % or higher with respect to the total mass of coloring material that shields visible light. In addition, it is preferable that black, gray, or a color similar to black or gray is exhibited using a combination of a plurality of coloring materials that shields visible light. In addition, it is preferable that the coloring material that shields visible light is a material that absorbs light in a wavelength range of violet to red. In addition, it is preferable that the coloring material that shields visible light is a coloring material that shields light in a wavelength range of 450 to 650 nm.

It is preferable that the coloring material that shields visible light satisfies at least one of the following requirement (1) or (2), and it is more preferable that the coloring material that shields visible light satisfies the requirement (1).

(1): An aspect in which the coloring material that shields visible light includes two or more chromatic colorants (2): An aspect in which the coloring material that shields visible light includes an organic black colorant In addition, in the present invention, the organic black colorant as the coloring material that shields visible light denotes a material that absorbs light in a visible range and allows transmission of at least a part of light in an infrared range. Accordingly, in the present invention, the organic black colorant as the coloring material that shields visible light does not denote a black colorant that absorbs both light in an infrared range and light in a visible range, for example, carbon black or titanium black.

Examples of the chromatic colorant are as described above. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-34664A (JP-H2-34664A). For example, "CHROMOFINE BLACK A1103" (manufactured by Dainichiseika Color & Chemicals Mfg. Co., Ltd.) is available.

It is preferable that the coloring material that shields visible light is a material in which a ratio A/B of a minimum value A of an absorbance in a wavelength range of 450 to 650 nm to a minimum value B of an absorbance in a wavelength range of 900 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants.

In a case where the coloring material that shields visible light includes two or more chromatic colorants, the chromatic colorants are selected from the group consisting of a red colorant, a green colorant, a blue colorant, a yellow colorant, a violet colorant, and an orange colorant.

In a case where the coloring material that shields visible light is formed using a combination of two or more chromatic colorants, examples of the combination of chromatic colorants are as follows.

(1) An aspect in which the coloring material that shields visible light includes a yellow colorant, a blue colorant, a violet colorant, and a red colorant (2) An aspect in which the coloring material that shields visible light includes a yellow colorant, a blue colorant, and a red colorant (3) An aspect in which the coloring material that shields visible light includes a yellow colorant, a violet colorant, and a red colorant (4) An aspect in which the coloring material that shields visible light includes a yellow colorant and a violet colorant (5) An aspect in which the coloring material that shields visible light includes a green colorant, a blue colorant, a violet colorant, and a red colorant (6) An aspect in which the coloring material that shields visible light includes a violet colorant and an orange colorant (7) An aspect in which the coloring material that shields visible light includes a green colorant, a violet colorant, and a red colorant (8) An aspect in which the coloring material that shields visible light includes a green colorant and a red colorant For example, ratios (mass ratios) between the respective colorants are as follows.

TABLE 55

| No. | Yellow Colorant | Green Colorant | Blue Colorant | Violet Colorant | Red Colorant | Orange Colorant |
|---|---|---|---|---|---|---|
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | 0.2 to 0.8 | | |
| 5 | | 0.1 to 0.4 | 0.1 to 0.4 | 0.1 to 0.4 | 0.1 to 0.4 | |
| 6 | | | | 0.2 to 0.6 | | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

In a case where the composition includes the coloring material that shields visible light, the content of the coloring material that shields visible light is preferably 30 mass % or lower, more preferably 20 mass % or lower, and still more preferably 15 mass % or lower with respect to the total solid content of the composition. The lower limit is, for example, 0.01 mass % or higher or 0.5 mass % or higher.

In addition, the composition may not substantially include the coloring material that shields visible light. The composition substantially not including the coloring material that shields visible light represents that the content of the coloring material that shields visible light is preferably 0.005 mass % or lower, more preferably 0.001 mass % or lower, and still more preferably 0% with respect to the total solid content of the composition.

<<Pigment Derivative>>

In a case where the composition includes a pigment, the composition may further include a pigment derivative. As the pigment derivative, a compound having a structure in which a portion of a pigment is substituted with an acidic group, a basic group, or a phthalimidomethyl group is preferable, and a pigment derivative represented by Formula (B1) is more preferable.

$$P\text{-}(L\text{-}(X)_n)_m \qquad (B1)$$

In Formula (B1), P represents a colorant structure, L represents a single bond or a linking group, X represents an acidic group, and a basic group, a group having a salt structure, or a phthalimido group. m represents an integer of 1 or more, and n represents an integer of 1 or more. In a case where m represents 2 or more, a plurality of L's and X's may be different from each other, and in a case where n represents 2 or more, a plurality of X's may be different from each other.

In Formula (B1), P represents a colorant structure, preferably at least one selected from the group consisting of a pyrrolopyrrole colorant structure, a diketo pyrrolopyrrole colorant structure, a quinacridone colorant structure, an anthraquinone colorant structure, an anthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a perylene colorant structure, a perinone colorant structure, a benzimidazolone colorant structure, a benzothiazole colorant structure, a benzimidazole colorant structure, and a benzoxazole colorant structure, more preferably at least one selected from the group consisting of a pyrrolopyrrole colorant structure, a diketo pyrrolopyrrole colorant structure, a quinacridone colorant structure, and a benzimidazolone colorant structure, and still more preferably a pyrrolopyrrole colorant structure.

In Formula (B1), L represents a single bond or a linking group. The linking group is a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

In Formula (B1), X represents an acidic group, a basic group, a group having a salt structure, or a phthalimido group.

In a case where the composition includes the pigment derivative, the content of the pigment derivative is preferably 1 to 50 parts by mass with respect to 100 parts by mass of the pigment in the composition. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the dispersibility of the pigment can be improved, and aggregation of particles can be effectively suppressed. As the pigment derivative, one kind or two or more kinds may be used. In a case where two or more pigment derivatives are used, it is preferable that the total content of the two or more pigment derivatives is in the above-described range.

<<Curable Compound>>

It is preferable that the composition includes a curable compound. As the curable compound, a well-known compound which is curable by a radical, an acid, or heat can be used. Examples of the crosslinking compound include a compound which has a group having an ethylenically unsaturated bond, a compound having an epoxy group, a compound having a methylol group, and a compound having an alkoxysilyl group. Examples of the group having an ethylenically unsaturated bond include a vinyl group, a (meth)allyl group, a (meth)acryloyl group, and a (meth) acryloyloxy group. Examples of the alkoxysilyl group include a monoalkoxysilyl group, a dialkoxysilyl group, and a trialkoxysilyl group. As the group having an ethylenically unsaturated bond, a (meth)acryloyl group or a (meth)acryloyloxy group is preferable. As the alkoxysilyl group, a dialkoxysilyl group or a trialkoxysilyl group is preferable. In addition, the number of carbon atoms in the alkoxy group of the alkoxysilyl group is preferably 1 to 5, more preferably 1 to 3, and still more preferably 1 or 2.

The curable compound may be in the form of a monomer or a polymer and is preferably a monomer. The molecular weight of the monomer type curable compound is preferably 100 to 3000. The upper limit is preferably 2000 or lower and more preferably 1500 or lower. The lower limit is preferably 150 or higher and more preferably 250 or higher. In addition, it is preferable that the curable compound is a compound substantially not having a molecular weight distribution. Here, the compound substantially not having a molecular weight distribution represent that the dispersity (weight-average molecular weight (Mw)/number-average molecular weight (Mn)) of the compound is preferably 1.0 to 1.5 and more preferably 1.0 to 1.3.

(Compound which has Group Having Ethylenically Unsaturated Bond)

As the curable compound, a compound which has a group having an ethylenically unsaturated bond can be used. It is preferable that the compound which has a group having an ethylenically unsaturated bond is a monomer. The molecular weight of the compound which has a group having an ethylenically unsaturated bond is preferably 100 to 3000. The upper limit is preferably 2000 or lower and more preferably 1500 or lower. The lower limit is preferably 150 or higher and more preferably 250 or higher. The compound which has a group having an ethylenically unsaturated bond is preferably a (meth)acrylate compound having 3 to 15 functional groups and more preferably a (meth)acrylate compound having 3 to 6 functional groups.

Examples of the compound can be found in paragraphs "0033" and "0034" of JP2013-253224A, the content of which is incorporated herein by reference. As the compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth) acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol or a propylene glycol residue is preferable. In addition, oligomers of the above-described examples can be used. In addition, the compound having an ethylenically unsaturated bond can be found in the description of a polymerizable compound in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the content of which is incorporated herein by reference.

In addition, diglycerin ethylene oxide (EO)-modified (meth)acrylate (as a commercially available product, M-460 manufactured by Toagosei Co., Ltd.) is preferable. Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The compound which has a group having an ethylenically unsaturated bond may have an acid group such as a carboxyl group, a sulfo group, or a phosphate group. Examples of the compound having an acid group include an ester of an aliphatic polyhydroxy compound and an unsaturated carboxylic acid. A compound having an acid group obtained by causing a nonaromatic carboxylic anhydride to react with an unreacted hydroxyl group of an aliphatic polyhydroxy compound is preferable. In particular, it is more preferable that, in this ester, the aliphatic polyhydroxy compound is pentaerythritol and/or dipentaerythritol. Examples of a commercially available product of the monomer having an acid group include M-305, M-510, and M-520 of ARONIX series as polybasic acid-modified acrylic oligomer (manufactured by Toagosei Co., Ltd.). The acid value of the compound having an acid group is preferably 0.1 to 40 mgKOH/g. The lower limit is preferably 5 mgKOH/g or higher. The upper limit is preferably 30 mgKOH/g or lower.

In addition, a compound having a caprolactone structure is also preferable as the compound which has a group having an ethylenically unsaturated bond. The compound having a caprolactone structure is not particularly limited as long as it has a caprolactone structure in a molecule. Examples of the compound having a caprolactone structure include ε-caprolactone-modified polyfunctional (meth)acrylate obtained by esterification of a polyhydric alcohol, (meth) acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARADDPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the compound which has a group having an ethylenically unsaturated bond, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having an ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, the compound which has a group having an ethylenically unsaturated bond can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

(Compound Having Epoxy Group)

As the curable compound, a compound having an epoxy group can also be used. Examples of the compound having an epoxy group include a monofunctional or polyfunctional glycidyl ether compound, and a polyfunctional aliphatic glycidyl ether compound. In addition, a compound having a glycidyl group such as glycidyl (meth)acrylate or allyl glycidyl ether, or a compound having an alicyclic epoxy group can also be used.

Examples of the compound having an epoxy group include a compound having one or more epoxy groups in one molecule. In particular, a compound having two or more epoxy groups in one molecule is preferable. The number of epoxy groups in one molecule is preferably 1 to 100. The upper limit is, for example, 10 or less or 5 or less. The lower limit is preferably 2 or more.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecular weight: lower than 2000 or lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and still more preferably 3000 or lower.

As the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference. Regarding the commercially available product, examples of the bisphenol A epoxy resin include jER825, jER827, jER828, jER834, jER1001, jER1002, jER1003, jER1055, jER1007, jER1009, and jER1010 (all of which are manufactured by Mitsubishi Chemical Corporation) and EPICLON860, EPICLON1050, EPICLON1051, and EPICLON1055 (all of which are manufactured by DIC Corporation). Examples of the bisphenol F epoxy resin include jER806, jER807, jER4004, jER4005, jER4007, and jER4010 (all of which are manufactured by Mitsubishi Chemical Corporation), EPICLON830 and EPICLON835 (all of which are manufactured by DIC Corporation), and LCE-21 and RE-602S (all of which are manufactured by Nippon Kayaku Co., Ltd.). Examples of the phenol novolac epoxy resin include jER152, jER154, jER157S70, and jER157S65 (all of which are manufactured by Mitsubishi Chemical Corporation) and EPICLON N-740, EPICLON N-770, and EPICLON N-775 (all of which are manufactured by DIC Corporation). Examples of the cresol novolac epoxy resin include EPICLON N-660, EPICLON N-665, EPICLON N-670, EPICLON N-673, EPICLON N-680, EPICLON N-690, and EPICLON N-695 (all of which are manufactured by DIC Corporation) and EOCN-1020 (manufactured by Nippon Kayaku Co., Ltd.). Examples of the aliphatic epoxy resin include ADEKA RESIN EP-4080S, ADEKA RESIN EP-4085S, and ADEKA RESIN EP-4088S (all of which are manufactured by Adeka Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all of which are manufactured by Daicel Corporation), and DENACOL EX-212L, DENACOL EX-214L, DENACOL EX-216L, DENACOL EX-321L, and DENACOL EX-850L (all of which are manufactured by Nagase ChemteX Corporation). Other examples of the commercially available product include ADEKA RESIN EP-4000S, ADEKA RESIN EP-4003S, ADEKA RESIN EP-4010S, and ADEKA RESIN EP-4011S (all of which are manufactured by Adeka Corporation), NC-2000, NC-3000, NC-7300, XD-1000, EPPN-501, and EPPN-502 (all of which are manufactured by Adeka Corporation), jER1031S (manufactured by Mitsubishi Chemical Corporation), and OXT-221 (manufactured by Toagosei Co., Ltd.).

As the compound having an epoxy group, an unsaturated compound having a glycidyl group such as glycidyl (meth) acrylate or allyl glycidyl ether as an epoxy group can be used, and an unsaturated compound having an alicyclic epoxy group is preferable. Examples of the compound can be found in, for example, paragraph "0045" of JP2009-265518A, the content of which is incorporated herein by reference.

(Compound Having Alkoxysilyl Group)

As the curable compound, a compound having an alkoxysilyl group can also be used. The number of carbon atoms in the alkoxy group of the alkoxysilyl group is preferably 1 to 5, more preferably 1 to 3, and still more preferably 1 or 2. It is preferable that two or more alkoxysilyl groups are present in one molecule, and it is more preferable that two or three alkoxysilyl groups are present in one molecule. Specific examples of the compound having an alkoxysilyl group include methyl trimethoxysilane, dimethyl dimethoxysilane, phenyl trimethoxysilane, methyltriethoxysilane, and dimethyl diethoxysilane, phenyltriethoxysilane, n-propyltrimethoxysilane, n-propyltriethoxysilane, hexyl trimethoxysilane, hexyl triethoxysilane, octyl triethoxysilane, decyl trimethoxysilane, 1,6-bis(trimethoxysilyl)hexane, trifluoropropyltrimethoxysilane, hexamethyldisilazane, vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, and 3-isocyanatepropyltriethoxysilane. In addition to the above-described examples, an alkoxy oligomer can be used. In addition, the following compounds can also be used.

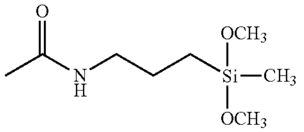

-continued

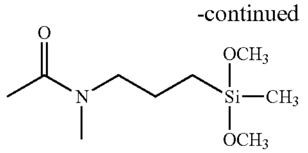

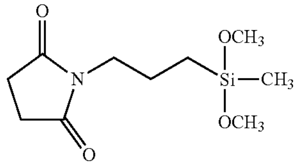

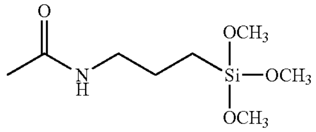

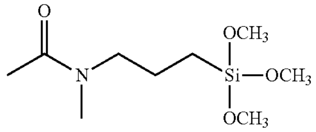

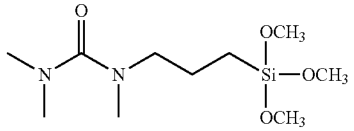

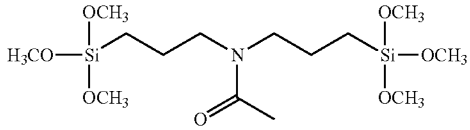

Examples of a commercially available product of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.).

In addition, as the compound having an alkoxysilyl group, a polymer having an alkoxysilyl group at a side chain can also be used.

(Compound Having Methylol Group)

As the curable compound, a compound having a methylol group can also be used. Examples of the compound having a methylol group include a compound in which a methylol group is bonded to a nitrogen atom or a carbon atom which forms an aromatic ring.

As the compound in which a methylol group is bonded to a nitrogen atom, for example, alkoxy methylated melamine, methylolated melamine, alkoxy methylated benzoguanamine, methylolated benzoguanamine, alkoxy methylated glycoluril, methylolated glycoluril, alkoxy methylated urea, or methylolated urea is preferable. In addition, 1,3,4,6-tetramethoxydimethyl glycoluril is also preferable. In addition, the details can be found in paragraphs "0134" to "0147" of JP2004-295116A or paragraphs "0095" to "0126" of JP2014-089408A, the content of which is incorporated herein by reference.

Examples of a preferable structure of the compound having a methylol group include compounds represented by the following Formulae (8-1) to (8-4).

(8-1)

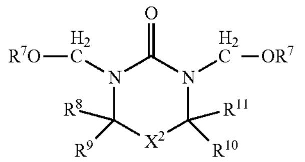

(8-2)

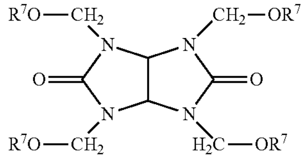

(8-3)

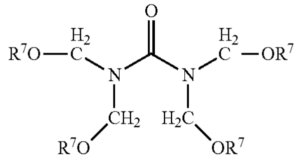

(8-4)

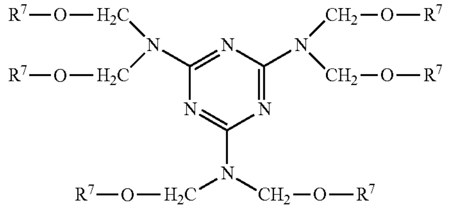

(In Formulae (8-1) to (8-4), $X^2$ represents a divalent organic group, and $R^7$ to $R^{11}$ each independently represents a hydrogen atom or a monovalent organic group.)

Examples of the compound having a methylol group include compounds represented by the following Formulae (4) and (5).

(4)

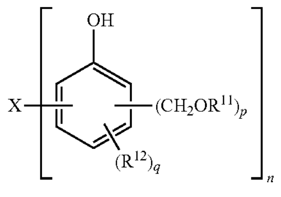

(In Formula (4), X represents a single bond or a monovalent to tetravalent organic group, $R^{11}$ and $R^{12}$ each independently represent a hydrogen atom or a monovalent organic group, n represents an integer of 1 to 4, p and q each independently represent an integer of 0 to 4. In a case where n represents 1, p represents an integer of 1 to 4. In a case where n represents an integer of 2 to 4, p represents an integer of 0 to 4 and includes one or more —$CH_2OR^{11}$'s in Formula (4).)

(5)

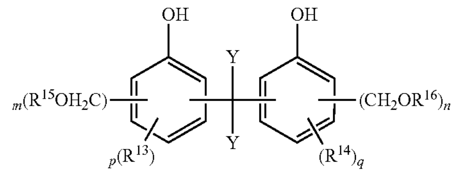

(In Formula (5), two Y's each independently represents a hydrogen atom or an alkyl group having 1 to 10 carbon atoms and may include an oxygen atom or a fluorine atom. $R^{13}$ to $R^{16}$ each independently represent a hydrogen atom or a monovalent organic group. m and n each independently represents an integer of 1 to 3, and p and q each independently represents an integer of 0 to 4.)

Preferable examples of a commercially available product of the compound having a methylol group include: CYMEL 300, 301, 303, 370, 325, 327, 701, 266, 267, 238, 1141, 272, 202, 1156, 1158, 1123, 1170, 1174, UFR65, and 300 (all of which are manufactured by Mitsubishi Cyanamid); and NIKALAC MX-750, -032, -706, -708, -40, -31, -270, -280, -290, -750LM, NIKALAC MS-11, NIKALAC MW-30HM, -100LM, and -390 (all of which are manufactured by Sanwa Chemical Co., Ltd.).

In a case where the composition includes the curable compound, the content of the curable compound is preferably 0.1 to 40 mass % with respect to the total solid content of the composition. For example, the lower limit is preferably 0.5 mass % or higher and more preferably 1 mass % or higher. For example, the upper limit is more preferably 30 mass % or lower and still more preferably 20 mass % or lower. As the curable compound, one kind may be used alone, or two or more kinds may be used in combination. In a case where two or more compounds having an epoxy group are used in combination, it is preferable that the total content of the two or more compounds having an epoxy group is in the above-described range.

<<Resin>>

The composition may include a resin. The resin is mixed, for example, in order to disperse the pigment and the like in the composition and to be added as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher. In addition, in a case where the resin is an epoxy resin, the weight-average molecular weight (Mw) of the epoxy resin is preferably 100 or higher and more preferably 200 to 2000000. The upper limit is preferably 1000000 or lower and more preferably 500000 or lower. The lower limit is preferably 100 or higher and more preferably 200 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or two or more kinds may be used in combination.

Examples of the (meth)acrylic resin include a polymer including a structural unit derived from (meth)acrylic acid and/or an ester thereof. Specific examples of the (meth) acrylic resin include a polymer obtained by polymerization of at least one selected from the group consisting of (meth) acrylic acid, a (meth)acrylic acid ester, a (meth)acrylamide, and a (meth)acrylonitrile.

Examples of the polyester resin include: a polymer obtained by a reaction of a polyol (for example, ethylene glycol, propylene glycol, glycerin, or trimethylolpropane) and a polybasic acid (for example, an aromatic dicarboxylic acid such as terephthalic acid, isophthalic acid, or naphthalenedicarboxylic acid, an aromatic dicarboxylic acid in which a hydrogen atom of an aromatic ring in the above-described aromatic dicarboxylic acid is substituted with a methyl group, an ethyl group, a phenyl group, or the like, an aliphatic dicarboxylic acid having 2 to 20 carbon atoms such as adipic acid, sebacic acid, or dodecanedicarboxylic acid, or an alicyclic dicarboxylic acid such as cyclohexanedicarboxylic acid); and a polymer (for example, polycaprolactone) obtained by ring-opening polymerization of a cyclic ester compound such as a caprolactone monomer.

Examples of the styrene resin include polyhydroxystyrene.

In addition, the resin may have an acid group. Examples of the acid group include a carboxyl group, a phosphate group, a sulfonate group, and a phenolic hydroxyl group. Among these acid groups, one kind may be used alone, or two or more kinds may be used in combination. The resin having an acid group can also be used as an alkali-soluble resin. In addition, the resin having an acid group can also be used as the dispersant.

As the resin having an acid group, a polymer having a carboxyl group at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxyl group at a side chain thereof; and a resin obtained by adding an acid anhydride to a polymer having a hydroxyl group. In particular, a copolymer of (meth)acrylic acid and another monomer which is copolymerizable with the (meth)acrylic acid is preferable. Examples of the other monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth) acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. In addition, examples of the other monomer include an N-position-substituted maleimide monomer described in JP1998-300922A (H10-300922). Examples of the N-position-substituted maleimide monomer include N-phenylmaleimide and N-cyclohexylmaleimide. As the other monomer which is copolymerizable with the (meth)acrylic acid, one kind may be used alone, or two or more kinds may be used in combination.

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer obtained by polymerization of monomer components including a compound represented by the following Formula (ED1) and/or a compound represented by the following Formula (ED2) (hereinafter, these compounds will also be referred to as "ether dimer") is also preferable.

(ED1)

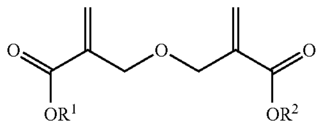

In Formula (ED1), $R^1$ and $R^2$ each independently represent a hydrogen atom or a hydrocarbon group having 1 to 25 carbon atoms which may have a substituent.

(ED2)

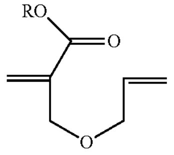

In Formula (ED2), R represents a hydrogen atom or an organic group having 1 to 30 carbon atoms. Specific examples of Formula (ED2) can be found in the description of JP2010-168539A The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer can be found in paragraph "0317" of JP2013-29760A, the content of which is incorporated herein by reference. Among these ether dimers, one kind may be used alone, or two or more kinds may be used in combination.

The resin having an acid group may include a structural unit which is derived from a compound represented by the following Formula (X).

(X)

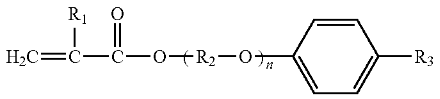

In Formula (X), $R_1$ represents a hydrogen atom or a methyl group, $R^2$ represents an alkylene group having 2 to 10 carbon atoms, and $R^3$ represents a hydrogen atom or an alkyl group having 1 to 20 carbon atoms which may have a benzene ring. n represents an integer of 1 to 15.

In Formula (X), the number of carbon atoms in the alkylene group of $R^2$ is preferably 2 to 3. In addition, the number of carbon atoms in the alkyl group of $R^3$ is preferably 1 to 20 and more preferably 1 to 10, and the alkyl group of $R^3$ may have a benzene ring. Examples of the alkyl group having a benzene ring represented by $R^3$ include a benzyl group and a 2-phenyl(iso)propyl group.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, for example, the following resins can also be used.

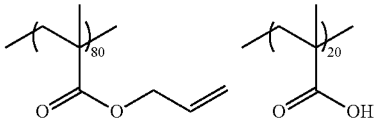

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

The resin may have a curable group. Examples of the curable group include a group having an ethylenically unsaturated bond, an epoxy group, a methylol group, and an alkoxysilyl group. Examples of the group having an ethylenically unsaturated bond include a vinyl group, a (meth)allyl group, a (meth)acryloyl group, and a (meth)acryloyloxy group. Examples of the alkoxysilyl group include a monoalkoxysilyl group, a dialkoxysilyl group, and a trialkoxysilyl group. Examples of the structural unit having a curable group include the following (A2-1) to (A2-4).

(A2-1)

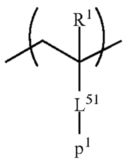

-continued (A2-2)

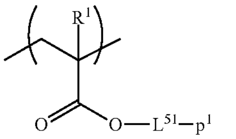

(A2-3)

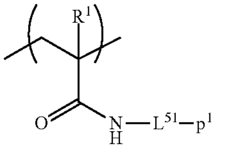

(A2-4)

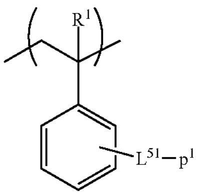

$R^1$ represents a hydrogen atom or an alkyl group. The number of carbon atoms in the alkyl group is preferably 1 to 5, more preferably 1 to 3, and still more preferably 1. It is preferable that $R^1$ represents a hydrogen atom or a methyl group.

$L^{51}$ represents a single bond or a divalent linking group. Examples of the divalent linking group include an alkylene group, an arylene group, —O—, —S—, —CO—, —COO—, —OCO—, —$SO_2$—, —$NR^{10}$— ($R^{10}$ represents a hydrogen atom or an alkyl group and preferably a hydrogen atom), and a group including a combination thereof. Among these, a group including a combination —O— and at least one of an alkylene group, an arylene group, or an alkylene group is preferable. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

$P^1$ represents a curable group. Examples of the curable group include a group having an ethylenically unsaturated bond, an epoxy group, a methylol group, and an alkoxysilyl group. Examples of the group having an ethylenically unsaturated bond include a vinyl group, a (meth)allyl group, a (meth)acryloyl group, and a (meth)acryloyloxy group. Examples of the alkoxysilyl group include a monoalkoxysilyl group, a dialkoxysilyl group, and a trialkoxysilyl group.

Examples of the resin having a curable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.). In addition, for example, the epoxy resin and the following resin can also be used.

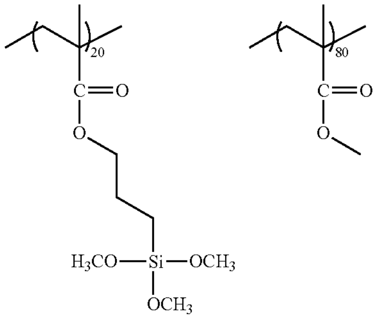

It is also preferable that the resin has a structural unit represented by any one of Formulae (A3-1) to (A3-7).

(A3-1)

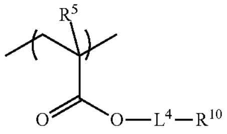

(A3-2)

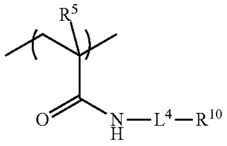

(A3-3)

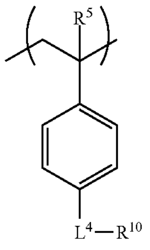

(A3-4)

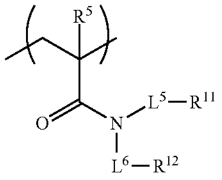

(A3-5)

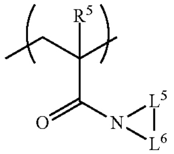

(A3-6)

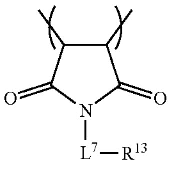

-continued (A3-7)

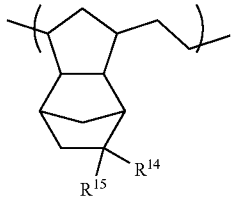

In the formulae, $R^5$ represents a hydrogen atom or an alkyl group, $L^4$ to $L^7$ each independently represent a single bond or a divalent linking group, and $R^{10}$ to $R^{13}$ each independently represent an alkyl group or an aryl group. $R^{14}$ and $R^{15}$ each independently represent a hydrogen atom or a substituent.

$R^5$ has the same definition and the same preferable range as $R^1$ in Formulae (A2-1) to (A2-4).

$L^4$ to $L^7$ have the same definition and the same preferable range as $L^{51}$ in Formulae (A2-1) to (A2-4).

The alkyl group represented by $R^{10}$ may be linear, branched, or cyclic and is preferably cyclic. The alkyl group may have a substituent or may be unsubstituted. The number of carbon atoms in the alkyl group is preferably 1 to 30, more preferably 1 to 20, and still more preferably 1 to 10. The number of carbon atoms in the aryl group represented by $R^{10}$ is preferably 6 to 18, more preferably 6 to 12, and still more preferably 6. It is preferable that $R^{10}$ represents a cyclic alkyl group or an aryl group.

The alkyl group represented by $R^{11}$ and $R^{12}$ may be linear, branched, or cyclic and is preferably linear or branched. The alkyl group may have a substituent or may be unsubstituted. The number of carbon atoms in the alkyl group is preferably 1 to 12, more preferably 1 to 6, and still more preferably 1 to 4. The number of carbon atoms in the aryl group represented by $R^{11}$ and $R^{12}$ is preferably 6 to 18, more preferably 6 to 12, and still more preferably 6. It is preferable that $R^{11}$ and $R^{12}$ represent a linear or branched alkyl group.

The alkyl group represented by $R^{13}$ may be linear, branched, or cyclic and is preferably linear or branched. The alkyl group may have a substituent or may be unsubstituted. The number of carbon atoms in the alkyl group is preferably 1 to 12, more preferably 1 to 6, and still more preferably 1 to 4. The number of carbon atoms in the aryl group represented by $R^{13}$ is preferably 6 to 18, more preferably 6 to 12, and still more preferably 6. It is preferable that $R^{13}$ represents a linear or branched alkyl group or an aryl group.

Examples of the substituent represented by $R^{14}$ and $R^{15}$ include the groups described above regarding Formula (SQ). In particular, it is preferable that at least one of $R^{14}$ or $R^{15}$ represents a cyano group or —COORa. Ra represents a hydrogen atom or a substituent. Examples of the substituent include the above-described substituents. For example, an alkyl group or an aryl group is preferable.

Examples of a commercially available product of the resin having a structural unit represented by Formula (A3-7) include ARTON F4520 (manufactured by JSR Corporation).

In addition, it is also preferable that MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) is used as the resin.

In a case where the composition includes a pigment, it is preferable that the resin includes a dispersant.

The resin which functions as a dispersant is preferably an acidic resin and/or a basic resin.

Here, the acidic resin refers to a resin in which the amount of an acid group is more than the amount of a basic group. In a case where the sum of the amount of an acid group and the amount of a basic group in the acidic resin is represented by 100 mol %, the amount of the acid group is preferably 70 mol % or higher and more preferably substantially 100 mol %. The acid group in the acidic resin is preferably a carboxyl group. An acid value of the acidic resin is preferably 40 to 105 mgKOH/g, more preferably 50 to 105 mgKOH/g, and still more preferably 60 to 105 mgKOH/g.

Here, the basic resin refers to a resin in which the amount of a basic group is more than the amount of an acid group. In a case where the sum of the amount of an acid group and the amount of a basic group in the basic resin is represented by 100 mol %, the amount of the basic group is preferably 50 mol % or higher. The basic group in the basic resin is preferably amine.

In terms of a structure, the resin can be further classified into a linear polymer, a terminal-modified polymer, a graft polymer, and a block polymer.

Examples of the terminal-modified polymer include a polymer having a phosphate group at a terminal thereof described in JP1991-112992A (JP-H3-112992A) or JP2003-533455A, a polymer having a sulfonate group at a terminal thereof described in JP2002-273191A, and a polymer having a partial skeleton or a heterocycle of an organic colorant described in JP1997-77994A (JP-H9-77994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the graft polymer include a reaction product of poly(low-alkylene imine) and polyester described in JP1979-37082A (JP-S54-37082A), JP1996-507960A (JP-H8-507960A), or JP2009-258668A, a reaction product of polyallylamine and polyester described in JP1997-169821A (JP-H9-169821A), a copolymer of a macromonomer and a monomer having a nitrogen atom described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A. Examples of the macromonomers include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H2-272009A).

As the block polymer, a block polymer described in JP2003-49110A or JP2009-52010A is preferable.

As the dispersant, a graft copolymer including a structural unit represented by any one of the following Formulae (1) to (4) can also be used.

(1)

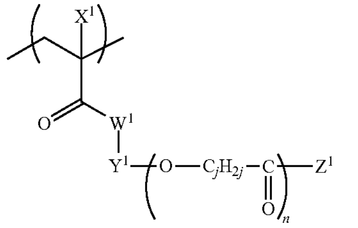

(2)

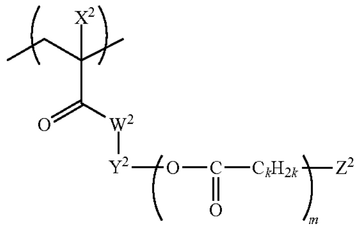

(3)

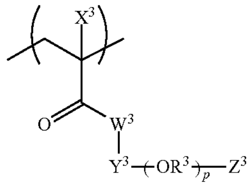

(4)

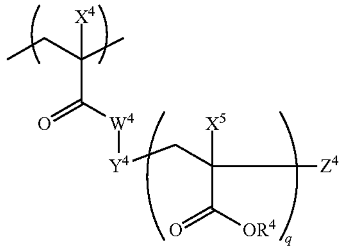

$X^1$, $X^2$, $X^3$, $X^4$, and $X^5$ each independently represent a hydrogen atom or a monovalent organic group, preferably a hydrogen atom or an alkyl group having 1 to 12 carbon atoms, more preferably a hydrogen atom or a methyl group, and still more preferably a methyl group. $W^1$, $W^2$, $W^3$, and $W^4$ each independently represent an oxygen atom or NH and preferably an oxygen atom. $R^3$ represents a branched or linear alkylene group (having preferably 1 to 10 carbon atoms and more preferably 2 or 3 carbon atoms). From the viewpoint of dispersion stability, it is preferable that $R^3$ represents a group represented by —$CH_2$—$CH(CH_3)$— or a group represented by —$CH(CH_3)$—$CH_2$—. $R^4$ represents a hydrogen atom or a monovalent group. $Y^1$, $Y^2$, $Y^3$, and $Y^4$ each independently represent a divalent linking group. $Z^1$, $Z^2$, $Z^3$, and $Z^4$ each independently represent a monovalent group. n, m, p, and q each independently represent an integer of 1 to 500, and j and k each independently represent an integer of 2 to 8.

The graft copolymer can be found in the description of paragraphs "0025" to "0069 of JP2012-255128A, the content of which is incorporated herein by reference.

Specific examples of the graft copolymer are as follows. In addition, a resin described in paragraphs "0072" to "0094" of JP2012-255128A can be used.

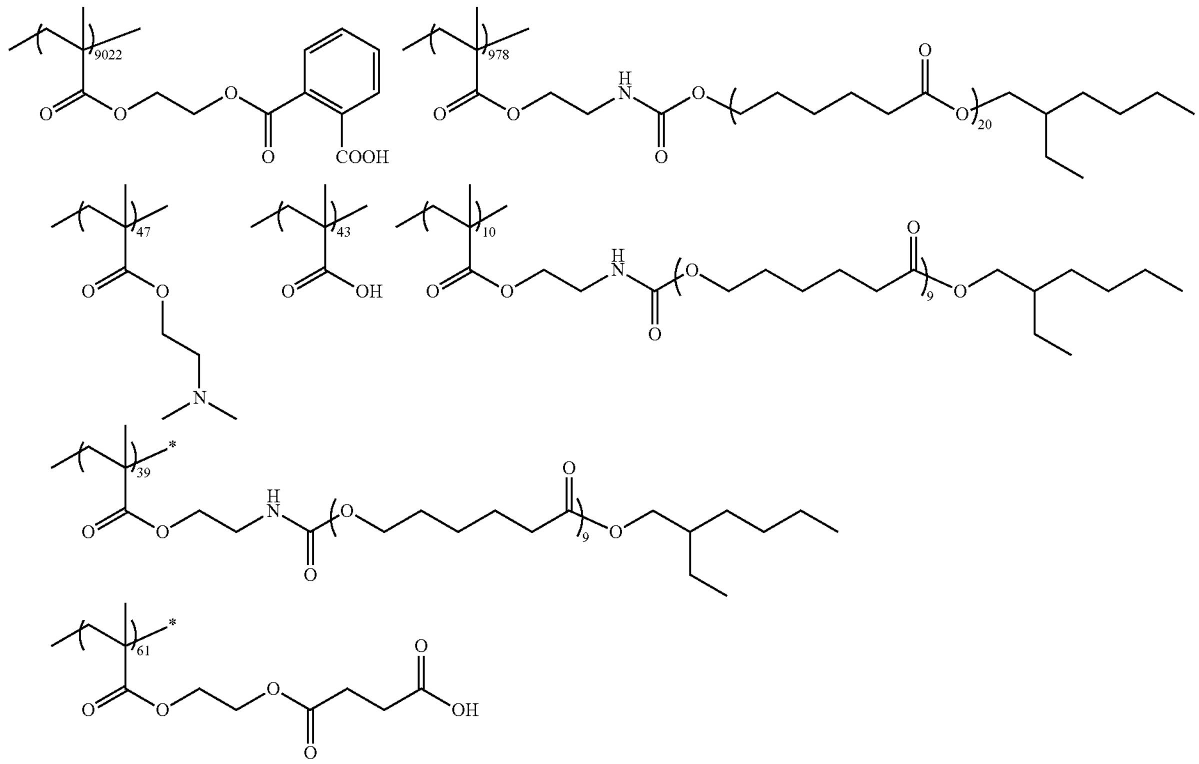

As the dispersant, an oligoimine resin having a nitrogen atom at at least either a main chain or a side chain can be used. As the oligoimine resin, a resin, which includes a structural unit having a partial structure X with a functional group (pKa: 14 or lower) and a side chain Y having 40 to 10000 atoms and has a basic nitrogen atom at at least either a main chain or a side chain, is preferable. The basic nitrogen atom is not particularly limited as long as it is a nitrogen atom exhibiting basicity.

Examples of the oligoimine resin include a resin including a structural unit represented by the following Formula (I-1), a structural unit represented by the following Formula (I-2), and/or a structural unit represented by the following Formula (I-2a).

(I-1)

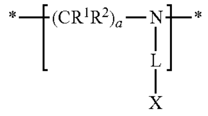

(I-2)

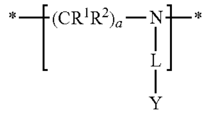

(I-2a)

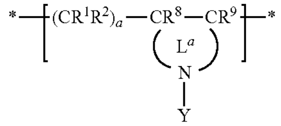

$R^1$ and $R^2$ each independently represent a hydrogen atom, a halogen atom, or an alkyl group (having preferably 1 to 6 carbon atoms). a's each independently represent an integer of 1 to 5. * represents a linking portion between structural units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms). $R^7$ represents a hydrogen atom or an alkyl group having 1 to 6 carbon atoms.

$L^a$ is a structural unit which forms a ring structure with $CR^8CR^9$ and N, preferably a structural unit which forms a nonaromatic heterocycle having 3 to 7 carbon atoms with $CR^8CR^9$ and a carbon atom, more preferably a structural unit which forms a nonaromatic 5- to 7-membered heterocycle with $CR^8CR^9$ and N (nitrogen atom), still more preferably a structural unit which forms a nonaromatic 5-membered heterocycle with $CR^8CR^9$ and N, and even still more preferably a structural unit which forms pyrrolidine with $CR^8CR^9$ and N. This structural unit may have a substituent such as an alkyl group.

X represents a group having a functional group (pKa: 14 or lower).

Y represents a side chain having 40 to 10000 atoms.

The resin (oligoimine resin) may further include one or more copolymerization components selected from the group consisting of the structural units represented by Formulae (I-3), (I-4), and (I-5). By the resin containing the above-described structural units, the dispersion performance of the pigment can be further improved.

(I-3)

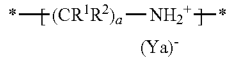

(I-4)

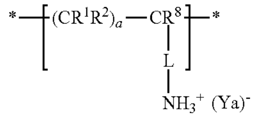

(I-5)

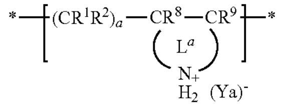

$R^1$, $R^2$, $R^8$, $R^9$, L, La, a, and * have the same definitions as those in Formulae (I-1), (I-2), and (I-2a).

Ya represents a side chain having 40 to 10000 atoms which has an anionic group. The structural unit represented by Formula (I-3) can be formed by adding an oligomer or a polymer having a group, which reacts with amine to form a salt, to a resin having a primary or secondary amino group at a main chain such that they react with each other.

The oligoimine resin can be found in the description of paragraphs "0102" to "0166" of JP2012-255128A, the content of which is incorporated herein by reference. Specific examples of the oligoimine resin are as follows. In addition, a resin described in paragraphs "0168" to "0174" of JP2012-255128A can be used.

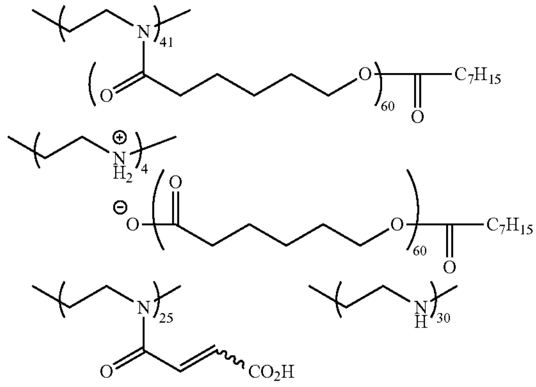

As the dispersant, a resin including a structural unit represented by the following Formula (P1) can be used.

(P1)

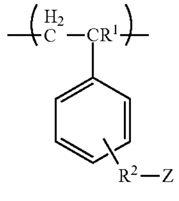

In Formula (P1), $R^1$ represents a hydrogen atom or a methyl group, $R^2$ represents an alkylene group, and Z represents a nitrogen-containing heterocyclic structure.

The alkylene group represented by $R^2$ is not particularly limited, and examples thereof include a methylene group, an ethylene group, a trimethylene group, a tetramethylene group, a hexamethylene group, a 2-hydroxypropylene group, a methyleneoxy group, an ethyleneoxy group, a methyleneoxycarbonyl group, and a methylenethio group. Among these, a methylene group, a methyleneoxy group, a methyleneoxycarbonyl group, or a methylenethio group is more preferable.

Examples of the nitrogen-containing heterocyclic structure represented by Z include a structure including a pyridine ring, a pyrazine ring, a pyrimidine ring, a pyrrole ring, an imidazole ring, a triazole ring, a tetrazole ring, an indole ring, a quinoline ring, an acridine ring, a phenothiazine ring, a phenoxazine ring, an acridone ring, a benzimidazole structure, a benzotriazole structure, a benzothiazole structure, a cyclic amide structure, a cyclic urea structure, or a cyclic imide structure. Among these, as the nitrogen-containing heterocyclic structure represented by Z, a structure represented by the following Formula (P2) or (P3) is preferable.

(P2)

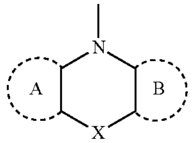

(P3)

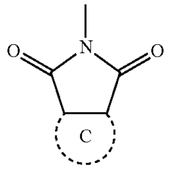

In the formula, X represents one selected from the group consisting of a single bond, an alkylene group (for example, a methylene group, an ethylene group, a propylene group, a trimethylene group, or a tetramethylene group), —O—, —S—, —NR—, and —C(=O)—. Here, R represents a hydrogen atom or an alkyl group. Examples of the alkyl group represented by R include a methyl group, an ethyl group, an n-propyl group, an i-propyl group, an n-butyl group, a t-butyl group, an n-hexyl group, an n-octyl group, a 2-ethylhexyl group, and an n-octadecyl group.

X represents preferably a single bond, a methylene group, —O—, or —C(=O)— and more preferably —C(=O)—.

In the formula, a ring A, a ring B, and a ring C each independently represent an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, and an anthraquinone ring. Among these, a benzene ring, a naphthalene ring, an anthracene ring, a pyridine ring, a phenoxazine ring, an acridine ring, a phenothiazine ring, an acridone ring, or an anthraquinone ring is preferable, and a benzene ring, a naphthalene ring, or a pyridine ring is more preferable.

Specific examples of the structural unit represented by Formula (P1) are as follows. In addition, specific examples of the structural unit can be found in paragraph "0023" of JP2008-009426A, the content of which is incorporated herein by reference.

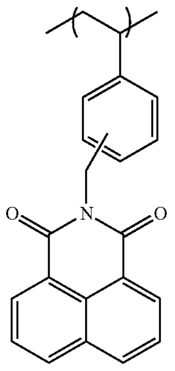

Specific examples of the resin including the structural unit represented by Formula (P1) are as follows.

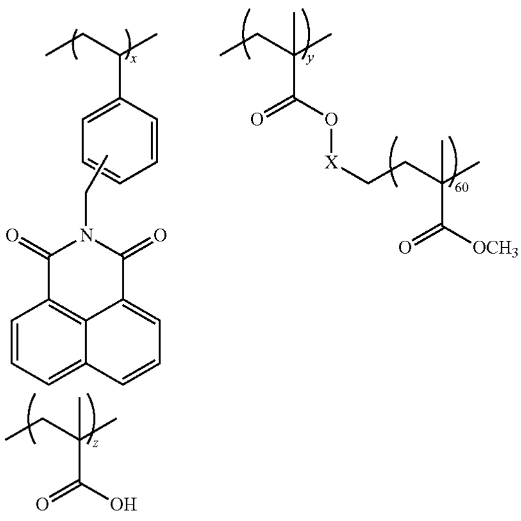

The resin is available as a commercially available product, and specific examples thereof include. "DA-7301" manufactured by Kusmotto Chemicals; "Disperbyk-101 (polyamideamine phosphate), 107 (carboxylate), 110, (copolymer containing an acid group), 111 (phosphate dispersant), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)" manufactured by Kao Corporation, "HOMOGENOL L-18 (high molecular polycarboxylic acid)" manufactured by Kao Corporation, "EMULGEN 920, 930, 935, and 985 (polyoxyethylene nonylphenyl ether)" manufactured by Kao Corporation, and "ACETAMIN 86 (stearylamine acetate)" manufactured by Kao Corporation; "SOLSPERSE 5000 (phthalocyanine derivative), 22000 (azo pigment derivative), 13240 (polyester amine), 3000, 12000, 17000, 20000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; HINOACT T-8000E manufactured by Kawaken Fine Chemicals Co., Ltd.; organosiloxane polymer KP341 manufactured by Shin-Etsu Chemical Co., Ltd.; "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd., and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "IONET S-20" manufactured by Sanyo Chemical Industries Ltd.

The content of the resin in the composition is preferably 1 to 80 mass % with respect to the total solid content of the composition. The lower limit is preferably 5 mass % or higher and more preferably 7 mass % or higher. The upper limit is preferably 50 mass % or lower and more preferably 30 mass % or lower.

<<Photopolymerization Initiator>>

The composition may include a photopolymerization initiator. In particular, in case where the composition includes a radically polymerizable component such as a resin which includes a group having an ethylenically unsaturated bond or a curable compound, it is preferable that the composition includes a photopolymerization initiator. The photopolymerization initiator is not particularly limited and can be appropriately selected from well-known photopolymerization initiators. For example, a photopolymerization initiator having photosensitivity to light in a range from the ultraviolet range to the visible range is preferable. It is preferable that the photopolymerization initiator is a photoradical polymerization initiator. In addition, it is preferable that the photopolymerization initiator is at least one compound having a molar absorption coefficient of at least 50 in a range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H5-281728A), a compound described in JP1993-34920A (JP-S5-34920A), and a compound described in U.S. Pat. No. 4,212,976A.

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable.

As the photopolymerization initiator, a hydroxyacetophenone compound (α-hydroxyketone compound), an aminoacetophenone compound (α-aminoketone compound), or an acylphosphine compound can also be preferably used. For example, an aminoacetophenone initiator described in JP1998-291969A (JP-H10-291969A) or an acylphosphine initiator described in JP4225898B can also be used. As the hydroxyacetophenone compound (α-hydroxyketone compound), for example, IRGACURE-184, DAROCUR-1173, IRGACURE-500, IRGACURE-2959, or IRGACURE-127 (trade name, all of which are manufactured by BASF SE) can be used. As the aminoacetophenone compound (α-aminoketone compound), IRGACURE-907, IRGACURE-369, or IRGACURE-379EG (trade name, all of which are manufactured by BASF SE) which is a commercially available product can be used. As the aminoacetophenone compound (α-aminoketone compound), a compound described in JP2009-191179A whose absorption wavelength is adjusted to match with that of a light source such as a 365 nm or 405 nm light source can also be used.

As the acylphosphine compound, IRGACURE-819, or DAROCUR-TPO (trade name, all of which are manufactured by BASF SE) which is a commercially available product can be used.

As the photopolymerization initiator, for example, an oxime compound is more preferable. Specific examples of the oxime compound include a compound described in JP2001-233842A, a compound described in JP2000-80068A, and a compound described in JP2006-342166A.

Examples of the oxime compound which can be preferably used include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, JP2000-66385A, JP2000-80068A, JP2004-534797A, or JP2006-342166A. As a commercially available product of the oxime compound, IRGACURE-OXE01 (manufactured by BASF SE), IRGACURE-OXE02 (manufactured by BASF SE), IRGACURE-OXE03 (manufactured by BASF SE), or IRGACURE-OXE04 (are manufactured by BASF SE) can also be preferably used. In addition, TR-PBG-304 (manufactured by Changzhou Tronly New Electronic Materials Co., Ltd.), and ADEKA ARKLS NCI-930 (manufactured by Adeka Corporation) can also be used.

In addition, in addition to the above-described oxime compounds, for example, a compound described in JP2009-519904A in which oxime is linked to a N-position of a carbazole ring, a compound described in U.S. Pat. No. 7,626,957B in which a hetero substituent is introduced into the benzophenone site, a compound described in JP2010-15025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays, or a compound described in paragraphs “0076” to “0079” of JP2014-137466A may be used.

Other preferable examples of the oxime compound can be found in paragraphs “0274” to “0275” of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(OX-1)

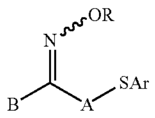

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

An oxime compound having a fluorene ring can also be used as the photopolymerization initiator. Specific examples of the oxime compound having a fluorene ring include a compound described in JP2014-137466A. The content is incorporated herein by reference.

As the photopolymerization initiator, an oxime compound having a fluorine atom can also be used. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

As the photopolymerization initiator, an oxime compound having a nitro group can be used. It is preferable that the oxime compound having a nitro group is a dimer. Specific examples of the oxime compound having a nitro group include compounds described in paragraphs “0031” to “0047” of JP2013-114249A and paragraphs “0008” to “0012” and “0070” to “0079” of JP2014-137466A, compounds described in paragraphs “0007” to 0025” of JP4223071B, and ADEKA ARKLS NCI-831 (manufactured by Adeka Corporation).

Hereinafter, specific examples of the oxime compound which are preferably used will be shown below, but the present invention is not limited thereto.

(C-1)

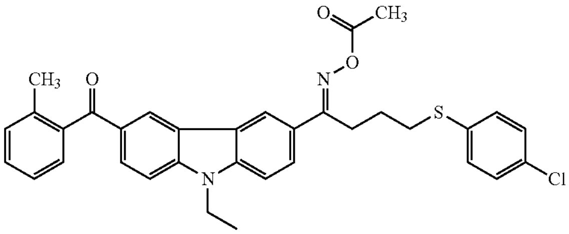

(C-2)

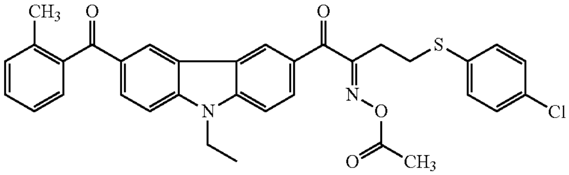

(C-3)

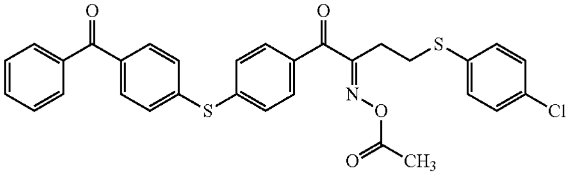

(C-4)

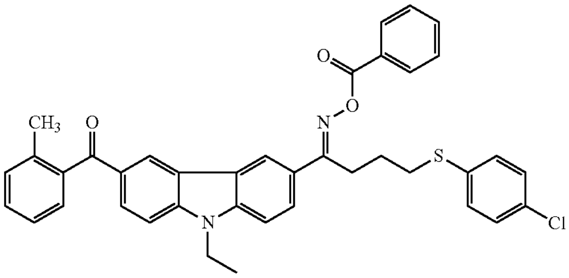

-continued (C-5)

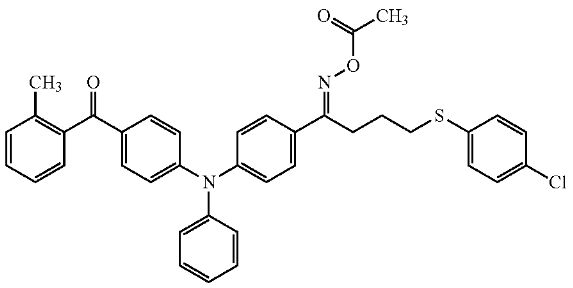

(C-6)

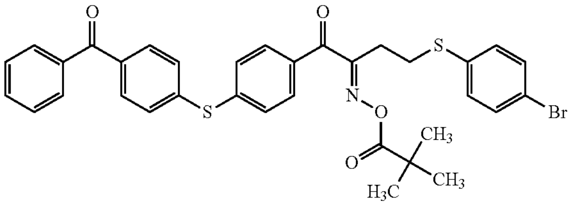

(C-7)

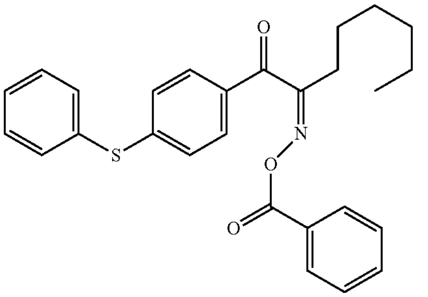

(C-8)

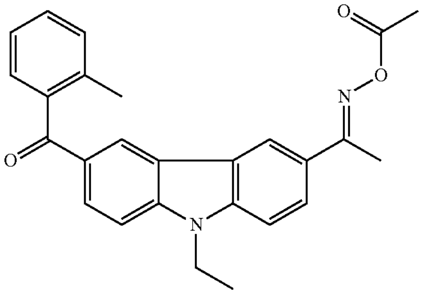

(C-9)

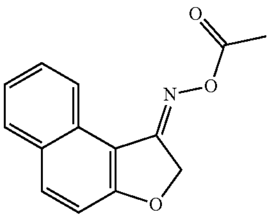

-continued (C-10)

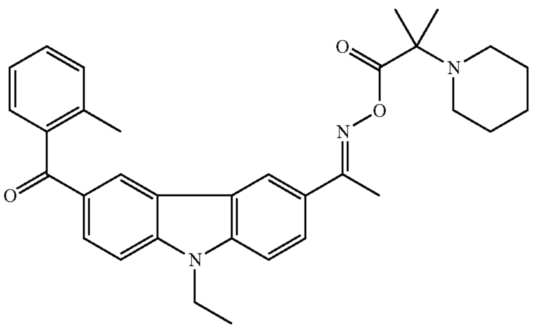

(C-11)

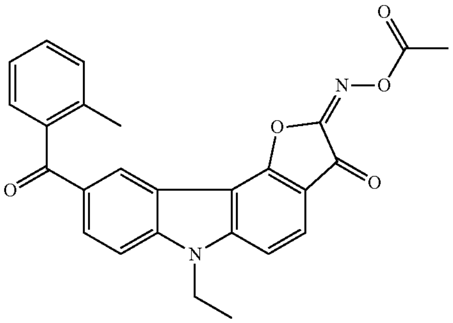

(C-12)

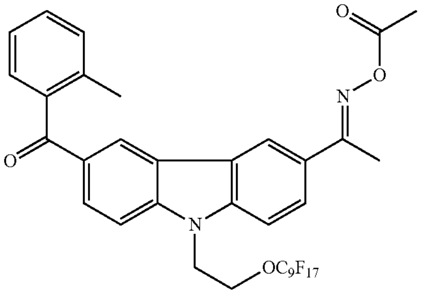

(C-13)

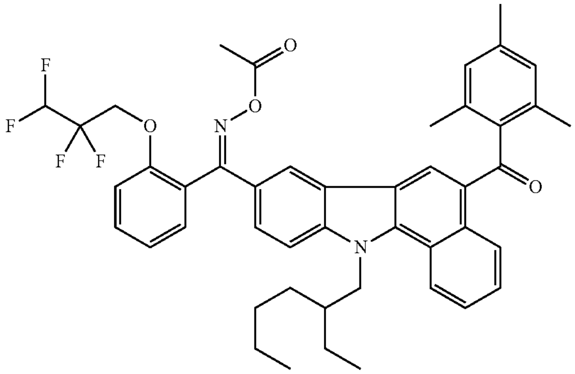

(C-14)

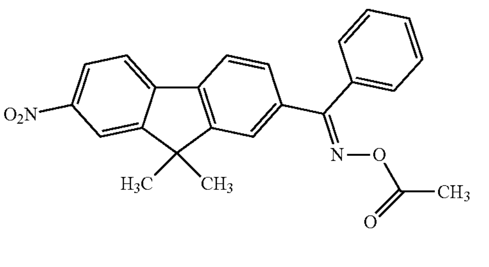

As the oxime compound, a compound having an absorption maximum in a wavelength range of 350 nm to 500 nm is preferable, a compound having an absorption wavelength in a wavelength range of 360 nm to 480 nm is more preferable, and a compound having a high absorbance at 365 nm and 405 nm is still more preferable.

The molar absorption coefficient of the oxime compound at 365 nm or 405 nm is preferably 1000 to 300000, more preferably 2000 to 300000, and still more preferably 5000 to 200000 from the viewpoint of sensitivity. The molar absorption coefficient of the compound can be measured using a well-known method. Specifically, for example, it is preferable that the molar absorption coefficient of the compound is measured using an ultraviolet-visible spectrophotometer (Cary-5 spectrophotometer, manufactured by Varian Medical Systems, Inc.) and an ethyl acetate solvent at a concentration of 0.01 g/L.

The content of the photopolymerization initiator is preferably 0.1 to 50 mass %, more preferably 0.5 to 30 mass %, and still more preferably 1 to 20 mass % with respect to the total solid content of the composition. In the above-described range, excellent sensitivity and pattern formability can be obtained. The composition may include one photopolymerization initiator or two or more photopolymerization initiators. In a case where the composition includes two or more catalysts, it is preferable that the total content of the two or more catalysts is in the above-described range.

<<Acid Generator>>

The composition may include an acid generator. In particular, in a case where the compound having an epoxy group or the compound having a methylol group is used as the curable compound, it is preferable that the composition includes an acid generator. As the acid generator, a compound (photoacid generator) which generates an acid by light irradiation is preferable. Examples of the acid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodisulfone, disulfone, or ortho-nitrobenzyl sulfonate.

The kind, specific compounds, and preferable examples of the acid generator can be found in the description of a compound in paragraphs "0066" to "0122" of JP2008-13646A, the content of which is also applicable to the present invention. For example, triethylammonium nonaflate can be used.

Examples of a compound which is preferable as the acid generator include compounds represented by the following Formulae (b1), (b2), and (b3).

(b1)

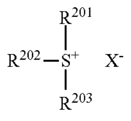

(b2)

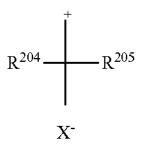

-continued (b3)

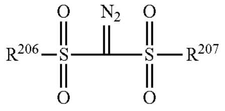

In Formulae (b1) to (b3), $R^{201}$ to $R^{207}$ each independently represent an organic group. X-represents a non-nucleophilic anion, preferably a sulfonate anion, a carboxylate anion, a bis(alkylsulfonyl)amide anion, a tris(alkylsulfonyl)methide anion, $BF_4^-$, $PF_6^-$, $SbF_6^-$, or a group shown below and more preferably $BF_4^-$, $PF_6^-$, or $SbF_6^-$.

Examples of a commercially available product of the acid generator include WPAG-469 (manufactured by Wako Pure Chemical Industries, Ltd.) and CPI-100P (manufactured by San-Apro Ltd.).

The content of the acid generator is preferably 0.1 to 50 mass %, more preferably 0.5 to 30 mass %, and still more preferably 1 to 20 mass % with respect to the total solid content of the composition. The composition may include one acid generator or two or more acid generators. In a case where the composition includes two or more acid generators, it is preferable that the total content of the two or more acid generators is in the above-described range.

<<Catalyst>>

The composition may further include a catalyst. In particular, in a case where the compound having an alkoxysilyl group is used as the curable compound, a sol-gel reaction is promoted and a strong cured film is obtained by addition of the catalyst. Examples of the catalyst include an acid catalyst and a base catalyst. Examples of the acid catalyst include hydrochloric acid, nitric acid, sulfuric acid, sulfurous acid, hydrogen sulfide, perchloric acid, hydrogen peroxide, carbonic acid, a carboxylic acid such as formic acid or acetic acid, a substituted carboxylic acid in which R in a structural formula represented by RCOOH is substituted with another element or a substituent, a sulfonic acid such as benzenesulfonic acid, and phosphoric acid. Further, Lewis acid such as aluminum chloride, aluminum acetylacetonate, zinc chloride, tin chloride, a boron trifluoride diethyl ether complex, or iodotrimethylsilane may be used. In addition, examples of the base catalyst include an ammonia base compound such as ammonia water and an organic amine such as ethylamine or aniline. In addition, as the catalyst, a catalyst described in paragraphs "0070" to "0076" of JP2013-201007A can also be used.

The content of the catalyst is preferably 0.1 to 100 parts by mass, more preferably 0.1 to 50 parts by mass, and still more preferably 0.1 to 20 parts by mass with respect to 100 parts by mass of the curable compound (preferably 100 parts by mass of the compound having an alkoxysilyl group). The composition may include one catalyst or two or more catalysts. In a case where the composition includes two or more catalysts, it is preferable that the total content of the two or more catalysts is in the above-described range.

<<Solvent>>

The composition may include a solvent. Examples of the solvent include an organic solvent. Basically, the solvent is not particularly limited as long as it satisfies the solubility of each component and the coating properties of the composition. However, it is preferable that the organic solvent is selected in consideration of the coating properties and safety of the composition.

Preferable examples of the organic solvent are as follows:

an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkoxyacetate (for example, methyl alkoxyacetate, ethyl alkoxyacetate, or butyl alkoxyacetate (for example, methyl methoxyacetate, ethyl methoxyacetate, butyl methoxyacetate, methyl ethoxyacetate, or ethyl ethoxyacetate)), alkyl 3-alkoxypropionate (for example, methyl 3-alkoxypropionate or ethyl 3-alkoxypropionate (for example, 3-methyl methoxypropionate, 3-ethyl methoxypropionate, 3-methyl ethoxypropionate, or 3-ethyl ethoxypropionate)), alkyl 2-alkoxypropionate (for example, methyl 2-alkoxypropionate, ethyl 2-alkoxypropionate, or propyl 2-alkoxypropionate, (for example, methyl 2-methoxypropionate, ethyl 2-methoxypropionate, propyl 2-methoxypropionate, methyl 2-ethoxypropionate, or 2-ethyl ethoxypropionate)), methyl 2-alkoxy-2-methylpropionate, ethyl 2-alkoxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate, or ethyl 2-oxobutanoate;

an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene.

Among these organic solvents, one kind may be used alone, or two or more kinds may be used in combination. In a case where two or more organic solvents are used in combination, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

A solvent having a low metal content is preferable. For example, the metal content in the solvent is preferably 10 ppb or lower. Optionally, a solvent having a metal content at a ppt level may be used. For example, such a high-purity solvent is available from Toyo Gosei Co., Ltd.

Examples of a method of removing impurities such as metal from the solvent include distillation (for example, molecular distillation or thin-film distillation) and filtering using a filter. During the filtering using a filter, the pore size of a filter is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same number of atoms and a different structure). The solvent may include only one isomer or a plurality of isomers.

As the organic solvent, an organic solvent containing 0.8 mmol/L or lower of a peroxide is preferable, and an organic solvent containing no peroxide is more preferable.

The content of the solvent is preferably 10 to 90 mass %, more preferably 20 to 80 mass %, and still more preferably 25 to 75 mass % with respect to the total mass of the composition.

<<Polymerization Inhibitor>>

The composition may include a polymerization inhibitor in order to prevent unnecessary thermal polymerization of the curable compound during the manufacturing or storage of the composition.

Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable.

The content of the polymerization inhibitor is preferably 0.01 to 5 mass % with respect to the total solid content of the composition.

<<Surfactant>>

The composition may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the composition including a fluorine surfactant, liquid characteristics (for example, fluidity) of a coating solution prepared from the composition are further improved, and the uniformity in coating thickness and liquid saving properties can be further improved. That is, in a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-41318A (paragraphs "0060" to "0064" of corresponding WO2014/17669) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, F780, and RS-72-K (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC1068, SC-381, SC-383, S393, and KH-40 (all of which are manufactured by Asahi Glass Co., Ltd.); and PolyFox, PF636, PF656, PF6320, PF6520, and PF7002 (all of which are manufactured by OMNOVA Solutions Inc.).

As the fluorine surfactant, a block polymer can also be used, and specific examples thereof include a compound described in JP2011-89090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

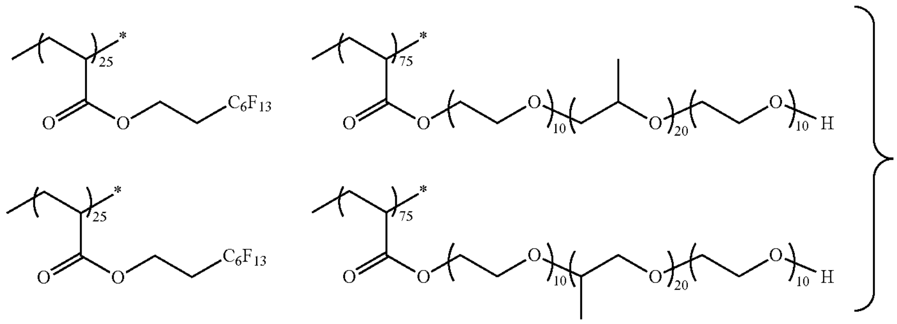

The weight-average molecular weight of the compound is preferably 3000 to 50000 and, for example, 14000.

In addition, as the fluorine surfactant, a fluorine-containing polymer having an ethylenically unsaturated group at a side chain can also be used. Specific examples include compounds described in paragraphs "0050" of "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

In addition, as the fluorine surfactant, an acrylic compound in which, when heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

Specific examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE)); and SOLSPERSE 20000 (manufactured by Lubrication Technology Inc.). In addition, NCW-101, NCW-1001, or NCW-1002 (manufactured by Wako Pure Chemical Industries, Ltd.) can also be used.

Specific examples of the cationic surfactant include an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The content of the surfactant is preferably 0.001 to 2.0 mass % and more preferably 0.005 to 1.0 mass % with respect to the total solid content of the composition.

<<Ultraviolet Absorber>>

The composition may include an ultraviolet absorber. The ultraviolet absorber is preferably a conjugated diene compound and more preferably a compound represented by the following Formula (1).

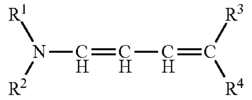

(1)

$R^1$ and $R^2$ each independently represent a hydrogen atom, an alkyl group having 1 to 20 carbon atoms, or an aryl group having 6 to 20 carbon atoms, and may be the same as or different from each other but does not represent a hydrogen atom at the same time.

$R^3$ and $R^4$ represent an electron-withdrawing group. The Hammett substituent constant σp value (hereinafter, referred to simply as "σp value") of the electron-withdrawing group is preferably 0.20 to 1.0 and more preferably 0.30 to 0.8. $R^3$ and $R^4$ represent preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group. Formula (1) can be found in paragraphs "0148" to "0158" of JP2010-049029A, the content of which is incorporated herein by reference.

Specific examples of the compound include represented by Formula (1) a compound described in paragraphs "0160" to "0162" of JP2010-049029A, the content of which is incorporated herein by reference.

Examples of a commercially available product of the ultraviolet absorber include UV503 (manufactured by Daito Chemical Co., Ltd.).

The content of the ultraviolet absorber is preferably 0.01 to 10 mass % and more preferably 0.01 to 5 mass % with respect to the total solid content of the composition.

<<Other Components>>

Optionally, the composition may further include a dispersant, a sensitizer, a curing accelerator, a filler, a thermal curing accelerator, a thermal polymerization inhibitor, a plasticizer, an adhesion accelerator, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent). By the near infrared absorbing composition appropriately including the components, desired stability, film properties, and the like of an optical filter such as a near infrared cut filter can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the content of which is incorporated herein by reference. In addition, examples of the antioxidant include a phenol compound, a phosphite compound, and a thioether compound. A phenol compound having a molecular weight of 500 or higher, a phosphite compound having a molecular weight of 500 or higher, or a thioether compound having a molecular weight of 500 or higher is more preferable. Among these compounds, a mixture of two or more kinds may be used. As the phenol compound, any phenol compound which is known as a phenol antioxidant can be used. As the phenol compound, for example, a hindered phenol compound is preferable. In particular, a compound having a substituent at a position (ortho-position) adjacent to a phenolic hydroxyl group is preferable. As the substituent, a substituted or unsubstituted alkyl group having 1 to 22 carbon atoms is preferable, and a methyl group, an ethyl group, a propionyl group, an isopropionyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. In addition, a compound (antioxidant) having a phenol group and a phosphite group in the same molecule is also preferable. In addition, as the antioxidant, a phosphorus-based antioxidant can also be preferably used. Examples of the phosphorus-based antioxidant include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-t-butyldibenzo[d,f][1,3,2]dioxaphosphepin-2-yl)oxy]ethyl]amine, and ethyl bis(2,4-di-t-butyl-6-methylphenyl) phosphite. The phosphorus-based antioxidant is easily commercially available, and examples of the commercially available product include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). The content of the antioxidant is preferably 0.01 to 20 mass % and more preferably 0.3 to 15 mass % with respect to the mass of the total solid content of the composition. As the antioxidant, one kind may be used alone, or two or more kinds may be used. In a case where two or more antioxidants are used in combination, it is preferable that the total content of the two or more antioxidants is in the above-described range.

(Method of Preparing Composition)

The composition can be prepared by mixing the above-described components with each other.

During the preparation of the composition, the respective components may be mixed with each other collectively, or may be mixed with each other sequentially after dissolved and/or dispersed in a solvent. In addition, during mixing, the order of addition or working conditions are not particularly limited. For example, all the components may be dissolved and/or dispersed in a solvent at the same time to prepare the composition. Optionally, two or more solutions or dispersions may be appropriately prepared using the respective components, and the solutions or dispersions may be mixed with each other during use (during application) to prepare the composition.

During the preparation of the composition, it is preferable that the composition is filtered through a filter, for example, in order to remove foreign matter or to reduce defects. The filter is not particularly limited as long as it is used in the related art for filtering or the like. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In the above-described range, fine foreign matter, which may inhibit manufacturing of a fine composition or formation of a smooth film in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the filtering using the second filter may be performed on a mixture of the dispersion and other components.

For example, in a case where a film is formed by coating, the viscosity (23° C.) of the composition is preferably in a range of 1 to 3000 mPa-s. The lower limit is preferably 3 mPa-s or higher and more preferably 5 mPa-s or higher. The upper limit is preferably 2000 mPa-s or lower and more preferably 1000 mPa-s or lower.

For example, the composition according to the present invention can also be used, for example, for a near infrared cut filter (for example, a near infrared cut filter for a wafer level lens) on a light receiving side of a solid image pickup element or as a near infrared cut filter on a back surface side (opposite to the light receiving side) of a solid image pickup element. In addition, the composition may be directly applied to an image sensor to form a coating film.

The composition can be supplied in an applicable state. Therefore, a near infrared cut filter can be easily formed on a desired member or position of a solid image pickup element.

In addition, the composition according to the present invention may be applied to a glass substrate or a layer containing copper.

In addition, in a case where the composition includes a chromatic colorant, the composition can also be used for forming a pixel of a color filter.

In addition, a color filter may be formed by using the pixel which is formed of the composition in combination with a pixel selected from the group consisting of a red pixel, a green pixel, a blue pixel, a magenta pixel, a yellow pixel, a cyan pixel, a black pixel, and an achromatic pixel.

<Film, Near Infrared Cut Filter, and Laminate>

Next, a film according to the present invention will be described. The film according to the present invention is formed using the above-described composition. In the film according to the present invention, infrared shielding properties and visible transparency are excellent, and spectral variation is not likely to occur (in particular, even after exposure to a high-temperature and high-humidity environment, spectral variation is not likely to occur). Therefore, the film according to the present invention can be preferably used as a near infrared cut filter or an infrared transmitting filter. In addition, the film according to the present invention can also be used as a heat ray shielding filter. The film may be a film having a pattern or a film (flat film) not having a pattern. In addition, the film may be used in a state where it is laminated on a support, or the film may be peeled off from a support. In a case where the film according to the present invention is used as an infrared transmitting filter, examples of the infrared transmitting filter include a filter that shields visible light and allows transmission of light in a wavelength range of 900 nm or longer. In a case where the film according to the present invention is used as an infrared transmitting filter, it is preferable that infrared transmitting filter is a filter that is formed of a composition including the near infrared absorbing compound A and the coloring material that shields visible light (preferably a coloring material including two or more chromatic colorants or a coloring material including at least an organic black colorant), or is a filter in which a layer of the coloring material that shields visible light is separately present in addition to a layer including the near infrared absorbing compound A. In a case where the film is used as an infrared transmitting filter, the near infrared absorbing compound A has a function of limiting light to be transmitted (near infrared light) to a long wavelength side.

In addition, the near infrared cut filter according to the present invention is formed using the above-described composition.

The thickness of the film according to the present invention can be adjusted according to the purpose. The thickness is preferably 20 μm or less, more preferably 10 μm or less, and still more preferably 5 μm or less. For example, the lower limit of the thickness is preferably 0.1 μm or more, more preferably 0.2 μm or more, and still more preferably 0.3 μm or more.

The film (near infrared cut filter) according to the present invention can be used in combination with a color filter that includes a chromatic colorant. The color filter can be manufactured using a coloring composition including a chromatic colorant. Examples of the chromatic colorant include the chromatic colorants described above regarding the composition. The coloring composition may further include, for example, a resin, a curable compound, a photopolymerization initiator, a surfactant, a solvent, a polymerization inhibitor, and an ultraviolet absorber. In more detail, for example, the materials described above regarding the composition can be used. In addition, the film (near infrared cut filter) according to the present invention may have not only a function as a near infrared cut filter but also a function as a color filter by including a chromatic colorant.

In addition, the laminate according to the present invention includes: the near infrared cut filter according to the present invention; and a color filter that includes a chromatic colorant. In the laminate, the near infrared cut filter and the color filter may be or may not be adjacent to the color filter in the thickness direction. In a case where the near infrared cut filter is not adjacent to the color filter in the thickness direction, the near infrared cut filter may be formed on another substrate other than a substrate on which the color filter is formed, or another member (for example, a microlens or a planarizing layer) constituting a solid image pickup element may be interposed between the near infrared cut filter and the color filter.

In the present invention, "near infrared cut filter" refers to a filter that allows transmission of light (visible light) in the visible range and shields at least a part of light (near infrared light) in the near infrared range. The near infrared cut filter may be a filter that allows transmission of light in the entire wavelength range of the visible range, or may be a filter that allows transmission of light in a specific wavelength range of the visible range and shields light in another specific wavelength range of the visible range. In addition, in the present invention, "color filter" refers to a filter that allows transmission of light in a specific wavelength range of the visible range and shields light in another specific wavelength range of the visible range. In addition, "infrared transmitting filter" refers to a filter that shields light (visible light) in the visible range and allows transmission of at least a part of light (near infrared light) in the near infrared range.

In a case where the film according to the present invention is used as a near infrared cut filter, the near infrared cut filter may further include, for example, a layer containing copper, a dielectric multi-layer film, or an ultraviolet absorbing layer in addition to the film according to the present invention.

By further including the layer containing copper and/or the dielectric multi-layer film, the near infrared cut filter having a wide view angle and excellent infrared shielding properties can be obtained. In addition, by including the ultraviolet absorbing layer, the near infrared cut filter having excellent ultraviolet shielding properties can be obtained. The details of the ultraviolet absorbing layer can be found in the description of an absorbing layer described in paragraphs "0040" to "0070" and paragraphs "0119" to "0145" of WO2015/099060, the content of which is incorporated herein by reference. The details of the dielectric multi-layer film can be found in paragraphs "0255" to "0259" of JP2014-41318AAs the layer containing copper, a glass substrate (copper-containing glass substrate) formed of glass containing copper, or a layer (copper complex-containing layer) containing a copper complex may also be used. Examples of a glass substrate including copper include a phosphate glass including copper and a fluorophosphate glass including copper. Examples of a commercially available product of the glass including copper include NF-50 (trade name, manufactured by AGC Techno Glass Co., Ltd.), BG-60 and BG-61 (trade names, both of which are manufactured by Schott AG), and CD5000 (trade name, manufactured by Hoya Corporation). Examples of a copper complex-containing layer include a layer that is formed using a composition including a copper complex. The copper complex is preferably a compound having an absorption maximum in a wavelength range of 700 to 1200 nm. It is more preferable the absorption maximum of the copper complex is present in a wavelength range of 720 to 1200 nm, and it is still more preferable the absorption maximum of the copper complex is present in a wavelength range of 800 to 1100 nm. Examples of the copper complex include the materials described above regarding the other near infrared absorbing compounds.

In a case where the film according to the present invention is used as a near infrared cut filter, it is preferable that the film has an absorption maximum in a wavelength range of 650 to 1000 nm.

In addition, regarding a preferable range of the visible transparency of the near infrared cut filter, an average transmittance in a wavelength range of 400 to 550 nm is preferably 70% or higher, more preferably 80% or higher, still more preferably 85% or higher, and even still more preferably 90% or higher. In addition, a total transmittance of the near infrared cut filter in a wavelength range of 400 to 550 nm is preferably 70% or higher, more preferably 80% or higher, and still more preferably 90% or higher.

In addition, a preferable range of the infrared shielding properties of the near infrared cut filter varies depending on the use. A transmittance at at least one point in a wavelength range of 700 to 1000 nm is preferably 20% or lower, more preferably 15% or lower, and still more preferably 10% or lower.

For example, in a case where the near infrared cut filter is used to shield infrared light in a wide wavelength range, regarding the infrared shielding properties of the near infrared cut filter, a minimum value of a transmittance in a wavelength range of 700 to 800 nm is preferably 20% or lower, more preferably 10% or lower, still more preferably 5% or lower, and even still more preferably 1% or lower. The near infrared cut filter having the above-described spectral characteristics excellent infrared shielding properties in a wavelength range of 700 to 800 nm. The near infrared cut filter having the above-described spectral characteristics may be formed using only the film according to the present invention, or may be formed using a combination of the film according to the present invention and another layer. Preferable examples of the combination include a combination of the film according to the present invention and a layer containing copper.

In addition, in a case where the near infrared cut filter is used to selectively shield infrared light in a predetermined wavelength range, regarding a preferable range of the infrared shielding properties of the near infrared cut filter, an average transmittance in a wavelength range of the absorption maximum of the near infrared cut filter±25 nm is preferably 20% or lower, more preferably 15% or lower, and still more preferably 10% or lower. The above-described spectral characteristics may be achieved using only the film according to the present invention, or may be achieved using a combination of the film according to the present invention and another layer.

In a case where the film according to the present invention is used as an infrared transmitting filter, it is preferable that the film according to the present invention has the following spectral characteristics (1). According to this aspect, a film capable of allowing transmission of infrared light in a state where noise generated from visible light is small can be formed.

(1) A light transmittance in a thickness direction of the film has a maximum value of 20% or lower in a wavelength range of 400 to 830 nm and has a minimum value of 80% or higher in a wavelength range of 1000 to 1300 nm. The film having the above-described spectral characteristics can be preferably used as an infrared transmitting filter that shields light in a wavelength range of 400 to 750 nm and allows transmission of light in a wavelength range of 900 nm or longer.

The spectral characteristics of the film are values obtained by measuring the transmittance in a wavelength range of 300 to 1300 nm using an ultraviolet-visible-near infrared spectrophotometer (U-4100, manufactured by Hitachi High-Technologies Corporation).

In a case where the film according to the present invention is used as a near infrared cut filter or an infrared transmitting filter, a near infrared cut filter and an infrared transmitting filter can be used in combination. By using a near infrared cut filter and an infrared transmitting filter in combination, this combination can be preferably used for an infrared sensor that detects infrared light at a specific wavelength. In a case where both an infrared cut filter and an infrared transmitting filter are used in combination, either or both of the near infrared cut filter and the infrared transmitting filter can be formed using the composition according to the present invention.

The film according to the present invention can be used in various devices including a solid image pickup element such as a charge coupled device (CCD) or a complementary metal-oxide semiconductor (CMOS), an infrared sensor, or an image display device. The film according to the present invention can be used, for example, as a lens that has a function of absorbing and cutting near infrared light (a camera lens for a digital camera, a mobile phone, or a vehicle-mounted camera, or an optical lens such as an a f-θ lens or a pickup lens), an optical filter for a semiconductor light receiving element, an agricultural coating agent for selective use of sunlight, a recording medium using heat absorbed from near infrared light, a near infrared light for an electronic apparatus or a picture, an eye protector, sunglasses, a heat ray shielding filter, a filter for reading and recording an optical character, a filter for preventing classified documents from being copied, an electrophotographic photoreceptor, or a filter for laser welding. In addition, the near infrared cut filter according to the present invention is also useful as a noise cut filter for a CCD camera or a filter for a CMOS image sensor.

<Pattern Forming Method>

A pattern forming method according to the present invention includes: a step of forming a composition layer on a support using the composition according to the present invention; and a step of forming a pattern on the composition layer using a photolithography method or a dry etching method.

In a case where a laminate in which the film according to the present invention and a color filter are laminated is manufactured, pattern formation on the film and pattern formation on the color filter may be separately performed. In addition, pattern formation may be performed on the laminate in which the film according to the present invention and the color filter are laminated. That is, pattern formation on the film according to the present invention and pattern formation on the color filter may be simultaneously performed.

The case where pattern formation on the film (near infrared cut filter) and pattern formation on the color filter are separately performed denotes the following aspect. Pattern formation is performed on any one of the film (near infrared cut filter) and the color filter. Next, the other filter layer is formed on the filter layer on which the pattern is formed. Next, pattern formation is performed on the filter layer on which a pattern is not formed.

A pattern forming method may be a pattern forming method using photolithography or a pattern forming method using dry etching.

In a case where the pattern forming method using photolithography is adopted, a dry etching step is not necessary, and an effect that the number of steps can be reduced can be obtained.

In a case where the pattern forming method using dry etching is adopted, a photolithography function is not necessary. Therefore, an effect that the concentration of a near infrared absorber or the like in the composition according to the present invention can increase can be obtained.

In a case where the pattern formation on the film (near infrared cut filter) and the pattern formation on the color filter are separately performed, the pattern formations on the respective filter layers may be performed using only the photolithography method or only the dry etching method. In addition, after performing the pattern formation on one filter layer using the photolithography method, the pattern formation may be performed on the other filter layer using the dry etching method. In a case where the pattern formation is performed using a combination of the dry etching method and the photolithography method, it is preferable that a pattern is formed on a first layer using the dry etching method and a pattern is formed on a second or subsequent layer using the photolithography method.

It is preferable that the pattern formation using the photolithography method includes: a step of forming a composition layer on a support using each composition; a step of exposing the composition layer in a pattern shape; and a step of forming a pattern by removing a non-exposed portion by development. Optionally, the pattern formation further includes: a step (pre-baking step) of baking the composition layer; and a step (post-baking step) of baking the developed pattern.

In addition, It is preferable that the pattern formation using the dry etching method includes: a step of forming a composition layer on a support using each composition and curing the cured composition layer; a step of forming a photoresist layer on the cured composition layer; a step of obtaining a resist pattern by patterning the photoresist layer by exposure and development; and a step of forming a pattern by dry-etching the cured composition layer by using the resist pattern as an etching mask. Hereinafter, the respective steps will be described.

<<Step of Forming Composition Layer>>

In the step of forming a composition layer, a composition layer is formed on a support using each of the compositions.

As the support, for example, a substrate for a solid image pickup element obtained by providing a solid image pickup element (light-receiving element) such as CCD or CMOS on a substrate (for example, a silicon substrate) can be used.

The pattern may be formed on a solid image pickup element-formed surface (front surface) of the substrate for a solid image pickup element, or may be formed on a solid image pickup element non-formed surface (back surface) thereof.

Optionally, an undercoat layer may be provided on the support to improve adhesion with a layer above the support, to prevent diffusion of materials, or to make a surface of the substrate flat.

As a method of applying the composition to the support, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using metal or the like; and a nanoimprint lithography method. The application method using an ink jet method is not particularly limited as long as the composition can be jetted using this method, and examples thereof include a method (in particular, pp. 115 to 133) described in "Extension of Use of Ink Jet—Infinite Possibilities in Patent-" (February, 2005, S.B. Research Co., Ltd.) and methods described in JP2003-262716A, JP2003-185831A, JP2003-261827A, JP2012-126830A, and JP2006-169325A.

The composition layer formed on the support may be dried (pre-baked). In a case where a pattern is formed through a low-temperature process, pre-baking is not necessarily performed.

In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 300 seconds, more preferably 40 to 250 seconds, and still more preferably 80 to 220 seconds. Drying can be performed using a hot plate, an oven, or the like.

(Case where Pattern is Formed Using Photolithography Method)

<<Exposure Step>>

Next, the composition layer is exposed in a pattern shape (exposure step). For example, the composition layer is exposed in a pattern shape using an exposure device such as a stepper through a mask having a predetermined mask pattern, thereby exposing a pattern. As a result, an exposed portion can be cured.

As radiation (light ray) used during the exposure, ultraviolet rays such as g-rays or i-rays are preferably used (i-rays are more preferably used). The irradiation dose (exposure dose) is preferably 0.03 to 2.5 J/cm$^2$, more preferably 0.05 to 1.0 J/cm$^2$, and most preferably 0.08 to 0.5 J/cm$^2$.

The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 W/m$^2$ to 100000 W/m$^2$ (for example, 5000 W/m$^2$, 15000 W/m$^2$, or 35000 W/m$^2$). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

<<Development Step>>

Next, a pattern is formed by removing a non-exposed portion by development. The non-exposed portion can be removed by development using a developer. As a result, a non-exposed portion of the composition layer in the exposure step is eluted into the developer, and only the photocured portion remains.

As the developer, an organic alkali developer which does not cause damages to a solid image pickup element as a substrate, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of an alkaline agent used in the developer include an organic alkaline compound such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, or 1,8-diazabicyclo-[5.4.0]-7-undecene. As the developer, an alkaline aqueous solution is preferably used in which the above alkaline agent is diluted with pure water such that a concentration thereof is 0.001 to 10 mass % and preferably 0.01 to 1 mass %. In addition, an inorganic alkali may be used as the developer. Preferable examples of the inorganic alkali include sodium hydroxide, potassium hydroxide, sodium carbonate, sodium bicarbonate, sodium silicate, and sodium metasilicate. In addition, a surfactant may be used as the developer. Examples of the surfactant include the surfactants described above regarding the composition. Among these, a nonionic surfactant is preferable. From the viewpoint of easiness of transport, storage, and the like, the developer may be obtained by temporarily preparing a concentrated solution and diluting the concentrated solution to a necessary dilution factor during use. The dilution factor is not particularly limited and, for example, can be set to be in a range of 1.5 to 100 times. In a case where a developer including the alkaline aqueous solution is used, in general, it is preferable that the film is rinsed with pure water after development.

After the development, it is preferable that the film is dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher. The film after the development is post-baked continuously or batch-wise using heating means such as a hot plate, a convection oven (hot air circulation dryer), or a high-frequency heater under the above-described conditions. In addition, in a case where a pattern is formed through a low-temperature process, post-baking is not necessarily performed.

(Case where Pattern is Formed Using Dry Etching Method)

The pattern formation using the dry etching method can be performed by curing the composition layer formed on the support to form a cured composition layer, forming a patterned photoresist layer on the obtained cured composition layer, and then etching the cured composition layer with etching gas using the photoresist layer as a mask. As a method of forming the photoresist layer, a method of applying a positive type or negative type radiation sensitive composition to the cured composition layer and drying the positive type or negative type radiation sensitive composition is preferable. It is preferable that pre-baking is further performed in order to form the photoresist layer. In particular, in a preferable aspect, as a process of forming the photoresist layer, baking after exposure or baking after development (post-baking) is performed. The details of the pattern formation using the dry etching method can be found in paragraphs "0010" to "0067" of JP2013-064993A, the content of which is incorporated herein by reference.

<Solid Image Pickup Element>

A solid image pickup element according to the present invention includes the film according to the present invention. The solid image pickup element is configured to include the film (near infrared cut filter) according to the present invention. The configuration of the solid image pickup element is not particularly limited as long as the solid image pickup element functions. For example, the following configuration can be adopted.

The solid image pickup element includes plural photodiodes and transfers electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the present invention is formed on the device protective film.

Further, a configuration in which light collecting means (for example, a microlens; hereinafter, the same shall be applied) is provided above the device protective film and below the near infrared cut filter according to the present invention (on a side thereof close to the support), or a configuration in which light collecting means is provided on the film (near infrared cut filter) according to the present invention may be adopted.

In addition, the color filter may have a structure in which a cured film which forms each color pixel is embedded in a space which is partitioned in, for example, a lattice shape by a partition wall. In this case, it is preferable that the partition wall has a low refractive index with respect to each color pixel. Examples of an imaging device having such a structure include a device described in JP2012-227478A and JP2014-179577A.

<Image Display Device>

The film according to the present invention can also be used in an image display device such as a liquid crystal display device or an organic electroluminescence (organic EL) display device. For example, by using the near infrared cut filter in combination with the respective colored pixels (for example, red, green, blue), the near infrared cut filter can be used for the purpose of shielding infrared light included in light emitted from a backlight (for example, a white light emitting diode (white LED)) of a display device to prevent a malfunction of a peripheral device, or for the purpose of forming an infrared pixel in addition to the respective color display pixels.

The definition of a display device and the details of each display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994) ". The liquid crystal display device to which the present invention is applicable is not particularly limited. For example, the present invention is applicable to various liquid crystal display devices described in "Next-Generation Liquid Crystal Display Techniques".

The image display device may include a white organic EL element. It is preferable that the white organic EL element has a tandem structure. The tandem structure of the organic EL element is described in, for example, JP2003-45676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the present invention includes the film according to the present invention. The configuration of the infrared sensor is not particularly limited as long as it includes the film according to the present invention and functions as an infrared sensor.

Hereinafter, an embodiment of the infrared sensor will be described using the drawing.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray hν side of the color filters 112 and the infrared transmitting filters 114. A planarizing layer 116 is formed so as to cover the microlenses 115.

Characteristics of the near infrared cut filters 111 can be selected depending on the emission wavelength of an infrared light emitting diode (infrared LED) described below.

In a case where the emission wavelength of the infrared LED is 850 nm, it is preferable that the near infrared cut filter 111 is a filter that allows transmission of visible light (for example, light in a wavelength range of 400 to 700 nm) and shields light in a wavelength range of longer than 850 nm.

In addition, in a case where the emission wavelength of the infrared LED is 940 nm, it is preferable that the near infrared cut filter 111 is a filter that allows transmission of visible light (for example, light in a wavelength range of 400 to 700 nm) and shields light in a wavelength range of longer than 940 nm.

The color filters 112 is not particularly limited as long as pixels which allow transmission of light having a specific wavelength in the visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected depending on the emission wavelength of the infrared LED described below.

For example, in a case where the emission wavelength of the infrared LED is 850 nm, a maximum value of a light transmittance of the infrared transmitting filter 114 in the thickness direction of the film in a wavelength range of 400 to 650 nm is preferably 30% or lower, more preferably 20% or lower, still more preferably 10% or lower and even still more preferably 0.1% or lower. It is preferable that the transmittance satisfies the above-described conditions in the entire wavelength range of 400 to 650 nm. The maximum value of the light transmittance in a wavelength range of 400 to 650 nm is typically 0.1% or higher.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED. The minimum value of the light transmittance in a wavelength range of 900 to 1300 nm is typically 99.9% or lower.

The thickness of the infrared transmitting filter 114 is preferably 100 μm or less, more preferably 15 μm or less, still more preferably 5 μm or less, and even still more preferably 1 μm or less. The lower limit value is preferably 0.1 μm. In a case where the thickness is in the above-described range, the film can satisfy the above-described spectral characteristics.

A method of measuring the spectral characteristics, the thickness, and the like of the infrared transmitting filter 114 is as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using an ultraviolet-visible-near infrared spectrophotometer (U-4100, manufactured by Hitachi High-Technologies Corporation).

The infrared transmitting filter 114 having the above-described spectral characteristics can be formed using a composition including the coloring material that shields visible light. The details of the coloring material that shields visible light are the same as the range described above regarding the composition.

In addition, for example, in a case where the emission wavelength of the infrared LED is 940 nm, it is preferable that a maximum value of a light transmittance of the infrared transmitting filter 114 in a thickness direction in a wavelength range of 450 to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

The infrared transmitting filter 114 having the above-described spectral characteristics can be manufactured using a composition including the coloring material that shields visible light and a near infrared absorbing compound having an absorption maximum in a wavelength range of 750 to 950 nm. The details of the coloring material that shields visible light are the same as the range described above regarding the composition. Examples of the near infrared absorbing compound include the near infrared absorbing compound described above regarding the composition.

The patterns of the near infrared cut filters, the color filters, and the infrared transmitting filters used in the infrared sensor shown in FIG. 1 can be formed, for example, as follows.

Figure 2:
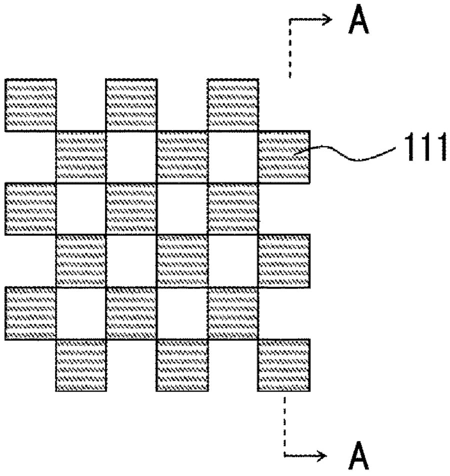
FIG. 2 is a diagram (plan view) showing a step of forming a pattern. Line A-A is a line along which a cross-sectional view for FIG. 3 is taken.
Figure 3:
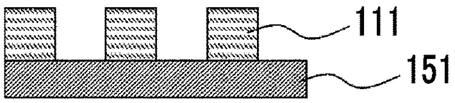
FIG. 3 is a cross-sectional view taken along line A-A of FIG. 2.

First, a composition for forming the near infrared cut filter (near infrared absorbing composition) is applied to the support 151 to form a near infrared absorbing composition layer. Next, a pattern is formed on the near infrared absorbing composition layer as shown in FIGS. 2 and 3. The pattern forming method may be any one of the photolithography method and the dry etching method. In FIGS. 2 and 3, a Bayer (lattice) pattern is formed on the near infrared absorbing composition layer. However, a shape of the pattern can be appropriately selected according to the use.

Figure 4:
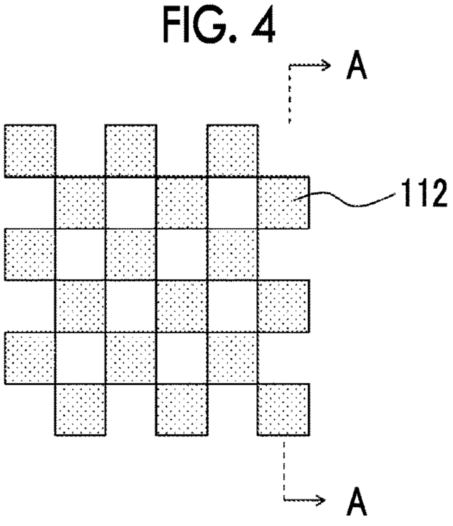
FIG. 4 is a diagram (plan view) showing a step of forming a pattern. Line A-A is a line along which a cross-sectional view for FIG. 5 is taken.
Figure 5:
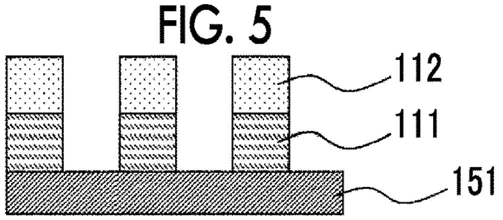
FIG. 5 is a cross-sectional view taken along line A-A of FIG. 4.

Next, a composition (coloring composition) for forming the color filter is applied to the Bayer pattern (the near infrared cut filters 111) of the near infrared absorbing composition layer to form a coloring composition layer thereon. Next, as shown in FIGS. 4 and 5, the coloring composition layer is patterned to form a Bayer pattern (the color filters 112) of the coloring composition layer on the Bayer pattern (the near infrared cut filters 111) of the near infrared absorbing composition layer. The pattern forming method may be any one of the photolithography method and the dry etching method and is preferably the photolithography method.

Figure 6:
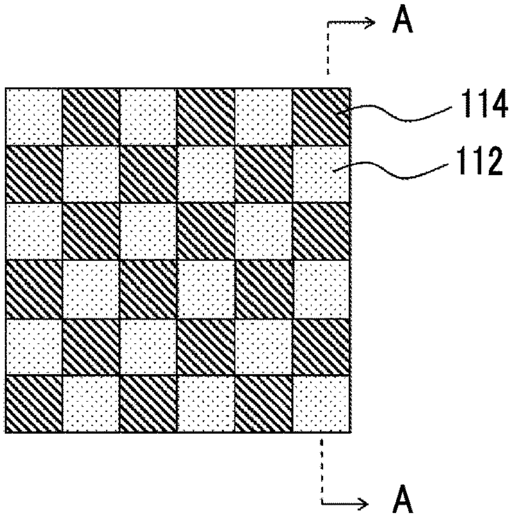
FIG. 6 is a diagram (plan view) showing a step of forming a pattern. Line A-A is a line along which a cross-sectional view for FIG. 7 is taken.
Figure 7:
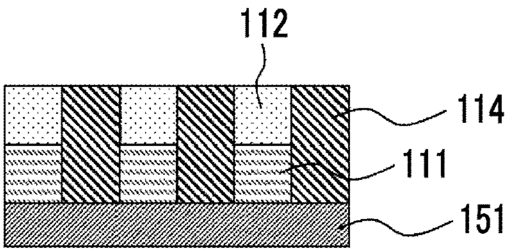
FIG. 7 is a cross-sectional view taken along line A-A of FIG. 6.

Next, a composition for forming the infrared transmitting filter is applied to the films on which the color filters 112 are formed to form a composition layer thereon. Next, as shown in FIGS. 6 and 7, the composition layer is patterned to form a pattern of the infrared transmitting filters 114 on a portion where the Bayer pattern of the near infrared cut filters 111 is not formed.

In addition, in the embodiment shown in FIG. 1, the color filters 112 are provided on the incidence ray hν side compared to the near infrared cut filter 111. The lamination order of the near infrared cut filter 111 and the color filters 112 may be reversed, and the near infrared cut filter 111 may be provided on the incidence ray hν side compared to the color filters 112. In addition, in the embodiment shown in FIG. 1, the infrared transmitting filter 114 may be configured as a single-layer film or as a multi-layer film including two or more layers. In addition, in the embodiment shown in FIG. 1, the near infrared cut filters 111 and the color filters 112 are laminated adjacent to each other. However, the infrared cut filters 111 and the color filters 112 are not necessarily provided adjacent to each other. The near infrared cut filters 111 may be formed on another support other than the support on which the color filters 112 are formed. As the support, any transparent substrate can be preferably used. In addition, a transparent substrate including copper, a substrate which includes a transparent layer containing copper, or a substrate on which a band pass filter is formed can also be used.

Figure 8:
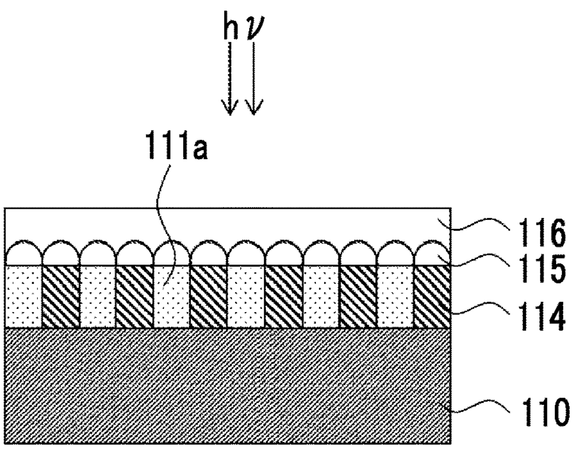
FIG. 8 is a schematic diagram showing another embodiment of an infrared sensor.

In addition, in a case where the near infrared cut filter 111 has a function as a color filter by further including a chromatic colorant in addition to the near infrared absorbing compound, the color filters 112 are not necessarily provided as shown in FIG. 8. In FIG. 8, reference numeral 111*a* represents a near infrared cut filter including a chromatic colorant which also has a function as a color filter.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "%" and "part(s)" represent "mass %" and "part(s) by mass". In addition, in the following chemical formulae, Me represents a methyl group, Bu represents a butyl group, and a Ph represents a phenyl group. NMR represents nuclear magnetic resonance.

Synthesis Example

Synthesis Example 1

Synthesis of Compound II-186

A compound II-186 was synthesized with reference to Chem. Eur. J. 2009, 15, 4857.

18.2 parts by mass of 60 mass % sodium hydride and 200 parts by mass of tetrahydrofuran were put into a flask, and 60 parts by mass of tert-butyl cyanoacetate was added dropwise in an ice bath. The reaction solution was stirred at room temperature for 1 hour, 25 parts by mass of 2-chloro-6-methyl-benzoxazole was added was added, and the reaction solution was stirred for 12 hours. The reaction solution was poured into 1000 parts by mass of water, 100 parts by mass of acetic acid was added, and precipitates were separated by filtration and were washed with hexane. The crystals were dried by blowing air at 50° C. As a result, 39 parts by mass of an intermediate A was obtained.

39 parts by mass of the intermediate A, 50 parts by mass of trifluoroacetic acid, and 300 parts by mass of chloroform were put into a flask and were stirred at 60° C. for 1 hour. After the reaction, a sodium carbonate aqueous solution was added, and the organic phase was extracted by liquid separation operation. The organic phase was washed with a saturated sodium chloride aqueous solution, and the solvent was removed by distillation under reduced pressure. As a result, a light yellow solid was obtained. The obtained light yellow solid was purified by silica column chromatography (hexane/chloroform solvent). As a result, 13 parts by mass of an intermediate a-1 was obtained.

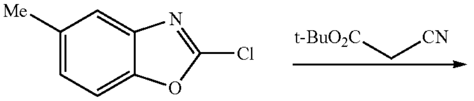

-continued

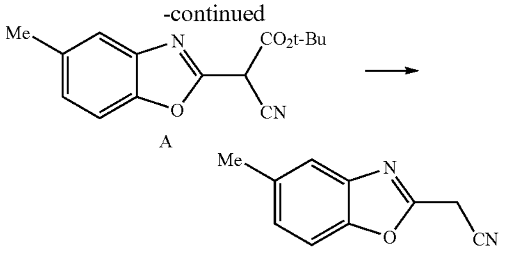

Intermediate a-1

21.6 parts by mass of isooctadecanol (FINEOXOCOL 180, manufactured by Nissan Chemical Industries Ltd.) and triethylamine were stirred in 80 parts by mass of toluene, and 10 parts by mass of methanesulfonyl chloride was added dropwise at −10° C. After completion of the dropwise addition, a reaction was caused to occur at 30° C. for 2 hours. The organic phase was extracted by liquid separation operation, and the solvent was removed by distillation under reduced pressure. After the removal of the solvent, 10.5 parts by mass of 3-cyanophenol, 13.9 parts by mass of potassium carbonate, and 16 parts by mass of dimethylacetamide were added, and the components were caused to react with each other at 100° C. for 24 hours. The organic phase was extracted by liquid separation operation, the organic phase was washed with a sodium hydroxide aqueous solution, and the solvent was removed by distillation under reduced pressure. As a result, 28 parts by mass of a compound A as a light yellow liquid was obtained.

30 parts by mass of the compound A, 9 parts by mass of diisopropyl succinate, 40 parts by mass of tert-amyl alcohol, and 16.5 parts by mass of potassium tert-butoxide were put into a flask and were stirred at 120° C. for 3 hours. After the reaction, 100 parts by mass of methanol and 100 parts by mass of water were added, and precipitates were separated by filtration. The crystals were dried by blowing air at 50° C. As a result, 20 parts by mass of a compound B was obtained.

20 parts by mass of the compound B and 9.4 parts by mass of the intermediate a-1 were stirred in 400 parts by mass of toluene. Next, 20.9 parts by mass of phosphorus oxychloride was added, and the components were heated to reflux for 4.5 hours. After the reaction, the reaction solution was cooled to room temperature, 800 parts by mass of methanol was added, and the components were stirred at room temperature for 30 minutes. The precipitated crystals were separated by filtration and were washed with 400 parts by mass of methanol. The obtained crystals were dried by blowing air at 40° C. for 12 hours. As a result, 13 parts by mass of a compound C was obtained.

10.5 parts by mass of titanium chloride was added to 90 parts by mass of toluene including 7.5 parts by mass of diphenylborinic acid 2-aminoethyl ester, and the components were stirred at 35° C. for 30 minutes. Next, 9 parts by mass of the compound C was added, and the components were stirred under 2-hour heating reflux conditions. The reaction solution was cooled to room temperature, 100 parts by mass of methanol was added, and the components were stirred at room temperature for 30 minutes. The precipitated crystals were separated by filtration and were purified by silica column chromatography (chloroform solvent). As a result, 8.8 parts by mass of a compound II-186 was obtained.

$^1$H-NMR ($CDCl_3$): δ0.75-1.88 (m, 70H), 2.13 (s, 6H), 3.75 (m, 4H), 6.20 (s, 2H), 6.42 (d, 4H), 6.64 (d, 4H), 6.93 (d, 2H), 7.12-7.22 (m, 22H)

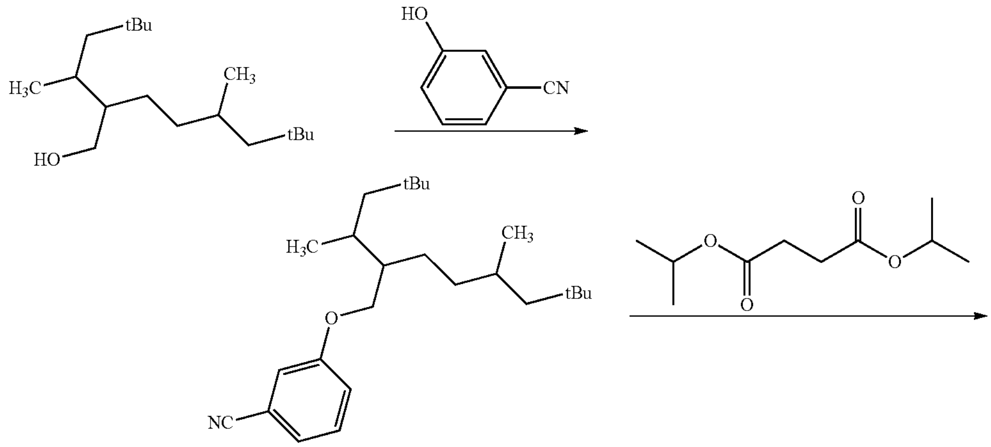
Compound A
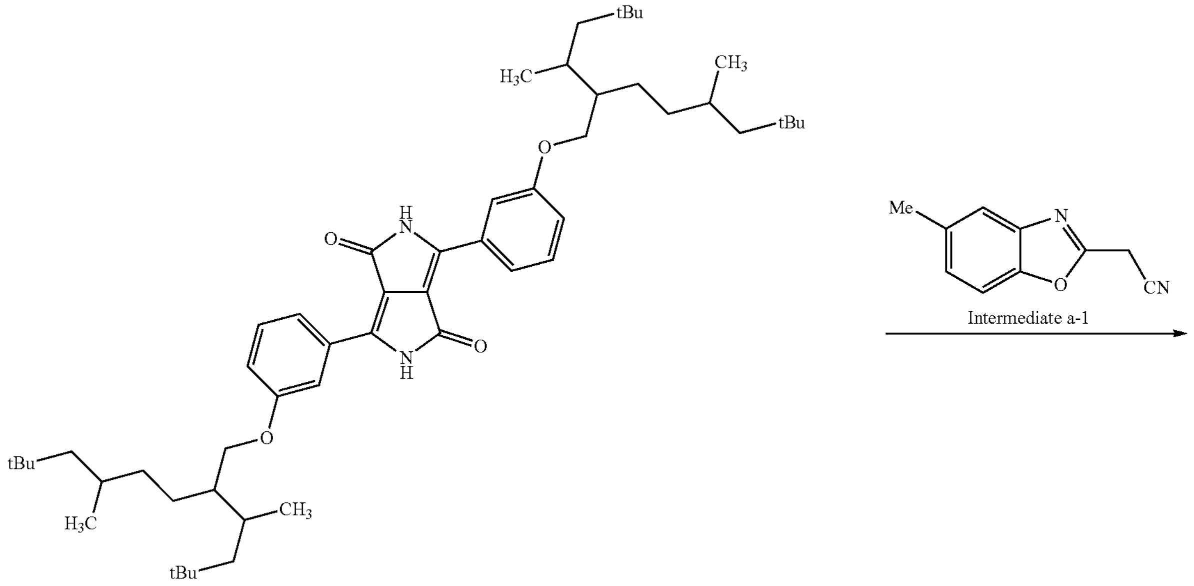
Compound B
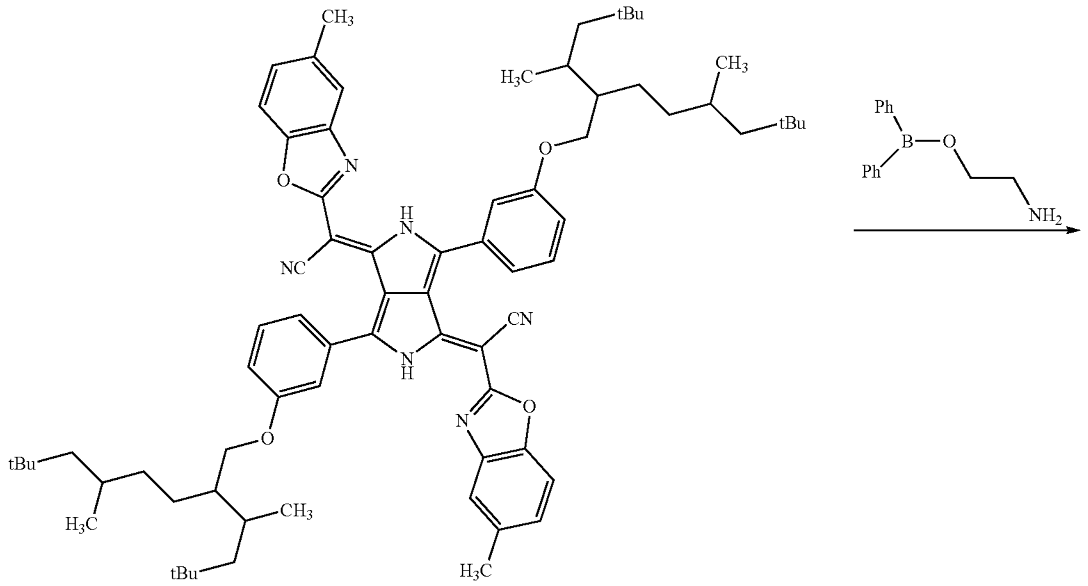
Compound C

-continued

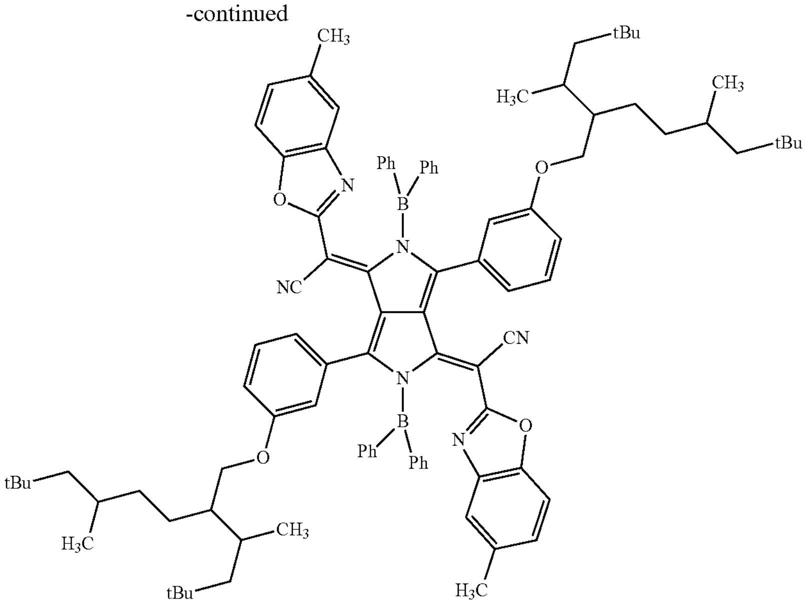

II-186

Synthesis Example 2

Compounds II-9, II-10, II-27, II-43, II-44, II-167, II-168, II-184, II-185, II-201, II-202, II-325, II-507, II-508, II-524, II-525, II-541, II-673, II-697, II-715, III-9, III-28, III-29, III-167, III-328, III-349, III-358, and III-365 were synthesized using the same method as that of the compound II-186.

Synthesis Example 3

Synthesis of Compound II-408

A compound D was synthesized using an intermediate a-2 which was synthesized using the same method as that of the intermediate a-1.

20 parts by mass of the compound D was added to 200 parts by mass of toluene including 10 parts by mass of 2-chloro-1,3,2-benzodioxaborole, 11 parts by mass of diisopropyl ethyl amine was added, and the components were stirred at 100° C. for 1 hour. The reaction solution was cooled to room temperature, 400 parts by mass of methanol was added, and the components were stirred at room temperature for 30 minutes. The precipitated crystals were separated by filtration and were purified by silica column chromatography (chloroform solvent). As a result, 13 parts by mass of a compound II-408 was obtained.

$^1$H-NMR ($CDCl_3$): δ0.85-2.02 (m, 70H), 3.70 (m, 4H), 6.44 (m, 4H), 6.63 (m, 8H), 6.95 (m, 6H), 7.29 (m, 2H), 7.41 (dd, 2H)

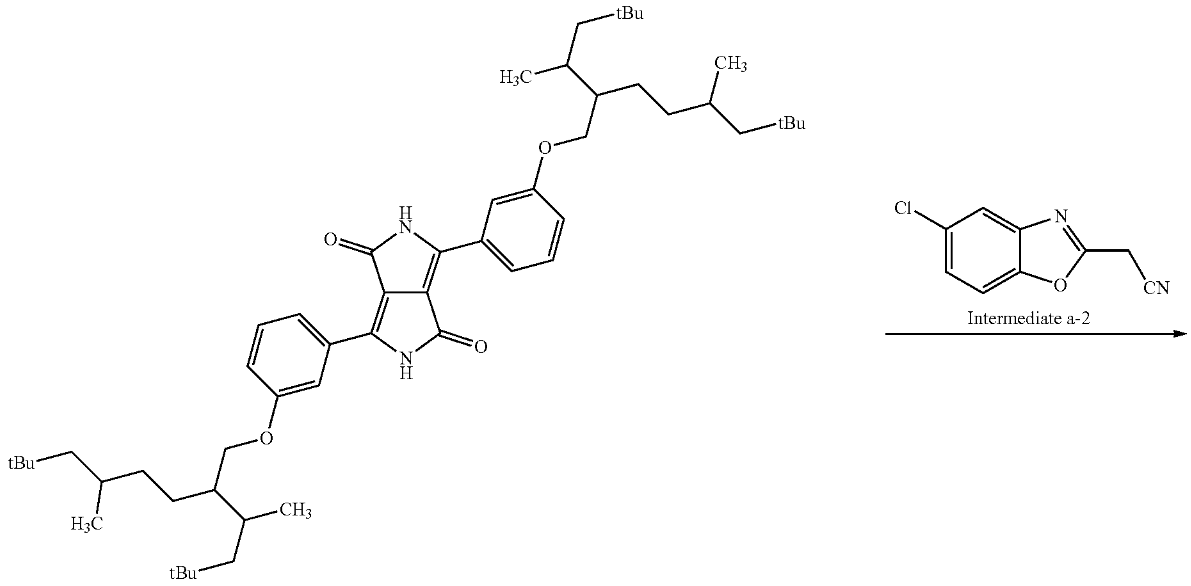
Compound B
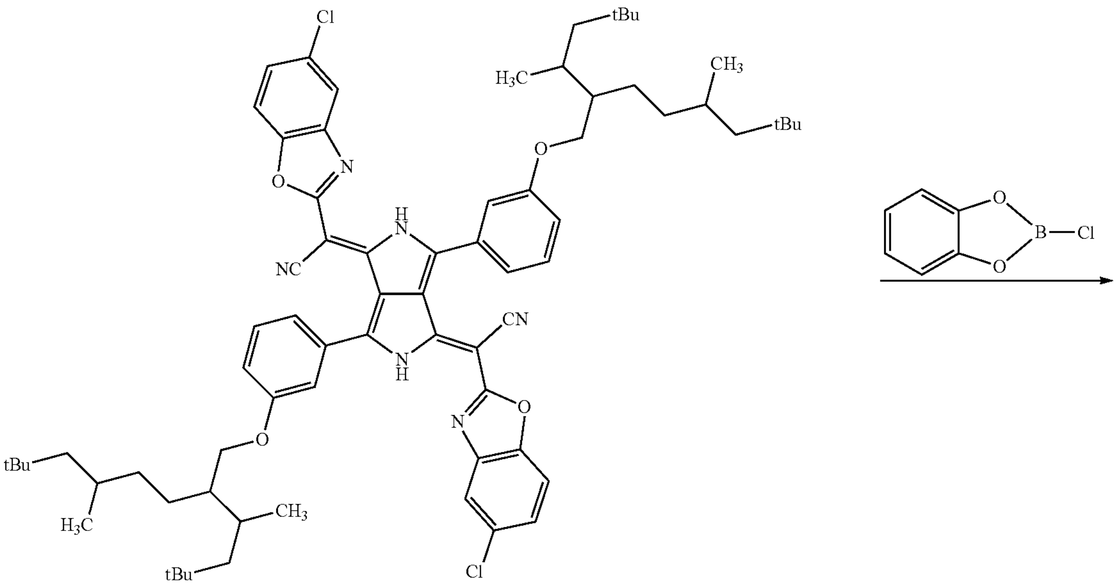
Compound D

-continued

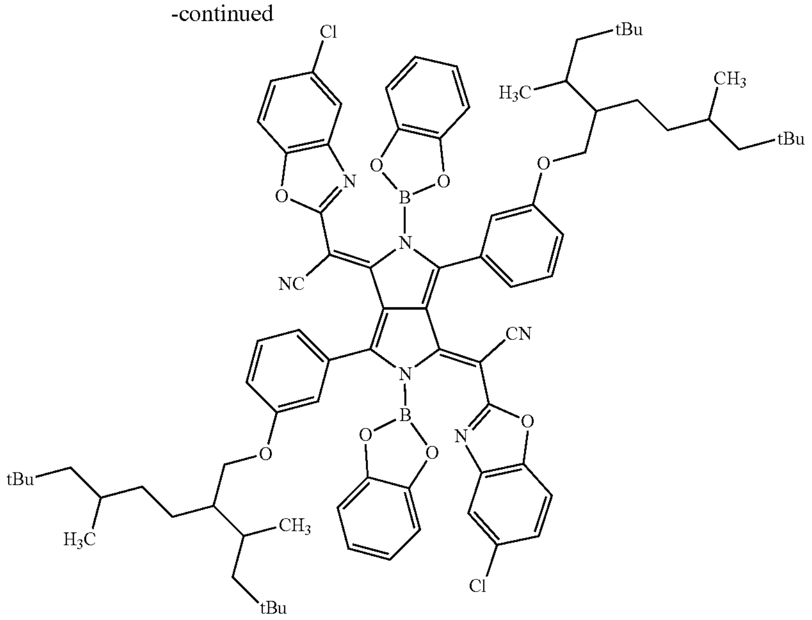

II-408

Synthesis Example 4

Compounds II-91, II-269, II-274, II-275, II-589, and II-590 were synthesized using the same method as that of the compound I-408.

Synthesis Example 5

Synthesis of Compound II-92

35 parts by mass of phosphorus oxychoride was added to 20 parts by mass of the compound B, and the components were heated to reflux for 2 hours. After the reaction, abundant phosphorus oxychloride was removed by distillation under reduced pressure, 200 parts by mass of toluene and 4.7 parts by mass of 2-(2-benzothiazolyl)acetonitrile were added, and the components were heated to reflux for 1 hour. The reaction solution was cooled to room temperature, 200 parts by mass of chloroform and 200 parts by mass of water were added, and the organic phase was extracted by liquid separation operation. The organic phase was washed with a saturated sodium chloride aqueous solution, and the solvent was removed by distillation under reduced pressure. As a result, 11 parts by mass of a compound E was obtained. 8 parts by mass of the compound E and 2.2 parts by mass of the intermediate a-1 were stirred in 80 parts by mass of toluene. Next, 4 parts by mass of phosphorus oxychloride was added, and the components were heated to reflux for 2 hours. After the reaction, the reaction solution was cooled to room temperature, 150 parts by mass of methanol was added, and the components were stirred at room temperature for 30 minutes. The precipitated crystals were separated by filtration and were washed with 100 parts by mass of methanol. The obtained crystals were dried by blowing air at 40° C. for 12 hours. As a result, 6 parts by mass of a compound F was obtained.

4.5 parts by mass of the compound F was added to 50 parts by mass of toluene including 2.5 parts by mass of 2-chloro-1,3,2-benzodioxaborole. Next, 2.5 parts by mass of diisopropylethylamine was added, and the components were stirred at 100° C. for 1 hour. The reaction solution was cooled to room temperature, 90 parts by mass of methanol was added, and the components were stirred at room temperature for 30 minutes. The precipitated crystals were separated by filtration and were purified by silica column chromatography (chloroform solvent). As a result, 3 parts by mass of a compound IV-92 was obtained.

$^1$H-NMR ($CDCl_3$): δ0.85-2.02 (m, 70H), 2.14 (s, 3H), 3.60-3.87 (m, 4H), 6.40 (m, 4H), 6.45 (s, 1H), 6.60 (m, 6H), 6.86 (m, 1H), 6.89-7.00 (m, 5H), 7.10 (d, 2H), 7.19 (t, 1H), 7.30 (t, 1H), 7.34 (d, 1H)

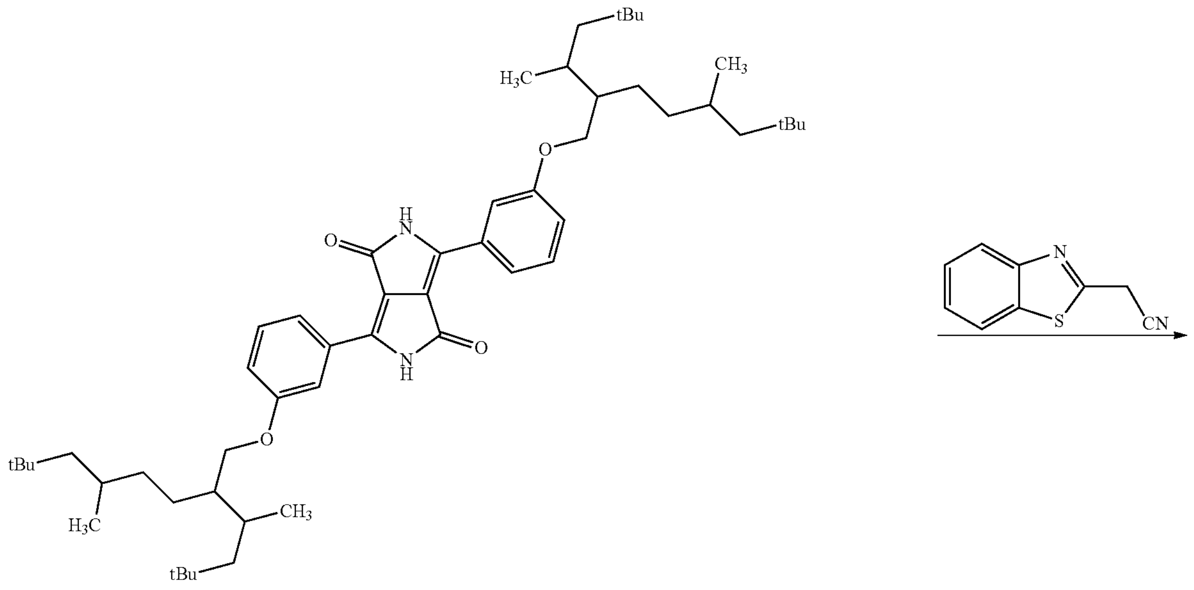
Compound B
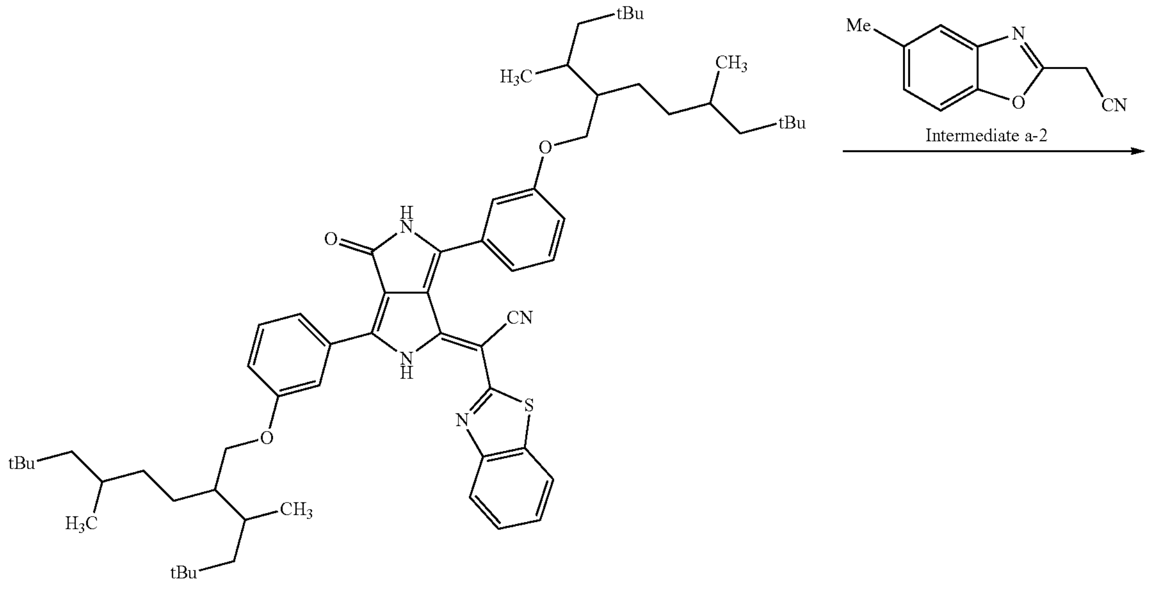
Compound E

-continued

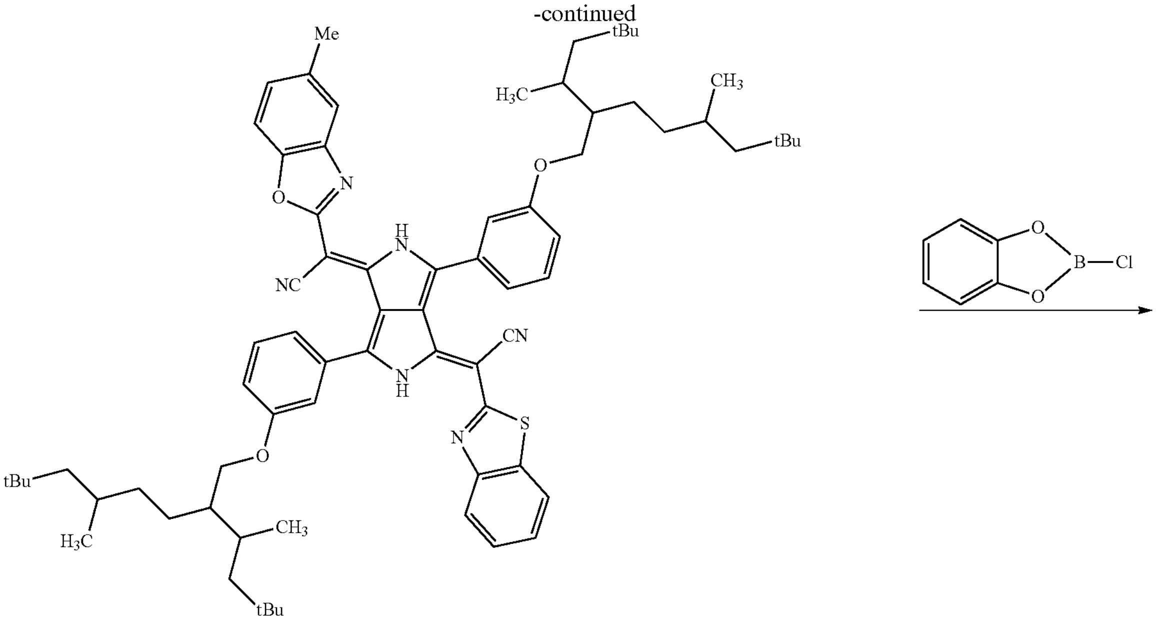

Compound F

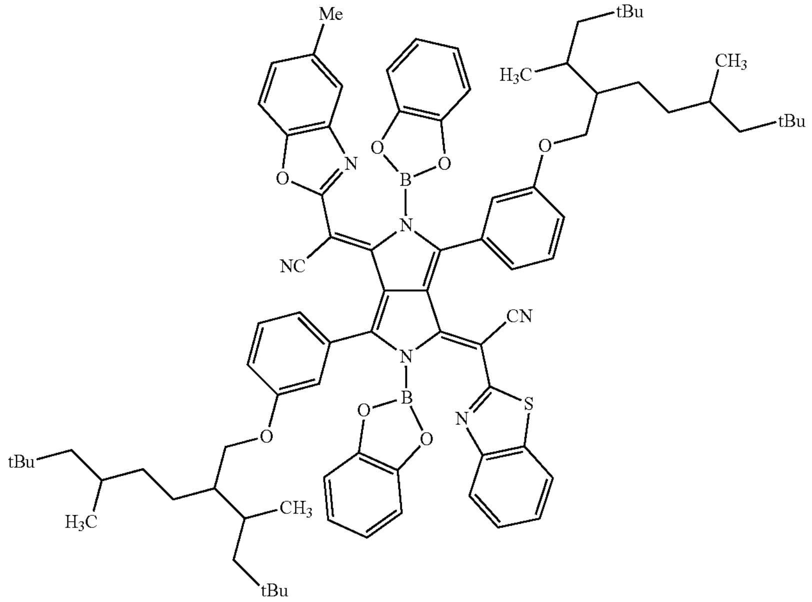

IV-92

Synthesis Example 6

Compounds IV-7 and IV-91 were synthesized using the same method as that of the compound III-92.

Synthesis Example 7

Synthesis of Compound III-168

21.6 parts by mass of isooctadecanol (FINEOXOCOL 180, manufactured by Nissan Chemical Industries Ltd.) and 9.7 parts by mass of triethylamine were added and stirred in 80 parts by mass of toluene, and 10 parts by mass of methanesulfonyl chloride was added dropwise at a liquid temperature of 10° C. or lower. After completion of the dropwise addition, a reaction was caused to occur at 30° C. for 2 hours. The organic phase was extracted by liquid separation operation, and the solvent was removed by distillation under reduced pressure. After the removal of the solvent, 10.5 parts by mass of 4-cyanophenol, 13.3 parts by mass of potassium carbonate, and 24 parts by mass of dimethylacetamide were added, and the components were caused to react with each other at 110° C. for 24 hours. The organic phase was extracted by liquid separation operation, the organic phase was washed with a sodium hydroxide aqueous solution, and the solvent was removed by distillation under reduced pressure. As a result, 28 parts by mass of a compound G as a light yellow liquid was obtained.

Next, 13 parts by mass of the compound G, 4.2 parts by mass of diisopropyl succinate, 18 parts by mass of t-amyl alcohol, and 7.7 parts by mass of potassium t-butoxide were put into a flask and were stirred at 120° C. for 6 hours. After the reaction, 36 parts by mass of methanol and 36 parts by mass of water were added, and precipitates were separated by filtration to obtain crystals. The crystals were dried by blowing air at 50° C. As a result, 5.1 parts by mass of a compound H was obtained.

Next, 5 parts by mass of the compound H and 3.5 parts by mass of an intermediate a-3 which was synthesized using a method described in WO2015/166873A were heated and stirred in 100 parts by mass of toluene. Next, 3.8 parts by mass of phosphorus oxychloride was added, and the components were heated to reflux for 4 hours. After the reaction, the reaction solution was cooled to room temperature, 200 parts by mass of methanol was added, and the components were stirred at room temperature for 30 minutes. The precipitated crystals were separated by filtration and were washed with 400 parts by mass of methanol. The obtained crystals were dried by blowing air at 50° C. for 12 hours. As a result, 3.1 parts by mass of a compound I was obtained.

Next, 3.1 parts by mass of titanium chloride was added to 20 parts by mass of toluene including 2.2 parts by mass of diphenylborinic acid 2-aminoethyl ester, and the components were stirred at 35° C. for 30 minutes. Next, 1.7 parts by mass of the compound I was added, and the components were stirred under 3-hour heating reflux conditions. The reaction solution was cooled to room temperature, 40 parts by mass of methanol was added, and the components were stirred at room temperature for 30 minutes. The precipitated crystals were separated by filtration and were purified by silica column chromatography (chloroform solvent). As a result, 1.8 parts by mass of a compound III-168 was obtained.

$^1$H-NMR ($CDCl_3$): δ8.99 (s, 2H), 8.16 (s, 2H), 7.78 (s, 2H), 7.26 (s, 10H), 7.19 (s, 10H), 6.58 (d, 4H), 6.18 (d, 4H), 3.95-3.82 (m, 4H), 1.98-1.67 (m, 4H), 1.45-1.08 (m, 18H), 1.03-0.95 (m, 48H)

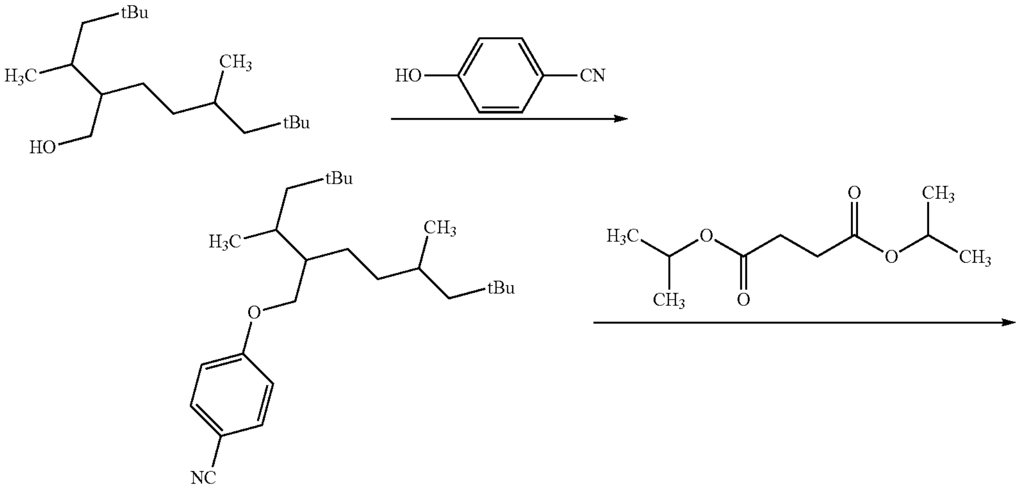

Compound G

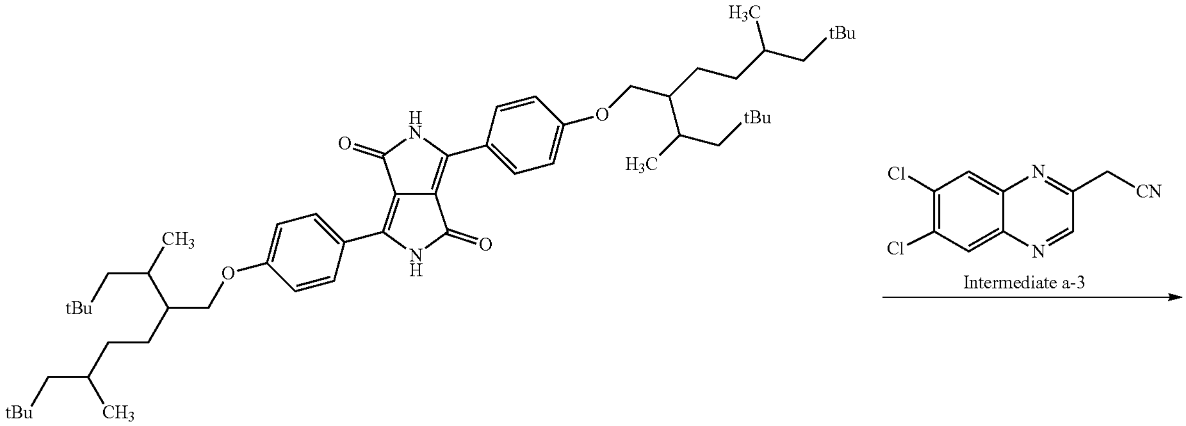

Compound H

-continued

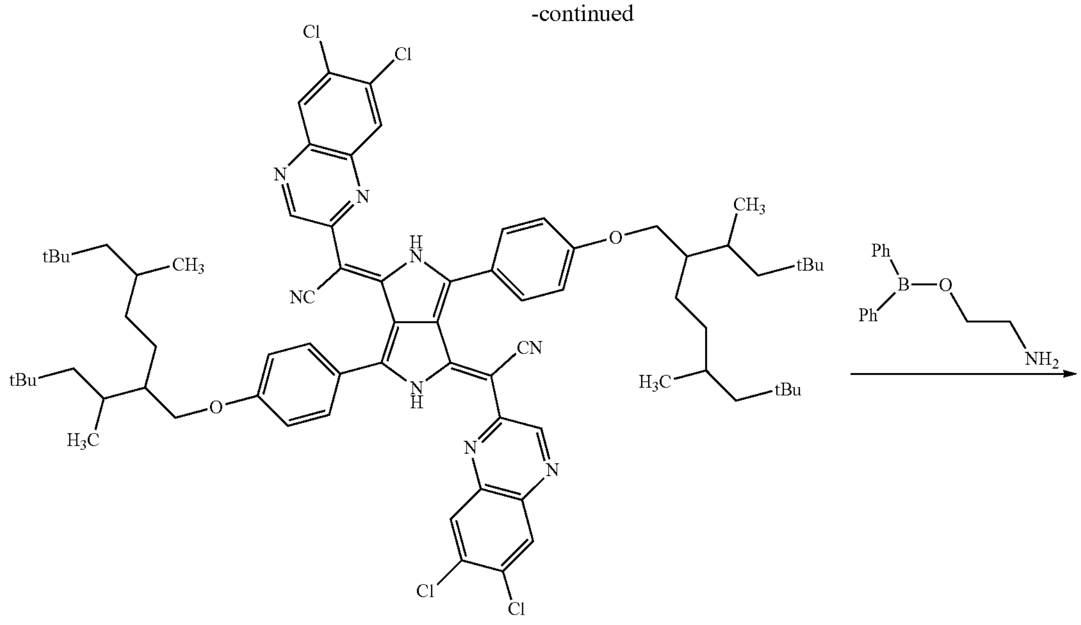

Compound I

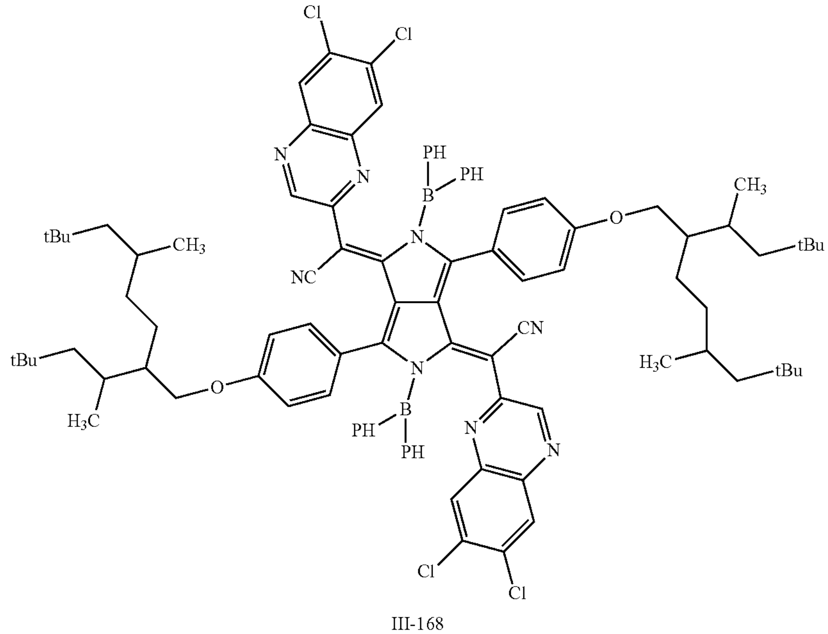

III-168

<Evaluation of Absorption Maximum and Absorbance Ratio>

Each of the compounds was dissolved in a measurement solvent shown in the following tables (concentration: $2.5\times 10^{-6}$ mol/L) to measure an absorption spectrum (optical path length: 10 mm).

The absorption maximum (λmax) of the absorption spectrum of each of the compounds is shown in the following tables.

In addition, an absorbance ratio (500 nm/λmax) as a value obtained by dividing an absorbance at a wavelength of 500 nm by an absorbance at an absorption maximum was evaluated based on the following criteria.

A: the absorbance ratio (500 nm/λmax) was 0.04 or lower

B: the absorbance ratio (500 nm/λmax) was higher 0.04 and 0.08 or lower C: the absorbance ratio (500 nm/λmax) was higher than 0.08

<Evaluation of Solubility>

Each of the compounds was added to water at 23° C. under the atmospheric pressure, the components were stirred for 1 hour, and the solubility of the compound in water was obtained. The solubility of the compound was evaluated based on the following criteria.

A: the solubility in water at 23° C. was 0.1 mass % or lower

B: the solubility in water at 23° C. was higher than 0.1 mass % and 1 mass % or lower C: the solubility in water at 23° C. was higher than 1 mass %

TABLE 56

| Kind of Compound | Compound No. | Solvent | Absorption Maximum (nm) | Absorbance Ratio | Solubility |
|---|---|---|---|---|---|
| Pyrrolopyrrole Compound | II-9 | Chloroform | 740 | A | A |
| Pyrrolopyrrole Compound | II-10 | Chloroform | 740 | A | A |
| Pyrrolopyrrole Compound | II-27 | Chloroform | 743 | A | A |
| Pyrrolopyrrole Compound | II-29 | Chloroform | 743 | A | A |
| Pyrrolopyrrole Compound | II-43 | Chloroform | 732 | A | A |
| Pyrrolopyrrole Compound | II-44 | Chloroform | 732 | A | A |
| Pyrrolopyrrole Compound | II-91 | Chloroform | 679 | A | A |
| Pyrrolopyrrole Compound | II-167 | Chloroform | 745 | A | A |
| Pyrrolopyrrole Compound | II-168 | Chloroform | 745 | A | A |
| Pyrrolopyrrole Compound | II-184 | Chloroform | 749 | A | A |
| Pyrrolopyrrole Compound | II-185 | Chloroform | 748 | A | A |
| Pyrrolopyrrole Compound | II-186 | Chloroform | 748 | A | A |
| Pyrrolopyrrole Compound | II-201 | Chloroform | 737 | A | A |
| Pyrrolopyrrole Compound | II-202 | Chloroform | 737 | A | A |
| Pyrrolopyrrole Compound | II-269 | Chloroform | 685 | A | A |
| Pyrrolopyrrole Compound | II-274 | Chloroform | 685 | A | A |
| Pyrrolopyrrole Compound | II-275 | Chloroform | 685 | A | A |
| Pyrrolopyrrole Compound | II-325 | Chloroform | 738 | A | A |
| Pyrrolopyrrole Compound | II-408 | Chloroform | 680 | A | A |
| Pyrrolopyrrole Compound | II-507 | Chloroform | 780 | A | A |
| Pyrrolopyrrole Compound | II-508 | Chloroform | 780 | A | A |
| Pyrrolopyrrole Compound | II-524 | Chloroform | 779 | A | A |
| Pyrrolopyrrole Compound | II-525 | Chloroform | 783 | A | A |
| Pyrrolopyrrole Compound | II-541 | Chloroform | 772 | A | A |
| Pyrrolopyrrole Compound | II-673 | Chloroform | 794 | A | A |
| Pyrrolopyrrole Compound | II-589 | Chloroform | 719 | A | A |
| Pyrrolopyrrole Compound | II-590 | Chloroform | 719 | A | A |
| Pyrrolopyrrole Compound | II-697 | Chloroform | 743 | A | A |
| Pyrrolopyrrole Compound | II-715 | Chloroform | 769 | A | A |
| Pyrrolopyrrole Compound | III-9 | Chloroform | 863 | A | A |
| Pyrrolopyrrole Compound | III-28 | Chloroform | 863 | A | A |
| Pyrrolopyrrole Compound | III-29 | Chloroform | 863 | A | A |
| Pyrrolopyrrole Compound | III-167 | Chloroform | 885 | A | A |
| Pyrrolopyrrole Compound | III-168 | Chloroform | 885 | A | A |
| Pyrrolopyrrole Compound | III-328 | Chloroform | 872 | A | A |
| Pyrrolopyrrole Compound | III-349 | Chloroform | 752 | A | A |
| Pyrrolopyrrole Compound | III-358 | Chloroform | 814 | A | A |
| Pyrrolopyrrole Compound | III-365 | Chloroform | 735 | A | A |
| Pyrrolopyrrole Compound | IV-7 | Chloroform | 698 | A | A |
| Pyrrolopyrrole Compound | IV-91 | Chloroform | 701 | A | A |
| Pyrrolopyrrole Compound | IV-92 | Chloroform | 701 | A | A |
| Pyrrolopyrrole Compound | PP-1 | Chloroform | 739 | B | A |
| Pyrrolopyrrole Compound | V-1 | Chloroform | 740 | A | A |
| Pyrrolopyrrole Compound | V-25 | Chloroform | 794 | A | A |
| Pyrrolopyrrole Compound | V-33 | Chloroform | 863 | A | A |
| Pyrrolopyrrole Compound | V-42 | Chloroform | 885 | A | A |

TABLE 57

| Kind of Compound | Compound No. | Solvent | Absorption Maximum (nm) | Absorbance Ratio | Solubility |
|---|---|---|---|---|---|
| Squarylium Compound | Q-3 | Chloroform | 737 | A | A |
| Squarylium Compound | Q-36 | Chloroform | 704 | A | A |
| Squarylium Compound | Q-39 | Chloroform | 822 | A | A |
| Squarylium Compound | Q-54 | Chloroform | 698 | A | A |
| Cyanine Compound | Cy-1 | Chloroform | 698 | A | A |
| Cyanine Compound | Cy-2 | Chloroform | 758 | A | A |
| Cyanine Compound | Cy-3 | Chloroform | 761 | A | A |
| Cyanine Compound | Cy-4 | Methanol | 758 | A | C |
| Cyanine Compound | Cy-5 | Methanol | 682 | A | C |
| Cyanine Compound | Cy-6 | Chloroform | 844 | A | A |
| Cyanine Compound | Cy-7 | Chloroform | 764 | A | A |
| Cyanine Compound | Cy-8 | Chloroform | 764 | A | A |
| Cyanine Compound | Cy-9 | Chloroform | 681 | A | A |
| Cyanine Compound | Cy-10 | Chloroform | 702 | A | A |
| Cyanine Compound | Cy-11 | Chloroform | 788 | A | A |
| Cyanine Compound | Cy-12 | Chloroform | 829 | A | A |
| Cyanine Compound | Cy-13 | Chloroform | 831 | A | A |

II-9
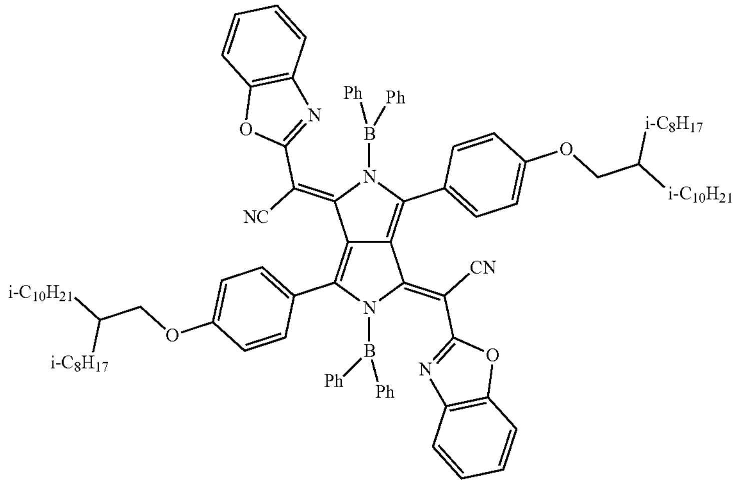
II-10
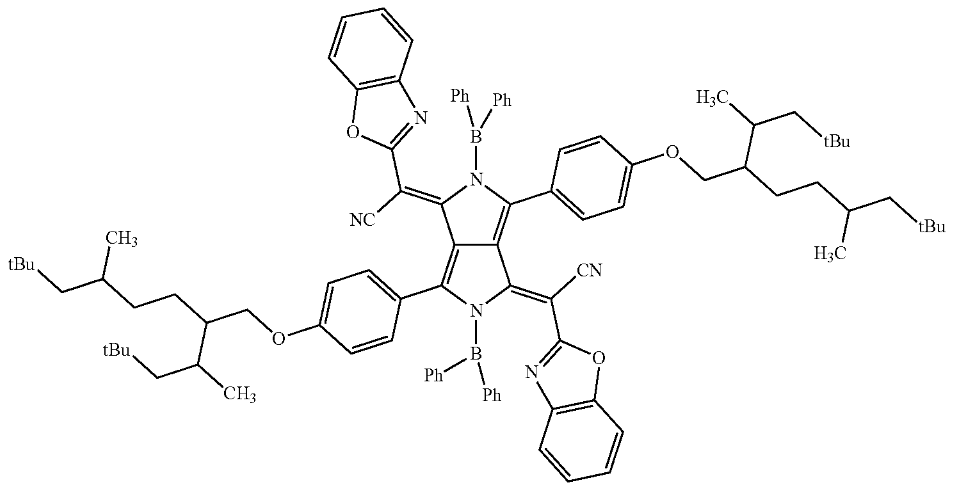
II-27
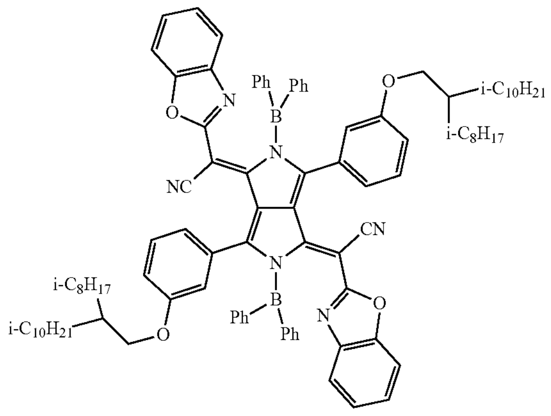
II-29
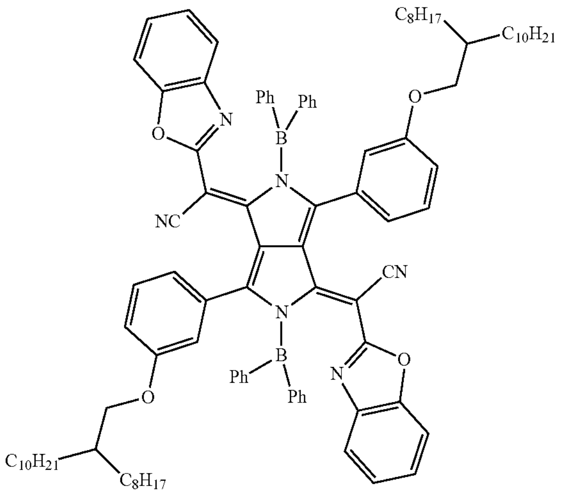

-continued
II-43
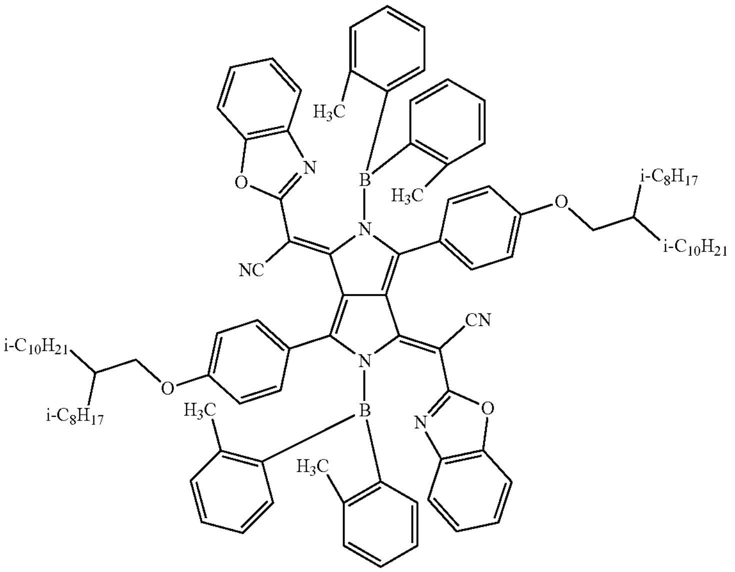
II-44
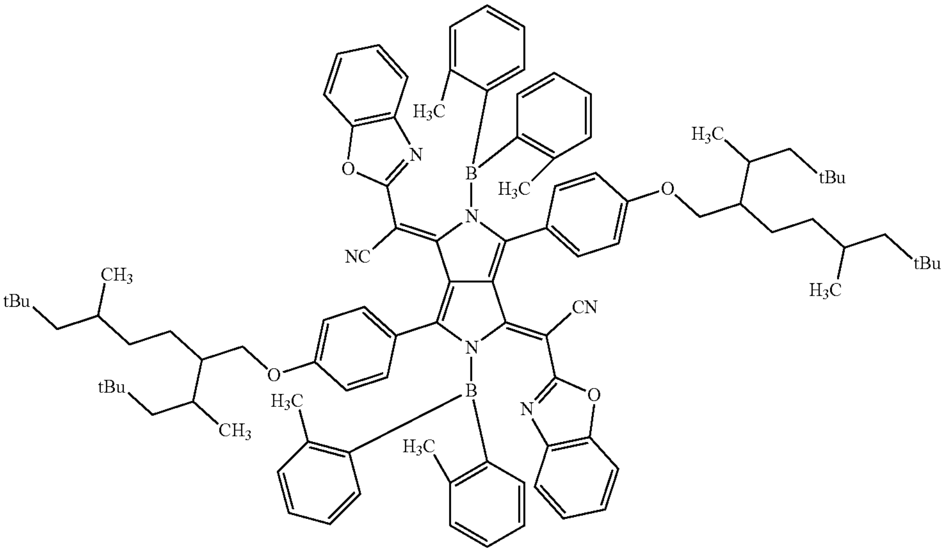
II-91
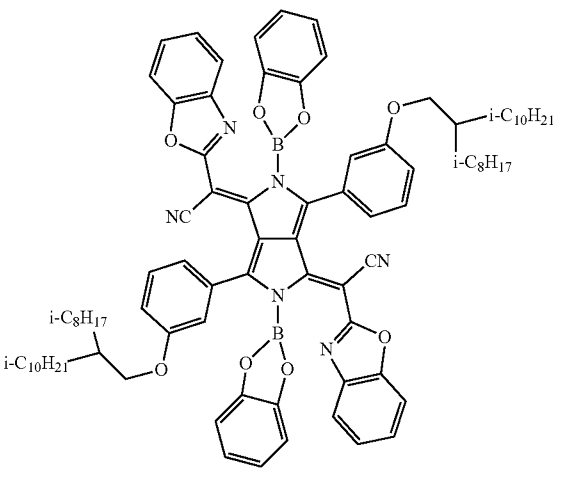
II-167
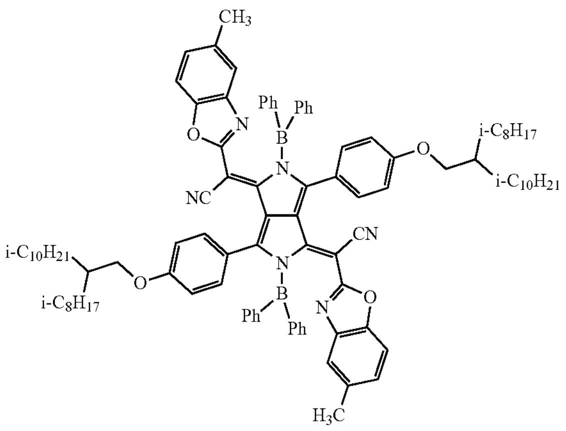

-continued
II-168
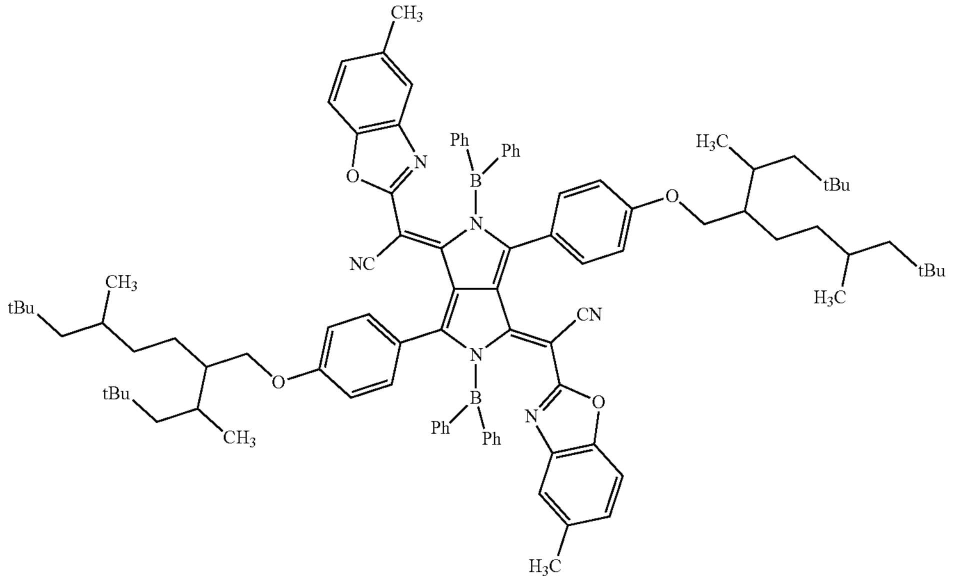
II-184
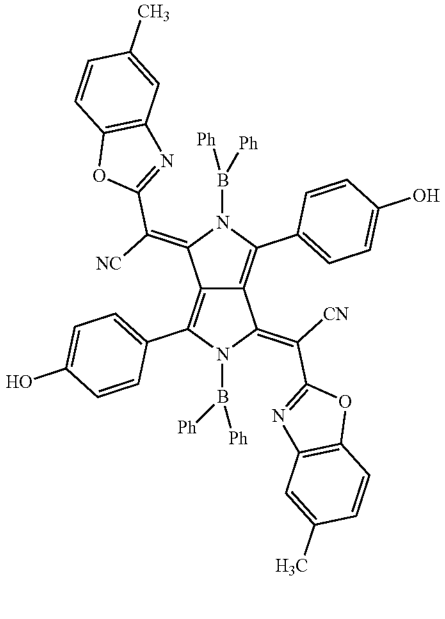
II-185
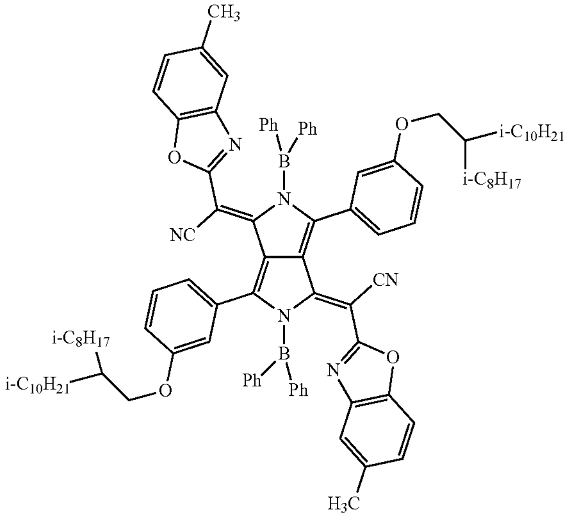

-continued
II-186
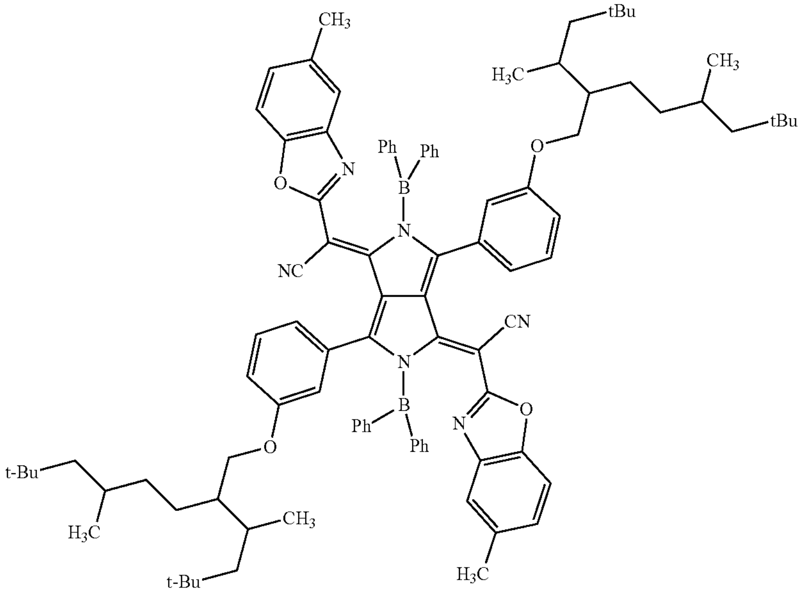
II-201
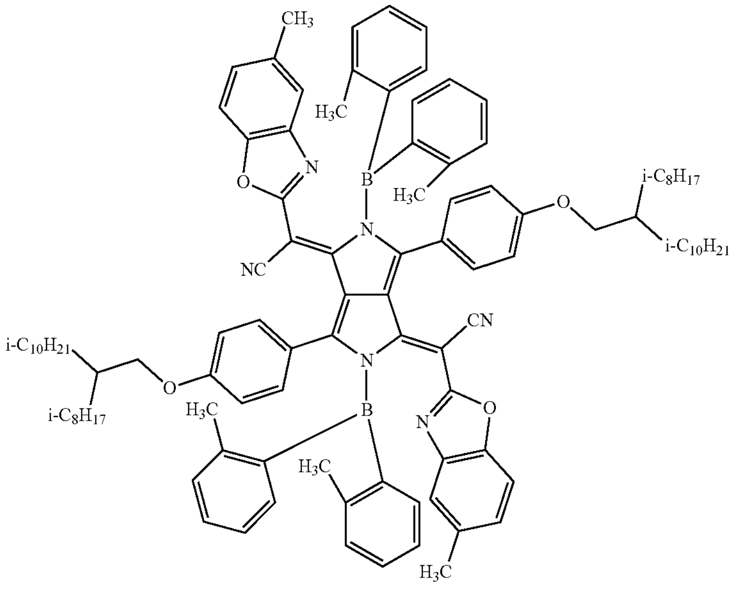

-continued
II-202
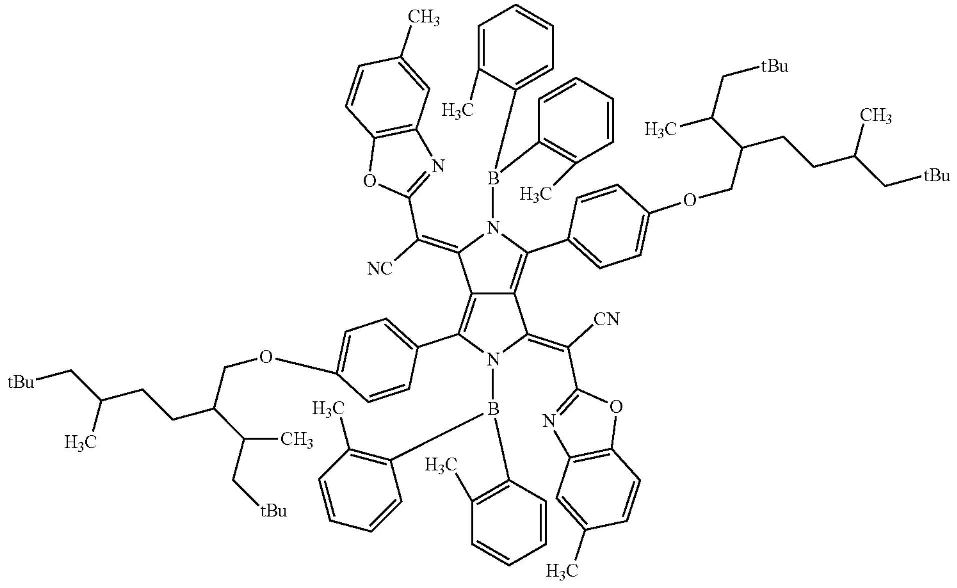
II-269
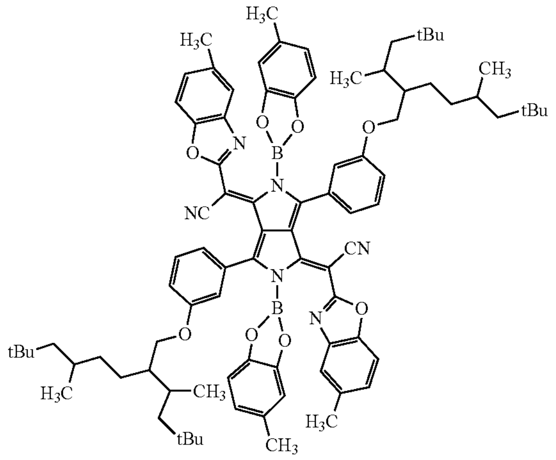
II-274
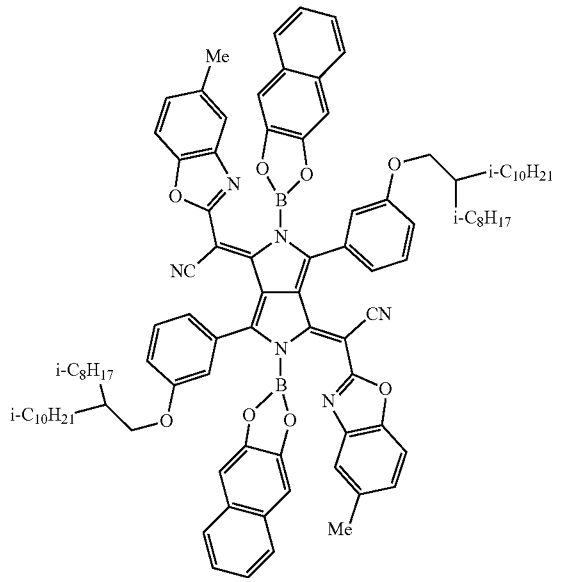

-continued
II-275
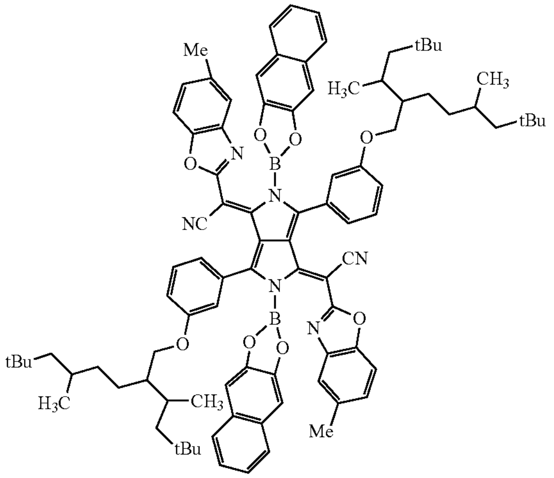
II-325
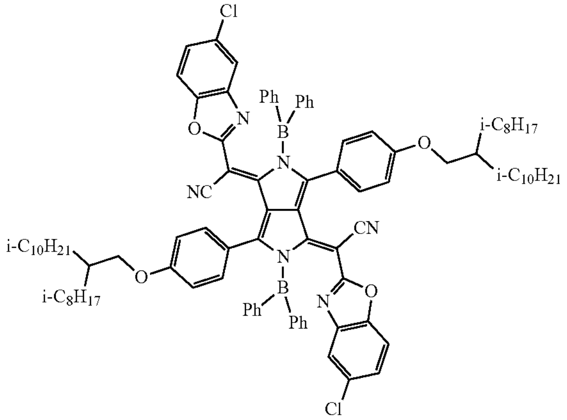
II-408
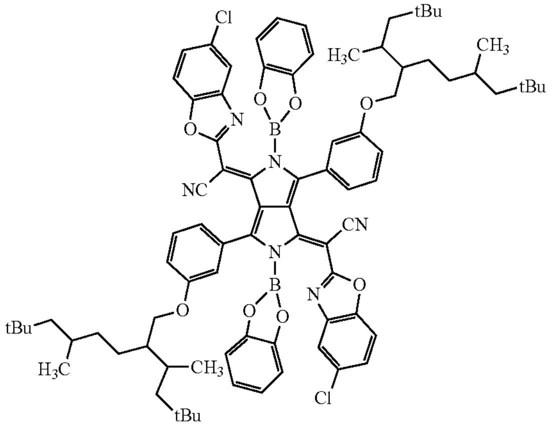
II-507
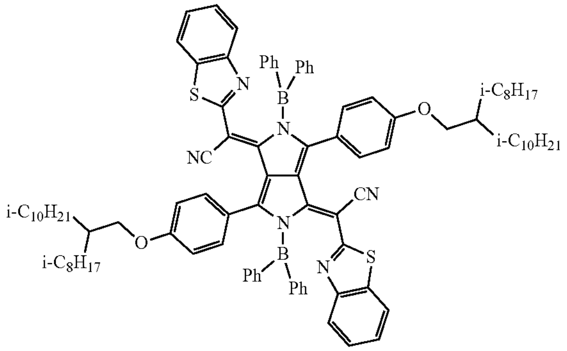
II-508
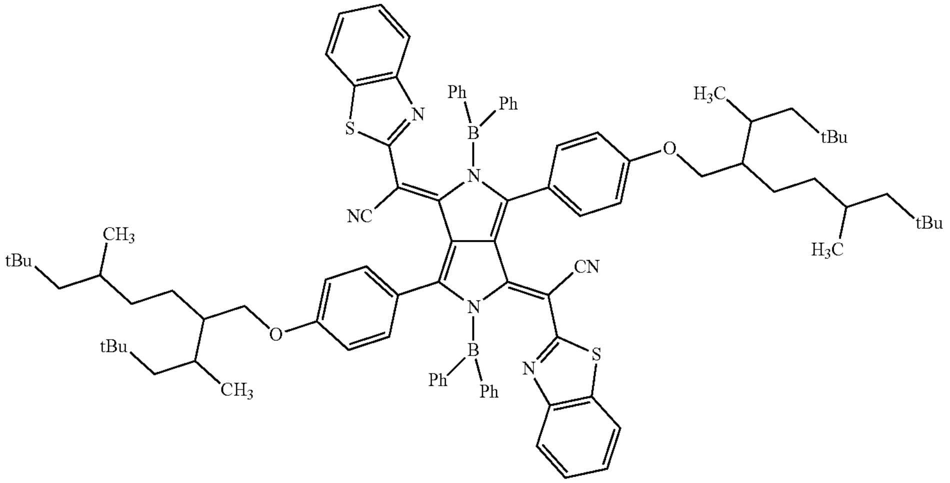

-continued
II-524
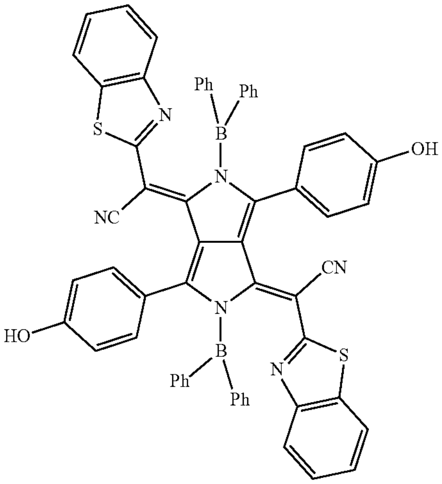
II-525
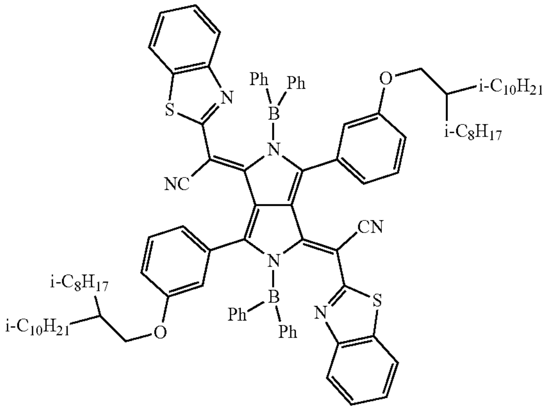
II-541
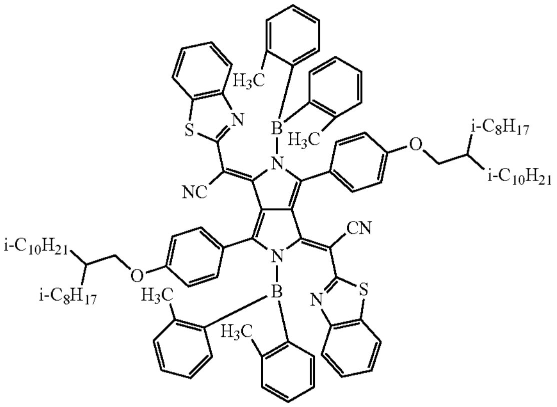
II-589
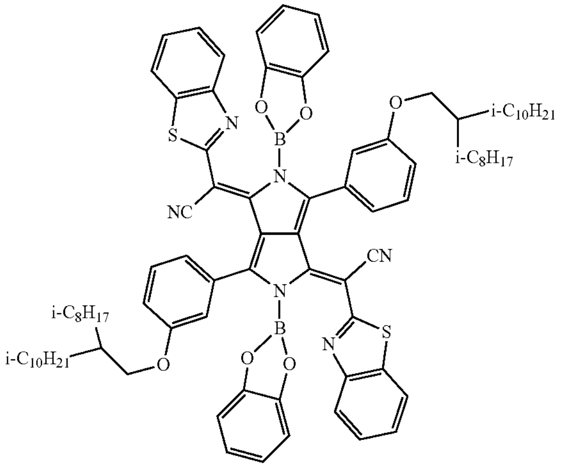
II-590
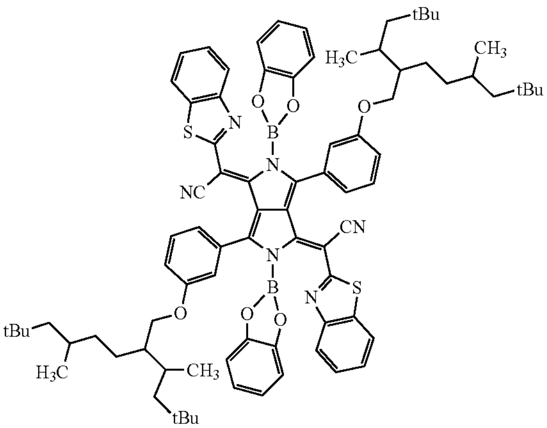
II-673
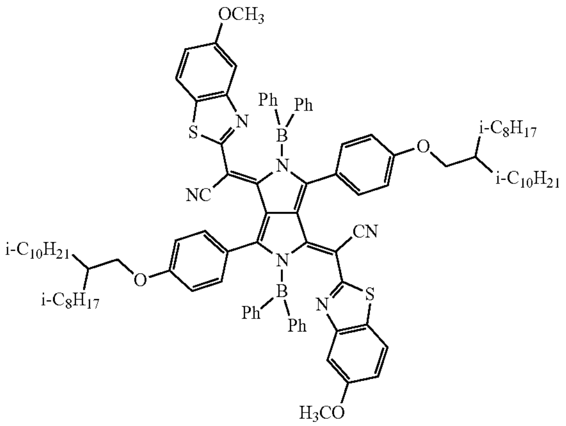

-continued
II-697
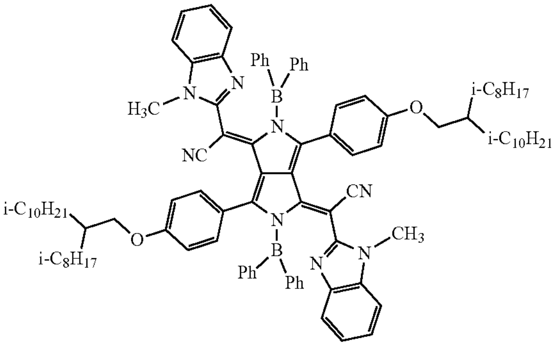
II-715
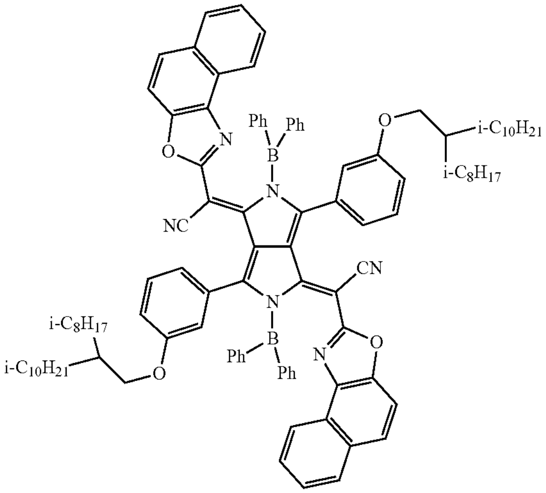
III-9
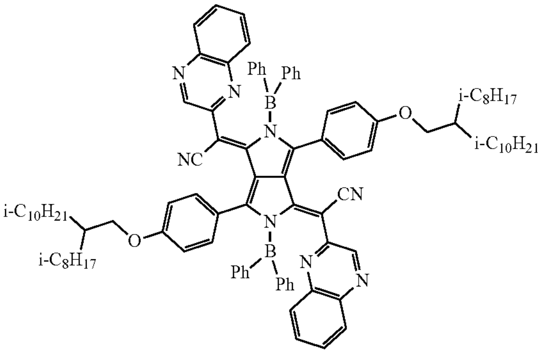
III-28
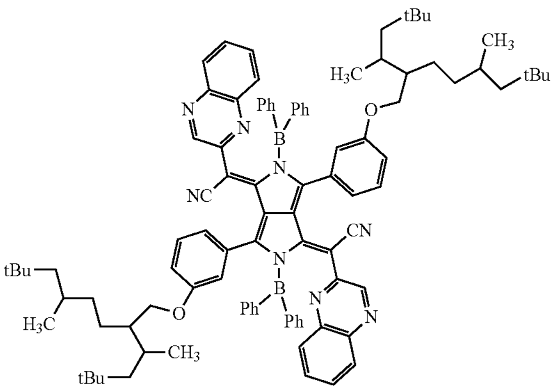
III-29
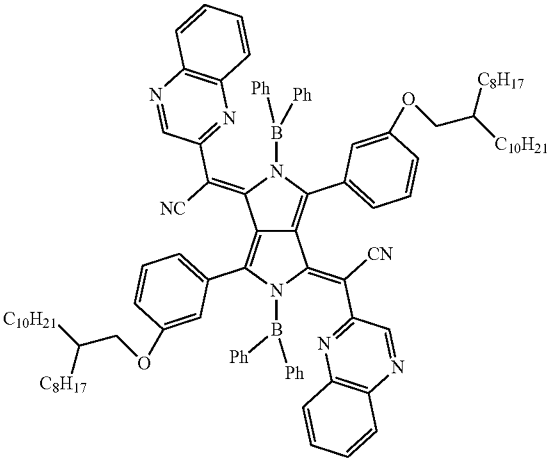
III-167
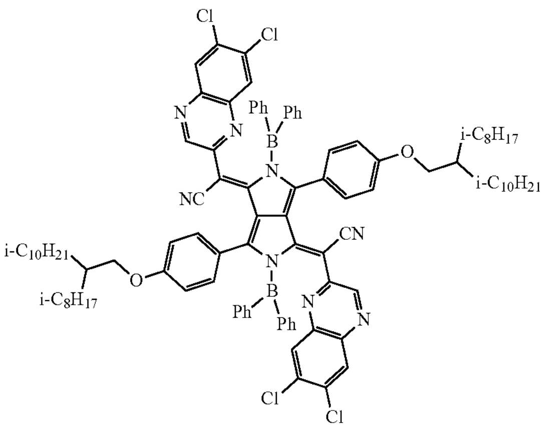

-continued
III-168
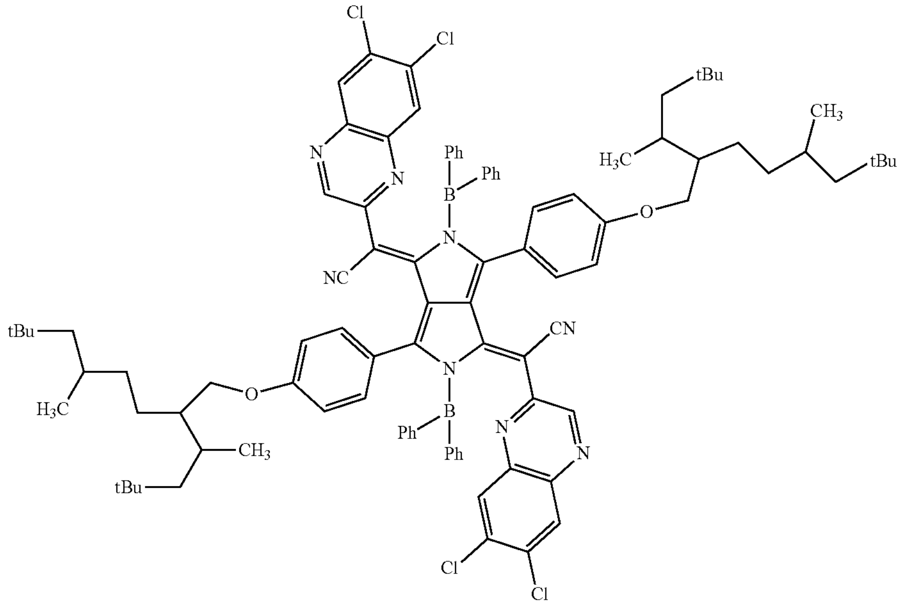
III-328
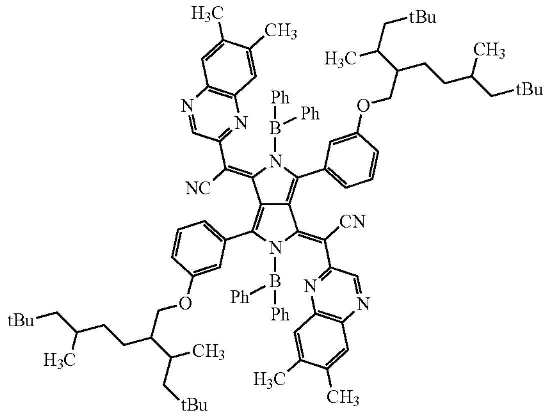
III-349
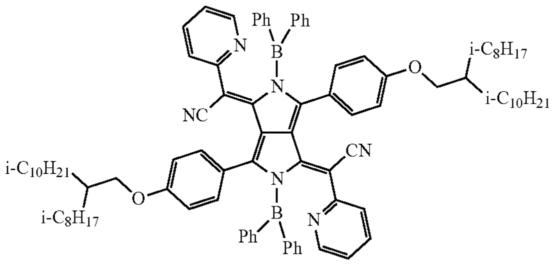
III-358
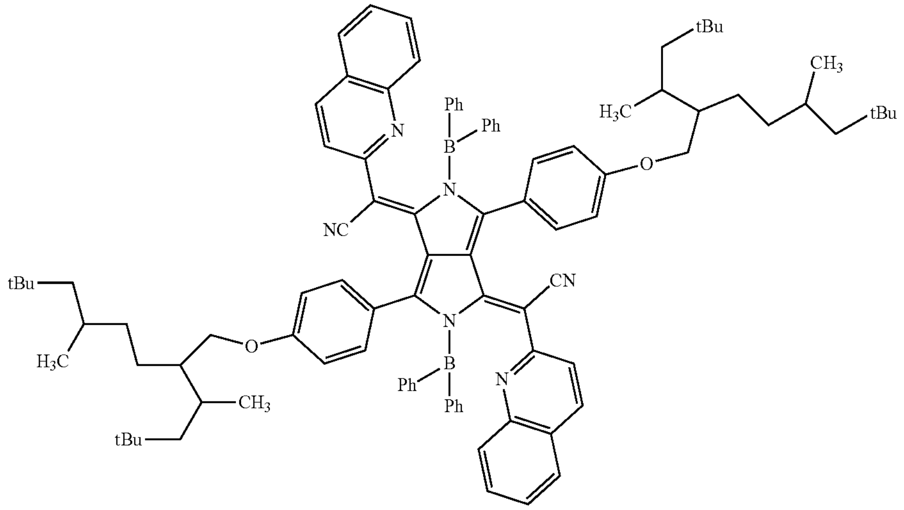

-continued
III-365
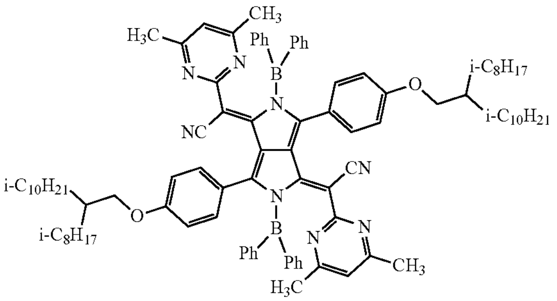
IV-7
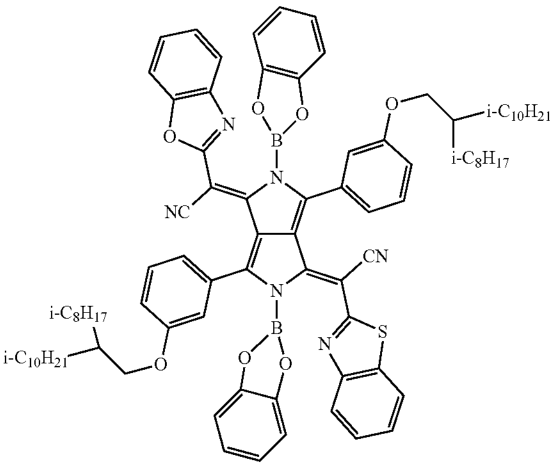
IV-91
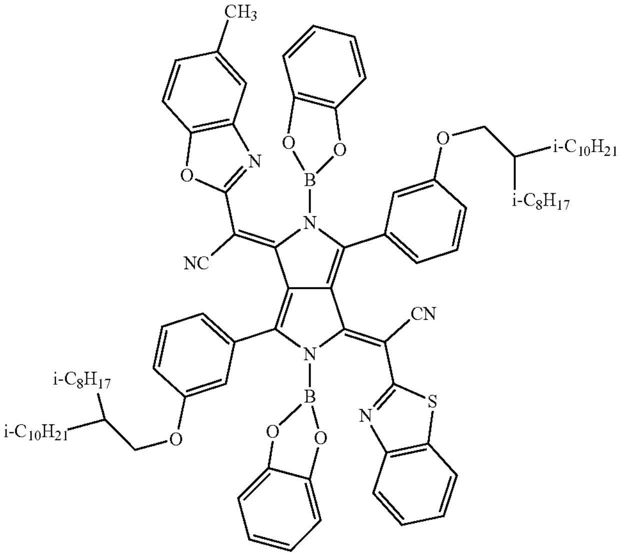
IV-92
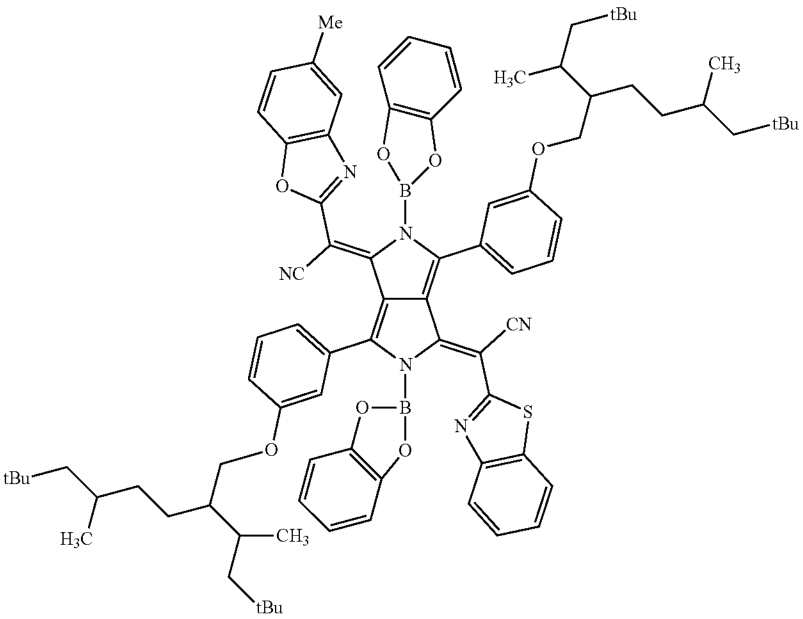

-continued
PP-1
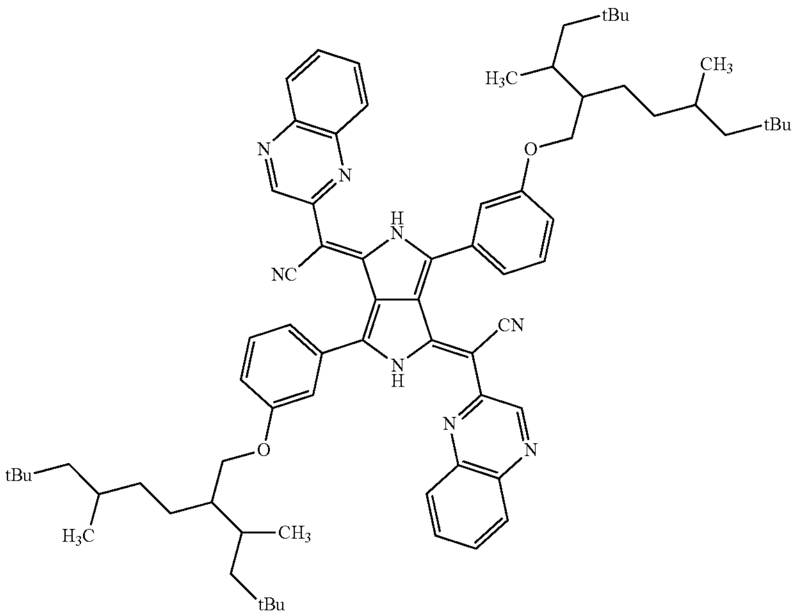
V-1
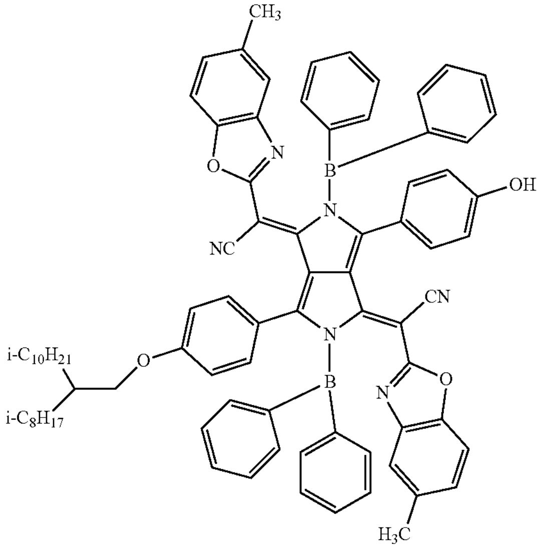
V-25
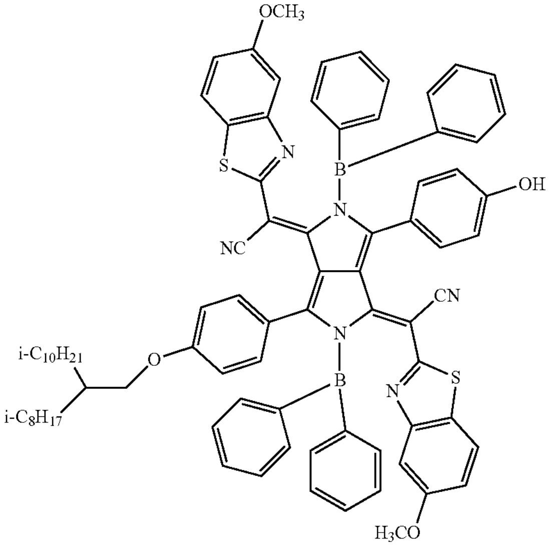

-continued
V-33
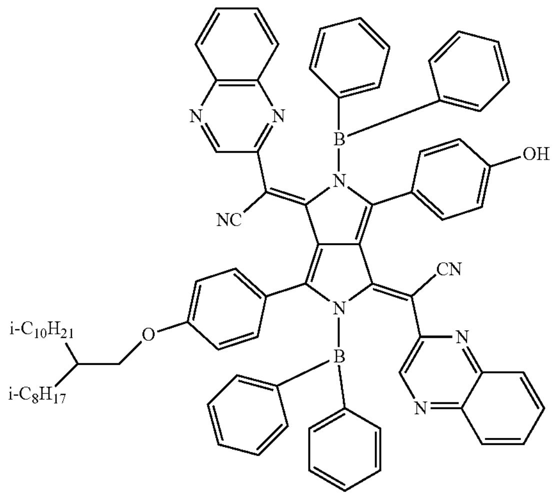
V-42
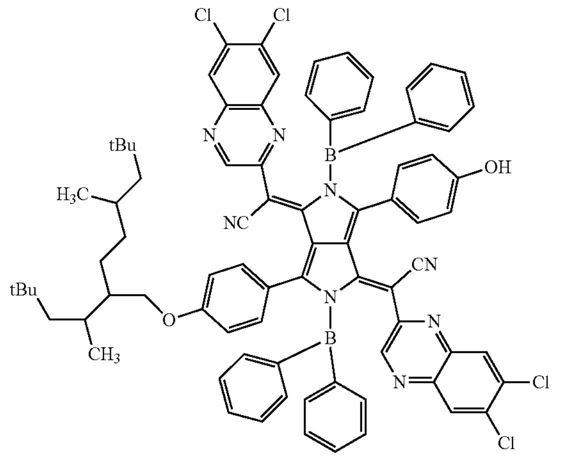
Squarylium Compound
Q-3
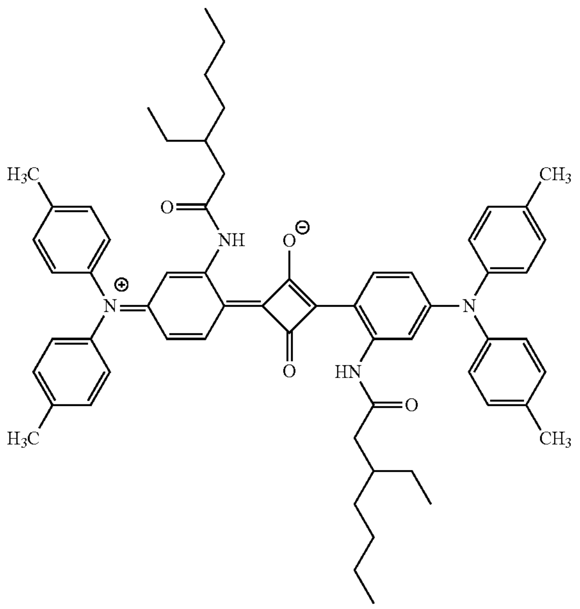
-continued
Q-36
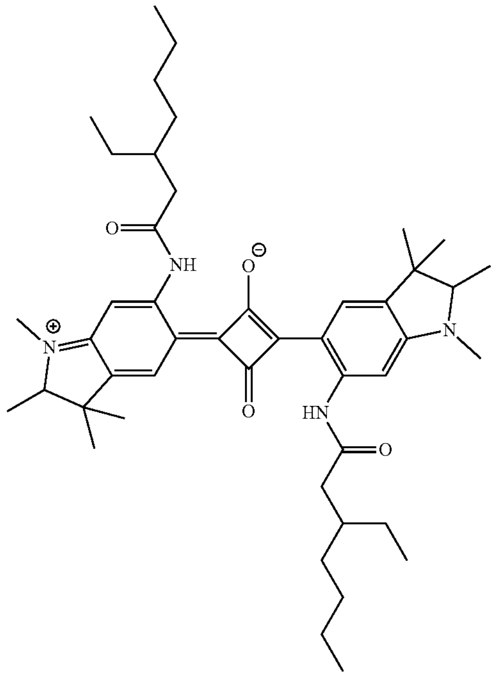

Q-39
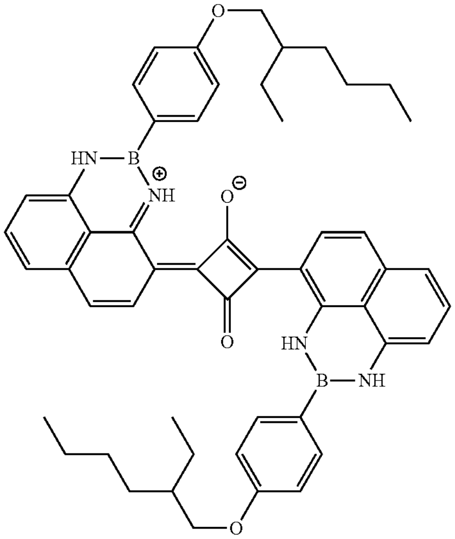
Q-54
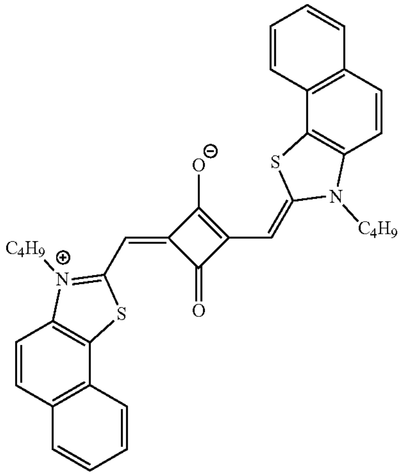
Cyanine Compound
Cy-1
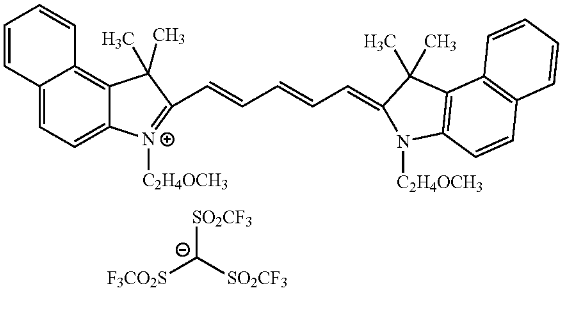
Cy-2
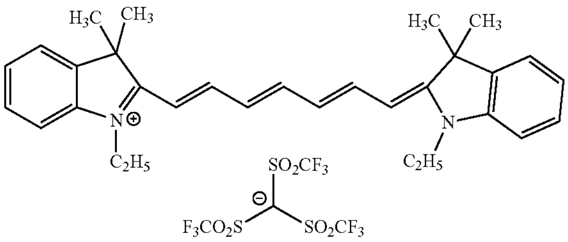
Cy-3
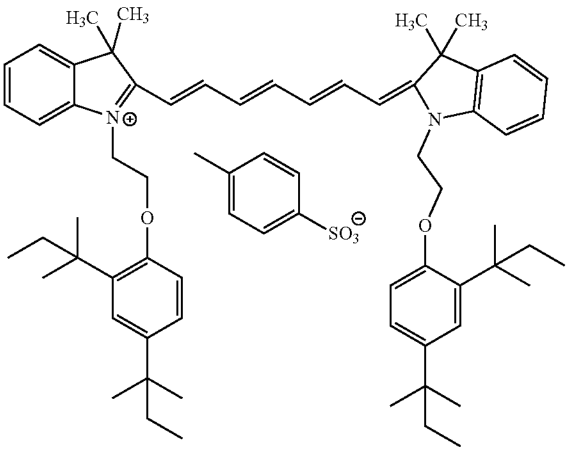
Cy-4
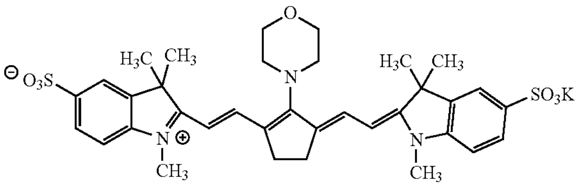
Cy-5
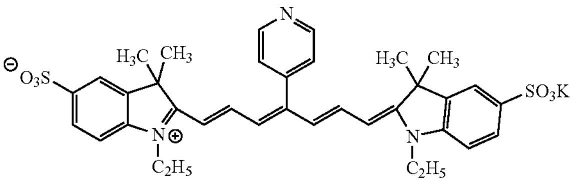
Cy-6
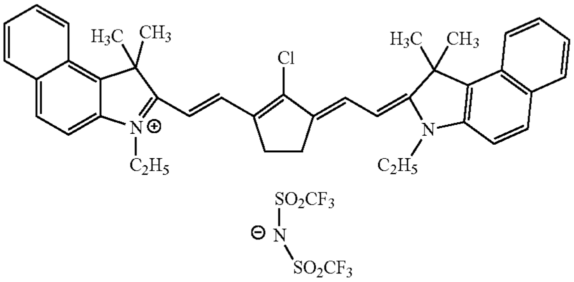

-continued

Cy-7

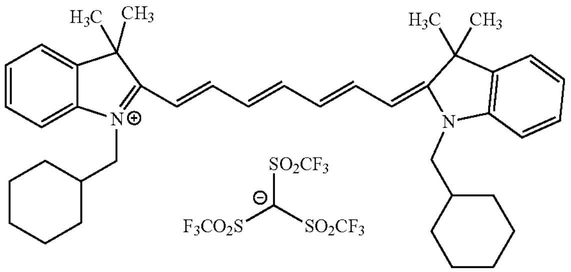

Cy-8

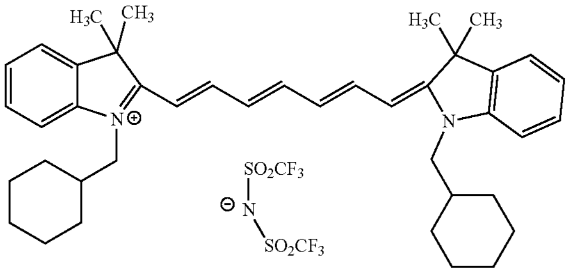

Cy-9

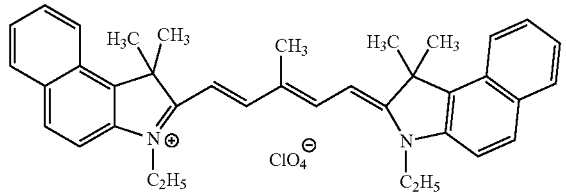

Cy-10

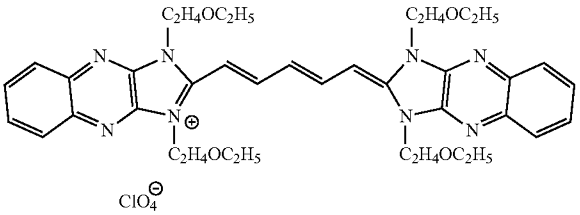

Cy-11

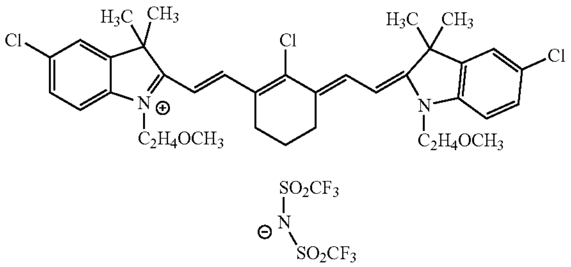

Cy-12

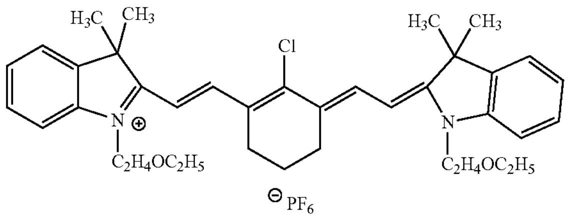

-continued

Cy-13

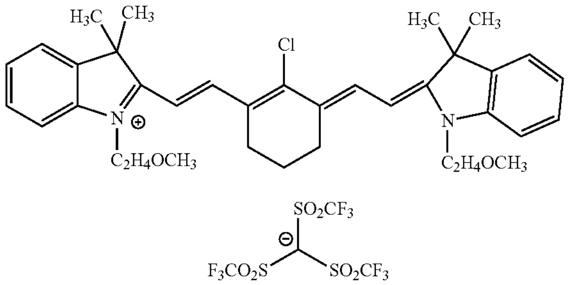

Test Example 1

(Preparation of Layer Containing Copper)

6.55 parts by mass of the following copper complex 1, 19.65 parts by mass of the following copper complex 2, 61.9 parts by mass of the following resin 1, 5 parts by mass of IRGACURE-OXE02 (manufactured by BASF SE), 0.025 parts by mass of aluminum tris(2,4-pentanedionate) (III) (manufactured by Tokyo Chemical Industry Co., Ltd.), 6.875 parts by mass of KBM-3066 (manufactured by Shin-Etsu Chemical Co., Ltd.), 24.344 parts by mass of cyclopentanone, 75.656 parts by mass of butyl acetate, and 0.1 parts by mass of water were mixed with each other and were stirred, and the mixture was filtered through a nylon filter (manufactured by Pall Corporation) having a pore size of 0.45 m to prepare a copper complex-containing composition 1.

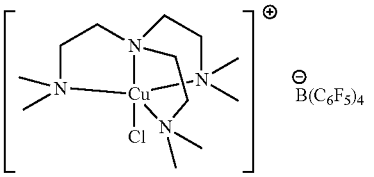

Copper Complex 1

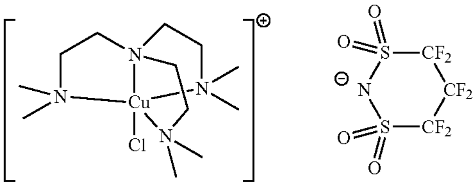

Copper Complex 2

Resin 1: (Mw=15000, numerical values added to a main chain represent a molar ratio between the respective structural units)

-continued

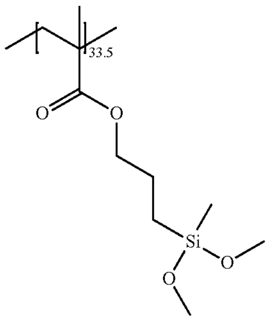

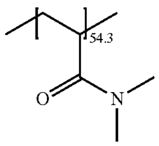

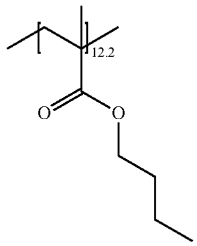

The obtained copper complex-containing composition 1 was applied to a glass wafer using a spin coater such that the thickness of the dried coating film was 100 m, and then was heated using a hot plate at 150° C. for 3 hours. As a result, a layer containing copper was prepared.

(Preparation of Composition)

The following components were mixed and stirred, and the obtained mixture was filtered through a nylon filter (manufactured by Pall Corporation) having a pore size of 0.45 m to prepare a composition.

<Composition 1>

| | |
|---|---|
| First near infrared absorbing compound (a compound shown in the following tables) | 0.96 parts |
| Second near infrared absorbing compound (a compound shown in the following tables) | 0.96 parts |
| Resin 1, resin 2, or resin 3 (a resin shown in the following tables) | 7.51 parts |

Resin 1: a resin (Mw: 40000) having the following structure

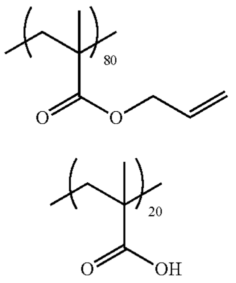

Resin 2: ARTON F4520 (manufactured by JSR Corporation)

Resin 3: a resin having the following structure (a ratio in a structural unit is a molar ratio), Mw = 11500, the resin was synthesized using a method described in paragraphs “0247” to “0249” of JP2012-198408A

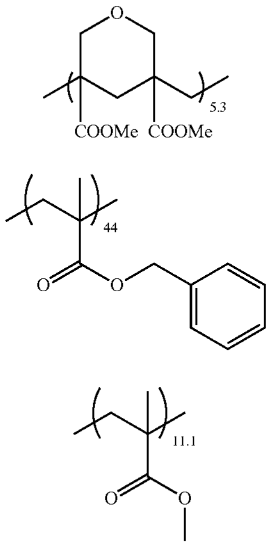

-continued

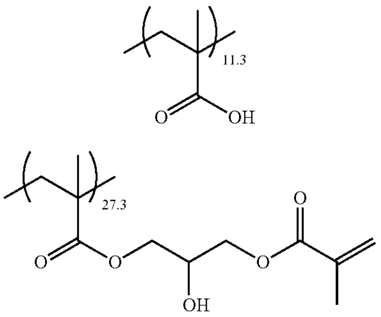

| | |
|---|---|
| Curable compound 1 (dipentaerythritol hexaacrylate (trade name: KAYARAD DPHA, manufactured by Nippon Kayaku Co., Ltd.)) | 1.28 parts |
| Photopolymerization Initiator (IRGACURE OXE-02, manufactured by BASF SE) | 1.40 parts |
| Surfactant 1 (MEGAFACE RS-72-K (manufactured by DIC Corporation, 30% propylene glycol monomethyl ether acetate solution) | 1.59 parts |
| Cyclohexanone | 86.3 parts |

<Composition 2>

| | |
|---|---|
| First near infrared absorbing compound (a compound shown in the following tables) | 0.96 parts |
| Second near infrared absorbing compound (a compound shown in the following tables) | 0.96 parts |
| Resin 4 (a random polymer haying a glycidyl methacrylate skeleton, MARPROOF G-0150M, manufactured by NOF Corporation, Mw: 10000) | 12.9 parts |
| Curable compound 2 (OXT-221, manufactured by Toagosei Co., Ltd.) | 12.9 parts |
| Acid generator 1 (CPI-100P, manufactured by San-Apro Ltd.) | 2.5 parts |
| Surfactant 2 (the following mixture, Mw: 14000) | 0.04 parts |

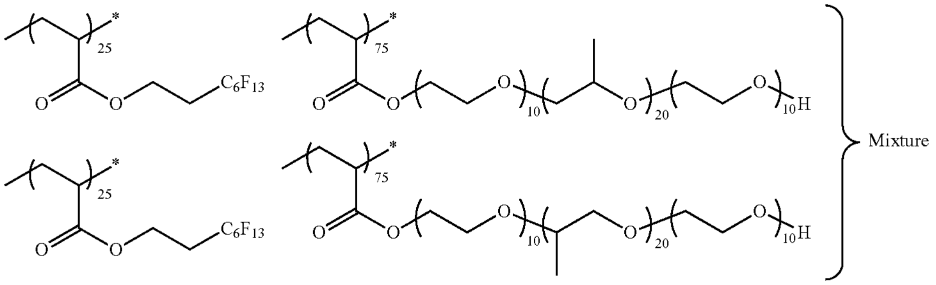

| | |
|---|---|
| Cyclohexanone | 49.6 parts |
| Propylene glycol monomethyl ether acetate | 19.3 parts |

<Composition 3>

| | |
|---|---|
| First near infrared absorbing compound (a compound shown in the following tables) | 0.96 parts |
| Second near infrared absorbing compound (a compound shown in the following tables) | 0.96 parts |
| Resin 5 (a resin having the following structure (a ratio in a structural unit is a molar ratio), Mw = 18000) | 12.9 parts |

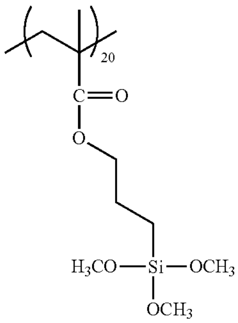

-continued

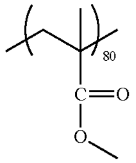

| | |
|---|---|
| Acid catalyst (phosphoric acid): | 2.5 parts |
| Surfactant 2: | 0.04 parts |
| Cyclohexanone | 58.9 parts |
| Propylene glycol monomethyl ether acetate: | 22.9 parts |
| Composition 4 | |
| First near infrared absorbing compound (a compound shown in the following tables) | 0.96 parts |
| Second near infrared absorbing compound (a compound shown in the following tables) | 0.96 parts |
| Resin 6: polyhydroxystyrene (manufactured by Sigma-Aldrich Co., Llc., Mw = 10000) | 12.9 parts |
| Curable compound 3: 1,3,4,6-tetramethoxydimethyl glycoluril (manufactured by Tokyo Chemical Industry Co., Ltd.) | 12.9 parts |
| Acid generator 2 (triethylammonium nonaflate) | 2.5 parts |
| Surfactant 3 (FC-4430, manufactured by Sumitomo 3M Ltd.) | 0.04 parts |
| Cyclohexanone | 49.6 parts |
| Propylene glycol monomethyl ether acetate | 19.3 parts |
| Composition 5 | |
| First near infrared absorbing compound (a compound shown in the following tables) | 0.96 parts |
| Second near infrared absorbing compound (a compound shown in the following tables) | 0.96 parts |
| Resin 1 | 7.51 parts |
| Curable compound 1 (dipentaerythritol hexaacrylate (trade name: KAYARAD DPHA, manufactured by Nippon Kayaku Co., Ltd.)) | 1.28 parts |
| Surfactant 1 (MEGAFACE RS-72-K (manufactured by DIC Corporation, 30% propylene glycol monomethyl ether acetate solution) | 1.59 parts |
| Cyclohexanone | 86.3 parts |

In Example 1-10, 0.48 parts of 11-590 and 0.48 parts of IV-92 were used as the second near infrared absorbing compound (used at a mass ratio II-590:IV-92 of 1:1).

In addition, in Example 1-11, 0.32 parts of II-589, 0.32 parts of IV-91, and 0.32 parts of II-274 were used as the second near infrared absorbing compound (used at a mass ratio II-589:IV-91:II-274 of 1:1:1).

In addition, in Example 1-30, 0.48 parts of 11-408 and 0.48 parts of II-91 were used as the second near infrared absorbing compound (used at a mass ratio II-408:II-91 of 1:1).

In addition, in Example 1-31, 0.32 parts of II-29, 0.32 parts of II-408, and 0.32 parts of II-91 were used as the second near infrared absorbing compound (used at a mass ratio II-29:II-408:II-91 of 1:1:1).

In addition, in Comparative Example 1-1, the content of the first near infrared absorbing compound was 1.92 parts.

In addition, in Comparative Example 1-2, the content of the first near infrared absorbing compound was 3.84 parts.

<<Manufacturing of Near Infrared Cut Filter>>

Examples 1-1 to 1-18, 1-20 to 1-31, and Comparative Examples 1-1 to 1-6

Each of the compositions was applied to a layer containing copper using a spin coater such that the thickness of a dried film was 0.8 m, and was heated (pre-baked) using a hot plate at 100° C. for 120 seconds.

Next, the entire surface of the layer containing copper was exposed using an i-ray stepper at 1000 mJ/cm$^2$. Next, the layer containing copper was heated (post-baked) at 200° C. for 300 seconds. As a result, a near infrared cut filter was manufactured.

Example 1-19

The composition according to Example 1-19 was applied to the layer containing copper using a spin coater such that the thickness after drying was 0.8 m, and then was heated (pre-baked) using a hot plate at 100° C. for 120 seconds. As a result, a near infrared cut filter was manufactured.

<<Evaluation of Infrared Shielding Properties>>

A transmittance of the near infrared cut filter in a wavelength range of 700 nm to 800 nm was measured using a spectrophotometer U-4100 (manufactured by Hitachi High-Technologies Corporation). The infrared shielding properties were evaluated based on the following criteria. The results are shown in the following table.

A: Minimum Value of Transmittance in Wavelength Range of 700 to 800 nm≤1%

B: 1%<Minimum Value of Transmittance in Wavelength Range of 700 to 800 nm≤5%

C: 5%<Minimum Value of Transmittance in Wavelength Range of 700 to 800 nm≤10%

D: 10%<Minimum Value of Transmittance in Wavelength Range of 700 to 800 nm≤20%

E: 20%<Minimum Value of Transmittance in Wavelength Range of 700 to 800 nm

<<Evaluation of Visible Transparency>>

In the near infrared cut filter obtained as described above, an average transmittance in a wavelength range of 400 to 550 nm was measured using a spectrophotometer U-4100 (manufactured by Hitachi High-Technologies Corporation). The visible transparency was evaluated based on the following criteria. The results are shown in the following table.

A: 90%≤Average Transmittance of Transmittance in Wavelength Range of 400 to 550 nm B: 85%≤Average Transmittance of Transmittance in Wavelength Range of 400 to 550 nm<90%

C: Average Transmittance of Transmittance in Wavelength Range of 400 to 550 nm<85%

<<Evaluation of Spectral Variation Resistance>>

The near infrared cut filter was left to stand in a high-temperature and high-humidity environment of 85° C. and relative humidity: 85% for 1 hour. Before and after the moisture resistance test, a maximum absorbance (Absλmax) of the near infrared cut filter in a wavelength range of 700 to 1400 nm and a minimum absorbance (Absλmin) in a wavelength range of 400 to 700 nm were measured using a spectrophotometer U-4100 (manufactured by Hitachi High-Technologies Corporation), and an absorbance ratio represented by "Absλmax/Absλmin" was obtained. A change rate of absorbance ratio represented by "|(Absorbance Ratio before Test-Absorbance Ratio after Test)/Absorbance Ratio before Test×100|(%) was evaluated based on the following criteria. The results are shown in the following table.

A: Change Rate of Absorbance Ratio≤2%

B: 2%<Change Rate of Absorbance Ratio≤4%

C: 4%<Change Rate of Absorbance Ratio≤7%

D: 7%<Change Rate of Absorbance Ratio

<<Light Fastness>>

The near infrared cut filter was irradiated with light using a xenon lamp at 50000 lux for 20 hours (corresponding to 1000000 lux-h), and then an ΔEab value of a color difference before and after a light fastness test was measured. The lower the ΔEab value, the higher the light fastness. The results are shown in the following table. The ΔEab value was obtained from the following color difference formula of CIE 1976 (L*, a*, b*) color space (Handbook of Color Science, p. 266, 1985, edited by The Color Science Association Of Japan).

$$\Delta Eab=\{(\Delta L^*)^2+(\Delta a^*)^2+(\Delta b^*)^2\}^{1/2}$$

A: ΔEab Value<5

B: 5≤ΔEab Value<10

C: 10≤ΔEab Value<20

D: 20≤ΔEab Value

TABLE 58

| | First Near Infrared Absorbing Compound | | | Second Near Infrared Absorbing Compound | | | | λmax |
|---|---|---|---|---|---|---|---|---|
| | Kind of Compound | Compound No. | λmax (nm) | Kind of Compound | Compound No. | λmax (nm) | Number of Colorants | Difference (nm) |
| Example 1-1 | Pyrrolopyrrole Compound | II-185 | 748 | Pyrrolopyrrole Compound | II-27 | 743 | 2 | 5 |
| Example 1-2 | Pyrrolopyrrole Compound | II-185 | 748 | Pyrrolopyrrole Compound | II-589 | 719 | 2 | 29 |
| Example 1-3 | Pyrrolopyrrole Compound | II-589 | 719 | Pyrrolopyrrole Compound | II-91 | 679 | 2 | 40 |
| Example 1-4 | Pyrrolopyrrole Compound | II-186 | 748 | Pyrrolopyrrole Compound | IV-92 | 701 | 2 | 47 |
| Example 1-5 | Pyrrolopyrrole Compound | II-185 | 748 | Pyrrolopyrrole Compound | IV-7 | 698 | 2 | 50 |
| Example 1-6 | Pyrrolopyrrole Compound | II-186 | 748 | Pyrrolopyrrole Compound | II-269 | 685 | 2 | 63 |
| Example 1-7 | Pyrrolopyrrole Compound | II-9 | 740 | Pyrrolopyrrole Compound | II-91 | 679 | 2 | 61 |
| Example 1-8 | Pyrrolopyrrole Compound | II-186 | 748 | Pyrrolopyrrole Compound | II-408 | 680 | 2 | 68 |
| Example 1-9 | Pyrrolopyrrole Compound | II-715 | 769 | Pyrrolopyrrole Compound | II-408 | 680 | 2 | 89 |
| Example 1-10 | Pyrrolopyrrole Compound | II-186 | 748 | Pyrrolopyrrole Compound | II-590<br>IV-92 | 719<br>701 | 3 | 29 |
| Example 1-11 | Pyrrolopyrrole Compound | II-185 | 748 | Pyrrolopyrrole Compound | II-589<br>IV-91<br>II-274 | 719<br>701<br>685 | 4 | 29 |
| Example 1-12 | Pyrrolopyrrole Compound | II-186 | 748 | Squarylium Compound | Q-36 | 704 | 2 | 44 |
| Example 1-13 | Pyrrolopyrrole Compound | II-186 | 748 | Cyanine Compound | Cy-1 | 698 | 2 | 50 |
| Example 1-14 | Squarylium Compound | Q-39 | 822 | Pyrrolopyrrole Compound | II-275 | 685 | 2 | 137 |
| Example 1-15 | Squarylium Compound | Q-39 | 822 | Cyanine Compound | Cy-1 | 698 | 2 | 124 |
| Example 1-16 | Squarylium Compound | Q-39 | 822 | Squarylium Compound | Q-36 | 704 | 2 | 118 |
| Example 1-17 | Cyanine Compound | Cy-3 | 761 | Pyrrolopyrrole Compound | IV-92 | 701 | 2 | 60 |
| Example 1-18 | Cyanine Compound | Cy-3 | 761 | Cyanine Compound | Cy-1 | 698 | 2 | 63 |
| Example 1-19 | Cyanine Compound | Cy-3 | 761 | Cyanine Compound | Cy-1 | 698 | 2 | 63 |
| Example 1-20 | Cyanine Compound | Cy-3 | 761 | Cyanine Compound | Cy-1 | 698 | 2 | 63 |
| Example 1-21 | Pyrrolopyrrole Compound | II-186 | 748 | Pyrrolopyrrole Compound | IV-92 | 701 | 2 | 47 |
| Example 1-22 | Pyrrolopyrrole Compound | II-186 | 748 | Pyrrolopyrrole Compound | IV-92 | 701 | 2 | 47 |
| Example 1-23 | Pyrrolopyrrole Compound | II-186 | 748 | Pyrrolopyrrole Compound | IV-7 | 698 | 2 | 50 |
| Example 1-24 | Cyanine Compound | Cy-3 | 761 | Cyanine Compound | Cy-9 | 681 | 2 | 80 |

TABLE 58-continued

| | | | | | | | | |
|---|---|---|---|---|---|---|---|---|
| Example 1-25 | Pyrrolopyrrole Compound | II-715 | 769 | Pyrrolopyrrole Compound | II-269 | 685 | 2 | 84 |
| Example 1-26 | Cyanine Compound | Cy-7 | 764 | Cyanine Compound | Cy-2 | 758 | 2 | 6 |
| Example 1-27 | Pyrrolopyrrole Compound | II-186 | 748 | Pyrrolopyrrole Compound | II-269 | 685 | 2 | 63 |
| Example 1-28 | Cyanine Compound | Cy-8 | 764 | Cyanine Compound | Cy-10 | 702 | 2 | 62 |
| Example 1-29 | Pyrrolopyrrole Compound | II-9 | 740 | Pyrrolopyrrole Compound | IV-92 | 701 | 2 | 39 |
| Example 1-30 | Pyrrolopyrrole Compound | II-186 | 748 | Pyrrolopyrrole Compound | II-408<br>II-91 | 680<br>679 | 3 | 68 |
| Example 1-31 | Pyrrolopyrrole Compound | II-186 | 748 | Pyrrolopyrrole Compound | II-29<br>II-408<br>II-91 | 743<br>680<br>679 | 4 | 5 |
| Comparative Example 1-1 | Pyrrolopyrrole Compound | II-589 | 719 | | — | | 1 | — |
| Comparative Example 1-2 | Pyrrolopyrrole Compound | II-589 | 719 | | — | | 1 | — |
| Comparative Example 1-3 | Pyrrolopyrrole Compound | III-9 | 863 | Cyanine Compound | Cy-1 | 698 | 2 | 165 |
| Comparative Example 1-4 | Cyanine Compound | Cy-4 | 758 | Cyanine Compound | Cy-5 | 682 | 2 | 76 |
| Comparative Example 1-5 | Cyanine Compound | Cy-6 | 844 | Cyanine Compound | Cy-9 | 681 | 2 | 163 |
| Comparative Example 1-6 | Cyanine Compound | Cy-7 | 764 | Cyanine Compound | Cy-8 | 764 | 2 | 0 |

| | Composition | Resin | Infrared Shielding Properties | Spectral Variation | Visible Transparency | Light Fastness |
|---|---|---|---|---|---|---|
| Example 1-1 | Composition 1 | Resin 1 | C | A | A | A |
| Example 1-2 | Composition 1 | Resin 1 | C | A | A | A |
| Example 1-3 | Composition 1 | Resin 1 | B | A | A | A |
| Example 1-4 | Composition 1 | Resin 1 | B | A | A | A |
| Example 1-5 | Composition 1 | Resin 1 | B | A | A | A |
| Example 1-6 | Composition 1 | Resin 1 | B | A | A | A |
| Example 1-7 | Composition 1 | Resin 1 | B | A | A | A |
| Example 1-8 | Composition 1 | Resin 1 | B | A | A | A |
| Example 1-9 | Composition 1 | Resin 1 | B | A | A | A |
| Example 1-10 | Composition 1 | Resin 1 | A | A | A | A |
| Example 1-11 | Composition 1 | Resin 1 | A | A | A | A |
| Example 1-12 | Composition 1 | Resin 1 | B | A | B | A |
| Example 1-13 | Composition 1 | Resin 1 | B | A | A | C |
| Example 1-14 | Composition 1 | Resin 1 | B | A | B | B |
| Example 1-15 | Composition 1 | Resin 1 | B | A | B | C |
| Example 1-16 | Composition 1 | Resin 1 | B | A | C | B |
| Example 1-17 | Composition 1 | Resin 1 | B | A | A | D |
| Example 1-18 | Composition 1 | Resin 1 | B | A | A | D |
| Example 1-19 | Composition 5 | Resin 1 | B | B | A | D |
| Example 1-20 | Composition 1 | Resin 2 | B | A | A | D |
| Example 1-21 | Composition 1 | Resin 2 | B | A | A | A |
| Example 1-22 | Composition 1 | Resin 3 | B | A | A | A |
| Example 1-23 | Composition 2 | Resin 4 | B | B | A | A |
| Example 1-24 | Composition 2 | Resin 4 | B | B | A | D |
| Example 1-25 | Composition 3 | Resin 5 | B | A | A | B |
| Example 1-26 | Composition 3 | Resin 5 | C | A | A | D |
| Example 1-27 | Composition 4 | Resin 6 | B | A | A | B |
| Example 1-28 | Composition 4 | Resin 6 | B | A | A | D |
| Example 1-29 | Composition 1 | Resin 1 | B | A | A | A |
| Example 1-30 | Composition 1 | Resin 1 | B | A | A | A |
| Example 1-31 | Composition 1 | Resin 1 | A | A | A | A |
| Comparative Example 1-1 | Composition 1 | Resin 1 | E | A | A | A |
| Comparative Example 1-2 | Composition 1 | Resin 1 | D | A | C | A |
| Comparative Example 1-3 | Composition 1 | Resin 1 | E | A | A | B |
| Comparative Example 1-4 | Composition 1 | Resin 1 | C | D | A | D |
| Comparative Example 1-5 | Composition 1 | Resin 1 | E | A | A | D |
| Comparative Example 1-6 | Composition 1 | Resin 1 | E | A | A | D |

As can be seen from the tables above, in Examples, spectral variation resistance, infrared shielding properties and visible transparency were excellent. In addition, in Examples in which the pyrrolopyrrole compound was used as the first near infrared absorbing compound, light fastness was further improved.

On the other hand, in Comparative Examples, at least either spectral variation resistance or infrared shielding properties were lower than that of Examples.

The same effects as those of Examples were obtained even in a case where a film was formed on both surfaces of the layer containing copper using each of the compositions according to Examples.

In addition, the same effects as those of Examples were obtained even in a case where, instead of the layer containing copper, a film was formed on phosphate glass containing copper or fluorophosphate glass containing copper using each of the compositions according to Examples.

In addition, the same effects as those of Examples were obtained even in a case where a film is formed on a glass substrate using a composition which was obtained by further adding the copper complex used for forming the layer containing copper to each of the compositions according to Examples.

In addition, the same effects as those of Examples were obtained even in a case where a layer was formed on a glass substrate using each of the compositions according to Examples and the layer containing copper was formed thereon.

In addition, the same effects as those of Examples were obtained even in a case where, instead of the above-described layer containing copper, a layer containing copper was formed using the following copper complex-containing composition 2 and then a film was formed on a single surface or both surfaces of the layer containing copper using each of the compositions according to Examples.

(Copper Complex-Containing Composition 2)

28.9 parts by mass of tetraethoxysilane, 28.9 parts by mass of phenyltriethoxysilane, and 30.6 parts by mass of 10 mass % hydrochloric acid were mixed with each other at room temperature for 4 hours to obtain a sol. 26.0 parts by mass of the copper complex 1 was dissolved in 85.5 parts by mass of cyclopentanone at room temperature for 20 minutes to obtain a solution, and the sol was added to the solution. The mixture was filtered through a nylon filter (manufactured by Pall Corporation) having a pore size of 0.45 m to prepare a copper complex-containing composition 2.

In addition, the same effects as those of Examples were obtained even in a case where a film of a composition including cesium tungsten oxide was formed on the film of each of the compositions according to Examples.

The following cesium tungsten oxide-containing composition was applied using a spin coating method to a film in which each of the compositions according to Examples was laminated on the layer containing copper. Next, the laminate was heated using a hot plate at 100° C. for 2 minutes to obtain a coating layer. The obtained coating layer was exposed using an i-ray stepper or an aligner at an exposure dose of 500 mJ/cm$^2$. Next, a curing treatment was further performed on the exposed coating layer using a hot plate at 220° C. for 5 minutes. As a result, a film having a thickness of 3.0 m was formed.

(Cesium Tungsten Oxide-Containing Composition)

49.84 parts by mass of YMS-01A-2 (cesium tungsten oxide particle dispersion; manufactured by Sumitomo Metal Mining Co., Ltd.), 39.5 parts by mass of the following resin (PGMEA solution having a solid content of 40%), 6.80 parts by mass of KAYARAD DPHA (manufactured by Nippon Kayaku Co., Ltd.), 2.18 parts by mass of IRGACURE 369 (manufactured by BASF SE), and 1.68 parts by mass of PGMEA were mixed and stirred to prepare a cesium tungsten oxide-containing composition.

Resin: a resin having the following structure (acid value: 70 mgKOH/g, Mw=11000; a ratio in a structural unit is a molar ratio)

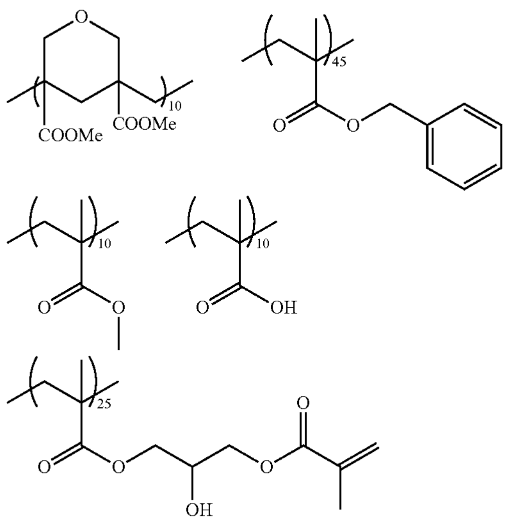

Example 1-32

The same effects as those of Example 1-30 were obtained even in a case where a near infrared cut filter formed of a film including two layers was formed using the following method.

The composition having the composition 6 was applied to a layer containing copper using a spin coater such that the thickness of a dried film was 0.8 m, and was heated (pre-baked) using a hot plate at 100° C. for 120 seconds. Next, the entire surface of the layer was exposed using an i-ray stepper at 1000 mJ/cm$^2$. Next, the layer was heated (post-baked) at 200° C. for 300 seconds. As a result, a first near infrared cut filter layer was manufactured.

Next, the composition having the composition 7 was applied to the first near infrared cut filter layer using a spin coater such that the thickness after drying was 0.8 m, and was heated (pre-baked) using a hot plate at 100° C. for 120 seconds. Next, the entire surface of the layer was exposed using an i-ray stepper at 1000 mJ/cm$^2$. Next, the layer was heated (post-baked) at 200° C. for 300 seconds. As a result, a near infrared cut filter including two layers was manufactured.

<Composition 6>

| | |
|---|---|
| First near infrared absorbing compound (II-186) | 0.96 parts |
| Second near infrared absorbing compound (II-408) | 0.48 parts |
| Resin 1 | 7.51 parts |
| Curable Compound 1 | 1.28 parts |
| Photopolymerization Initiator (IRGACURE OXE-02, manufactured by BASF SE) | 1.40 parts |
| Surfactant 1 | 1.59 parts |
| Cyclohexanone | 86.3 parts |

<Composition 7>

| | |
|---|---|
| Near infrared absorbing compound (II-91) | 0.48 parts |
| Resin 1 | 7.51 parts |
| Curable Compound 1 | 1.28 parts |
| Photopolymerization Initiator (IRGACURE OXE-02, manufactured by BASF SE) | 1.40 parts |
| Surfactant 1 | 1.59 parts |
| Cyclohexanone | 86.3 parts |

Example 1-33

The same effects as those of Example 1-31 were obtained even in a case where a near infrared cut filter formed of a film including two layers was formed using the following method.

The composition having the composition 8 was applied to a layer containing copper using a spin coater such that the thickness of a dried film was 0.8 m, and was heated (pre-baked) using a hot plate at 100° C. for 120 seconds. Next, the entire surface of the layer was exposed using an i-ray stepper at 1000 mJ/cm$^2$. Next, the layer was heated (post-baked) at 200° C. for 300 seconds. As a result, a first near infrared cut filter layer was manufactured.

Next, the composition having the composition 9 was applied to the first near infrared cut filter layer using a spin coater such that the thickness after drying was 0.8 m, and was heated (pre-baked) using a hot plate at 100° C. for 120 seconds. Next, the entire surface of the layer was exposed using an i-ray stepper at 1000 mJ/cm$^2$. Next, the layer was heated (post-baked) at 200° C. for 300 seconds. As a result, a near infrared cut filter including two layers was manufactured.

<Composition 8>

| | |
|---|---|
| First near infrared absorbing compound (II-186) | 0.96 parts |
| Second near infrared absorbing compound (II-408) | 0.32 parts |
| Resin 1 | 7.51 parts |
| Curable Compound 1 | 1.28 parts |
| Photopolymerization Initiator (IRGACURE OXE-02, manufactured by BASF SE) | 1.40 parts |
| Surfactant 1 | 1.59 parts |
| Cyclohexanone | 86.3 parts |

<Composition 9>

| | |
|---|---|
| First near infrared absorbing compound (II-29) | 0.32 parts |
| Second near infrared absorbing compound (II-91) | 0.32 parts |
| Resin 1 | 7.51 parts |
| Curable Compound 1 | 1.28 parts |
| Photopolymerization Initiator (IRGACURE OXE-02, manufactured by BASF SE) | 1.40 parts |
| Surfactant 1 | 1.59 parts |
| Cyclohexanone | 86.3 parts |

Test Example 2

(Preparation of Composition)

The following components were mixed and stirred, and the obtained mixture was filtered through a nylon filter (manufactured by Pall Corporation) having a pore size of 0.45 m to prepare a composition.

| | |
|---|---|
| [Composition] First near infrared absorbing compound (a compound shown in the following tables) | 2.38 parts |
| Second near infrared absorbing compound (a compound shown in the following tables) | 0.98 parts |
| Resin 1, resin 2, or resin 3 (a resin shown in the following tables) | 6.86 parts |
| Resin 1: a resin having the following structure (Mw = 40000, a ratio in a structural unit is a molar ratio) | |

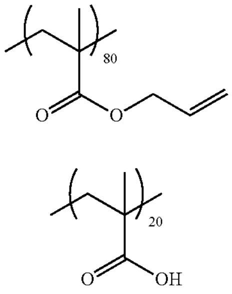

Resin 2: ARTON F4520 (manufactured by JSR Corporation)

Resin 3: a resin having the following structure (a ratio in a structural unit is a molar ratio), Mw = 11500, the resin was synthesized using a method described in paragraphs “0247” to “0249” of JP2012-198408A

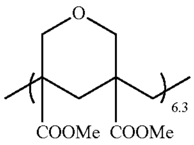

-continued

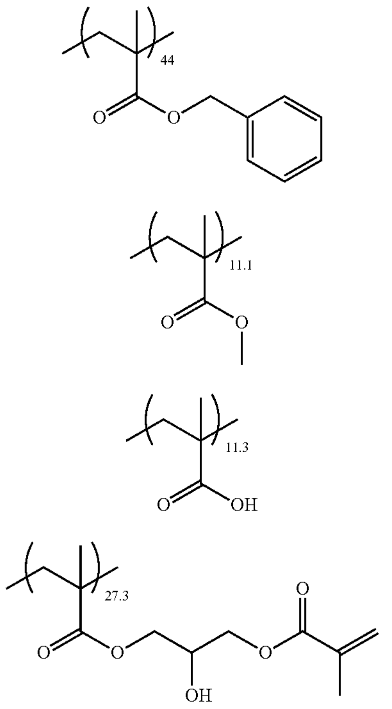

| | |
|---|---|
| Curable compound (dipentaerythritol hexaacrylate (trade name: KAYARAD DPHA, manufactured by Nippon Kayaku Co., Ltd.)) | 1.41 parts |
| Photopolymerization initiator (the following compound) | 1.55 parts |

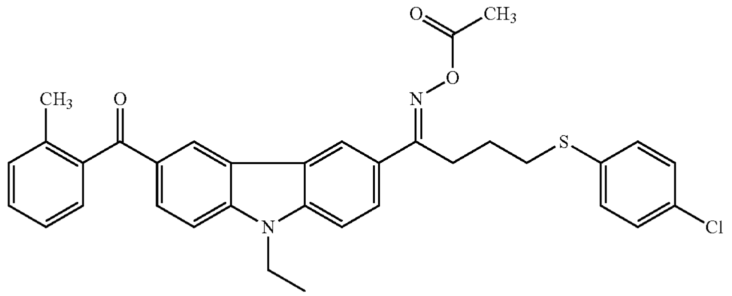 [SMILES: CCn1c2ccc(C(=O)c3ccccc3C)cc2c2cc(/C(CCCSc3ccc(Cl)cc3)=N/OC(C)=O)ccc21]

| | |
|---|---|
| Surfactant (MEGAFACE RS-72-K (manufactured by DIC Corporation, 30% propylene glycol monomethyl ether acetate solution)) | 2.71 parts |
| Polymerization inhibitor (p-methoxyphenol) | 0.001 parts |
| Cyclopentanone | 84.11 parts |

In Example 2-20 in which three colorants were used, 1.12 parts of II-507 was used as the first near infrared absorbing compound, and 1.12 parts of II-186 and 1.12 parts of IV-91 were used as the second near infrared absorbing compound (used at a mass ratio II-507:II-186:IV-91 of 1:1:1).

In addition, in Example 2-21 in which three colorants were used, 1.12 parts of II-507 was used as the first near infrared absorbing compound, and 1.12 parts of II-43 and 1.12 parts of II-589 were used as the second near infrared absorbing compound (used at a mass ratio II-507:11-43:11-589 of 1:1:1).

In addition, in Example 2-22 in which three colorants were used, 1.12 parts of III-9 was used as the first near infrared absorbing compound, and 1.12 parts of II-673 and 1.12 parts of II-9 were used as the second near infrared absorbing compound (used at a mass ratio III-9:II-673:11-9 of 1:1:1).

In addition, in Example 2-23 in which three colorants were used, 1.12 parts of II-673 was used as the first near infrared absorbing compound, and 1.12 parts of II-507 and 1.12 parts of II-43 were used as the second near infrared absorbing compound (used at a mass ratio II-673:11-507: 11-43 of 1:1:1).

In addition, in Example 2-24 in which four colorants were used, 0.84 parts of III-9 was used as the first near infrared absorbing compound, and 0.84 parts of II-673, 0.84 parts of II-167, and 0.84 parts of IV-92 were used as the second near infrared absorbing compound (used at a mass ratio III-9:II-673:II-167:IV-92 of 1:1:1:1).

In addition, in Example 2-34, the photopolymerization initiator was not added.

In addition, in Comparative Example 2-1, the content of the first near infrared absorbing compound was 2.38 parts.

In addition, in Comparative Example 2-2, the content of the first near infrared absorbing compound was 4.0 parts.

In addition, in Example 2-39, 17.6 parts of a pigment dispersion prepared as described below was used as the first near infrared absorbing compound.

Preparation of Pigment Dispersion

A mixed solution having the following composition was mixed and dispersed using a beads mill (a high-pressure dispersing machine with a pressure reducing mechanism, NANO-3000-10 (manufactured by Nippon BEE Chemical Co., Ltd.)), with zirconia beads having a diameter of 0.3 mm, until an average particle size (secondary particles) of a pyrrolopyrrole compound was 75 nm or less. As a result, a pigment dispersion was prepared. The volume average particle size of a pigment in the pigment dispersion was measured using MICROTRAC UPA 150 (manufactured by Nikkiso Co., Ltd.).

| | | |
|---|---|---|
| Pyrrolopyrrole compound (II-524) | . . . | 13.5 parts by mass |
| Resin (Disperbyk-111, (manufactured by BYK Chemie)) | . . . | 4 parts by mass |
| Propylene glycol monomethyl ether acetate (PGMEA) | . . . | 82.5 parts by |

<<Preparation of Near Infrared Cut Filter>>

Examples 2-1 to 2-33, 2-35 to 2-39, Comparative Examples 2-1 to 2-6

Each of the compositions was applied to a glass substrate (1737, manufactured by Corning Inc.) using a spin coater such that the thickness of a dried film was 1.0 m, and was heated (pre-baked) using a hot plate at 100° C. for 120 seconds.

Next, the glass substrate was exposed using an i-ray stepper exposure device FPA-3000 i5+(manufactured by Canon Corporation) at 500 mJ/cm$^2$. Further, the glass substrate was heated (post-baked) using a hot plate at 200° C. for 300 seconds. As a result, a near infrared cut filter was manufactured.

Example 2-34

The composition according to Example 2-34 was applied to on a glass substrate (1737, manufactured by Corning Inc.) using a spin coater such that the thickness after drying was 1.0 μm, and then was heated (pre-baked) using a hot plate at 100° C. for 120 seconds. As a result, a near infrared cut filter was manufactured.

<<Evaluation of Infrared Shielding Properties>>

A transmittance of the near infrared cut filter was measured using a spectrophotometer U-4100 (manufactured by Hitachi High-Technologies Corporation). The infrared shielding properties were evaluated based on the following criteria. The results are shown in the following table.

A: Average Transmittance in Wavelength Rang of Absorption Maximum λmax ± 25 nm ≤ 10%
B: 10% < Average Transmittance in Wavelength Rang of Absorption Maximum λmax ± 25 nm ≤ 15%
C: 15% < Average Transmittance in Wavelength Rang of Absorption Maximum λmax ± 25 nm ≤ 20%
D: 20% < Average Transmittance in Wavelength Rang of Absorption Maximum λmax ± 25 nm <<Evaluation of Visible Transparency>>

An average transmittance of the near infrared cut filter in a wavelength range of 400 to 550 nm was measured using a spectrophotometer U-4100 (manufactured by Hitachi High-Technologies Corporation). The visible transparency was evaluated based on the following criteria. The results are shown in the following table.

A: 90% ≤ Average Transmittance of Transmittance in Wavelength Range of 400 to 550 nm
B: 85% ≤ Average Transmittance of Transmittance in Wavelength Range of 400 to 550 nm < 90%
C: Average Transmittance of Transmittance in Wavelength Range of 400 to 550 nm < 85%

<<Evaluation of Spectral Variation Resistance>>

The near infrared cut filter was left to stand in a high-temperature and high-humidity environment of 85° C. and relative humidity: 85% for 1 hour. Before and after the moisture resistance test, a maximum absorbance (Absλmax) of the near infrared cut filter in a wavelength range of 700 to 1400 nm and a minimum absorbance (Absλmin) in a wavelength range of 400 to 700 nm were measured using a spectrophotometer U-4100 (manufactured by Hitachi High-Technologies Corporation), and an absorbance ratio represented by "Absλmax/Absλmin" was obtained. A change rate of absorbance ratio represented by "|(Absorbance Ratio before Test-Absorbance Ratio after Test)/Absorbance Ratio before Test×100|(%)" was evaluated based on the following criteria. The results are shown in the following table.

A: Change Rate of Absorbance Ratio ≤ 2%
B: 2% < Change Rate of Absorbance Ratio ≤ 4%
C: 4% < Change Rate of Absorbance Ratio ≤ 7%
D: 7% < Change Rate of Absorbance Ratio <<Light Fastness>>

The near infrared cut filter was irradiated with light using a xenon lamp at 50000 lux for 20 hours (corresponding to 1000000 lux-h), and then an ΔEab value of a color difference before and after a light fastness test was measured. The lower the ΔEab value, the higher the light fastness. The results are shown in the following table. The ΔEab value was obtained from the following color difference formula of CIE 1976 (L*, a*, b*) color space (Handbook of Color Science, p. 266, 1985, edited by The Color Science Association Of Japan).

$$\Delta Eab=\{(\Delta L^*)^2+(\Delta a^*)^2+(\Delta b^*)^2\}^{1/2}$$

A: ΔEab Value<5

B: 5≤ΔEab Value<10

C: 10≤ΔEab Value<20

D: 20≤ΔEab Value

TABLE 59

| | First Near Infrared Absorbing Compound | | | Second Near Infrared Absorbing Compound | | | | λmax |
|---|---|---|---|---|---|---|---|---|
| | Kind of Compound | Compound No. | λmax (nm) | Kind of Compound | Compound No. | λmax (nm) | Number of Colorants | Difference (nm) |
| Example 2-1 | Pyrrolopyrrole Compound | II-525 | 783 | Pyrrolopyrrole Compound | II-507 | 780 | 2 | 3 |
| Example 2-2 | Pyrrolopyrrole Compound | II-507 | 780 | Pyrrolopyrrole Compound | II-715 | 769 | 2 | 11 |
| Example 2-3 | Pyrrolopyrrole Compound | II-507 | 780 | Pyrrolopyrrole Compound | II-185 | 748 | 2 | 32 |
| Example 2-4 | Pyrrolopyrrole Compound | II-525 | 783 | Pyrrolopyrrole Compound | II-185 | 748 | 2 | 35 |
| Example 2-5 | Pyrrolopyrrole Compound | II-507 | 780 | Pyrrolopyrrole Compound | II-186 | 748 | 2 | 32 |
| Example 2-6 | Pyrrolopyrrole Compound | II-507 | 780 | Pyrrolopyrrole Compound | III-365 | 735 | 2 | 45 |
| Example 2-7 | Pyrrolopyrrole Compound | II-507 | 780 | Pyrrolopyrrole Compound | II-697 | 743 | 2 | 37 |
| Example 2-8 | Pyrrolopyrrole Compound | II-507 | 780 | Pyrrolopyrrole Compound | III-349 | 752 | 2 | 28 |
| Example 2-9 | Pyrrolopyrrole Compound | II-507 | 780 | Pyrrolopyrrole Compound | II-9 | 740 | 2 | 40 |
| Example 2-10 | Pyrrolopyrrole Compound | II-507 | 780 | Pyrrolopyrrole Compound | II-10 | 740 | 2 | 40 |
| Example 2-11 | Pyrrolopyrrole Compound | II-507 | 780 | Pyrrolopyrrole Compound | II-167 | 745 | 2 | 35 |
| Example 2-12 | Pyrrolopyrrole Compound | II-507 | 780 | Pyrrolopyrrole Compound | II-168 | 745 | 2 | 35 |
| Example 2-13 | Pyrrolopyrrole Compound | II-507 | 780 | Pyrrolopyrrole Compound | II-325 | 738 | 2 | 42 |
| Example 2-14 | Pyrrolopyrrole Compound | II-507 | 780 | Pyrrolopyrrole Compound | II-43 | 732 | 2 | 48 |
| Example 2-15 | Pyrrolopyrrole Compound | II-507 | 780 | Pyrrolopyrrole Compound | II-44 | 732 | 2 | 48 |
| Example 2-16 | Pyrrolopyrrole Compound | II-507 | 780 | Pyrrolopyrrole Compound | II-201 | 737 | 2 | 43 |
| Example 2-17 | Pyrrolopyrrole Compound | II-507 | 780 | Pyrrolopyrrole Compound | II-202 | 737 | 2 | 43 |
| Example 2-18 | Pyrrolopyrrole Compound | II-541 | 772 | Pyrrolopyrrole Compound | II-43 | 732 | 2 | 40 |
| Example 2-19 | Pyrrolopyrrole Compound | III-9 | 863 | Pyrrolopyrrole Compound | II-507 | 780 | 2 | 83 |
| Example 2-20 | Pyrrolopyrrole Compound | II-507 | 780 | Pyrrolopyrrole Compound | II-186<br>IV-91 | 743<br>701 | 3 | 37 |
| Example 2-21 | Pyrrolopyrrole Compound | II-507 | 780 | Pyrrolopyrrole Compound | II-43<br>II-589 | 732<br>719 | 3 | 48 |
| Example 2-22 | Pyrrolopyrrole Compound | III-9 | 863 | Pyrrolopyrrole Compound | II-673<br>II-9 | 794<br>740 | 3 | 69 |
| Example 2-23 | Pyrrolopyrrole Compound | II-673 | 794 | Pyrrolopyrrole Compound | II-507<br>II-43 | 780<br>732 | 3 | 14 |
| Example 2-24 | Pyrrolopyrrole Compound | III-9 | 863 | Pyrrolopyrrole Compound | III-673<br>II-167<br>IV-92 | 794<br>745<br>702 | 4 | 69 |
| Example 2-25 | Pyrrolopyrrole Compound | III-167 | 885 | Pyrrolopyrrole Compound | III-358 | 814 | 2 | 71 |
| Example 2-26 | Pyrrolopyrrole Compound | III-168 | 885 | Pyrrolopyrrole Compound | III-28 | 863 | 2 | 22 |
| Example 2-27 | Pyrrolopyrrole Compound | III-328 | 872 | Pyrrolopyrrole Compound | III-29 | 863 | 2 | 9 |
| Example 2-28 | Pyrrolopyrrole Compound | II-186 | 748 | Squarylium Compound | Q-36 | 704 | 2 | 44 |
| Example 2-29 | Pyrrolopyrrole Compound | II-507 | 780 | Cyanine Compound | Cy-2 | 758 | 2 | 22 |
| Example 2-30 | Squarylium Compound | Q-39 | 822 | Pyrrolopyrrole Compound | II-507 | 780 | 2 | 42 |
| Example 2-31 | Squarylium Compound | Q-39 | 822 | Cyanine Compound | Cy-11 | 788 | 2 | 34 |
| Example 2-32 | Squarylium Compound | Q-3 | 737 | Squarylium Compound | Q-36 | 704 | 2 | 33 |
| Example 2-33 | Cyanine Compound | Cy-12 | 829 | Pyrrolopyrrole Compound | II-507 | 780 | 2 | 49 |
| Example 2-34 | Cyanine Compound | Cy-13 | 831 | Cyanine Compound | Cy-11 | 788 | 2 | 43 |
| Example 2-35 | Cyanine Compound | Cy-13 | 831 | Cyanine Compound | Cy-11 | 788 | 2 | 43 |
| Example 2-36 | Cyanine Compound | Cy-12 | 829 | Cyanine Compound | Cy-3 | 761 | 2 | 68 |
| Example 2-37 | Pyrrolopyrrole Compound | II-507 | 780 | Pyrrolopyrrole Compound | II-9 | 740 | 2 | 40 |

TABLE 59-continued

| | | | | | | | | |
|---|---|---|---|---|---|---|---|---|
| Example 2-38 | Pyrrolopyrrole Compound | II-507 | 780 | Pyrrolopyrrole Compound | II-9 | 740 | 2 | 40 |
| Example 2-39 | Pyrrolopyrrole Compound | II-524 | 779 | Pyrrolopyrrole Compound | II-186 | 743 | 2 | 36 |
| Comparative Example 2-1 | Pyrrolopyrrole Compound | III-349 | 752 | — | | | 2 | — |
| Comparative Example 2-2 | Pyrrolopyrrole Compound | III-349 | 752 | — | | | 2 | — |
| Comparative Example 2-3 | Pyrrolopyrrole Compound | III-9 | 863 | Cyanine Compound | Cy-10 | 702 | 2 | 161 |
| Comparative Example 2-4 | Cyanine Compound | Cy-4 | 758 | Cyanine Compound | Cy-5 | 682 | 2 | 76 |
| Comparative Example 2-5 | Cyanine Compound | Cy-6 | 844 | Cyanine Compound | Cy-9 | 681 | 2 | 163 |
| Comparative Example 2-6 | Cyanine Compound | Cy-7 | 764 | Cyanine Compound | Cy-8 | 764 | 2 | 0 |

| | Resin | Infrared Shielding Properties | Spectral Variation | Visible Transparency | Light Fastness |
|---|---|---|---|---|---|
| Example 2-1 | Resin 1 | B | A | A | A |
| Example 2-2 | Resin 1 | B | A | A | A |
| Example 2-3 | Resin 1 | A | A | A | A |
| Example 2-4 | Resin 1 | A | A | A | A |
| Example 2-5 | Resin 1 | A | A | A | A |
| Example 2-6 | Resin 1 | A | A | A | B |
| Example 2-7 | Resin 1 | A | A | A | B |
| Example 2-8 | Resin 1 | A | A | A | B |
| Example 2-9 | Resin 1 | A | A | A | A |
| Example 2-10 | Resin 1 | A | A | A | A |
| Example 2-11 | Resin 1 | A | A | A | A |
| Example 2-12 | Resin 1 | A | A | A | A |
| Example 2-13 | Resin 1 | A | A | A | A |
| Example 2-14 | Resin 1 | A | A | A | A |
| Example 2-15 | Resin 1 | A | A | A | A |
| Example 2-16 | Resin 1 | A | A | A | A |
| Example 2-17 | Resin 1 | A | A | A | A |
| Example 2-18 | Resin 1 | A | A | A | A |
| Example 2-19 | Resin 1 | B | A | A | A |
| Example 2-20 | Resin 1 | A | A | A | A |
| Example 2-21 | Resin 1 | A | A | A | A |
| Example 2-22 | Resin 1 | A | A | A | A |
| Example 2-23 | Resin 1 | A | A | A | A |
| Example 2-24 | Resin 1 | A | A | A | A |
| Example 2-25 | Resin 1 | A | A | A | A |
| Example 2-26 | Resin 1 | A | A | A | A |
| Example 2-27 | Resin 1 | B | A | A | A |
| Example 2-28 | Resin 1 | A | A | B | A |
| Example 2-29 | Resin 1 | A | A | A | C |
| Example 2-30 | Resin 1 | A | A | B | B |
| Example 2-31 | Resin 1 | A | A | B | C |
| Example 2-32 | Resin 1 | A | A | C | B |
| Example 2-33 | Resin 1 | A | A | A | D |
| Example 2-34 | Resin 1 | A | A | A | D |
| Example 2-35 | Resin 1 | A | B | A | D |
| Example 2-36 | Resin 2 | A | A | A | D |
| Example 2-37 | Resin 2 | A | A | A | A |
| Example 2-38 | Resin 3 | A | A | A | A |
| Example 2-39 | Resin 1 | A | A | A | A |
| Comparative Example 2-1 | Resin 1 | D | A | A | B |
| Comparative Example 2-2 | Resin 1 | C | A | C | B |
| Comparative Example 2-3 | Resin 1 | D | A | A | B |
| Comparative Example 2-4 | Resin 1 | B | D | A | C |
| Comparative Example 2-5 | Resin 1 | D | A | A | D |
| Comparative Example 2-6 | Resin 1 | E | A | A | D |

As can be seen from the tables above, in Examples, spectral variation resistance, infrared shielding properties and visible transparency were excellent. In addition, in Examples in which the pyrrolopyrrole compound was used as the first near infrared absorbing compound, light fastness was further improved.

On the other hand, in Comparative Examples, at least either spectral variation resistance or infrared shielding properties were lower than that of Examples.

In Examples 2-1 to 2-39, the chromatic colorant was further added. As a result, a filter having excellent transmittance in a wavelength range other than a specific visible range and infrared shielding properties and having excellent spectral variation resistance was obtained.

In addition, a favorable effect was obtained in a laminated film including a dielectric multi-layer film and a film which was obtained from each of the compositions according to Examples 2-1 to 2-39.

In Examples 2-1 to 2-39, by further adding a coloring material that shields visible light, an infrared transmitting filter having excellent spectral variation resistance was obtained.

In Examples 2-1 to 2-39, the same effects as those of Examples were obtained even in a case where the curable compound (dipentaerythritol hexaacrylate (trade name: KAYARAD DPHA, manufactured by Nippon Kayaku Co., Ltd.)) was changed to diglycerin ethylene oxide (EO)-modified (meth)acrylate (trade name: M-460, manufactured by Toagosei Co., Ltd.).

In Examples 2-1 to 2-19 and 2-25 to 2-39, the same effects as those of Examples were obtained even in a case where a film was formed using the following composition 10.

(Composition 10)

The following components were mixed and stirred, and the obtained mixture was filtered through a nylon filter (manufactured by Pall Corporation) having a pore size of 0.45 m to prepare a composition.

| | |
|---|---|
| [Composition] First near infrared absorbing compound (a compound shown in the following tables) | 2.38 parts |
| Second near infrared absorbing compound (a compound shown in the following tables) | 0.98 parts |
| Resin 1, resin 2, or resin 3 | 7.52 parts |
| Curable compound (dipentaerythritol hexaacrylate (trade name: KAYARAD DPHA, manufactured by Nippon Kayaku Co., Ltd.)) | 1.41 parts |
| Photopolymerization initiator (the following compound) | 1.55 parts |

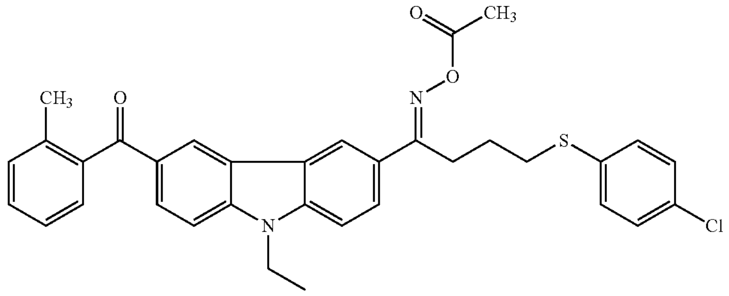 [SMILES: CCn1c2ccc(C(=O)c3ccccc3C)cc2c2cc(/C(CCCSc3ccc(Cl)cc3)=N/OC(C)=O)ccc21]

| | |
|---|---|
| Surfactant (MEGAFACE RS-72-K (manufactured by DIC Corporation, 30% propylene glycol monomethyl ether acetate solution)) | 0.467 parts |
| Polymerization inhibitor (p-methoxyphenol) | 0.001 parts |
| Cyclopentanone | 85.68 parts |

Test Example 3

The composition according to Example 2-5 or 2-26 was applied to a silicon wafer using a spin coating method such that the thickness of the formed film was 1.0 m. Next, the silicon wafer was heated using a hot plate at 100° C. for 2 minutes. Next, the silicon wafer was heated using a hot plate at 200° C. for 5 minutes. Next, a 2 m Bayer pattern (near infrared cut filter) was formed using a dry etching method.

Next, a Red composition was applied to the Bayer pattern of the near infrared cut filter using a spin coating method such that the thickness of the formed film was 1.0 m Next, the silicon wafer was heated using a hot plate at 100° C. for 2 minutes. Next, using an i-ray stepper exposure device FPA-3000 i5+(manufactured by Canon Corporation) at 1000 mJ/cm$^2$, a 2 μm dot pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the glass wafer was rinsed by spin showering and was washed with pure water. Next, the silicon wafer was heated using a hot plate at 200° C. for 5 minutes. As a result, the Red composition was patterned on the Bayer pattern of the near infrared cut filter. Likewise, a Green composition and a Blue composition were sequentially patterned to form red, blue, and green color patterns.

Next, the composition for forming an infrared transmitting filter (a composition 100 or a composition 101) was applied to the pattern-formed film using a spin coating method such that the thickness of the formed film was 2.0 m. Next, the silicon wafer was heated using a hot plate at 100° C. for 2 minutes. Next, using an i-ray stepper exposure device FPA-3000 i5+(manufactured by Canon Corporation) at 1000 mJ/cm$^2$, a 2 μm Bayer pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the glass wafer was rinsed by spin showering and was washed with pure water. Next, the silicon wafer was heated using a hot plate at 200° C. for 5 minutes. As a result, the infrared transmitting filter was patterned on a portion where the Bayer pattern of the near infrared cut filter was not formed. This filter was incorporated into a solid image pickup element using a well-known method In the obtained solid image pickup element, the incidence angle dependency was satisfactory Further the evaluation results of the recognition were also satisfactory.

In a case where a near infrared cut filter was manufactured using the composition according to Example 2-5, a composition for forming an infrared transmitting filter having a composition 100 was used. In a case where a near infrared cut filter was manufactured using the composition according to Example 2-26, a composition for forming an infrared transmitting filter having a composition 101 was used.

The Red composition, the Green composition, the Blue composition, and the composition for forming an infrared transmitting filter used in Test Example 3 are as follows.

(Red Composition)

The following components were mixed and stirred, and the obtained mixture was filtered through a nylon filter (manufactured by Pall Corporation) having a pore size of 0.45 m to prepare a Red composition.

| | |
|---|---|
| Red Pigment Dispersion | 51.7 parts by mass |
| Resin 4 (40% PGMEA solution) | 0.6 parts by mass |
| Curable Compound 4 | 0.6 parts by mass |
| Photopolymerization Initiator 1 | 0.3 parts by mass |
| Surfactant 1 | 4.2 parts by mass |
| PGMEA | 42.6 parts by mass |

(Green Composition)

The following components were mixed and stirred, and the obtained mixture was filtered through a nylon filter (manufactured by Pall Corporation) having a pore size of 0.45 m to prepare a Green composition.

| | |
|---|---|
| Green Pigment Dispersion | 73.7 parts by mass |
| Resin 4 (40% PGMEA solution) | 0.3 parts by mass |
| Curable Compound 1 | 1.2 parts by mass |
| Photopolymerization Initiator 1 | 0.6 parts by mass |
| Surfactant 1 | 4.2 parts by mass |
| Ultraviolet Absorber 1 | 0.5 parts by mass |
| PGMEA | 19.5 parts by mass |

(Blue Composition)

The following components were mixed and stirred, and the obtained mixture was filtered through a nylon filter (manufactured by Pall Corporation) having a pore size of 0.45 m to prepare a Blue composition.

| | |
|---|---|
| Blue Pigment Dispersion | 44.9 parts by mass |
| Resin 4 (40% PGMEA solution) | 2.1 parts by mass |
| Curable Compound 1 | 1.5 parts by mass |
| Curable Compound 4 | 0.7 parts by mass |
| Photopolymerization Initiator 1 | 0.8 parts by mass |
| Surfactant 1 | 4.2 parts by mass |
| PGMEA | 45.8 parts by mass |

(Preparation of Composition for Forming Infrared Transmitting Filter)

The components having the following compositions were mixed and stirred, and the obtained mixture was filtered through a nylon filter (manufactured by Pall Corporation) having a pore size of 0.45 m to prepare a composition for forming an infrared transmitting filter.

(Composition 100)

| | |
|---|---|
| Pigment Dispersion 1-1 | 46.5 parts by mass |
| Pigment Dispersion 1-2 | 37.1 parts by mass |
| Curable Compound 5 | 1.8 parts by mass |
| Resin 4 | 1.1 parts by mass |
| Photopolymerization Initiator 2 | 0.9 parts by mass |
| Surfactant 1 | 4.2 parts by mass |

-continued

| | |
|---|---|
| Polymerization Inhibitor 1 | 0.001 parts by mass |
| Substrate Adhesive | 0.6 parts by mass |
| PGMEA | 7.8 parts by mass |

(Composition 101)

| | |
|---|---|
| Pigment Dispersion 2-1 | 22.67 parts by mass |
| Pigment Dispersion 3-1 | 11.33 parts by mass |
| Pigment Dispersion 3-2 | 22.67 parts by mass |
| Pigment Dispersion 3-3 | 10.34 parts by mass |
| Pigment Dispersion 3-4 | 6.89 parts by mass |
| Curable Compound 6 | 1.37 parts by mass |
| Resin 5 | 3.52 parts by mass |
| Photopolymerization Initiator 1 | 0.86 parts by mass |
| Surfactant 1 | 0.42 parts by mass |
| Polymerization Inhibitor 1 | 0.001 parts by mass |
| PGMEA | 19.93 parts by mass |

Materials used in the Red composition, the Green composition, the Blue composition, and the composition for forming an infrared transmitting filter are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure dispersing machine NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure dispersing machine NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure dispersing machine NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min.

This dispersing treatment was repeated 10 times. As a result, a Blue pigment dispersion was obtained.

Pigment Dispersion 1-1

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. As a result, Pigment Dispersion 1-1 was prepared.

| | |
|---|---|
| Mixed pigment including a red pigment (C.I. Pigment Red 254) and a yellow pigment (C.I. Pigment Yellow 139) | 11.8 parts by mass |
| Resin (Disperbyk-111, manufactured by BYK Chemie) | 9.1 parts by mass |
| PGMEA | 79.1 parts by mass |

Pigment Dispersion 1-2

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. As a result, Pigment Dispersion 1-2 was prepared.

| | |
|---|---|
| Mixed pigment including a blue pigment (C.I. Pigment Blue 15:6) and a violet pigment (C.I. Pigment Violet 23) | 12.6 parts by mass |
| Resin (Disperbyk-111, manufactured by BYK Chemie) | 2.0 parts by mass |
| Resin 10 | 3.3 parts by mass |
| Cyclohexanone | 31.2 parts by mass |
| PGMEA | 50.9 parts |

Resin 10: a resin having the following structure (Mw = 14000, a ratio in a structural unit is a molar ratio)

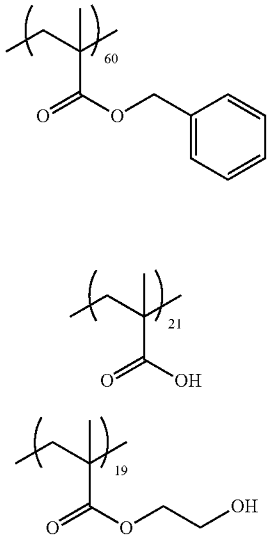

Pigment Dispersion 2-1

A mixed solution having the following composition was mixed and dispersed using a beads mill (a high-pressure dispersing machine with a pressure reducing mechanism, NANO-3000-10 (manufactured by Nippon BEE Chemical Co., Ltd.)), with zirconia beads having a diameter of 0.3 mm, until an average particle size (secondary particles) of a pyrrolopyrrole pigment was 75 nm or less. As a result, a pigment dispersion was prepared. The volume average particle size of a pigment in the pigment dispersion was measured using MICROTRAC UPA 150 (manufactured by Nikkiso Co., Ltd.).

| | |
|---|---|
| Pyrrolopyrrole pigment | 13.5 parts by mass |
| Resin (Disperbyk-111, manufactured by BYK Chemie) | 4 parts by mass |
| PGMEA | 82.5 parts by mass |

Pyrrolopyrrole pigment: a compound having the following structure

-continued

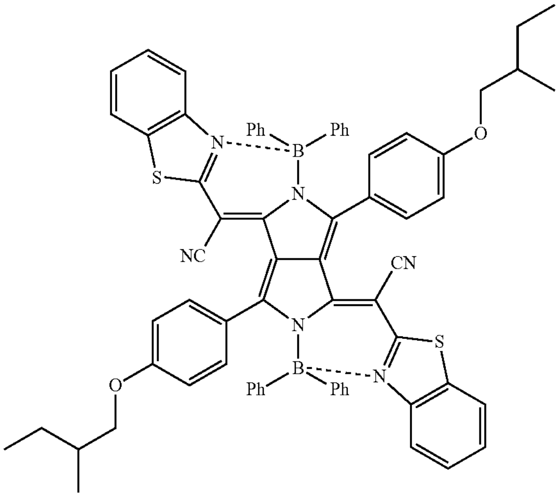

Pigment Dispersion 3-1

A mixed solution having a composition shown below was mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared.

| | |
|---|---|
| C.I. Pigment Red 254 | 13.5 parts by mass |
| Resin 11 | 2 parts by mass |
| Resin 12 | 2 parts by mass |
| PGMEA | 82.5 parts by mass |

Resin 11: a resin having the following structure (Mw: 7950, numerical values added to a main chain represent a molar ratio between the respective structural units, a numerical value added to a side chain represents the number of repeating units)

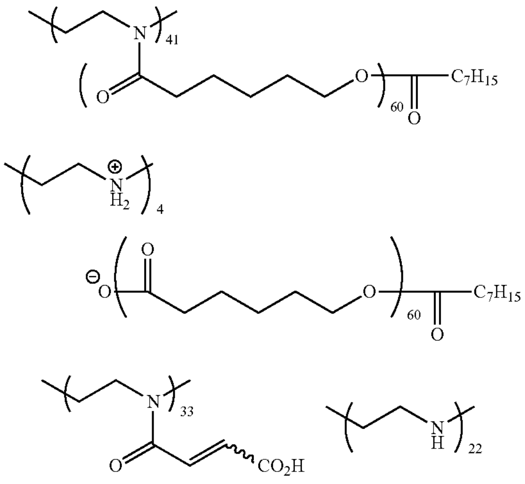

Resin 12: a resin having the following structure (Mw = 12000, a ratio in a structural unit is a molar ratio)

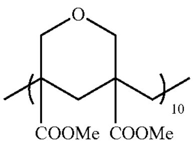

-continued

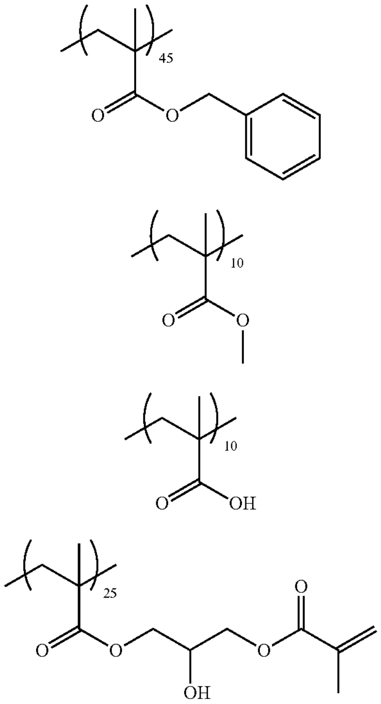

Pigment Dispersion 3-2

A mixed solution having a composition shown below was mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared.

| | |
|---|---|
| C.I. Pigment Blue 15:6 | 13.5 parts by mass |
| Resin 13 | 4 parts by mass |
| PGMEA | 82.5 parts by mass |

Resin 13: a resin having the following structure (Mw: 30000, numerical values added to a main chain represent a molar ratio between the respective structural units, a numerical value added to a side chain represents the number of repeating units)

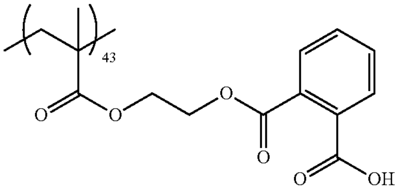

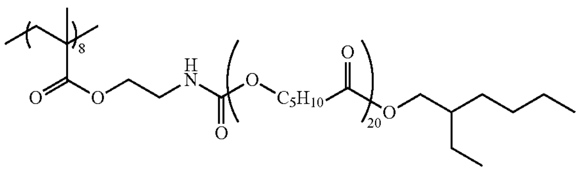

-continued

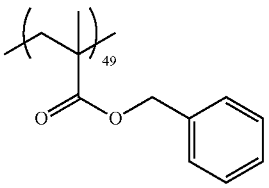

Pigment Dispersion 3-3

A mixed solution having a composition shown below was mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared.

| | |
|---|---|
| C.I. Pigment Yellow 139 | 14.8 parts by mass |
| Resin (Disperbyk-111, manufactured by BYK Chemie) | 3 parts by mass |
| Resin 12 | 2.2 parts by mass |
| PGMEA | 80 parts by mass |

Pigment Dispersion 3-4

A mixed solution having a composition shown below was mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared.

| | |
|---|---|
| C.I. Pigment Violet 23 | 14.8 parts by mass |
| Resin (Disperbyk-111, manufactured by BYK Chemie) | 3 parts by mass |
| Resin 12 | 2.2 parts by mass |
| PGMEA | 80 parts by mass |

Curable Compound 1: KAYARAD DPHA (manufactured by Nippon Kayaku Co., Ltd.)

Curable Compound 4: a compound having the following structure

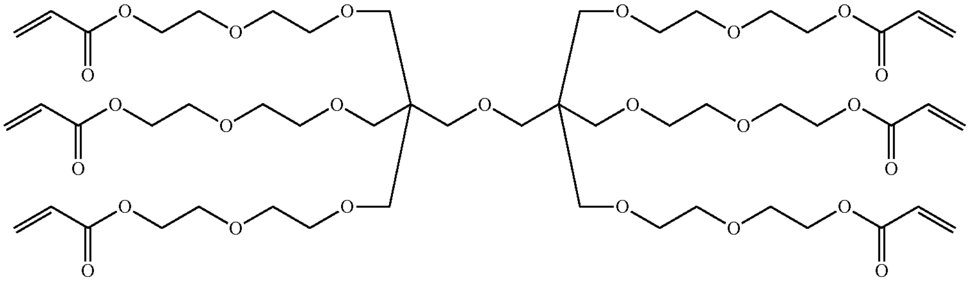 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Curable Compound 5: a compound having the following structures (a mixture in which a molar ratio between a left compound and a right compound is 7:3)

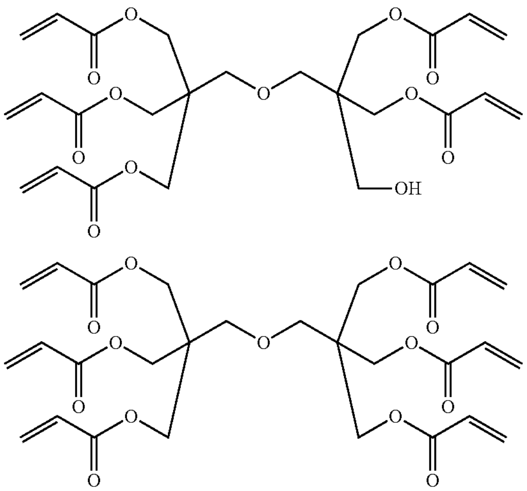

Curable Compound 6: M-305 (including 55 to 63 mass % of triacrylate; manufactured by Toagosei Co., Ltd.)

-continued

Resin 4: a resin having the following structure (acid value: 70 mgKOH/g, Mw = 11000; a ratio in a structural unit is a molar ratio)

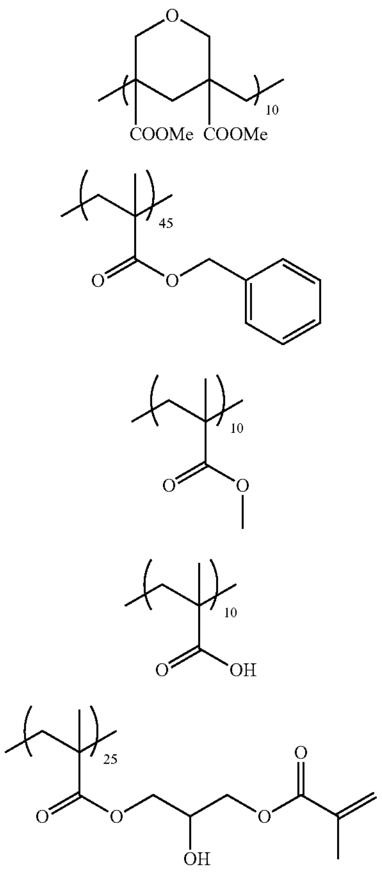

Resin 5: a resin having the following structure (Mw = 40000, a ratio in a structural unit is a molar ratio)

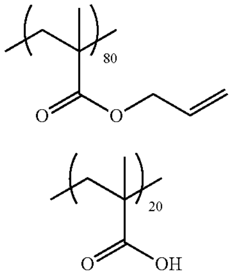

Photopolymerization Initiator 1: IRGACURE-OXE 01 (manufactured by BASF SE)

Photopolymerization Initiator 2: a compound having the following structure

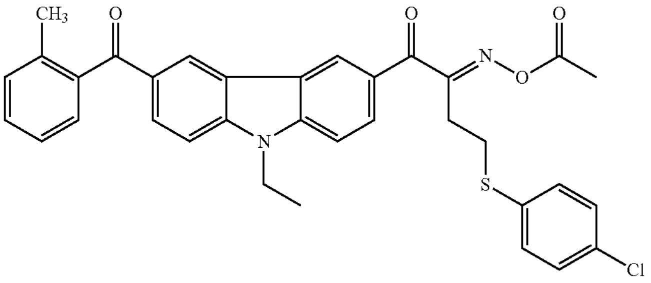 [SMILES: CCn1c2ccc(C(=O)/C(CCSc3ccc(Cl)cc3)=N/OC(C)=O)cc2c2cc(C(=O)c3ccccc3C)ccc21]

Surfactant 1: the following mixture (Mw: 14000, 1% PGMEA solution)

-continued

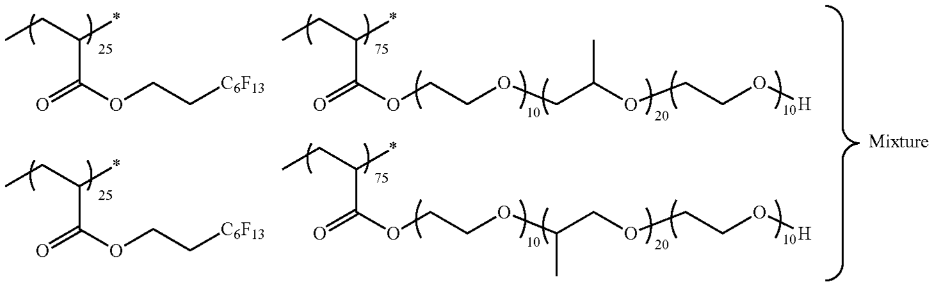

Substrate Adhesive: a compound having the following structure

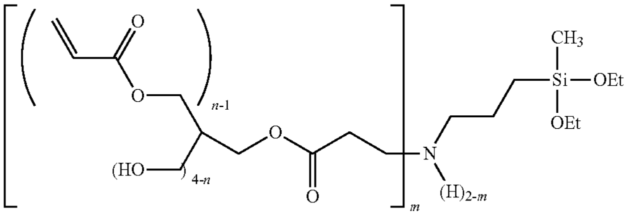

$n$ = 4, 3, 2 ($n$ = 4 main reactant)    $m$ = 2 or 1 ($m$ = 2 main product)

Polymerization Inhibitor 1: p-methoxyphenol

Ultraviolet absorber: a compound haying the following structure

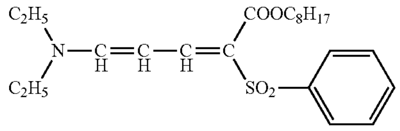

EXPLANATION OF REFERENCES

110: solid image pickup element
111, 111*a*: near infrared cut filter
112: color filter
114: infrared transmitting filter
115: microlens
116: planarizing layer
151: support

What is claimed is:

1. A composition comprising:

three or more near infrared absorbing compounds having an absorption maximum in a wavelength range of 650 to 1000 nm and having a solubility of 0.1 mass % or lower in water at 23° C., wherein at least three of the three or more near infrared absorbing compounds are each independently selected from the group consisting of a pyrrolopyrrole compound, a squarylium compound, a phthalocyanine compound, a naphthalocyanine compound, and a rylene compound, and wherein the three or more near infrared absorbing compounds include a first near infrared absorbing compound having an absorption maximum in a wavelength range of 650 to 1000 nm, and a second near infrared absorbing compound having an absorption maximum in a wavelength range of 650 to 1000 nm which is shorter than the absorption maximum of the first near infrared absorbing compound, a difference between the absorption maximum of the first near infrared absorbing compound and the absorption maximum of the second near infrared absorbing compound is 1 to 150 nm, and a content of the second near infrared absorbing compound is 30 to 200 parts by mass with respect to 100 parts by mass of the first near infrared absorbing compound, provided that, among the three or more near infrared absorbing compounds, a near infrared absorbing compound having a longest absorption maximum in a wavelength range of 650 to 1000 nm is the first near infrared absorbing compound, and all near infrared absorbing compounds having an absorption maximum which is shorter than the absorption maximum of the first near infrared absorbing compound are the second near infrared absorbing compound.

2. The composition according to claim 1, wherein in each of the first near infrared absorbing compound and the second near infrared absorbing compound, a ratio A1/A2 of an absorbance A1 at a wavelength of 500 nm to an absorbance A2 at the absorption maximum is 0.04 or lower.

3. The composition according to claim 1, wherein at least three of the three or more near infrared absorbing compounds are each independently selected from the group consisting of a pyrrolopyrrole compound, a squarylium compound, and a phthalocyanine compound.

4. The composition according to claim 1, wherein the first near infrared absorbing compound and the second near infrared absorbing compound have a common colorant skeleton.

5. The composition according to claim 1, wherein at least three of the three or more near infrared absorbing compounds are each independently a pyrrolopyrrole compound.

6. The composition according to claim 1, wherein at least three of the three or more near infrared absorbing compounds are each independently a squarylium compound.

7. The composition according to claim 1, wherein a difference between the absorption maximum of the first near infrared absorbing compound and the absorption maximum of the second near infrared absorbing compound is 1 to 90 nm.

8. The composition according to claim 1, further comprising: a curable compound.

9. The composition according to claim 1, further comprising: a resin; and a solvent.

10. The composition according to claim 1, further comprising: a chromatic colorant.

11. A film comprising: the composition according to claim 1.

12. A solid image pickup element comprising: the film according to claim 11.

13. An image display device comprising: the film according to claim 11.

14. An infrared sensor comprising: the film according to claim 11.

15. A near infrared cut filter comprising: the composition according to claim 1.

16. The near infrared cut filter according to claim 15, further comprising: a layer containing copper.

17. A laminate comprising: the near infrared cut filter according to claim 15; and a color filter that includes a chromatic colorant.

18. A pattern forming method comprising: forming a composition layer on a support, the composition layer including the composition according to claim 1; and forming a pattern on the composition layer using a photolithography method or a dry etching method.

19. A color filter comprising: a pixel that includes the composition according to claim 1; and a pixel selected from the group consisting of a red pixel, a green pixel, a blue pixel, a magenta pixel, a yellow pixel, a cyan pixel, a black pixel, and an achromatic pixel.

20. The composition according to claim 1, further comprising: a compound having an epoxy group, wherein a weight-average molecular weight of the compound having an epoxy group is 200 to 100,000.

21. The composition according to claim 1, wherein at least one of the three or more near infrared absorbing compounds is a compound represented by the following Formula (SQ-1), (SQ-1)

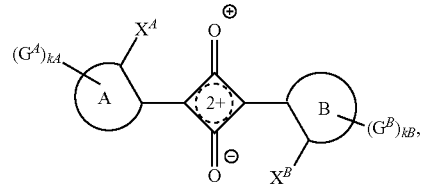

in Formula (SQ-1), a ring A and a ring B each independently represent an aromatic ring, $X^A$ and $X^B$ each independently represent —OH, —SH, —COOH, —$SO_3H$, —$NHR^{x1}$, —$NR^{x1}R^{x2}$, —$CONR^{x1}R^{x2}$, —$NHCONR^{x1}R^{x2}$, —$NHCOOR^{x1}$, —$NHSO_2R^{x1}$, —$B(OH)_2$, —$PO(OH)_3$, or —$NHBR^{x1}R^{x2}$, and $R^{x1}$ and $R^{x2}$ each independently represent a substituent, $G^A$ and $G^B$ each independently represent a substituent, kA represents an integer of 0 to nA, and kB represents an integer of 0 to nB, nA represents an integer representing the maximum number of $G^A$'s which may be substituted in the ring A, and nB represents an integer representing the maximum number of $G^B$'s which may be substituted in the ring B, $X^A$ and $G^A$, or $X^B$ and $G^B$ may be bonded to each other to form a ring, and in a case where a plurality of $G^A$'s and a plurality of $G^B$'s are present, $G^A$'s or $G^B$'s may be bonded to each other to form a ring.

22. A composition comprising: two or more near infrared absorbing compounds having an absorption maximum in a wavelength range of 650 to 1000 nm and having a solubility of 0.1 mass % or lower in water at 23° C., wherein the two or more near infrared absorbing compounds include a first near infrared absorbing compound having an absorption maximum in a wavelength range of 650 to 1000 nm, and a second near infrared absorbing compound having an absorption maximum in a wavelength range of 650 to 1000 nm which is shorter than the absorption maximum of the first near infrared absorbing compound, and a difference between the absorption maximum of the first near infrared absorbing compound and the absorption maximum of the second near infrared absorbing compound is 1 to 150 nm, and wherein the first near infrared absorbing compound and the second near infrared absorbing compound are each independently a compound represented by the following Formula (SQ-1), (SQ-1)

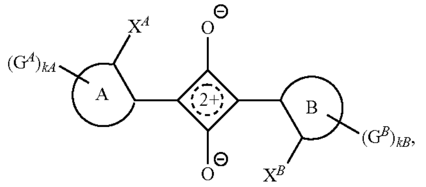

in Formula (SQ-1), a ring A and a ring B each independently represent an aromatic ring, $X^A$ and $X^B$ each independently represent —OH, —SH, —COOH, —$SO_3H$, —$NHR^{x1}$, —$NR^{x1}R^{x2}$, —CONR$^{x1}$R$^{x2}$, —NHCONR$^{x1}$R$^{x2}$, —NHCOOR$^{x1}$, —NHSO$_2$R$^{x1}$, —B(OH)$_2$, —PO(OH)$_3$, or —NHBR$^{x1}$R$^{x2}$, and R$^{x1}$ and R$^{x2}$ each independently represent a substituent, $G^A$ and $G^B$ each independently represent a substituent, kA represents an integer of 0 to nA, and kB represents an integer of 0 to nB, nA represents an integer representing the maximum number of $G^A$'s which may be substituted in the ring A, and nB represents an integer representing the maximum number of $G^B$'s which may be substituted in the ring B, $X^A$ and $G^A$, or $X^B$ and $G^B$ may be bonded to each other to form a ring, and in a case where a plurality of $G^A$'s and a plurality of $G^B$'s are present, $G^A$'s or $G^B$'s may be bonded to each other to form a ring.

23. The composition according to claim 22, wherein $X^A$ and $X^B$ each independently represent —CONR$^{x1}$R$^{x2}$, —NHcONR$^{x1}$R$^{x2}$, —NHCOOR$^{x1}$, —NHSO$_2$R$^{x1}$, —B(OH)$_2$, —PO(OH)$_3$, or —NHBR$^{x1}$R$^{x2}$.

24. The composition according to claim 22, wherein $X^A$ and $X^B$ each independently represent —OH, —SH, —COOH, or —SO$_3$H.

* * * * *